US007076226B2

(12) United States Patent
Bult et al.

(10) Patent No.: US 7,076,226 B2
(45) Date of Patent: Jul. 11, 2006

(54) VARIABLE GAIN AMPLIFIER FOR LOW VOLTAGE APPLICATIONS

(75) Inventors: Klaas Bult, Bosch en Duin (NL); Rudy van de Plassche, Waalre (NL); Pieter Vorenkamp, Laguna Niguel, CA (US); Arnoldus Venes, Laguna Niguel, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 10/747,124

(22) Filed: Dec. 30, 2003

(65) Prior Publication Data

US 2004/0219898 A1 Nov. 4, 2004

Related U.S. Application Data

(63) Continuation of application No. 09/747,159, filed on Dec. 20, 2000, now Pat. No. 6,684,065.

(60) Provisional application No. 60/172,865, filed on Dec. 20, 1999.

(51) Int. Cl.
*H04B 1/06* (2006.01)
*H03F 3/45* (2006.01)

(52) U.S. Cl. ............................... 455/252.1; 455/127.2; 455/323.1; 330/254; 330/278

(58) Field of Classification Search ............. 455/127.2, 455/232.1, 234.1, 245.1, 250.1, 252.1; 330/69, 330/250, 252, 254, 278
See application file for complete search history.

(56) References Cited

U.S. PATENT DOCUMENTS 3,641,450 A 2/1972 Lunn
4,211,975 A 7/1980 Kuroda
4,357,578 A * 11/1982 Yokoyama .................. 330/252
5,077,541 A 12/1991 Gilbert
5,469,106 A * 11/1995 Dow .......................... 330/254
5,581,213 A 12/1996 Linder et al.
5,625,307 A 4/1997 Scheinberg (Continued)

FOREIGN PATENT DOCUMENTS

EP 0 587 965 A1 3/1994

OTHER PUBLICATIONS

Gilbert, B., "A Low-Noise Wideband Variable-Gain Amplifier Using an Interpolated Ladder Attenuator," IEEE International Solid-State Circuits Conference, US, New York, No. 34, Feb. 1991, pp. 280-281 and p. 330.

(Continued)

*Primary Examiner*—Quochien B. Vuong
(74) *Attorney, Agent, or Firm*—Sterne, Kessler, Goldstein & Fox P.L.L.C.

(57) ABSTRACT

An integrated communications system. Comprising a substrate having a receiver disposed on the substrate for converting a received signal to an IF signal. Coupled to a VGA for low voltage applications and coupled to the receiver for processing the IF signal. The VGA includes a bank pair having a first bank of differential pairs of transistors and a second bank of differential pairs of transistors. The bank pair is cross-coupled in parallel, the IF signal is applied to the bank pair decoupled from a control signal used to control transconductance output gain of the bank pair over a range of input voltages. A digital IF demodulator is disposed on the substrate and coupled to the VGA for low voltage applications, for converting the IF signal to a demodulated baseband signal. And a transmitter is disposed on the substrate operating in cooperation with the receiver to establish a two way communications path.

8 Claims, 104 Drawing Sheets

U.S. PATENT DOCUMENTS

| | | | |
|---|---|---|---|
| 5,668,502 | A | 9/1997 | Rijns |
| 5,715,012 | A | 2/1998 | Patel et al. |
| 5,737,035 | A | 4/1998 | Rotzoll |
| 5,742,203 | A | 4/1998 | Van De Plassche et al. |
| 5,828,265 | A | 10/1998 | Mensink et al. |
| 5,896,063 | A | 4/1999 | Marsh et al. |
| 5,949,285 | A | 9/1999 | Ando |
| 6,049,251 | A | 4/2000 | Meyer |
| 6,150,881 | A | 11/2000 | Lovelace et al. |
| 6,373,337 | B1 | 4/2002 | Ganser |
| 6,445,251 | B1 | 9/2002 | Robinson |

OTHER PUBLICATIONS

Leung, L., et al., "10-MHz 60-dB Dynamic-Range 6-dB Variable Gain Amplifier," IEEE, 1997, pp. 173-176.

Poole, S. et al., "A CMOS Subscriber Line Audio Processing Circuit Including Adaptive Balance," IEEE International Symposium on Circuits and Systems, Finland, Espoo, vol. 2 of 3, Jun. 7-9, 1988, pp. 1931-1934.

Furth et al., "Linearised Differential Transductors in Subthreshold CMOS", Electronics Letters, IEEE Stevenage, GB, vol. 31, No. 7, Mar. 30, 1995, pp 545-547.

Copy of International Search Report for International Application No. PCT/US01/04451, filed Feb. 8, 2001.

Mensink et al., "A CMOS "Soft-Switched" Transconductor and Its Application in Gain Control and Filters", IEEE Journal of Solid-State Circuits, vol. 32, No. 7, Jul. 1997.

Shin et al., "An Inductorless 900MHz RF Low-Noise Amplifier in 0.9um CMOS", IEEE 1997 Custom Integrated Circuits Conference, May 5-8, 1997, pp. 513-516.

Tham et al., "A Direct-Conversion Transceiver Chip Set For 900MHz (ISM Band) Spread-Spectrum Digital Cordless Telephone", 1996 IEEE International Symposium on Circuits and Systems, vol. 4, May 12-15, 1996, pp. 85-88.

* cited by examiner

DUAL CONVERSION RECEIVER

PPL Xtal REFERENCE=10MHz
LO-1, 10MHz FREQUENCY STEPS
LO-2, 100kHz FREQUENCY STEPS

*FIG. 21*

44MHz IF

NOTE
• LO-2 REF=100KHz
SO DIVIDE RANGE=9216 TO 9280

TABLE OF FREQUENCIES BASED ON COARSE/FINE PLL SOLUTION:

| Frf (MHz) | 50 | 56 | 62 | 68 | 74 | 80 | 86 | 92 | 98 | 104 | 110 | 116 | 122 | 128 | '' | 854 | 860 |
|---|---|---|---|---|---|---|---|---|---|---|---|---|---|---|---|---|---|
| LO-1 (MHz) | 1250 | 1260 | 1260 | 1270 | 1270 | 1280 | 1290 | 1290 | 1300 | 1300 | 1310 | 1320 | 1320 | 1330 | '' | 2050 | 2060 |
| IF-1 (MHz) | 1200 | 1204 | 1198 | 1202 | 1196 | 1200 | 1204 | 1198 | 1202 | 1196 | 1200 | 1204 | 1198 | 1202 | '' | 1196 | 1200 |
| LO-2 (MHz) | 924.8 | 928.0 | 923.2 | 926.4 | 921.6 | 924.8 | 928.0 | 923.2 | 926.4 | 921.6 | 924.8 | 928.0 | 923.2 | 926.4 | '' | 921.6 | 924.8 |
| IF-2 (MHz) | 275.2 | 276 | 274.8 | 275.6 | 274.4 | 275.2 | 276.0 | 274.8 | 275.6 | 274.4 | 275.2 | 276.0 | 274.8 | 275.6 | '' | 274.4 | 275.2 |
| LO-3 (MHz) | 231.2 | 232 | 230.8 | 232 | 230 | 231 | 232 | 231 | 232 | 230 | 231 | 232 | 231 | 232 | '' | 230 | 231 |
| IF-3 (MHz) | 44.0 | 44.0 | 44.0 | 44.0 | 44.0 | 44.0 | 44.0 | 44.0 | 44.0 | 44.0 | 44.0 | 44.0 | 44.0 | 44.0 | '' | 44.0 | 44.0 |

PPL Xtal REFERENCE=10MHz
LO-1, 10MHz FREQUENCY STEPS
LO-2, 100kHz FREQUENCY STEPS

*FIG. 22*

36MHz IF

TABLE OF FREQUENCIES BASED ON COARSE/FINE PLL SOLUTION:

NOTE
• LO-2 REF=100KHz
SO DIVIDE RANGE=9280 TO 9340

| Frf (MHz) | 50 | 58 | 66 | 74 | 82 | 90 | 98 | 106 | 114 | 122 | 130 | 138 | 146 | 154 | " | 852 | 860 |
|---|---|---|---|---|---|---|---|---|---|---|---|---|---|---|---|---|---|
| | | | | | | | | | | | | | | | | | |
| LO-1 (MHz) | 1250 | 1260 | 1270 | 1270 | 1280 | 1290 | 1300 | 1310 | 1310 | 1320 | 1330 | 1340 | 1350 | 1350 | " | 2050 | 2060 |
| | | | | | | | | | | | | | | | | | |
| IF-1 (MHz) | 1200 | 1202 | 1204 | 1196 | 1198 | 1200 | 1202 | 1204 | 1196 | 1198 | 1200 | 1202 | 1204 | 1196 | " | 1198 | 1200 |
| | | | | | | | | | | | | | | | | | |
| LO-2 (MHz) | 931.2 | 932.8 | 934.4 | 928.0 | 930 | 931 | 933 | 934 | 928.0 | 930 | 931 | 933 | 934 | 928.0 | " | 929.60 | 931.2 |
| | | | | | | | | | | | | | | | | | |
| IF-2 (MHz) | 268.8 | 269.2 | 269.6 | 268.0 | 268.4 | 268.8 | 269.2 | 269.6 | 268.0 | 268.4 | 268.8 | 269.2 | 269.6 | 268.0 | " | 268.4 | 268.8 |
| | | | | | | | | | | | | | | | | | |
| LO-3 (MHz) | 232.8 | 233.2 | 233.6 | 232 | 232 | 233 | 233 | 234 | 232 | 232 | 233 | 233 | 234 | 232.0 | " | 232.4 | 232.8 |
| | | | | | | | | | | | | | | | | | |
| IF-3 (MHz) | 36.0 | 36.0 | 36.0 | 36.0 | 36.0 | 36.0 | 36.0 | 36.0 | 36.0 | 36.0 | 36.0 | 36.0 | 36.0 | 36.0 | " | 36.0 | 36.0 |

PGA SETTINGS

CLAMPING CONTROL RANGE

CONTROLLED GAIN COMPARATOR

CATV TUNER

SET-TOP BOX

TELEVISION

VCR BLOCK DIAGRAM

VARIABLE GAIN AMPLIFIER FOR LOW VOLTAGE APPLICATIONS

CROSS-REFERENCE TO RELATED APPLICATIONS

This application is a continuation of application Ser. No. 09/747,159, filed Dec. 20, 2000, now allowed U.S. Pat. No. 6,684,065, which claims the benefit of U.S. Provisional Application No. 60/172,865 filed Dec. 20, 1999, the contents of which is hereby incorporated by reference.

BACKGROUND OF THE INVENTION

Radio receivers, or tuners, are widely used in applications requiring the reception of electromagnetic energy. Applications can include broadcast receivers such as radio and television, set top boxes for cable television, receivers in local area networks, test and measurement equipment, radar receivers, air traffic control receivers, and microwave communication links among others. Transmission of the electromagnetic energy may be over a transmission line or by electromagnetic radio waves.

The design of a receiver is one of the most complex design tasks in electrical engineering. In the current state of the art, there are many design criteria that must be considered to produce a working radio receiver. Trade-off in the design's performance are often utilized to achieve a given objective. There are a multitude of performance characteristics that must be considered in designing the receiver.

However, certain performance characteristics are common to all receivers. Distortion and noise are two such parameters. The process of capturing the signal creates distortion that must be accounted for in the design of the radio receiver. The distortion must either be filtered out or canceled. Once a radio signal is captured, the noise surrounding the received signal in the receiver must be considered. Radio signals are often extremely weak and if noise is present in the circuit, the signal, even though satisfactorily received, can be easily lost in this noise floor. The current state of the art in receiver design is often directed to overcoming these receiver limitations in a cost effective manner.

Amplifiers are utilized to boost signal levels above the receiver noise floor. Amplification is used in many receiver functions. It is used in a fixed gain amplifier to provide a fixed gain to a signal presented to it. In providing a fixed gain a signal of a given power level presented to an amplifier is increased in power by a fixed multiplication factor. In a variable gain amplifier ("VGA") gain is often adjusted to provide an output signal of fixed power for a variety of input signal power levels. The multiplication factor is adjusted by a control depending on the power of the input signal.

Amplification is often used in conjunction with other circuit functions. Filters often incorporate amplification to boost a desired signal's level while simultaneously rejecting unwanted signals. Attenuators also incorporate amplifiers to expand their dynamic range. Thus an attenuator with gain included can produce an output signal having more or less power than a signal input to the device, depending on the setting.

Due to inherent amplifier nonlinearities the amplifiers produce distortion. Distortion tends to vary with the signal level presented to an amplifier. Strong input signals tend to increase distortion levels. Often to limit distortion the dynamic range of an amplifier is constrained to a narrow range of input signal levels to prevent distortion from arising. Constraint on signal level affects a receiver system's overall performance.

For example constraint on input levels requires tight automatic gain control ("GC") of the receiver giving rise to further problems of stability, response time, and maintenance of the required signal level range. Amplifiers with an increased dynamic range are thus desirable in designing receivers to decrease distortion and to relax systems requirements.

SUMMARY OF THE INVENTION

An integrated communications system. Comprising a substrate having a receiver disposed on the substrate for converting a received signal to an IF signal. Coupled to a VGA for low voltage applications and coupled to the receiver for processing the IF signal.

The VGA includes a bank pair having a first bank of differential pairs of transistors and a second bank of differential pairs of transistors. The bank pair is cross-coupled in parallel, the IF signal is applied to the bank pair decoupled from a control signal used to control trans conductance output gain of the bank pair over a range of input voltages.

A digital IF demodulator is disposed on the substrate and coupled to the VGA for low voltage applications, for converting the IF signal to a demodulated baseband signal. And a transmitter is disposed on the substrate operating in cooperation with the receiver to establish a two way communications path.

DESCRIPTION OF THE DRAWINGS

These and other features and advantages of the present invention will be better understood from the following detailed description read in light of the accompanying drawings, wherein.

Oscillator Figures

Figure 6:
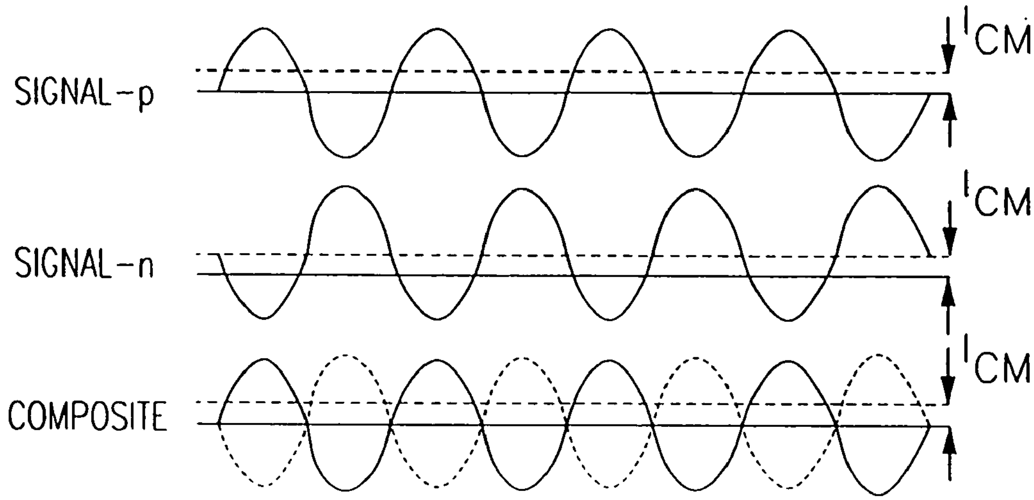
Figure 7:
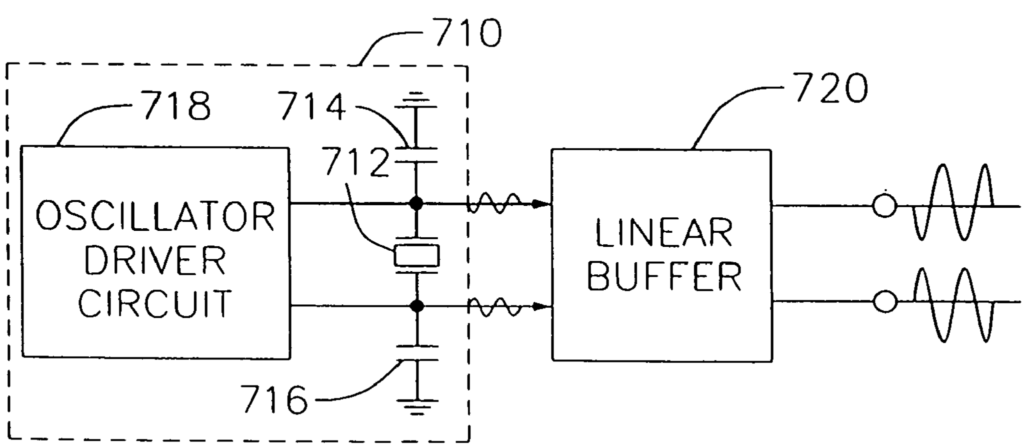
Figure 8:
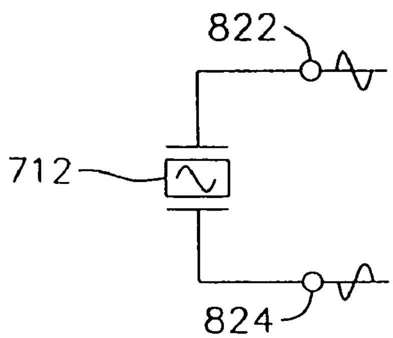
Figure 9:
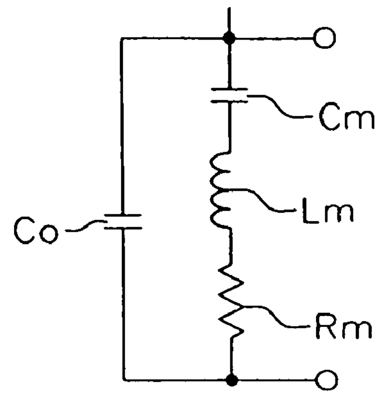
Figure 10:
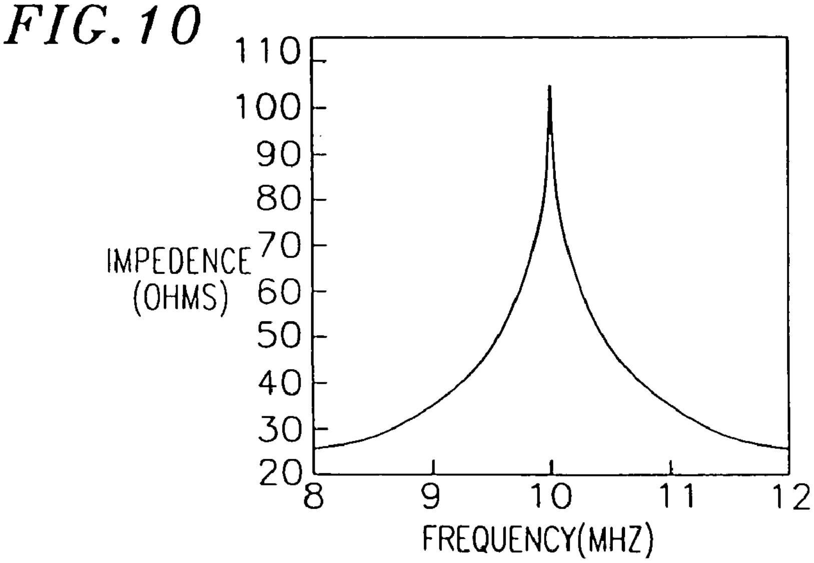
Figure 11:
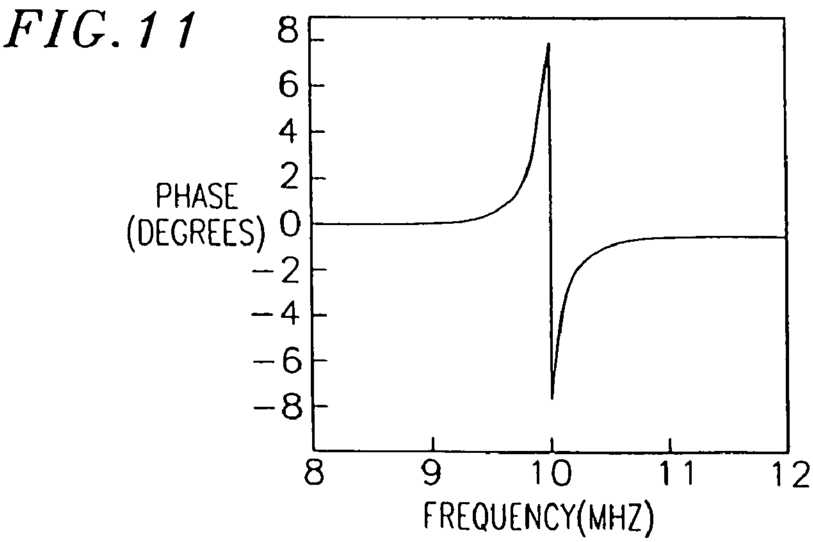
Figure 12:
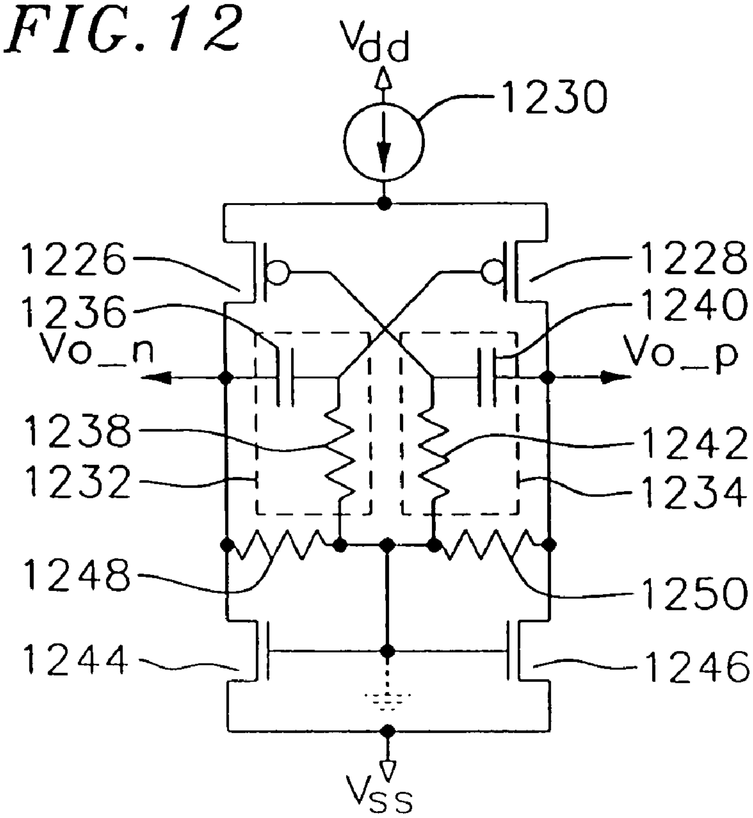
Figure 13:
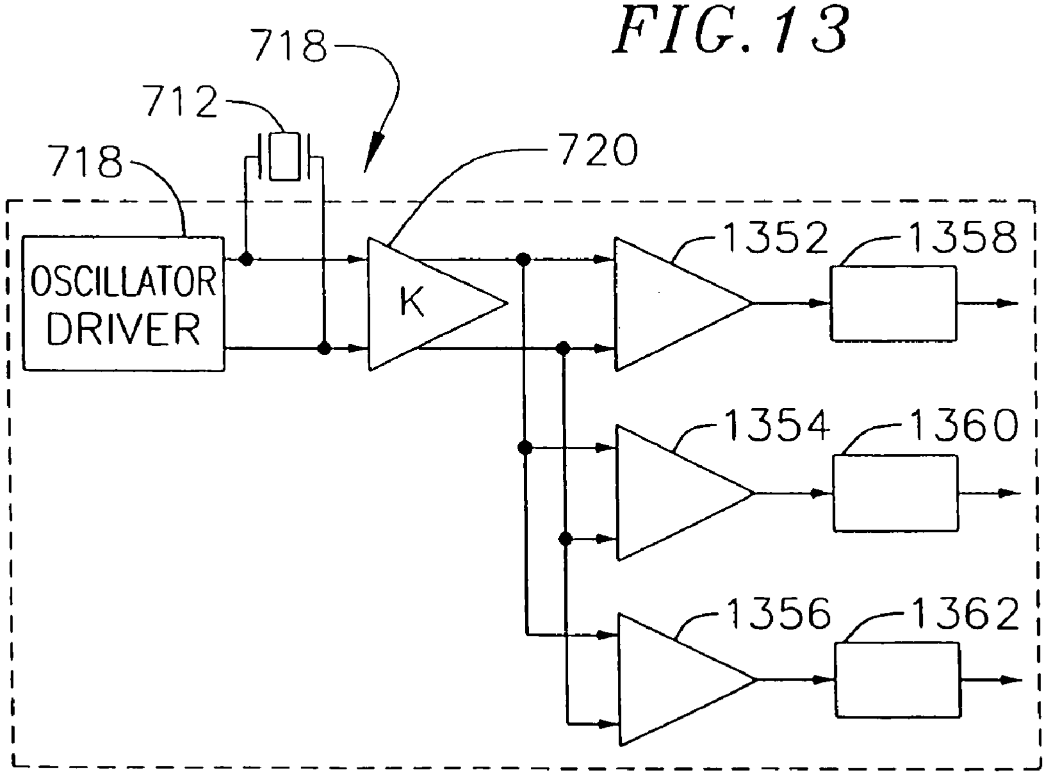
Figure 14:
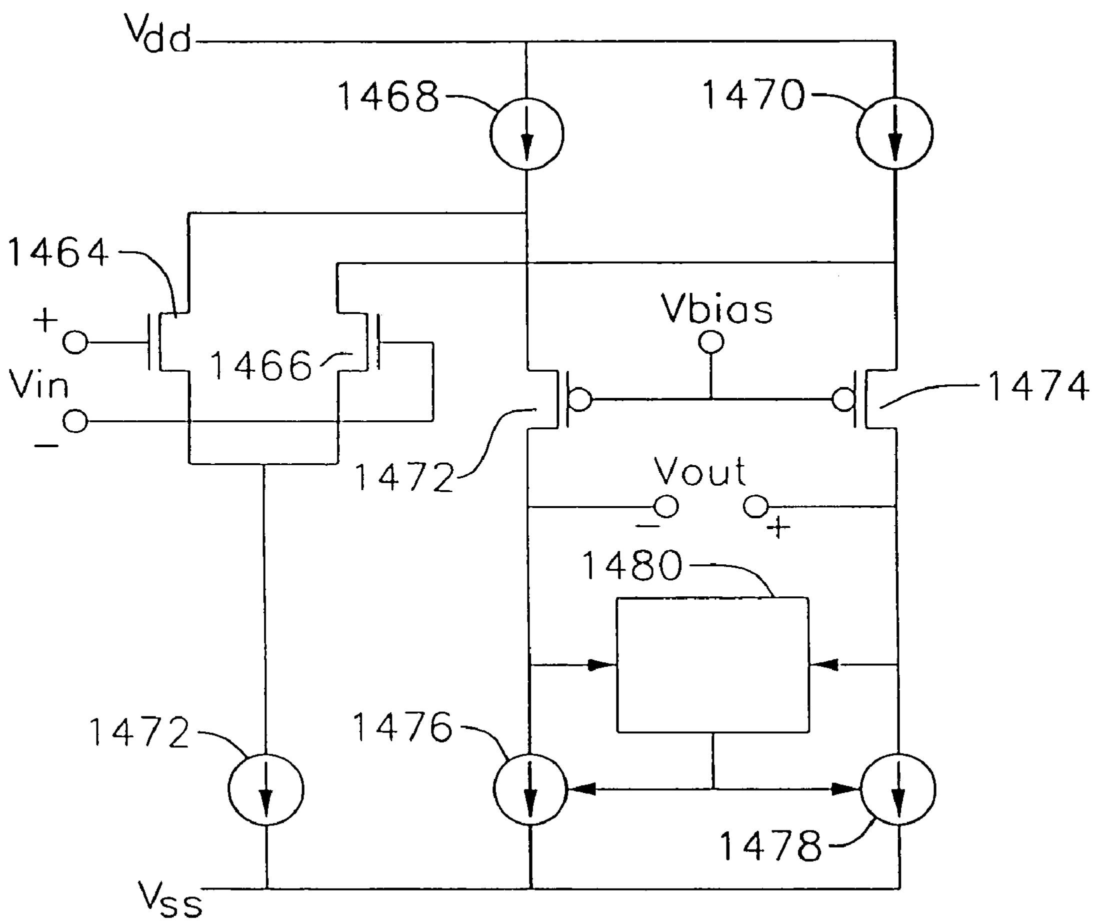
Figure 15:
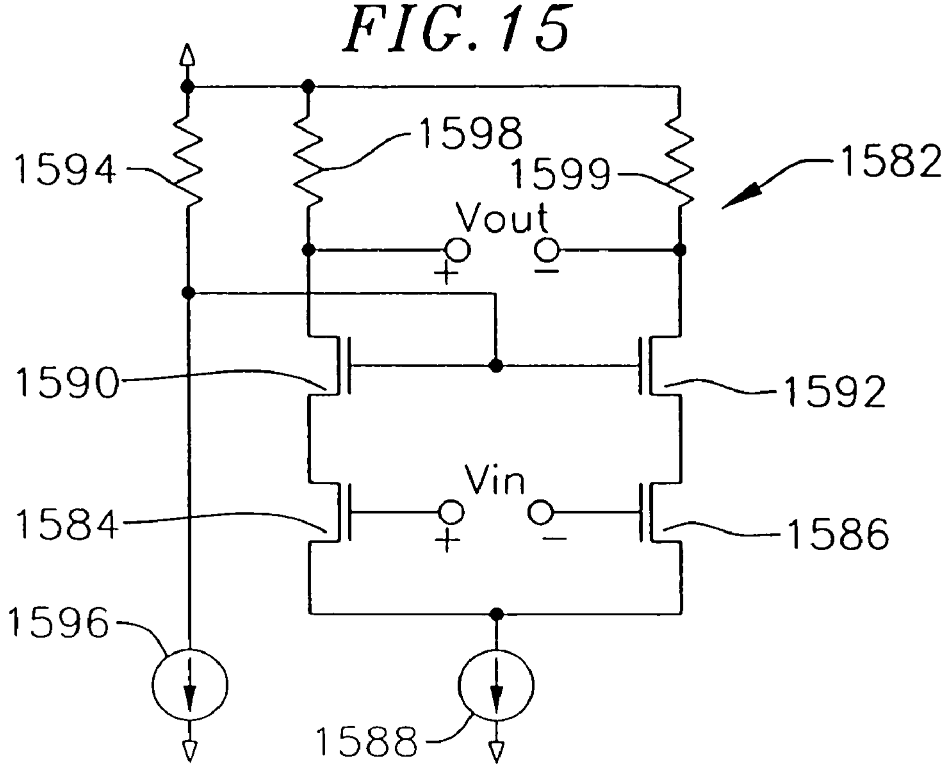
Figure 16:
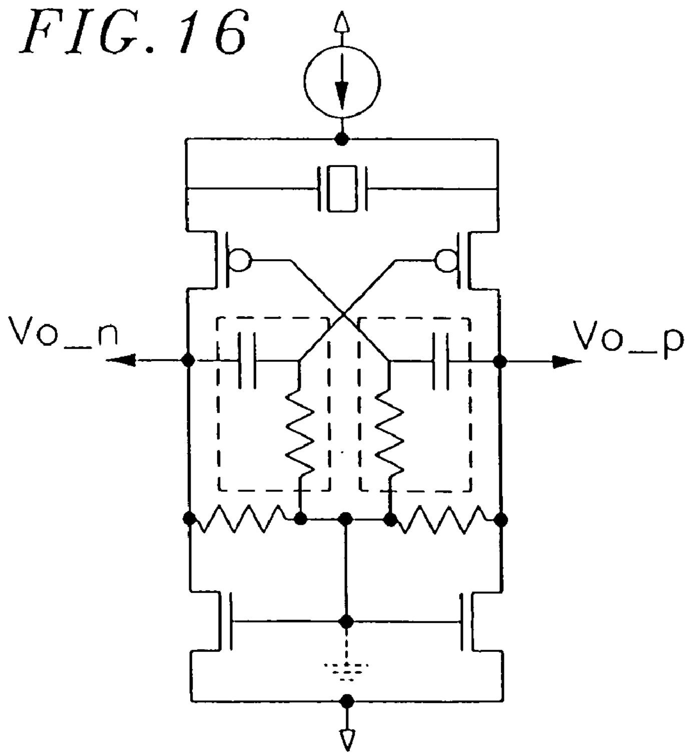
Figure 17:
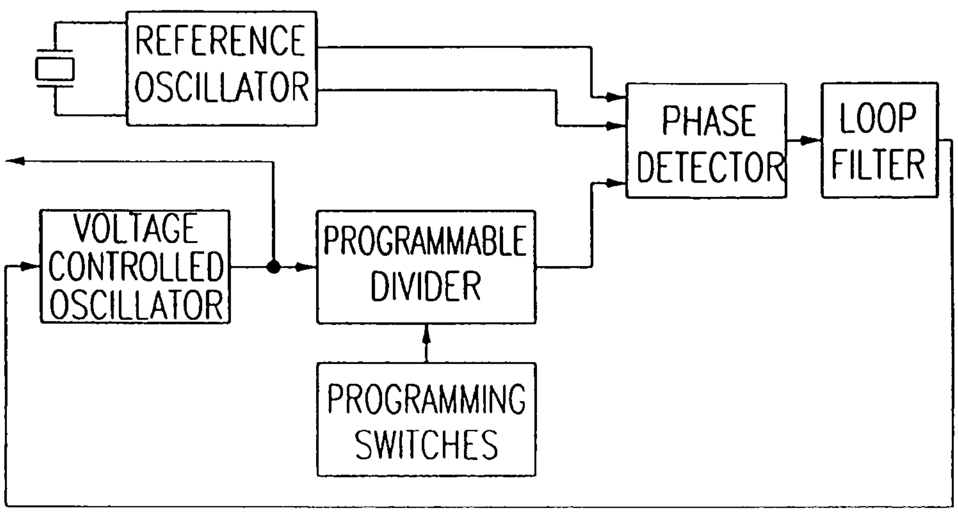
Figure 18:
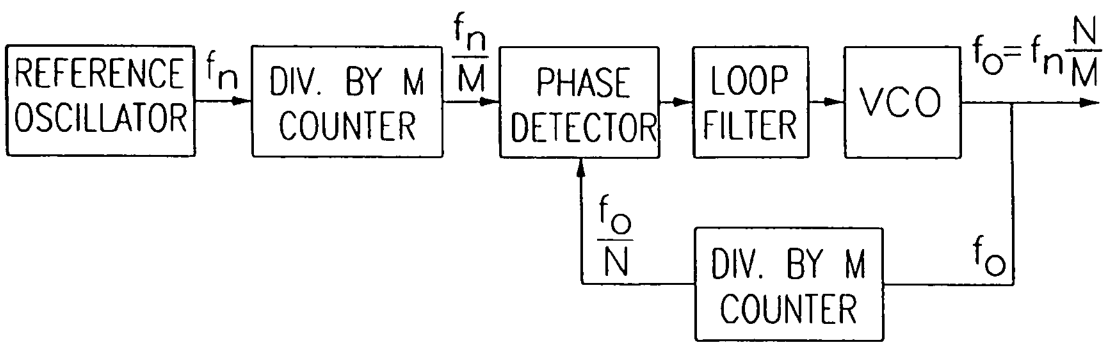

FIG. 6 is a semi-schematic simplified timing diagram of differential signals, including a common mode component, as might be developed by a differential crystal oscillator in accordance with the invention;

FIG. 7 is a semi-schematic block diagram of a differential crystal oscillator, including a quartz crystal resonator and oscillator circuit differentially coupled to a linear buffer amplifier in accordance with the invention;

FIG. 8 is a simplified schematic illustration of differential signals present at the output of a crystal resonator;

FIG. 9 is a simplified schematic diagram of a quartz crystal resonator equivalent circuit;

FIG. 10 is a simplified graphical representation of a plot of impedance vs. Frequency for a crystal resonator operating near resonance;

FIG. 11 is a simplified graphical representation of a plot of phase vs. Frequency for a crystal resonator operating near resonance;

FIG. 12 is a simplified schematic diagram of the differential oscillator circuit of FIG. 7;

FIG. 13 is a simplified, semi-schematic block diagram of a periodic signal generation circuit including a crystal oscillator having balanced differential outputs driving cascaded linear and non-linear buffer stages;

FIG. 14 is a simplified schematic diagram of a differential folded cascade linear amplifier suitable for use in connection with the present invention;

FIG. 15 is a simplified, semi-schematic diagram of a differential nonlinear buffer amplifier suitable for use as a clock buffer in accordance with the invention;

FIG. 16 is a semi-schematic illustration of an alternative embodiment of the differential oscillator driver circuit;

FIG. 17 is an block diagram of a differential crystal oscillator as a reference signal generator in a phase-lock-loop;

FIG. 18 is a simplified block diagram of an illustrative frequency synthesizer that might incorporate the differential periodic signal generation circuit of the invention;

Coarse/Fine PLL Tuning Figures

Figure 19:
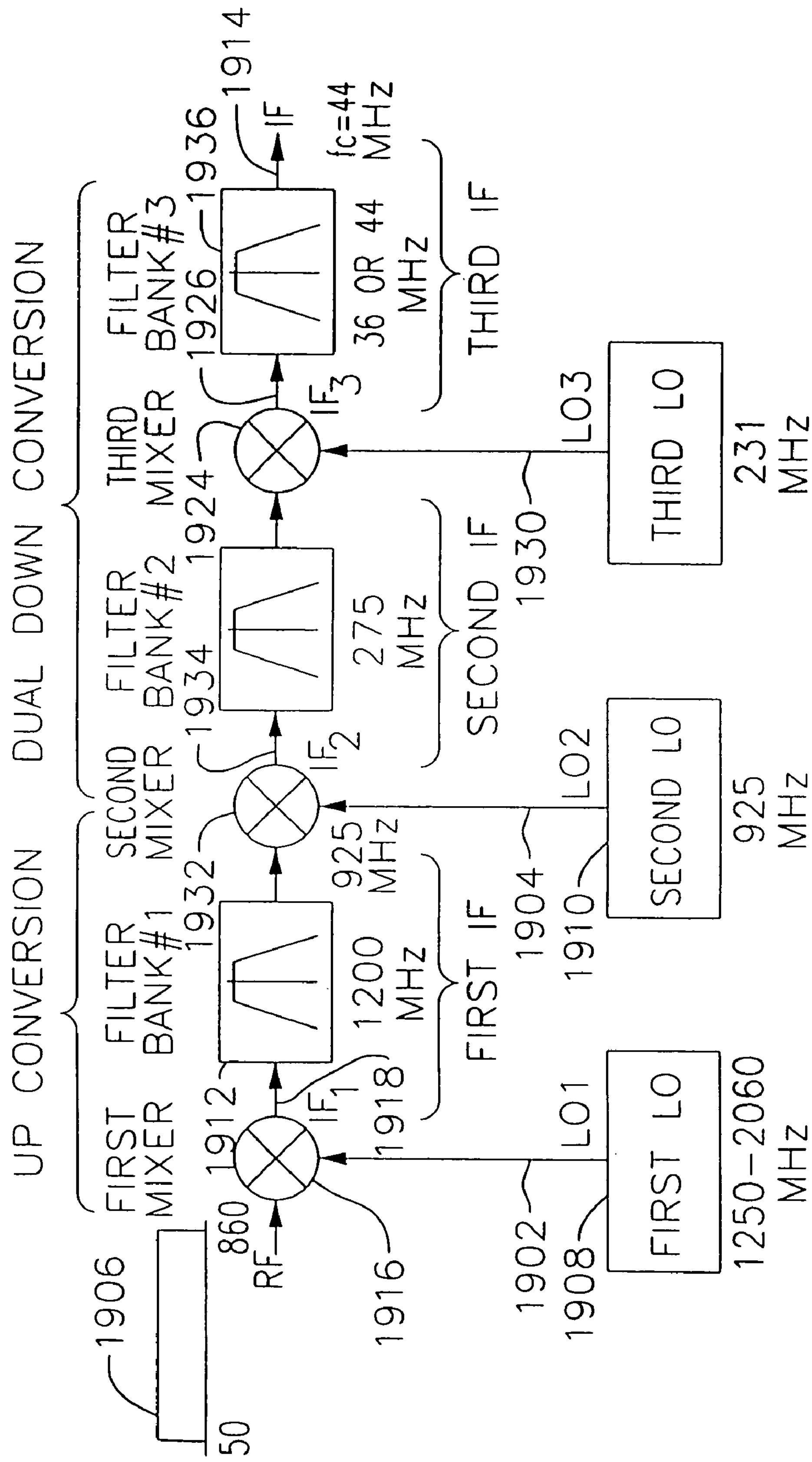
Figure 20:
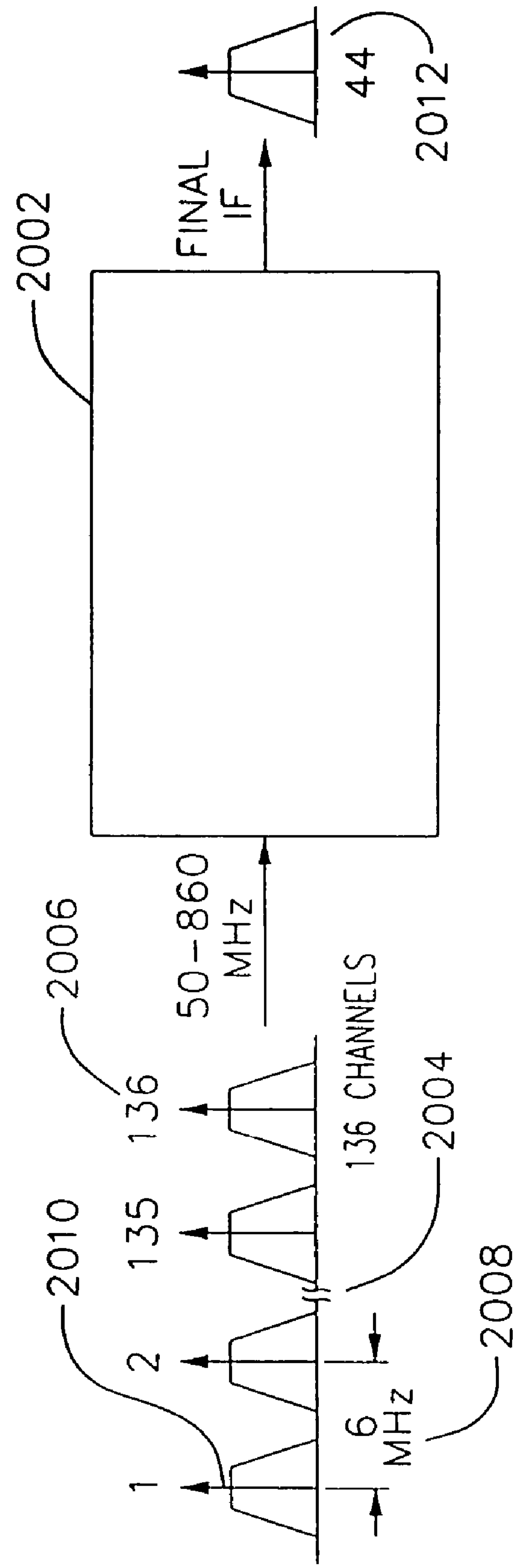
Figure 23:
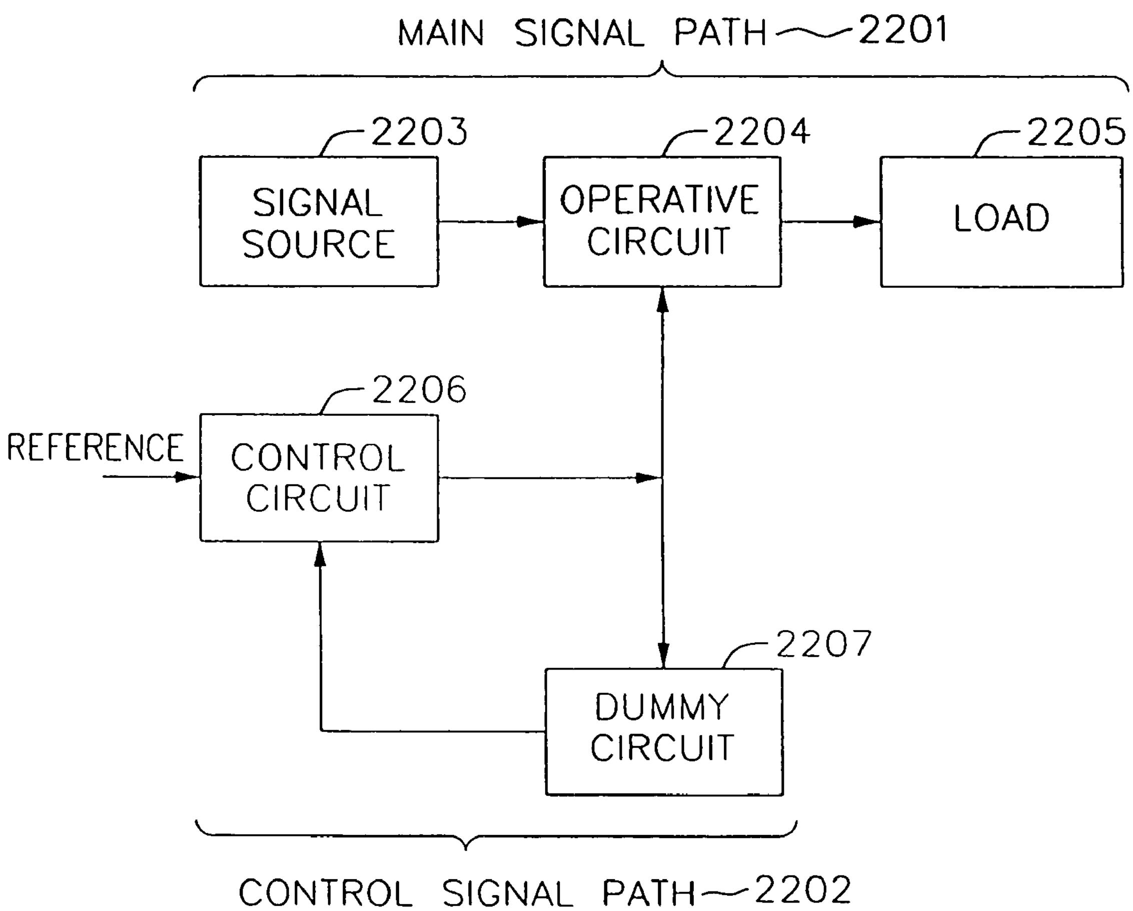

FIG. 19 is a block diagram illustrating the exemplary frequency conversions for receiver tuning utilized in the embodiments of the invention;

FIG. 20 is a block diagram of an exemplary tuner designed to receive a 50 to 860 MHz bandwidth containing a multiplicity of channels;

FIG. 21 is an exemplary table of frequencies utilizing coarse and fine PLL tuning to derive a 44 MHz IF;

FIG. 22 is an illustration of an alternative embodiment of the coarse and fine PLL tuning method to produce an exemplary final IF of 36 MHz;

FIG. 23 is a block diagram of a dummy component used to model an operative component on an integrated circuit chip;

Filter Tuning Figures

Figure 24A:
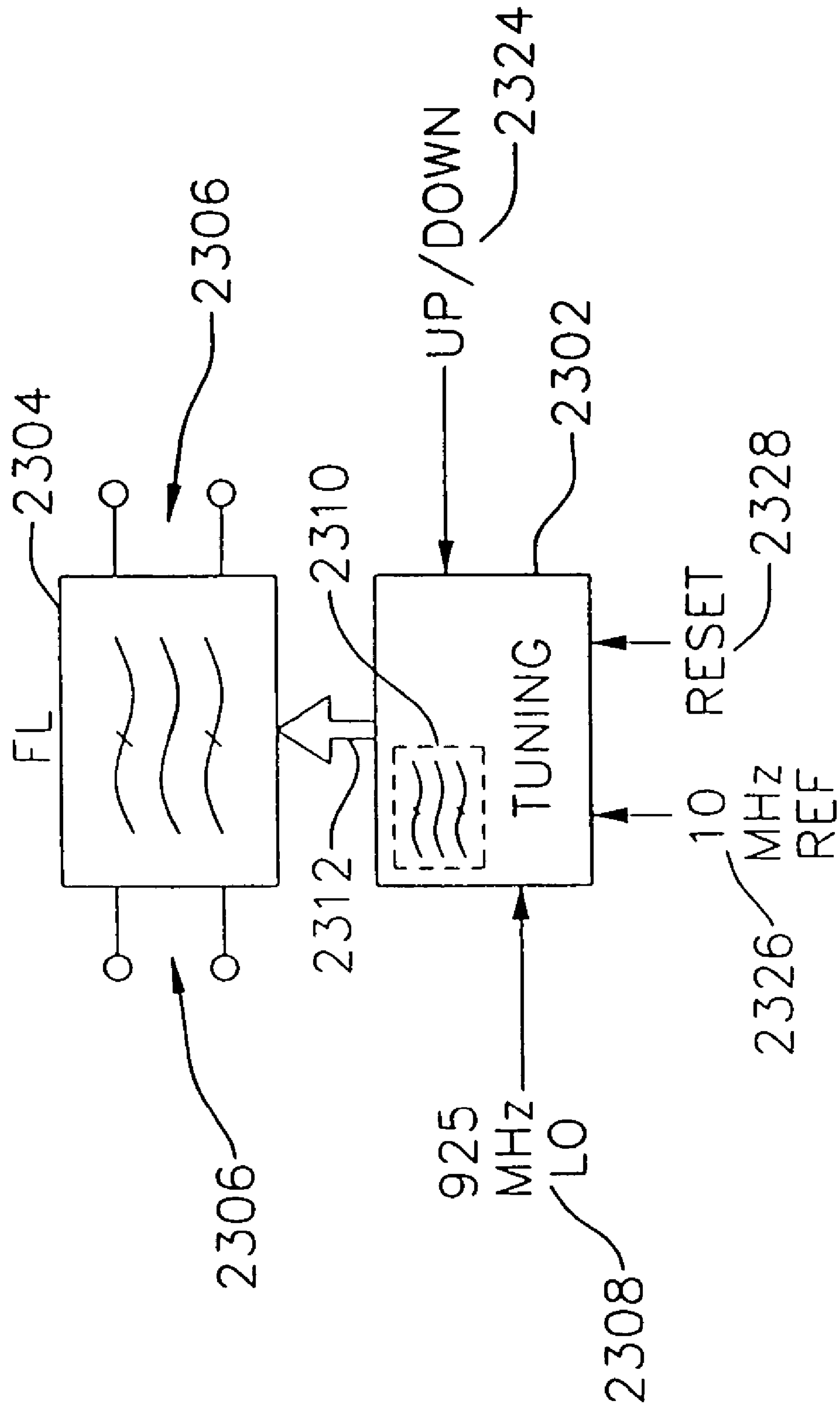
Figure 24B:
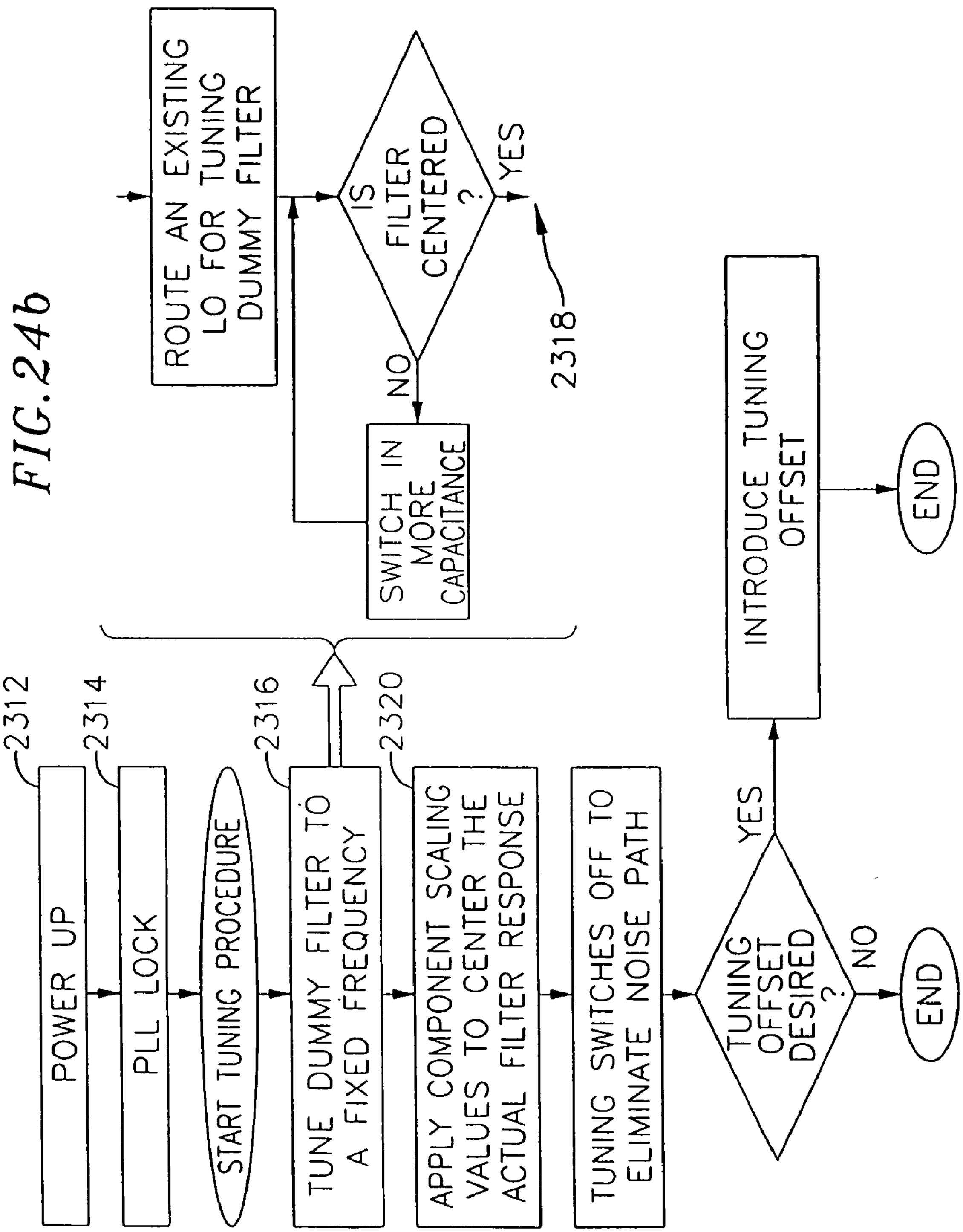
Figure 24C:
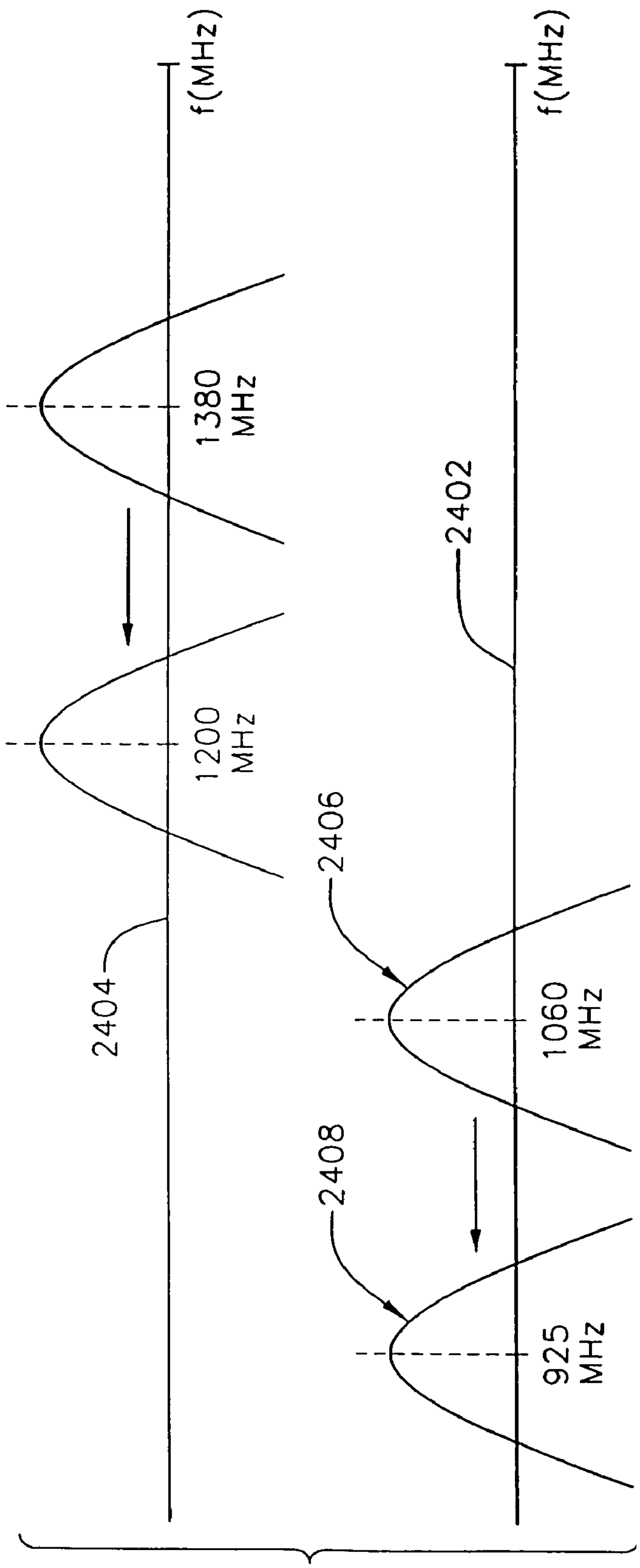
Figure 25:
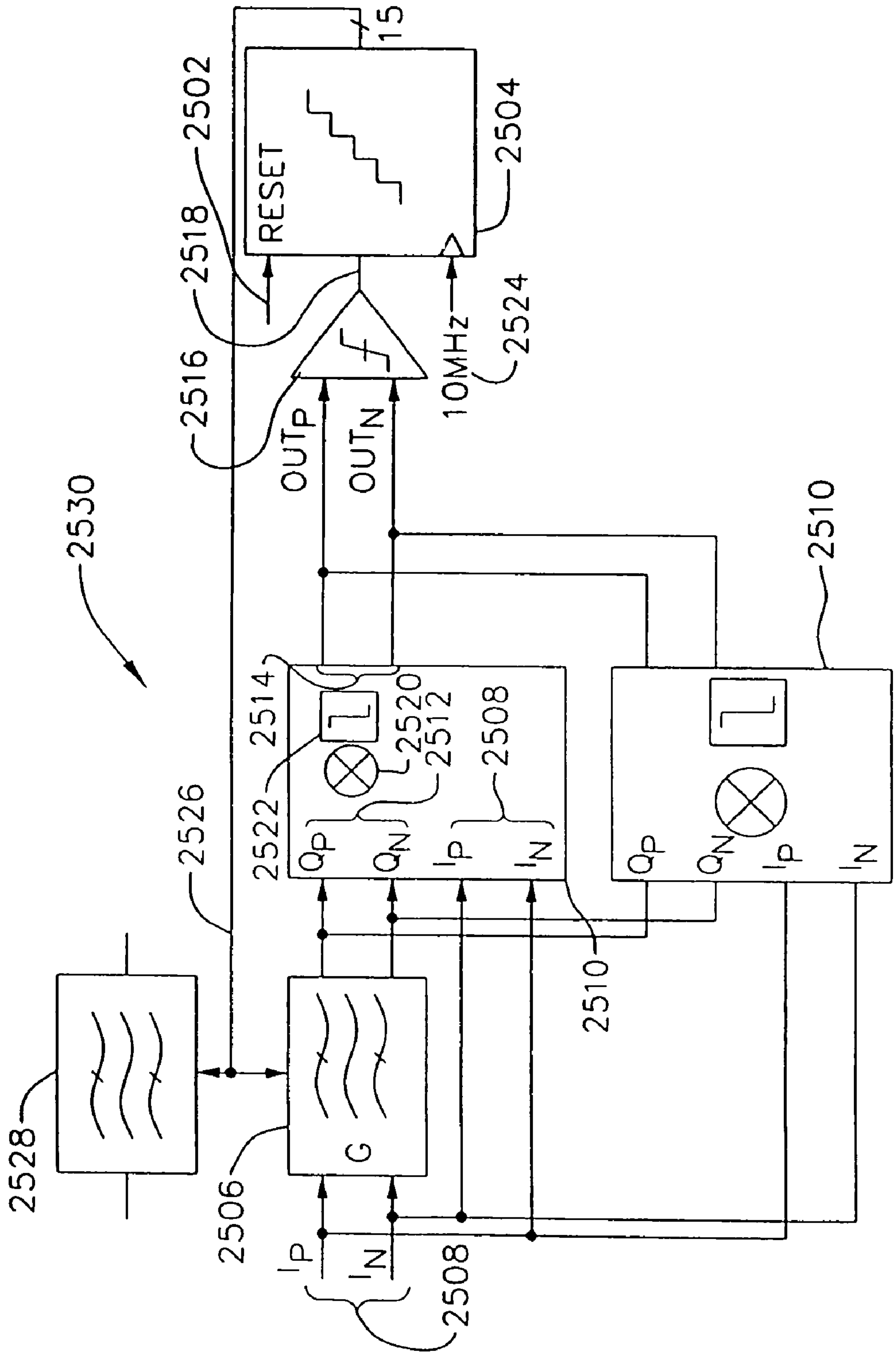
Figure 26:
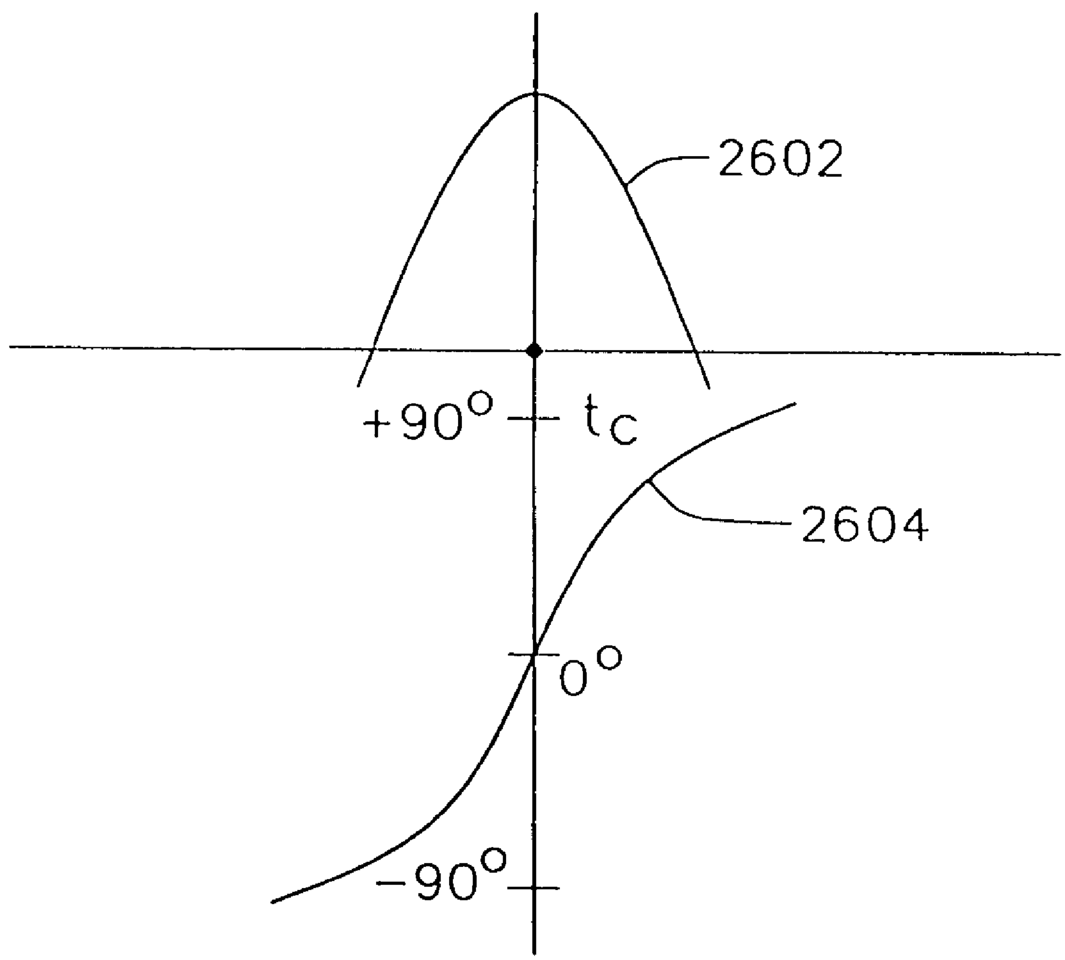
Figure 27:
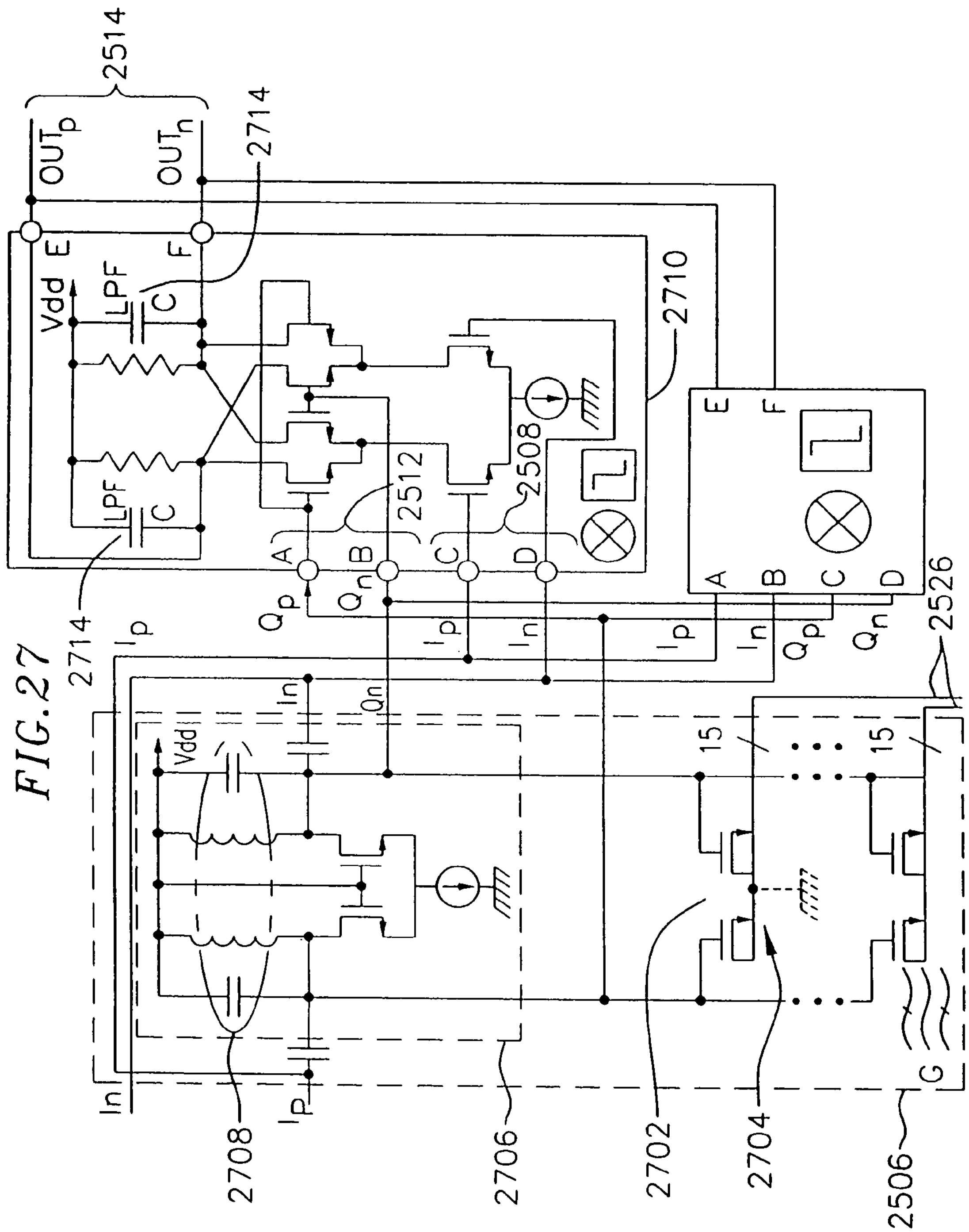

FIG. 24*a* is a block diagram of a tuning process;

FIG. 24*b* is a flow diagram of the tuning process;

FIG. 24*c* is an exemplary illustration of the tuning process;

FIG. 25 is a block diagram of an exemplary tuning circuit;

FIG. 26 illustrates the amplitude and phase relationship in an LC filter at resonance;

FIG. 27 is a schematic diagram showing the configuration of switch able capacitors in a differential signal transmission embodiment;

Active Filter Multi-Track Integrated Spiral Inductor Figures

Figure 28A:
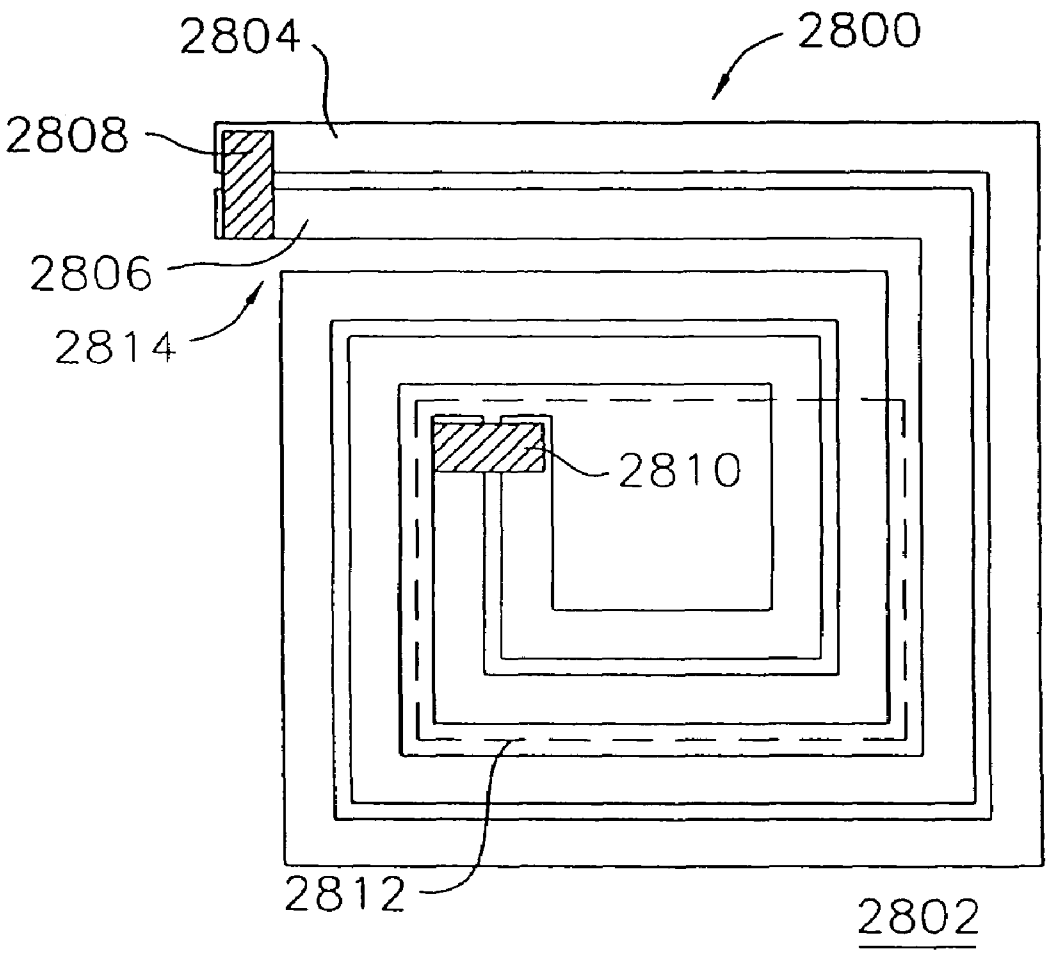
Figure 28B:
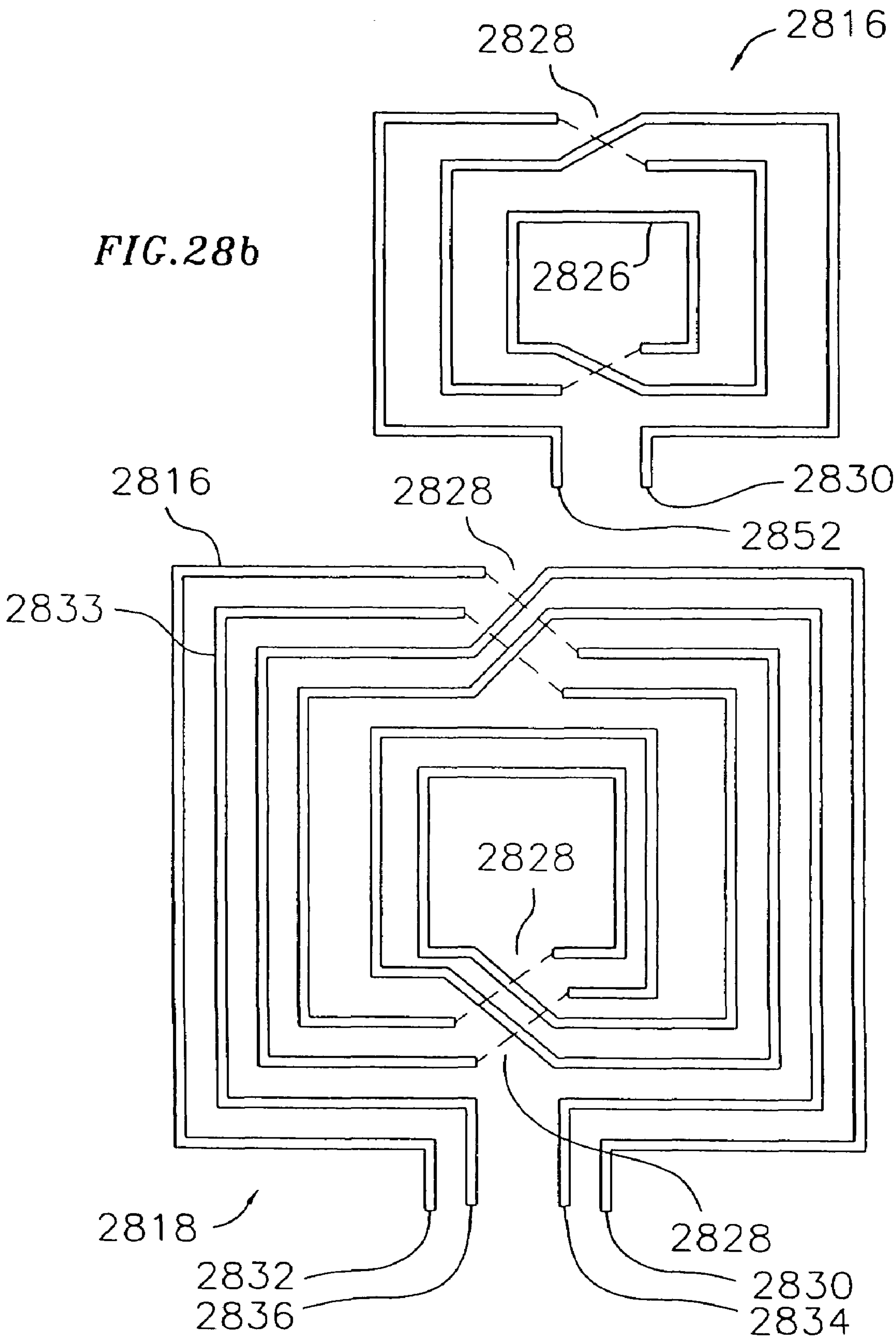
Figure 28E:
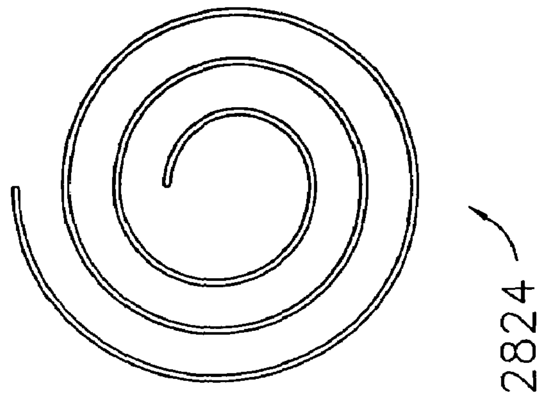
Figure 28D:
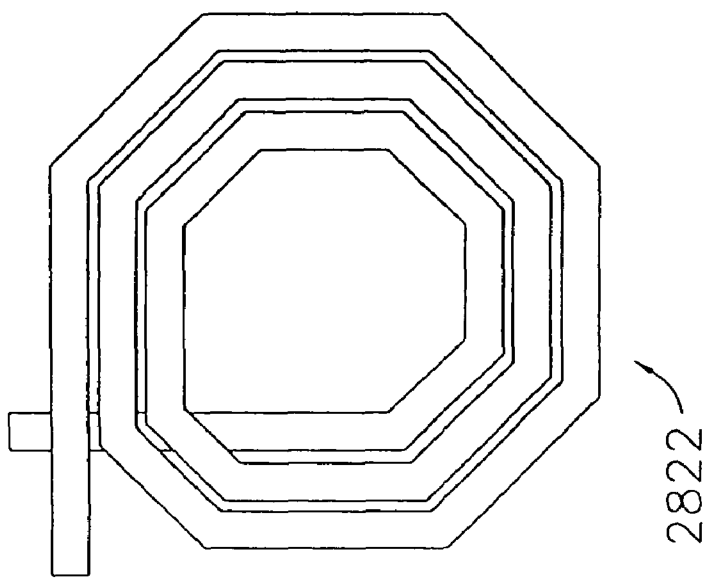
Figure 28C:
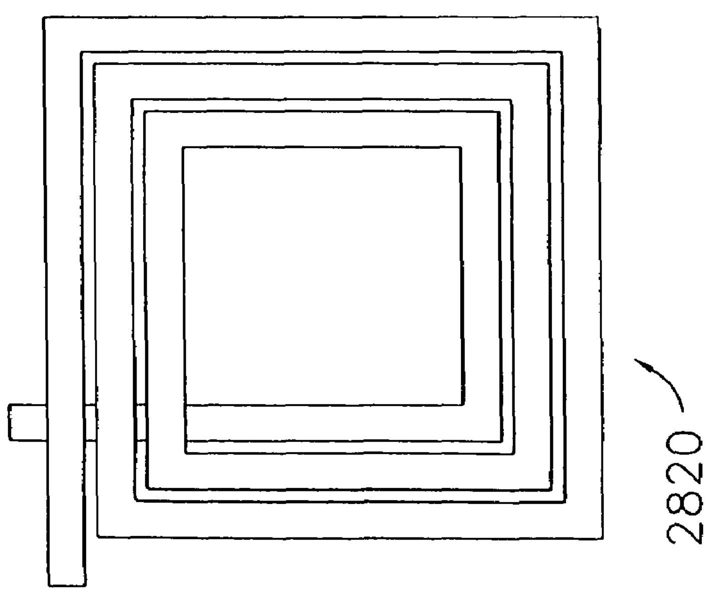
Figure 28F:
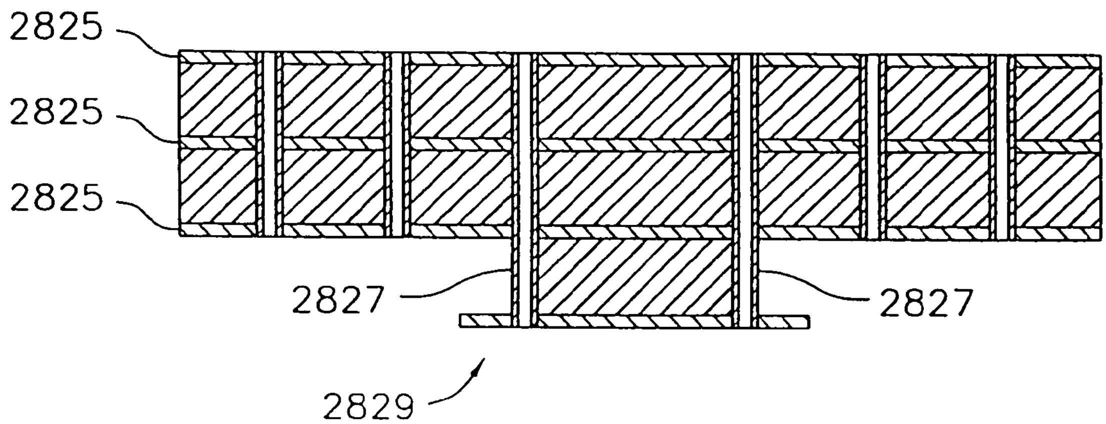
Figure 28G:
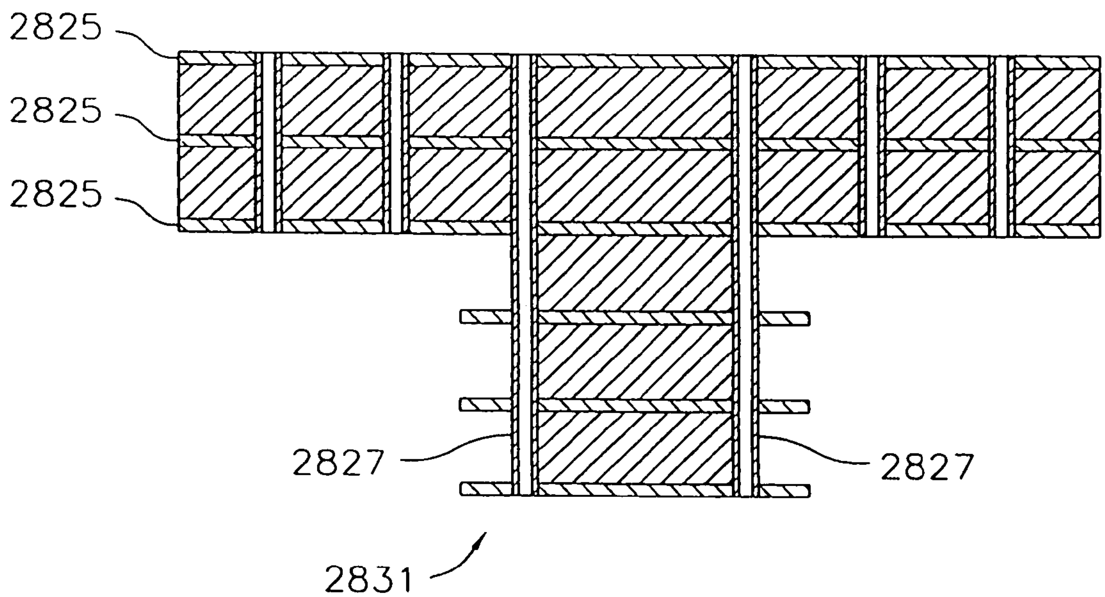
Figure 28H:
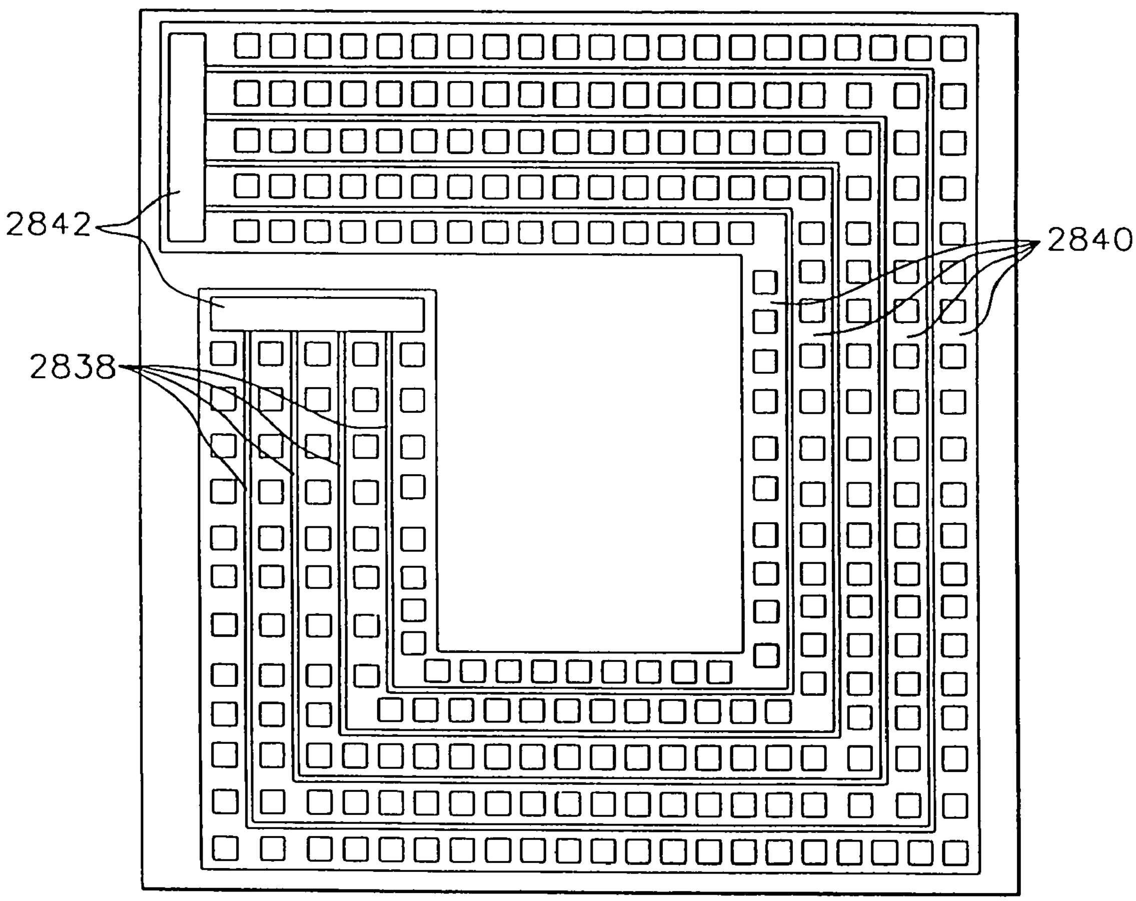
Figure 28I:
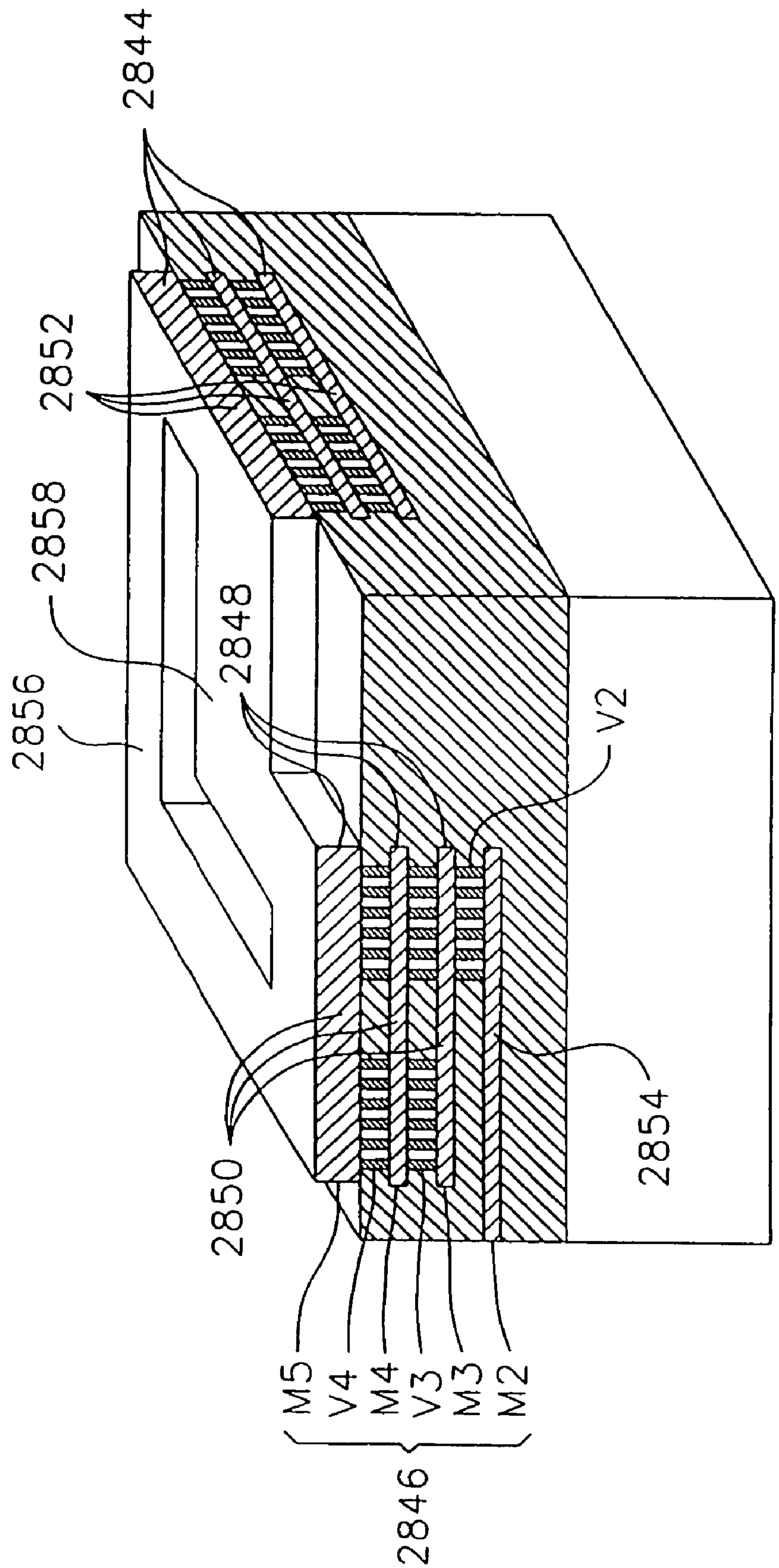
Figure 28J:
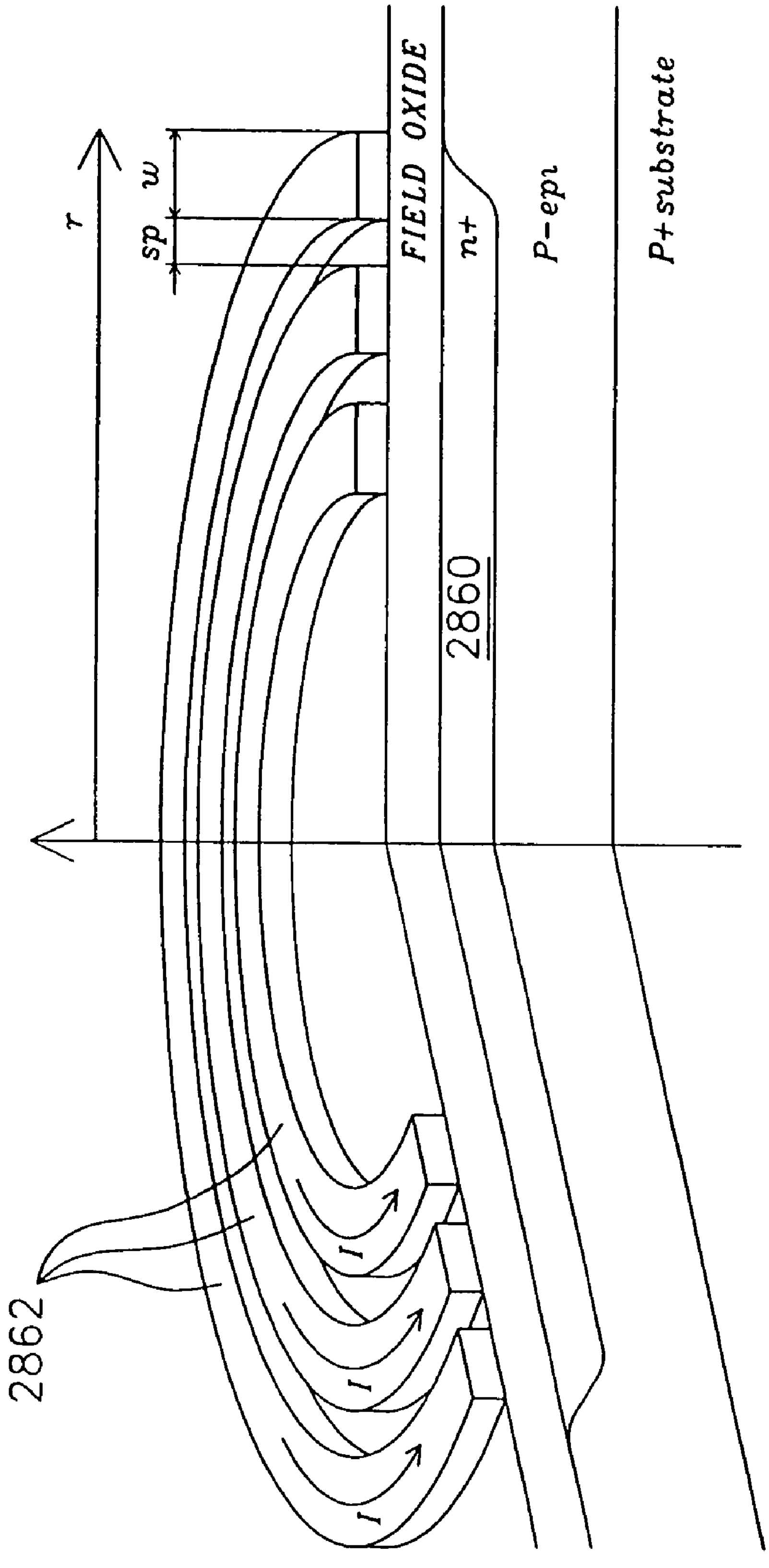
Figure 28K:
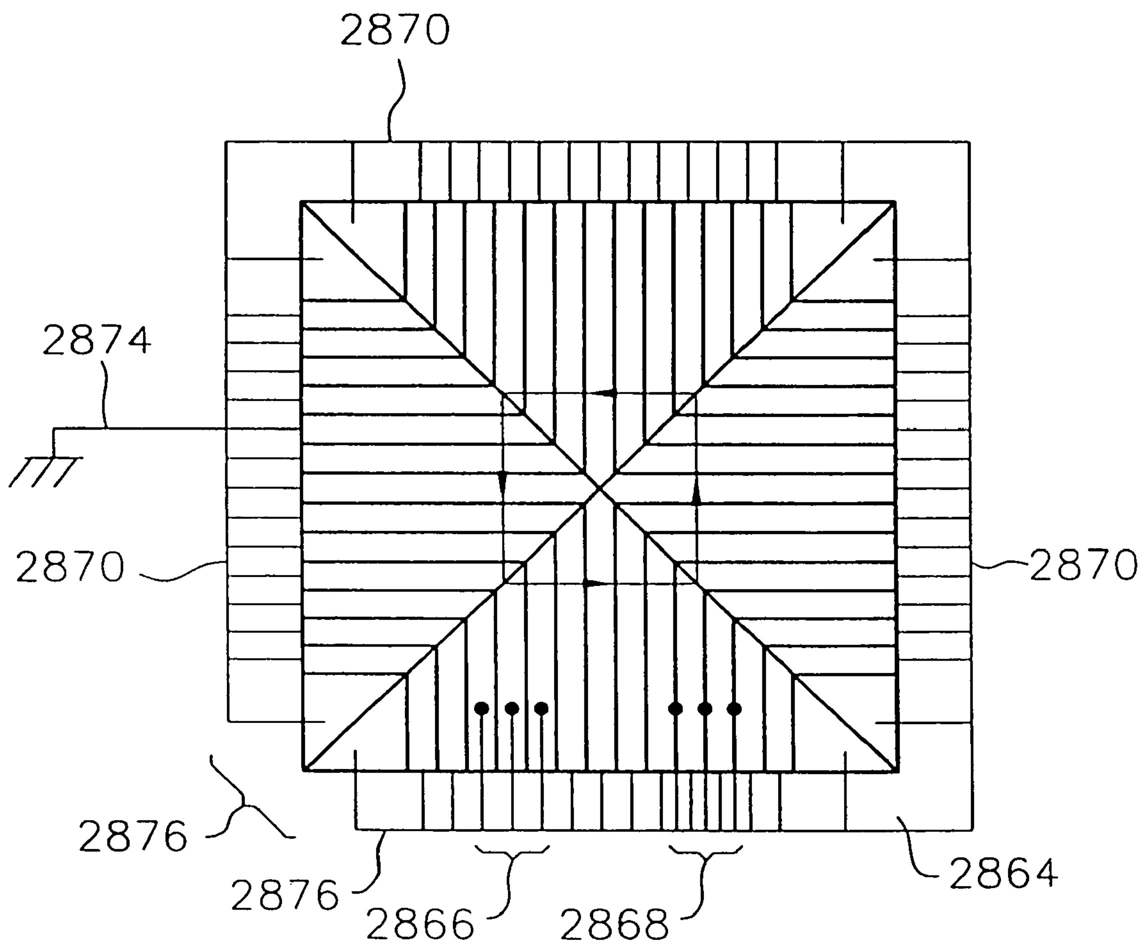
Figure 29:
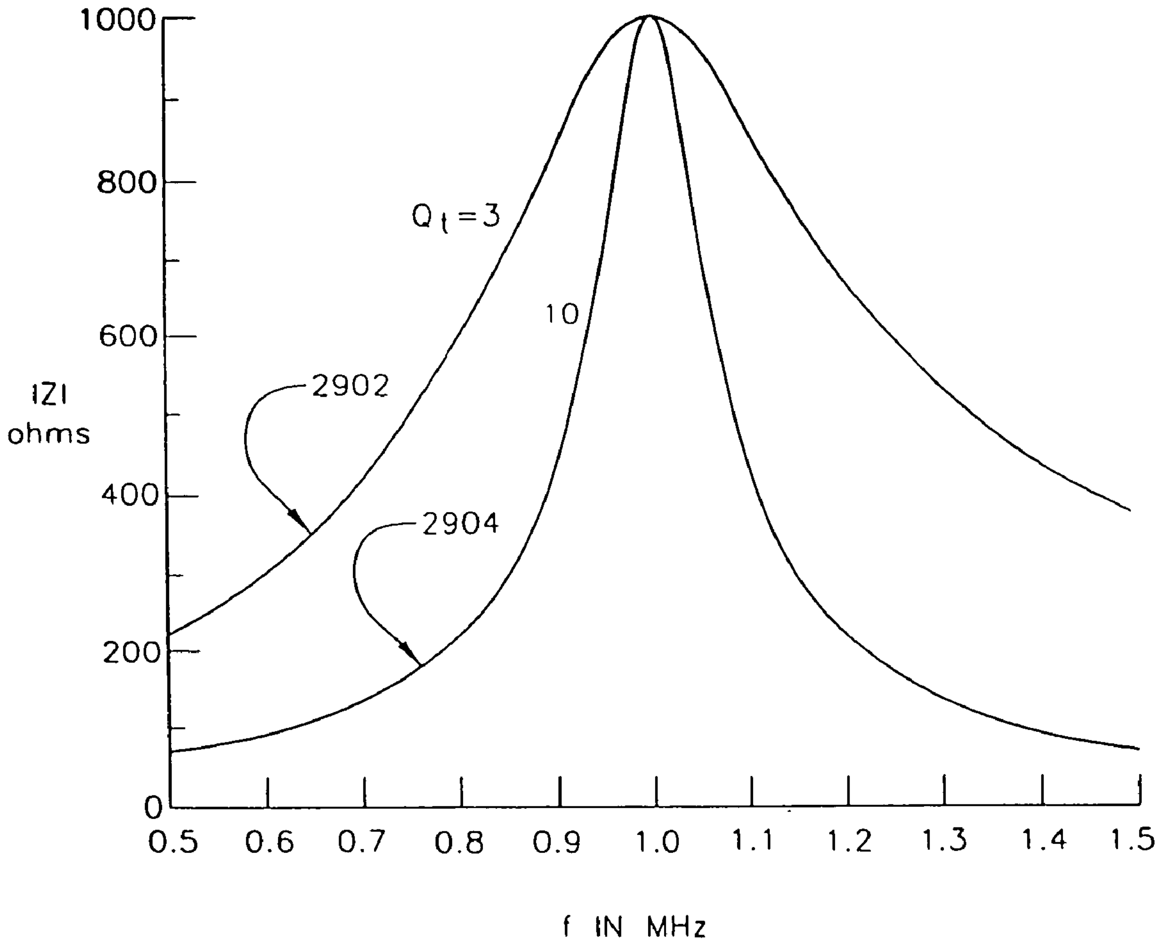
Figure 30:
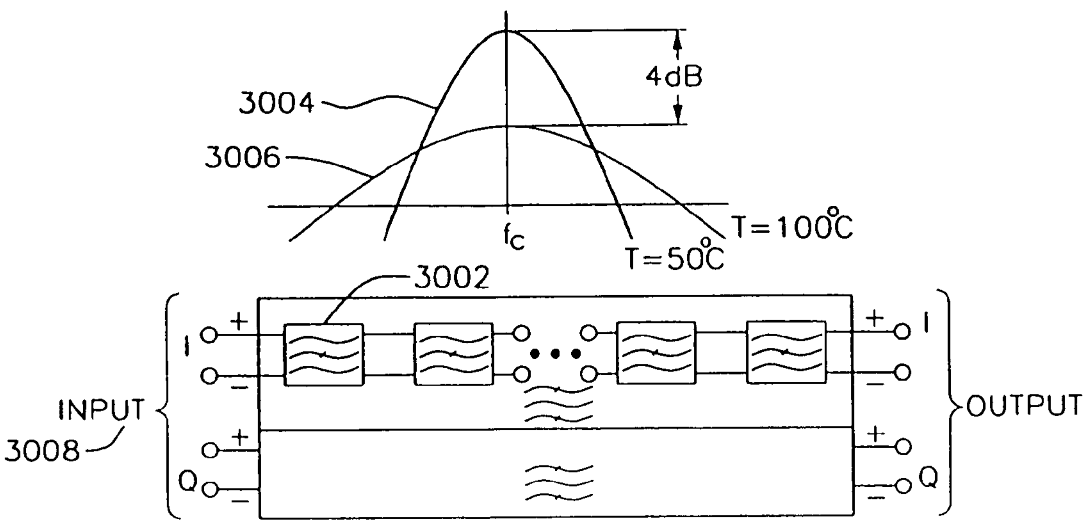

FIG. 28*a* is a plan view of a multi-track spiral inductor suitable for integration onto an integrated circuit, such as one produced with a CMOS process;

FIGS. 28*b*–28*g* illustrate various planar devices comprising inductor and transformer configurations suitable for incorporating multiple tracks into their designs;

FIG. 28*h* is an illustration of a second embodiment of an inductor having a single winding comprising five tracks per layer;

FIG. 28*i* illustrates the placement of tracks in a layered structure;

FIG. 28*j* is an illustration of an embodiment utilizing a shield disposed beneath an inductor;

FIG. 28*k* is an illustration of a patterned shield 2864 that is utilized beneath a multi-track inductor;

FIG. 29 is an illustration of the effect of decreasing "Q" on the selectivity of a tuned circuit;

FIG. 30 is an illustration of a typical filter bank utilized in embodiments of the invention for filtering I and Q IF signals;

Active Filter Utilizing a Linearized Differential Pair Amplifier Figures

Figure 31A:
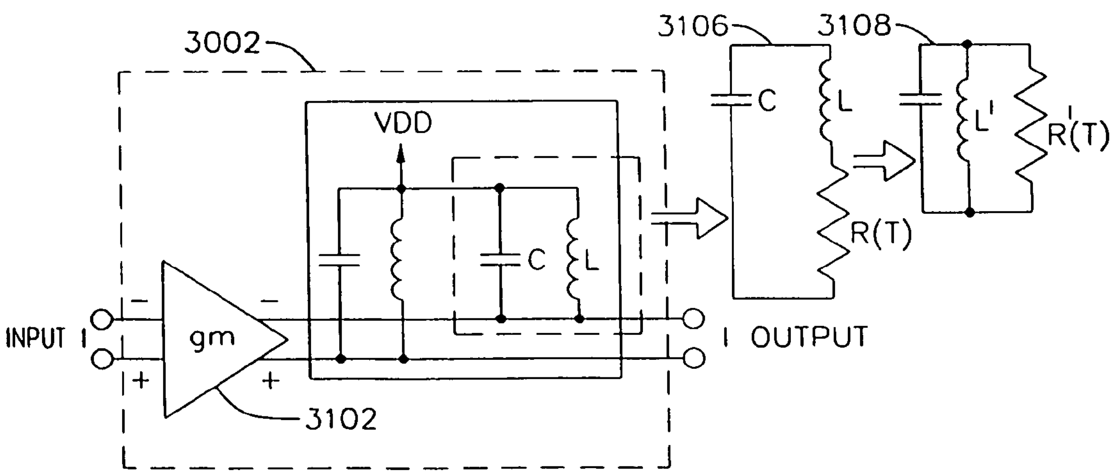
Figure 31B:
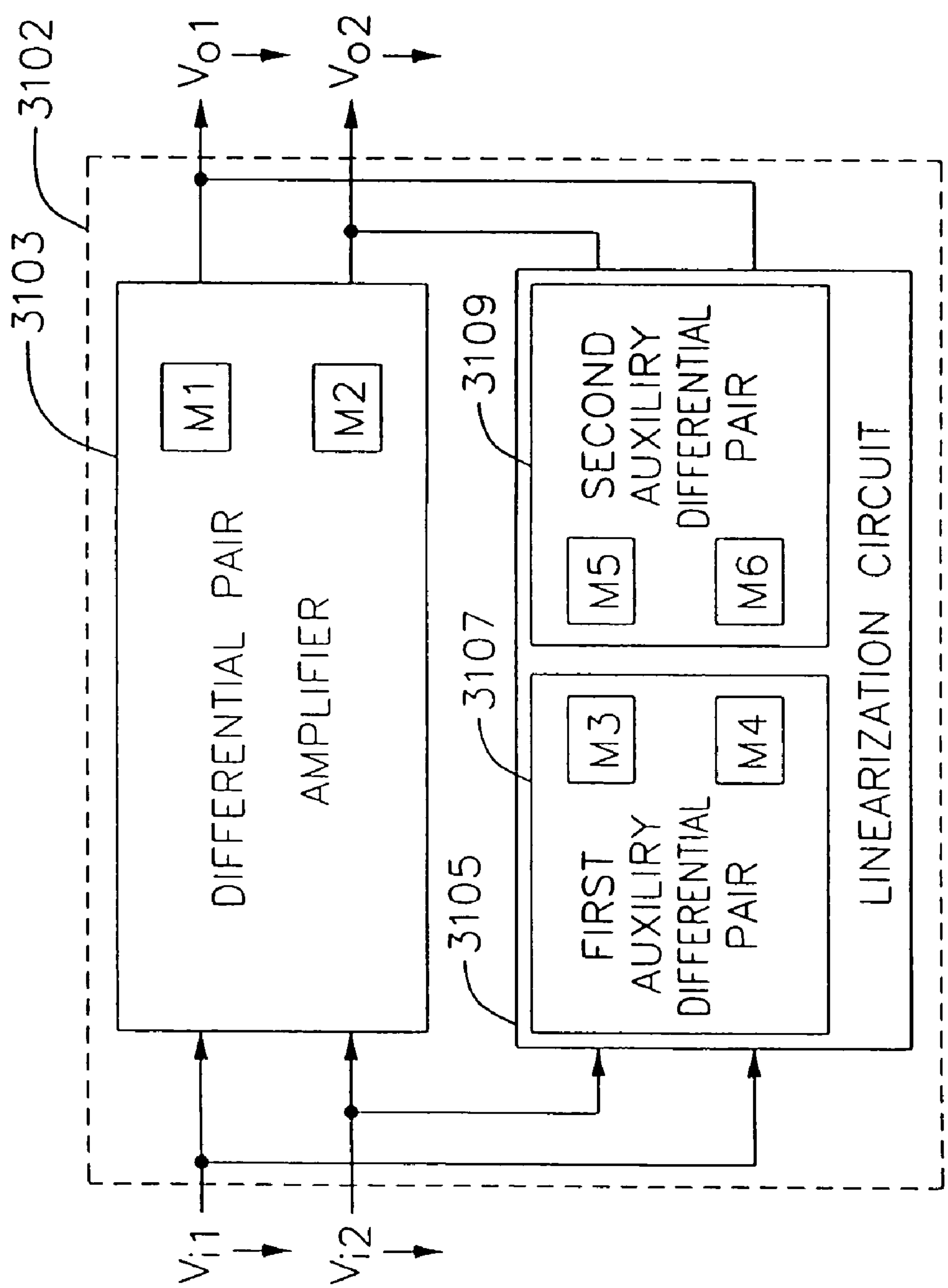
Figure 31C:
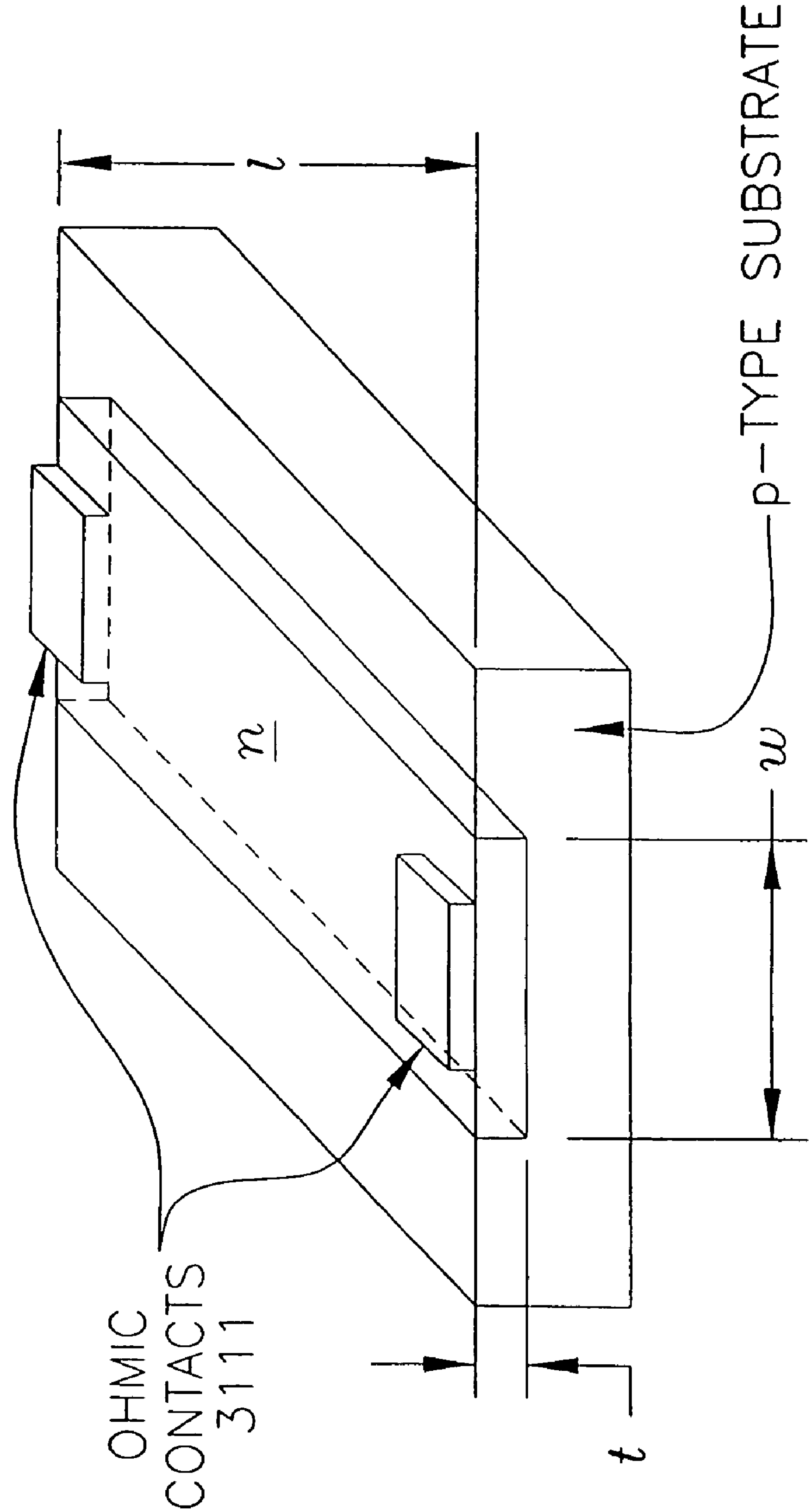
Figure 31D:
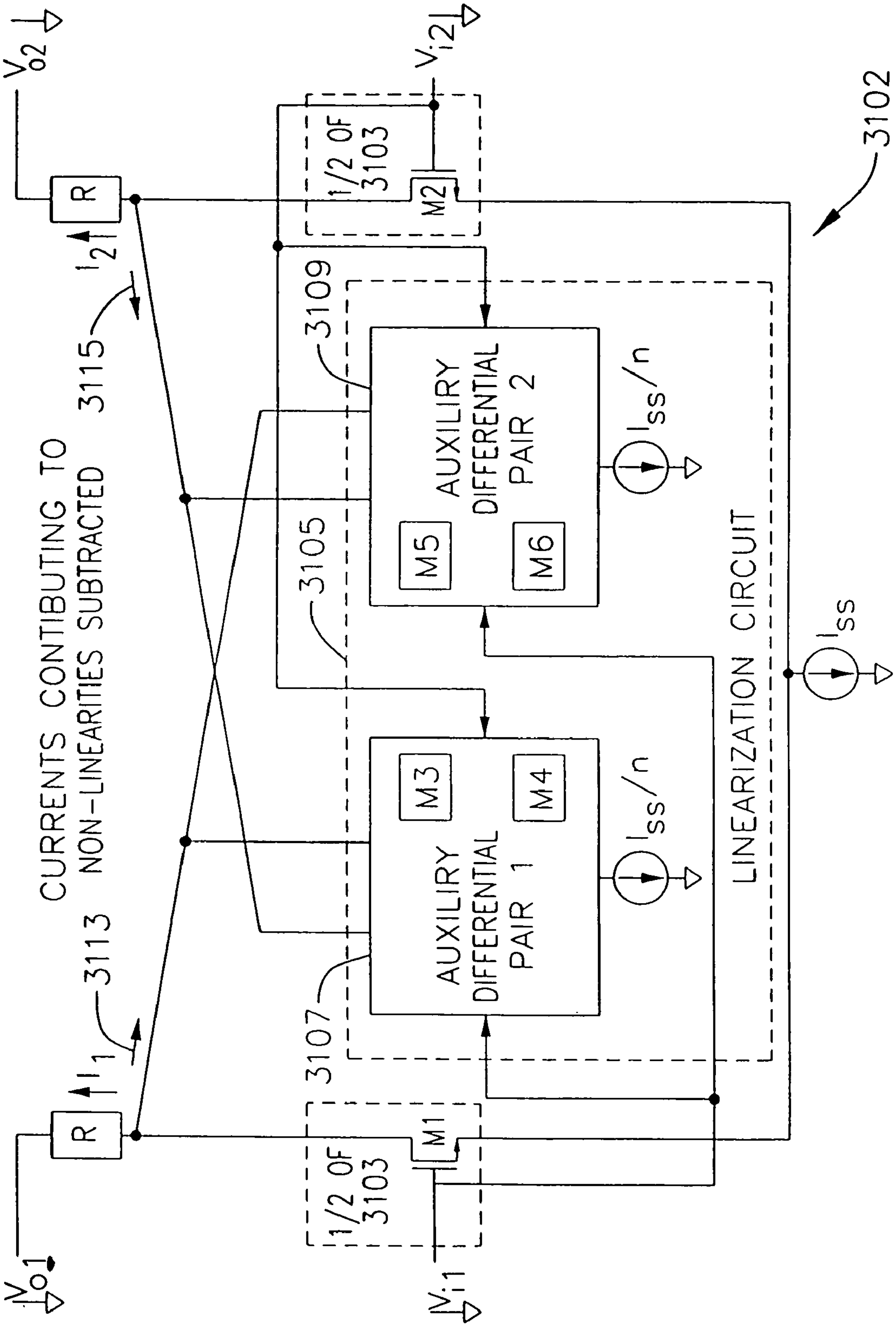
Figure 31E:
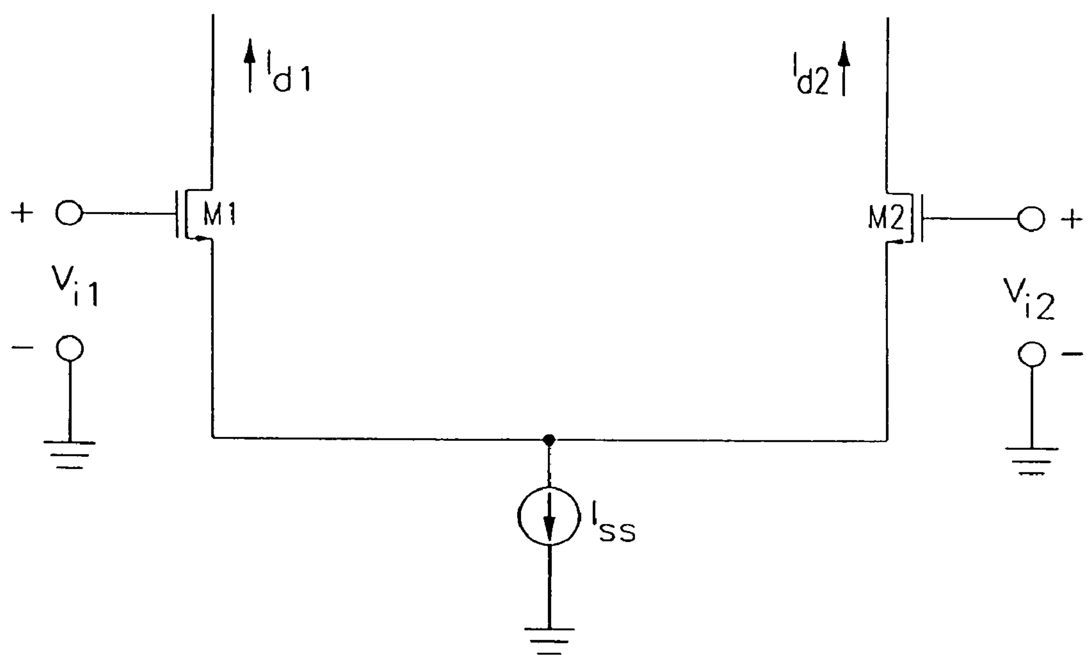
Figure 31F:
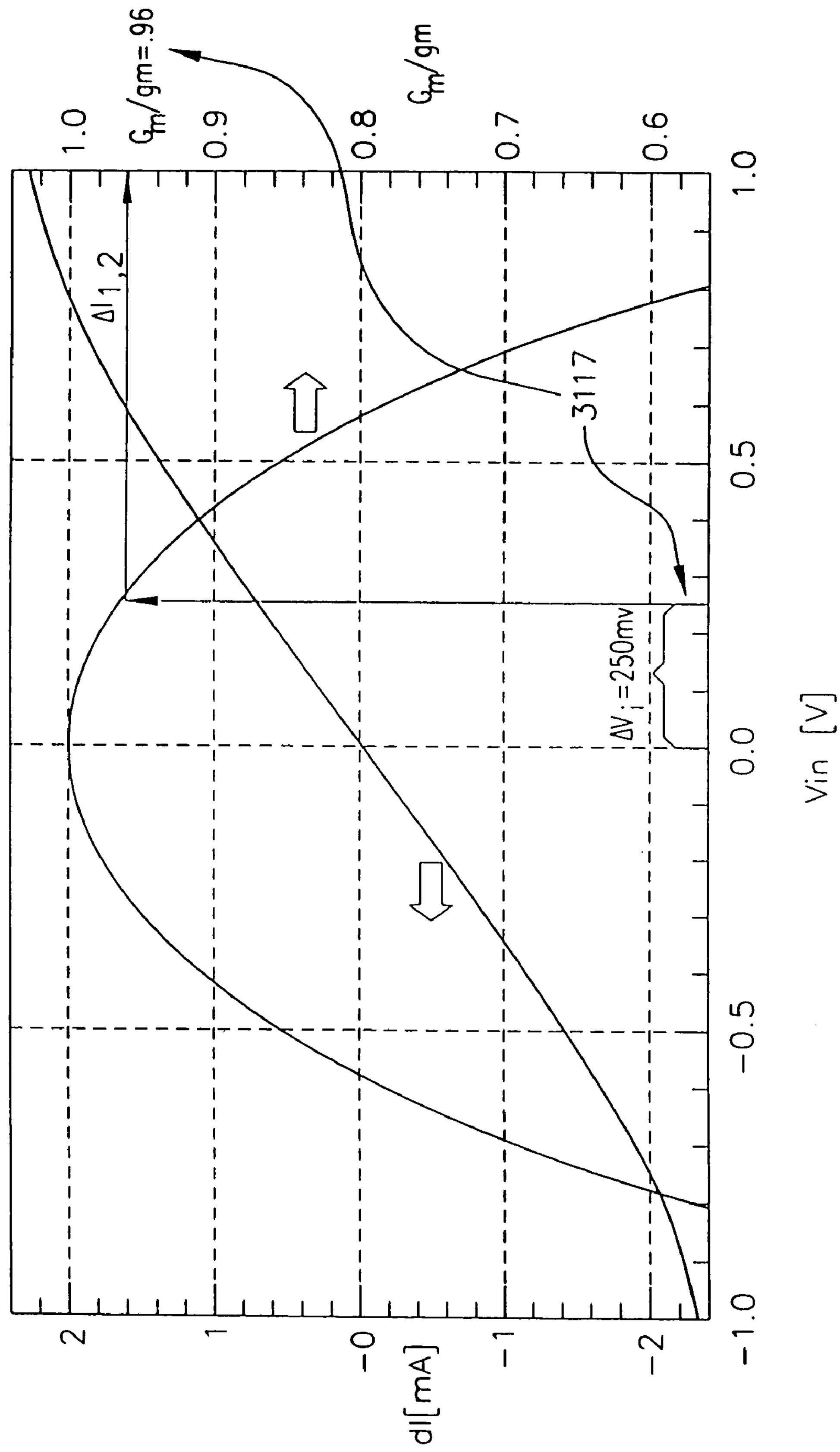

FIG. 31*a* is a diagram of an exemplary differential trans conductance stage with an LC load;

FIG. 31*b* is a block diagram of a linearized differential pair amplifier that is coupled to distortion canceling liberalization circuit;

FIG. 31*c* is an illustration depicting a representative channel of any one of the typical field effect of transistors M1, M2, M3, M4;

FIG. 31*d* is a block diagram showing the interconnection of a differential pair amplifier to a linearization circuit;

FIG. 31*e* is a schematic illustrating a CMOS differential pair of transistors;

FIG. 31*f* is a graph of a differential current ($\Delta I_{1,2}=\Delta I_d$) and normalized transconductance ($G_m/g_m$) as input voltage ($V_{in}=\Delta V_i$) is varied in the differential pair of FIG. 31*e;*

Figure 31G:
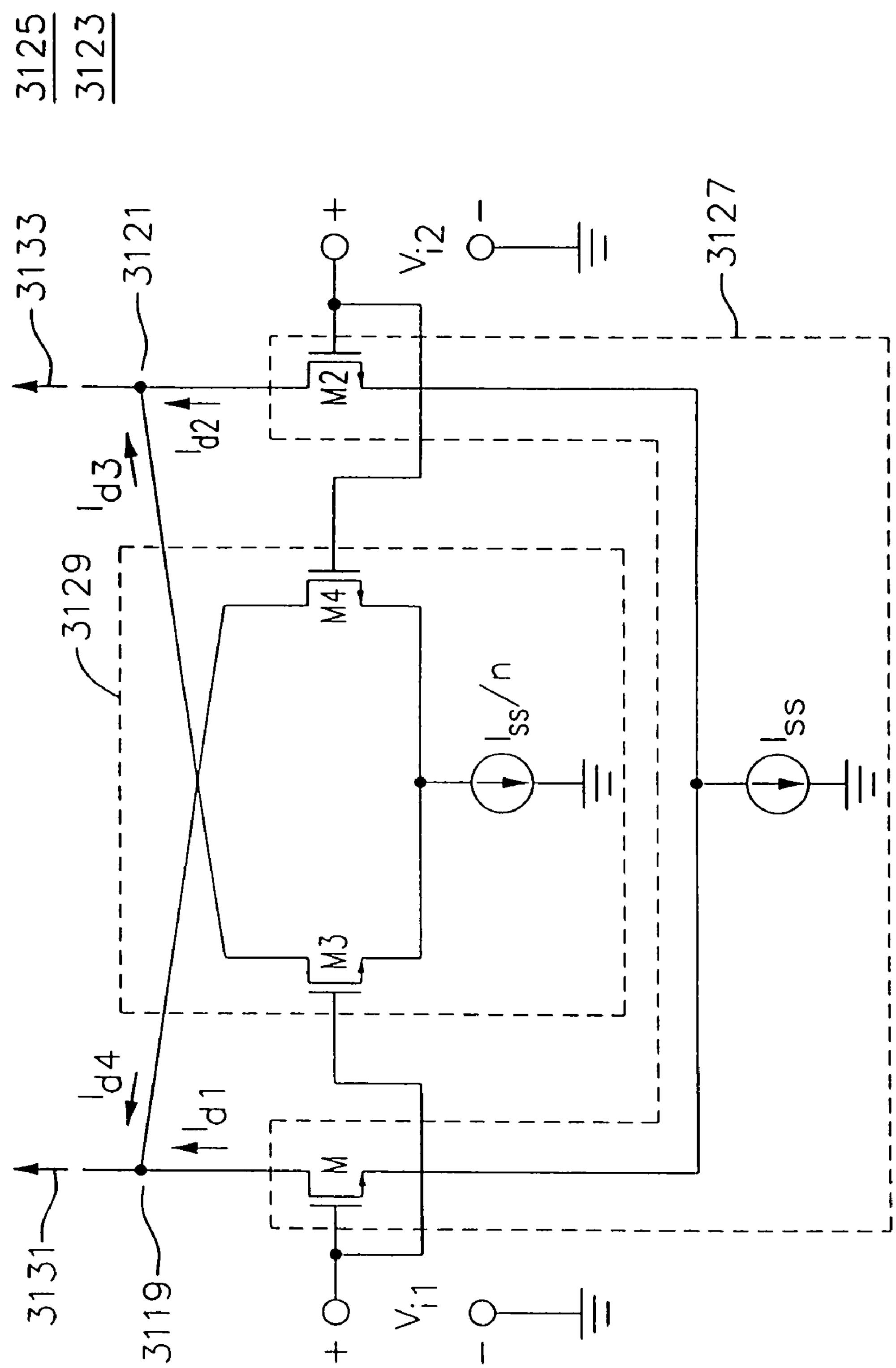
Figure 31H:
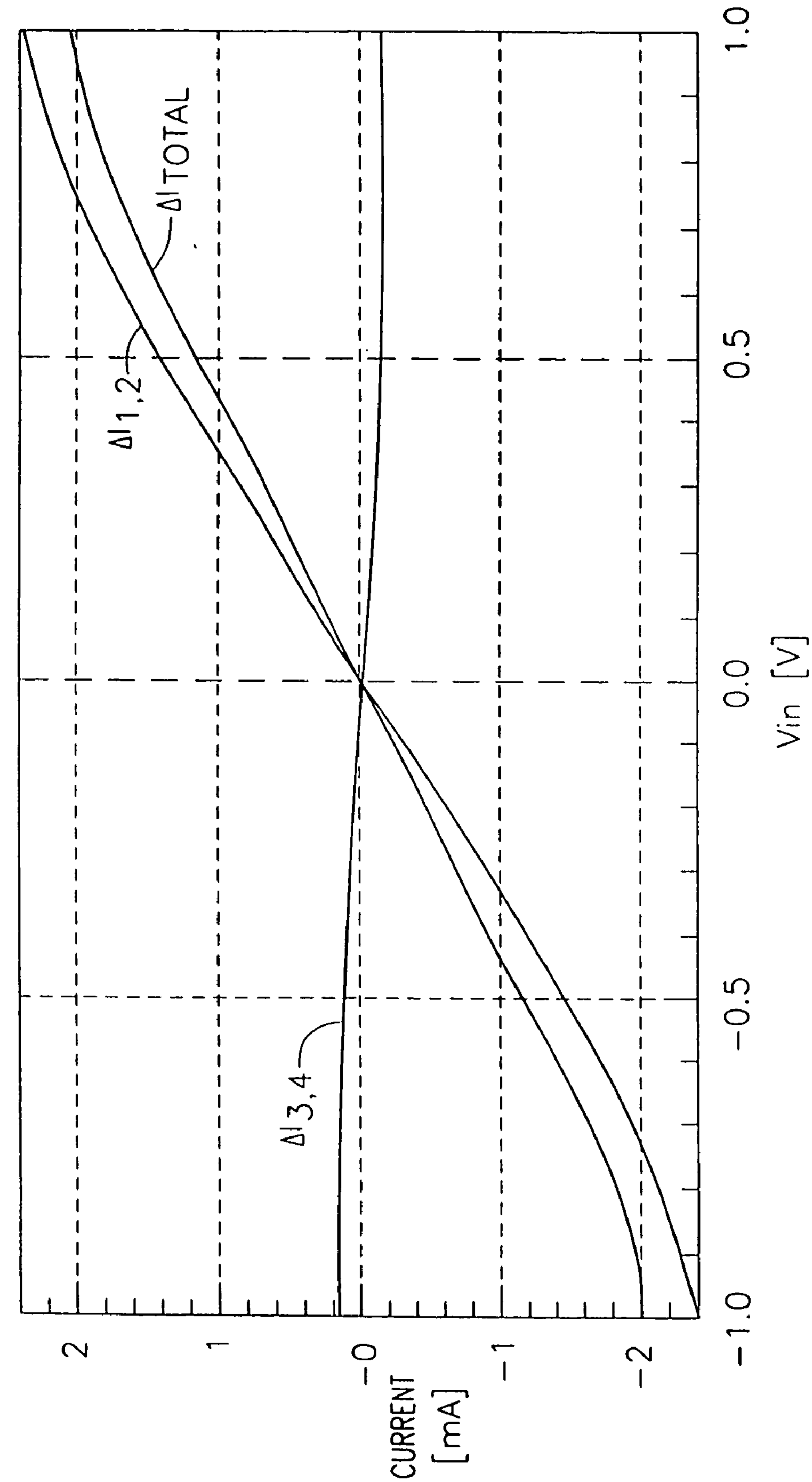
Figure 31I:
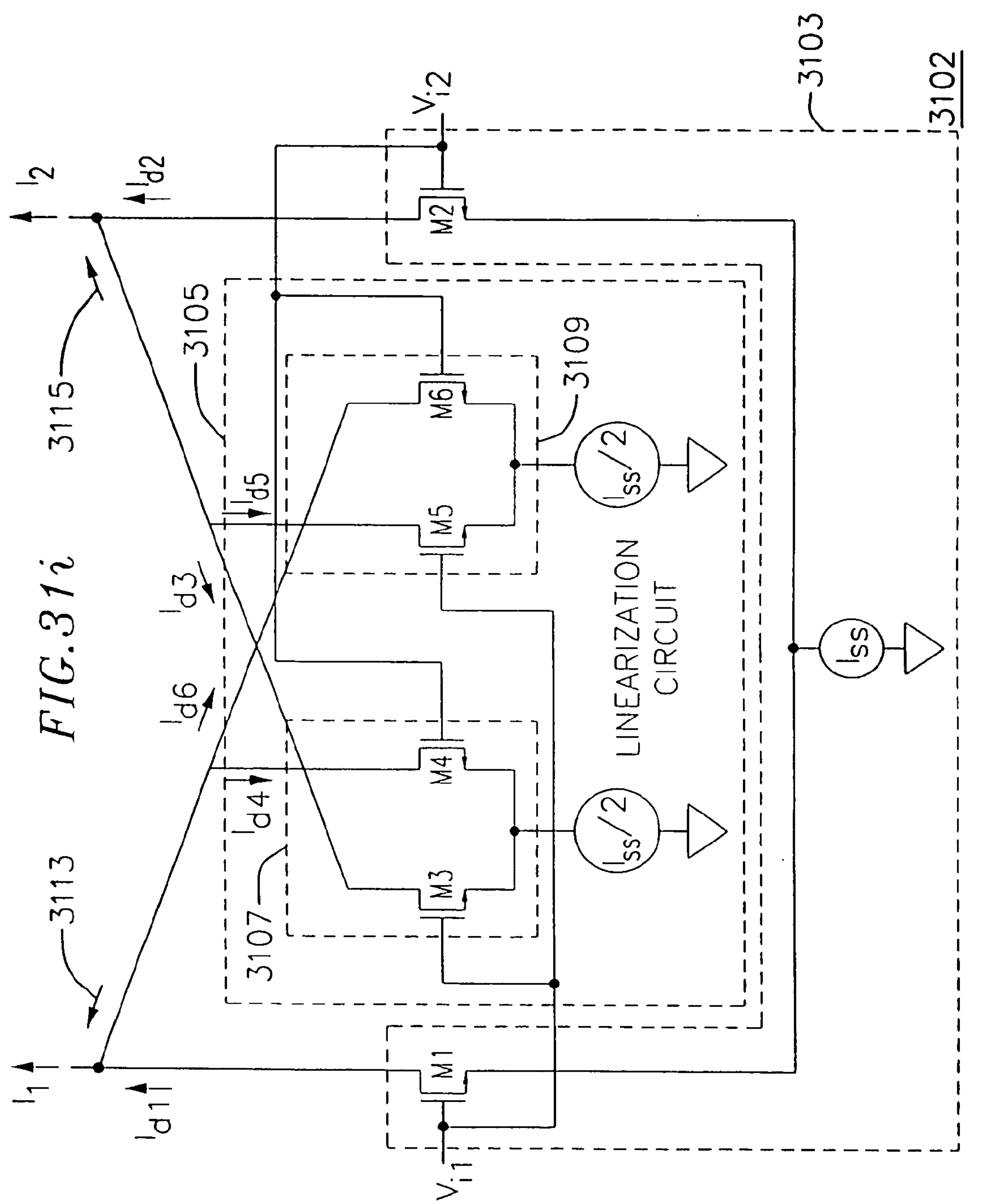
Figure 31J:
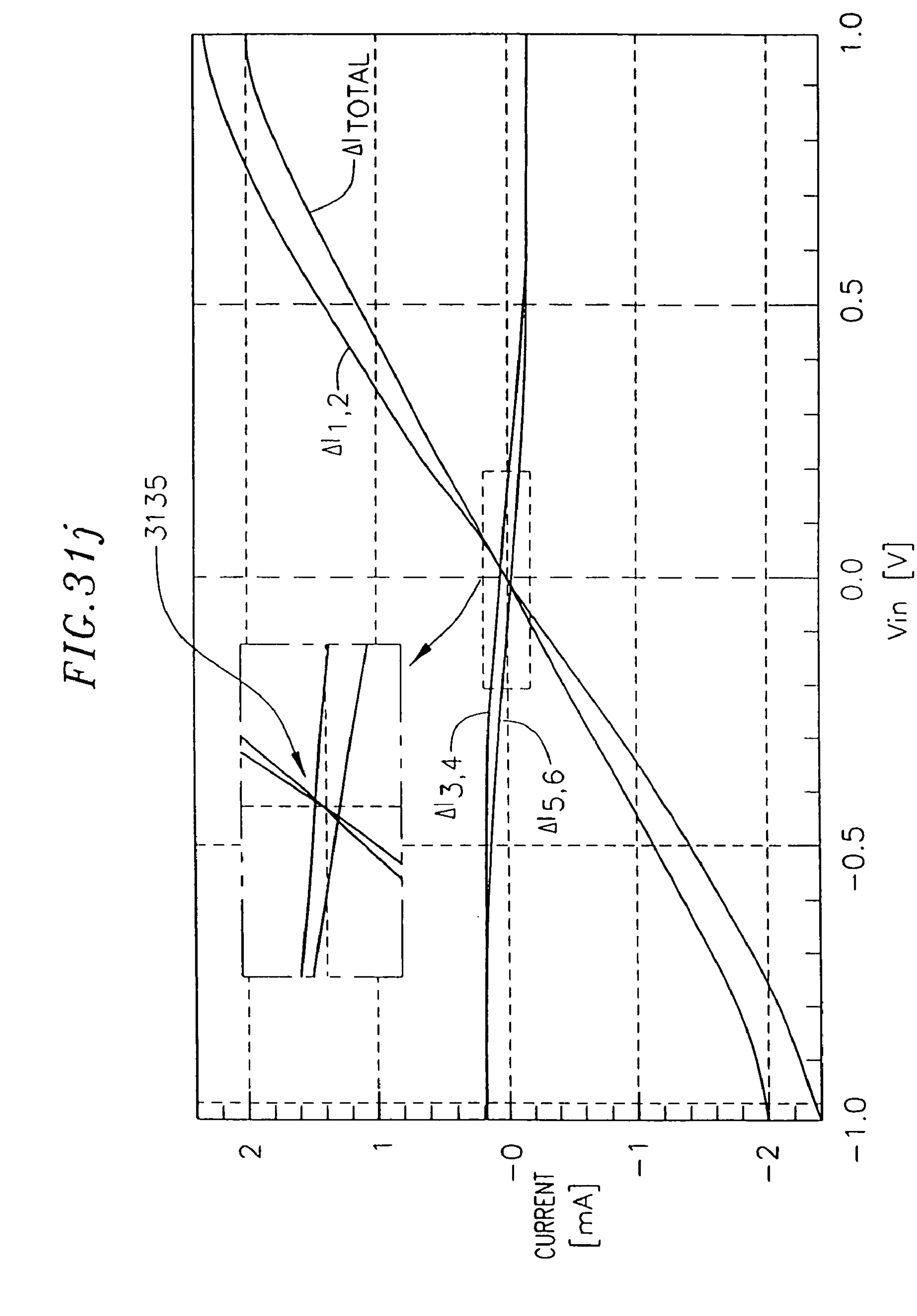
Figure 31K:
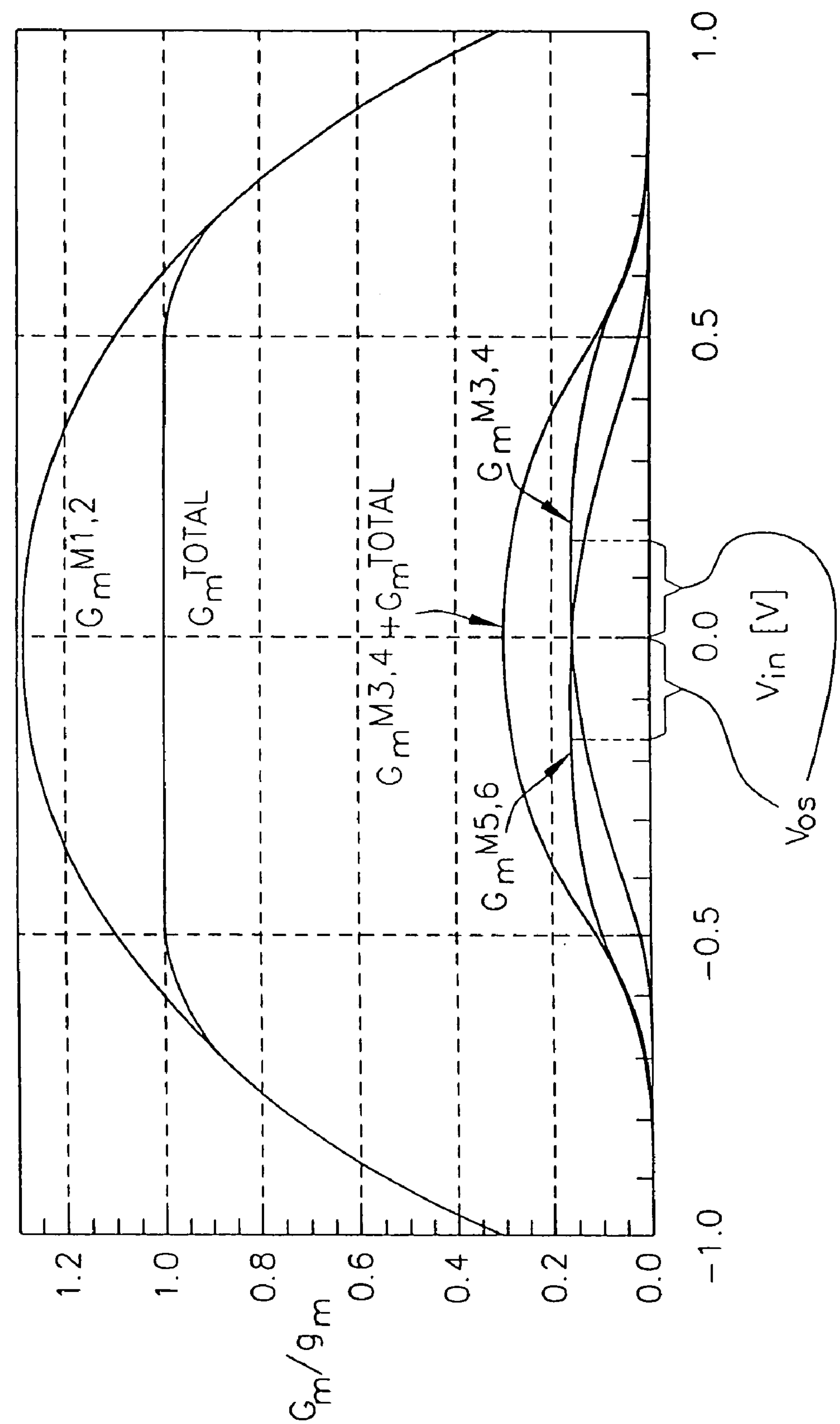
Figure 31L:
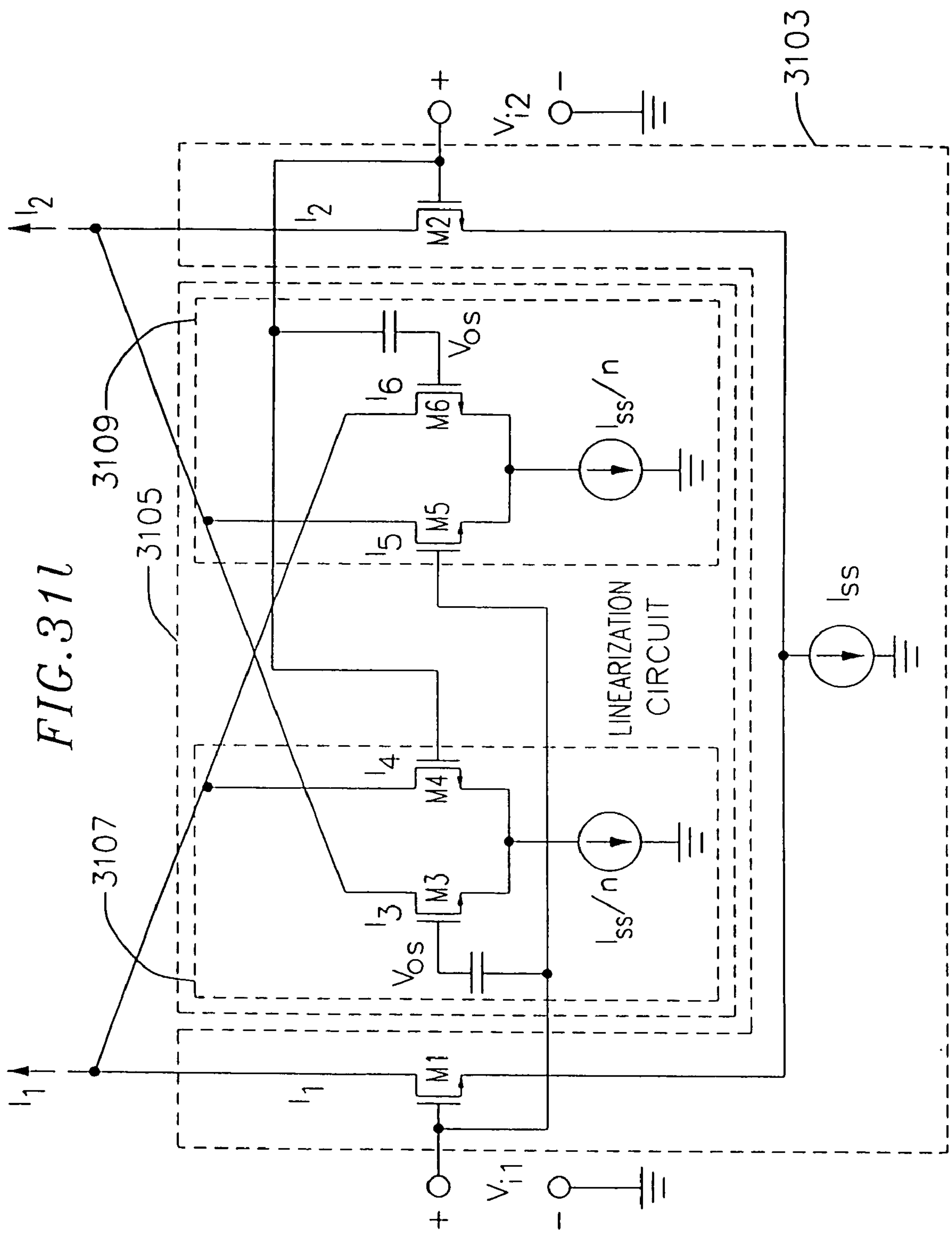
Figure 31M:
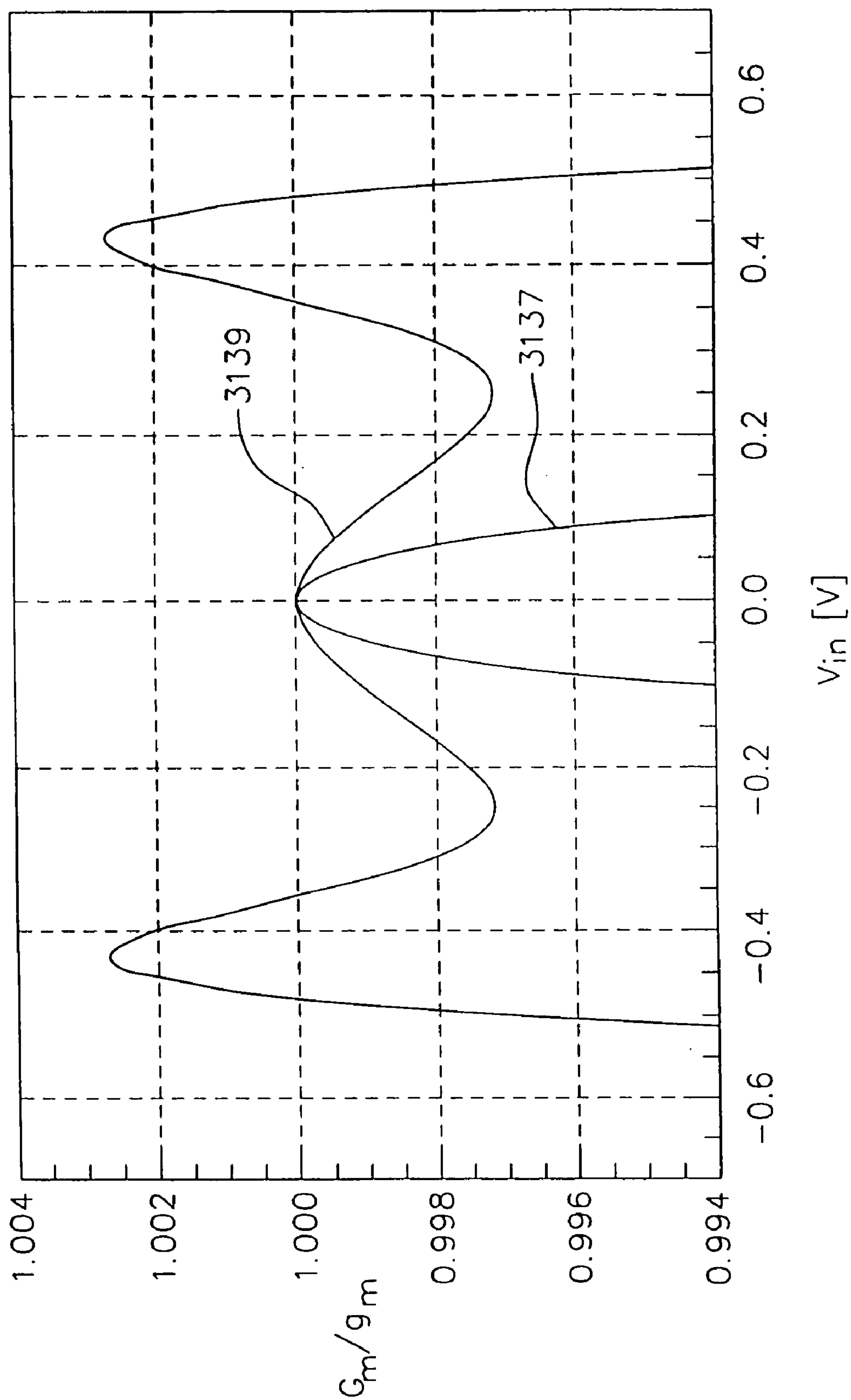
Figure 32:
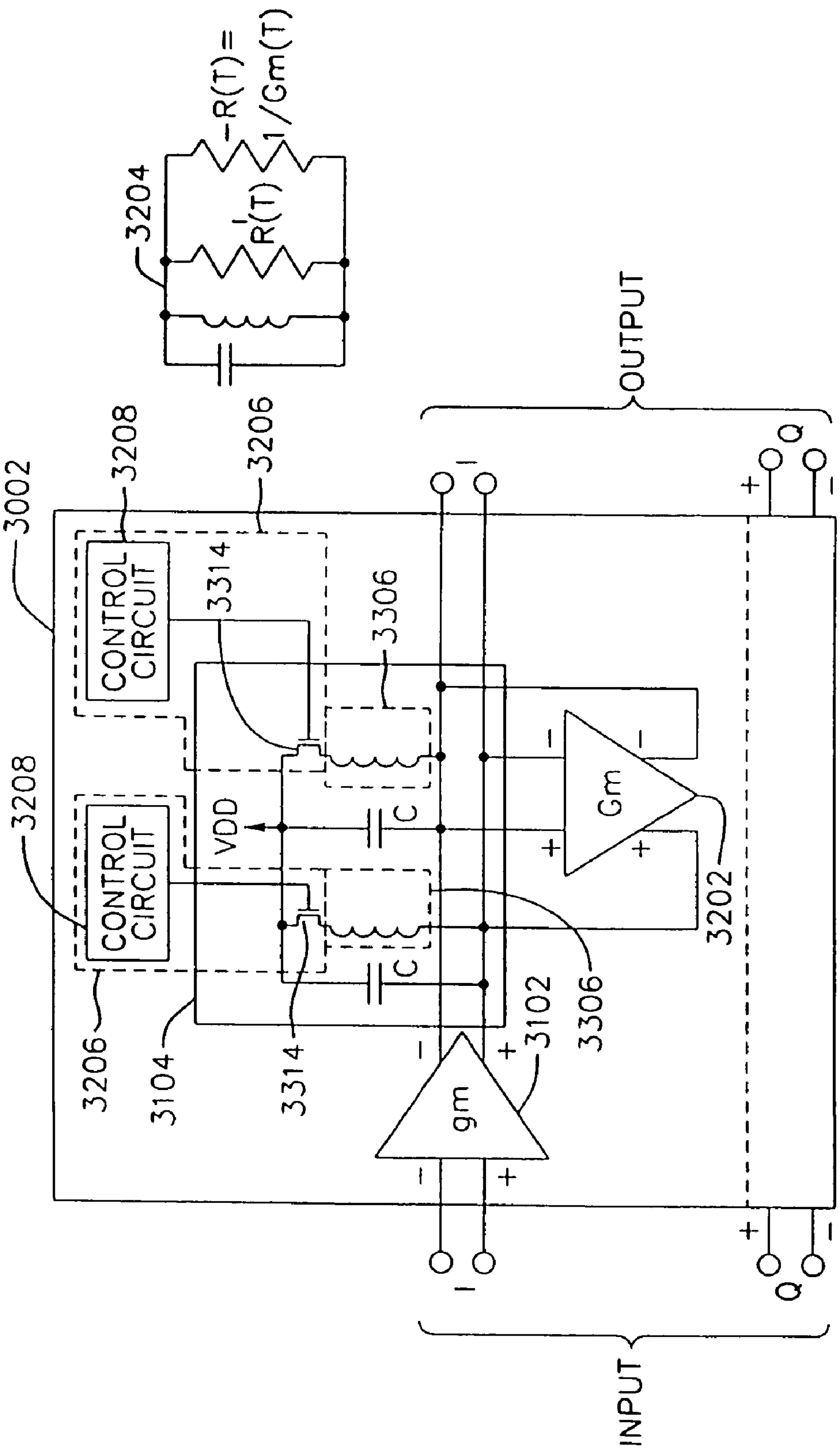

FIG. 31*g* is a schematic diagram of a differential pair amplifier 3127 with a second cross coupled differential pair error amplifier added that tends to reduce distortion;

FIG. 31*h* is a graph illustrating The linearized output current of a cross coupled differential output amplifier;

FIG. 31*i* is a schematic of a differential pair amplifier incorporating two auxiliary cross-coupled differential pairs to improve linearization of the output response $I_1$ and $I_2$;

FIG. 31*j* is a graph of the currents present in the main and two auxiliary differential pair amplifiers graphed against input voltage as measured across the input terminals where $V_{in}=V_{i1}-V_{i2}$;

FIG. 31*k* is a graph of transconductance curves for the differential amplifier made up of a main differential pair amplifier 3103 and a linearization circuit comprising differential pair amplifiers;

FIG. 31*l* illustrates an equivalent circuit that provides an offset voltage $V_O S$ that permits shaping of The $G_m^{Total}$ curve;

FIG. 31*m* is a graph of the transconductance curve for The exemplary differential pair amplifier that extends the input voltage range by allowing ripple in the overall $G_m$ of the amplifier;

FIG. 32 shows a transconductance stage with an LC load and Q enhancement;

Active Filter Inductor Q Temperature Compensation Figure

Figure 33:
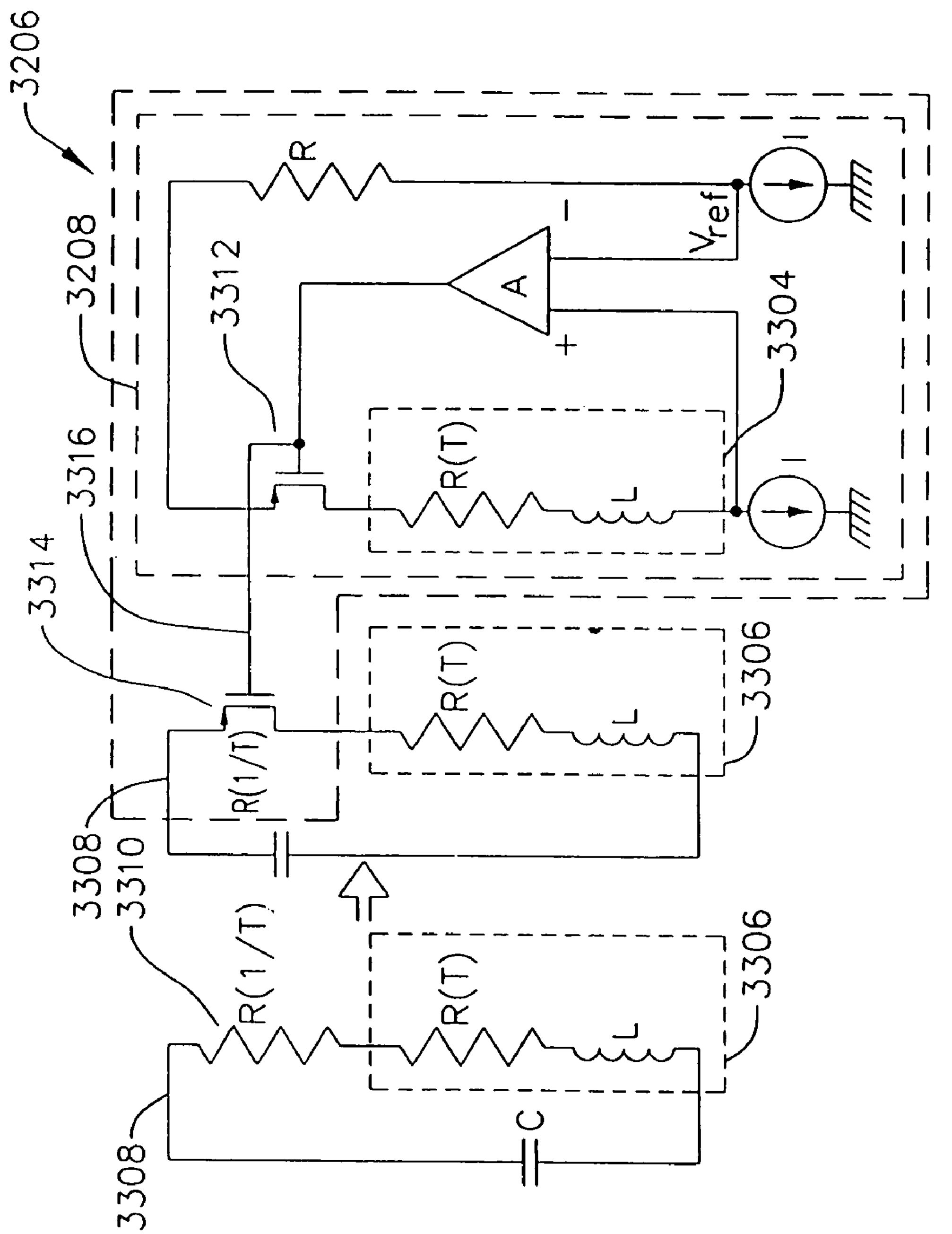

FIG. 33 shows a method of tuning inductor Q over temperature;

Communications Receiver Figure

Figure 34:
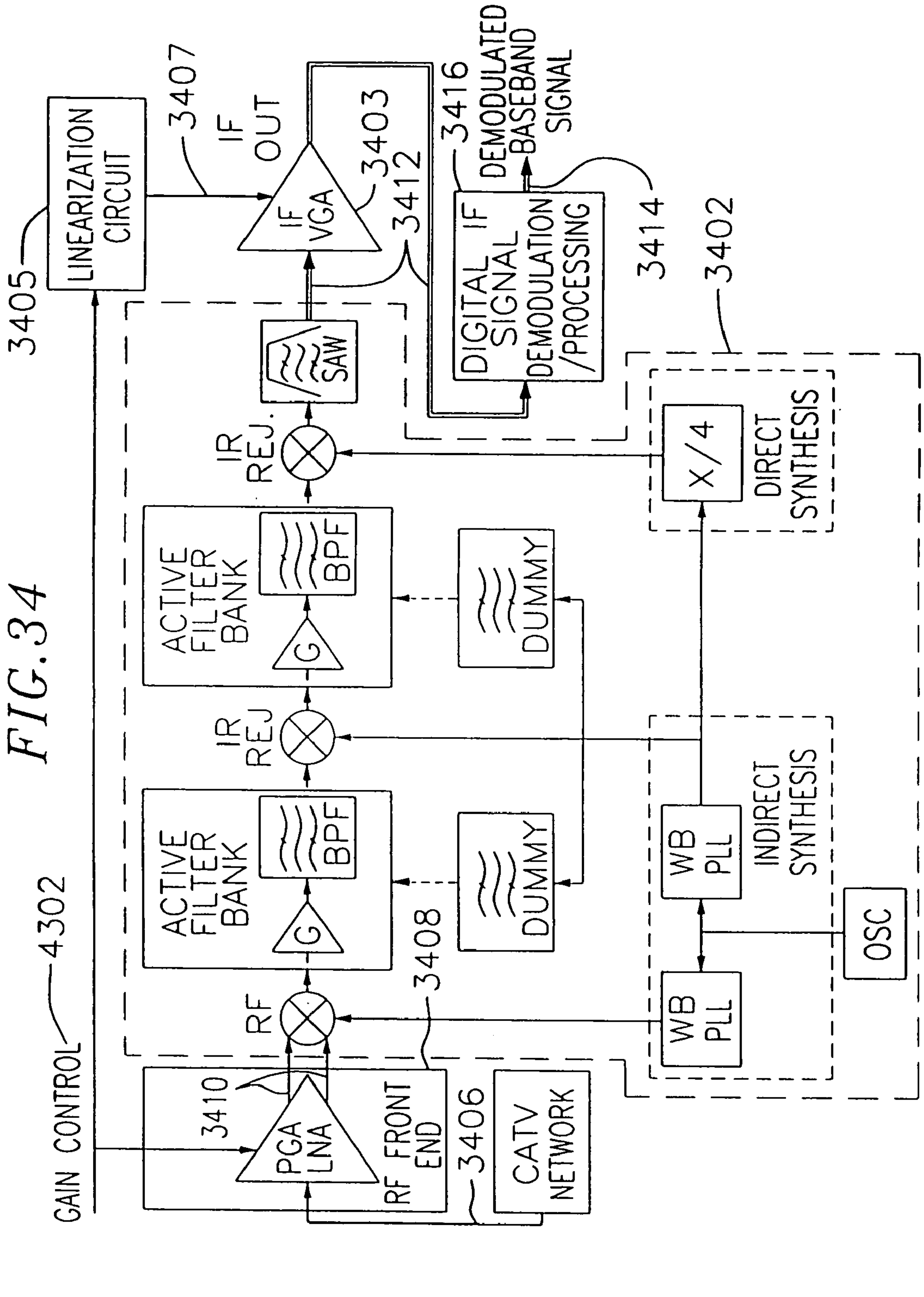

FIG. 34 is a block diagram of a communications network utilizing a receiver according to any one of the exemplary embodiments of the invention;

Receiver Front End-Programable Attenuator and LNA Figures

Figure 5:
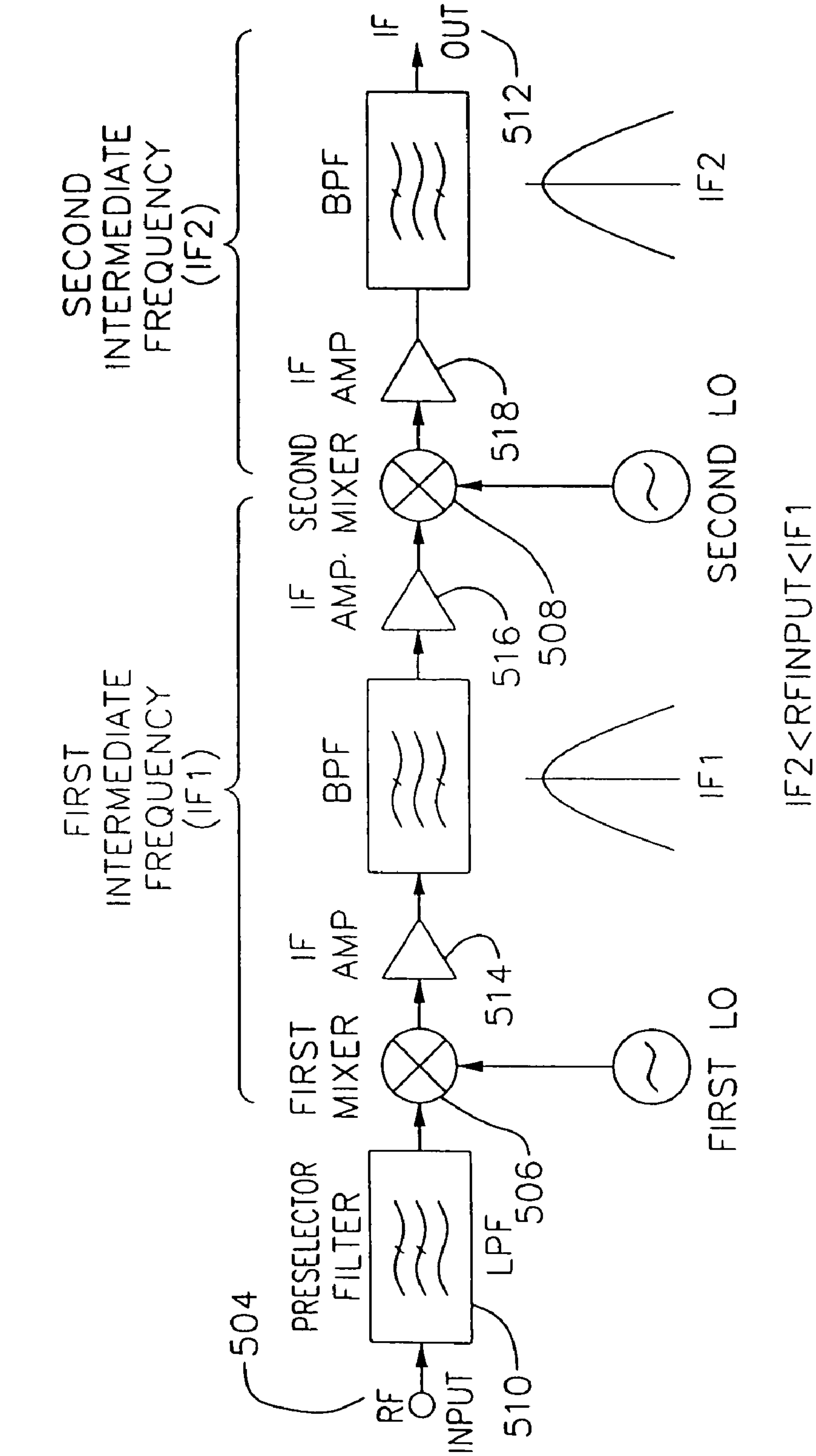
FIG. 5 is an illustration of a typical dual conversion receiver utilizing an up conversion and a subsequent down conversion.
Figure 35:
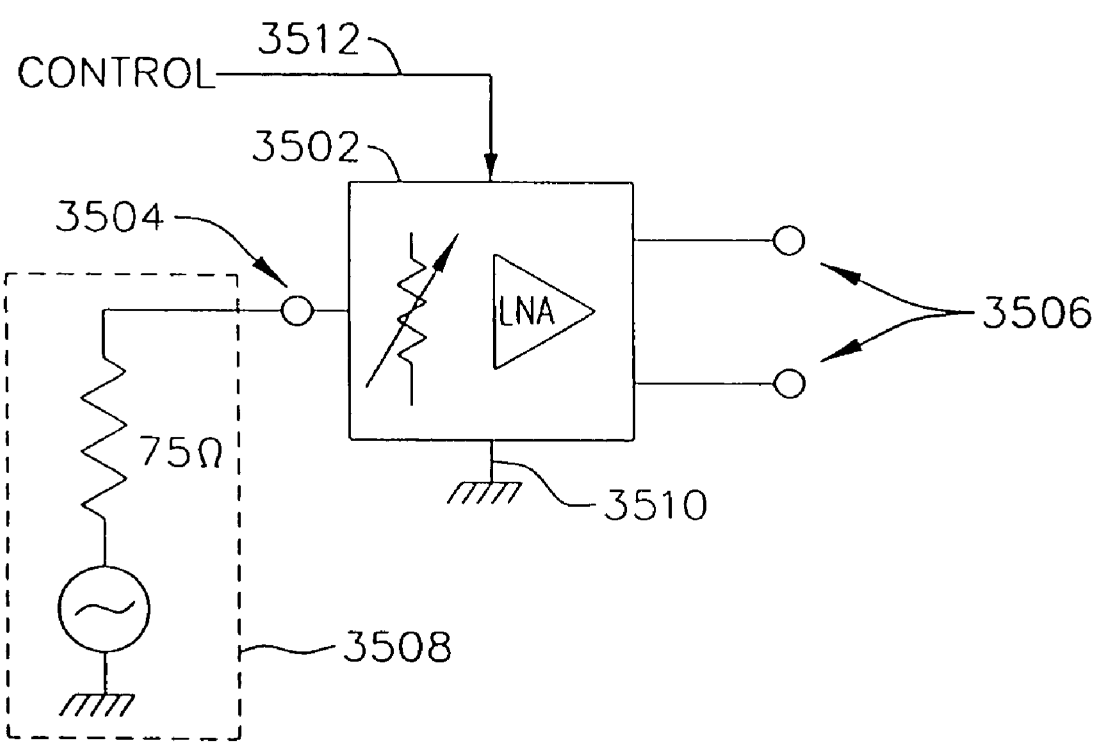
Figure 36:
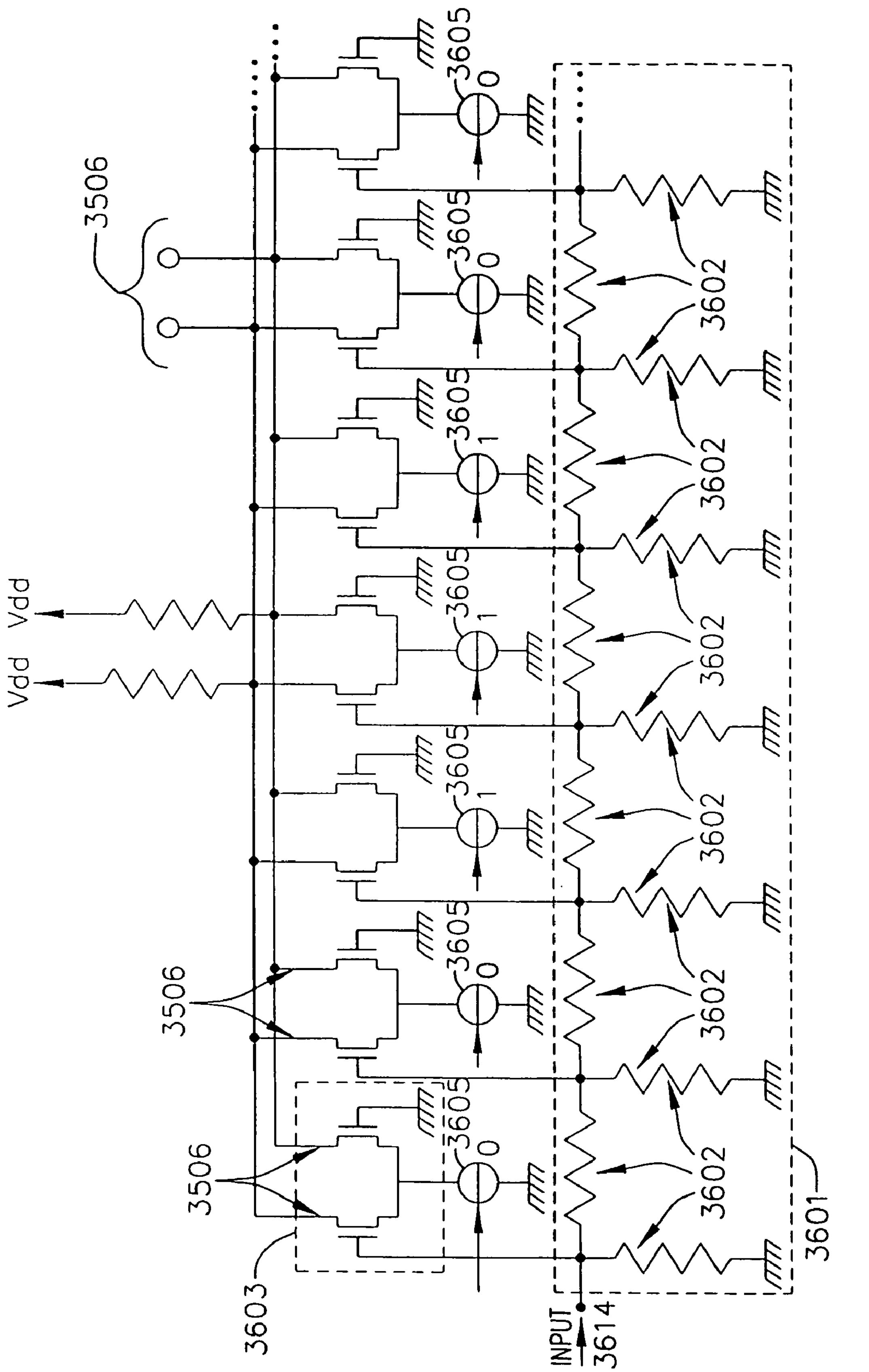
Figure 37:
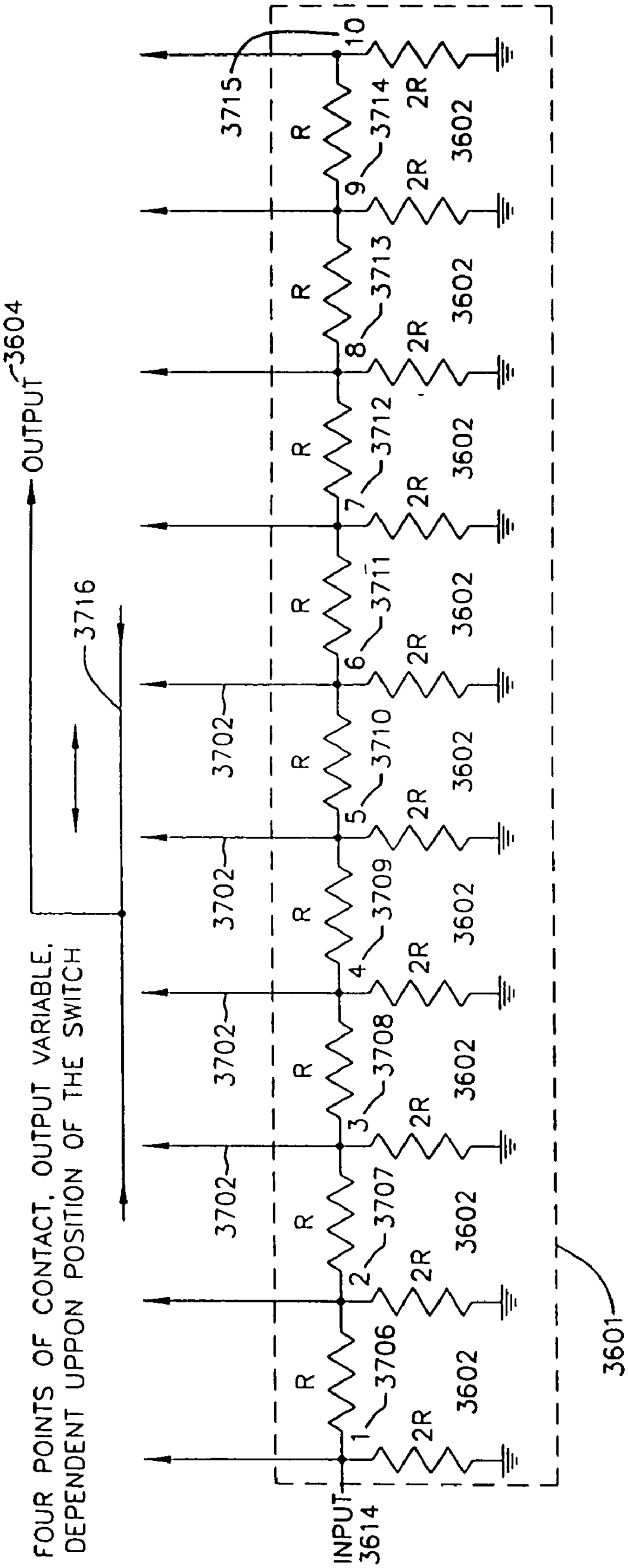
Figure 38:
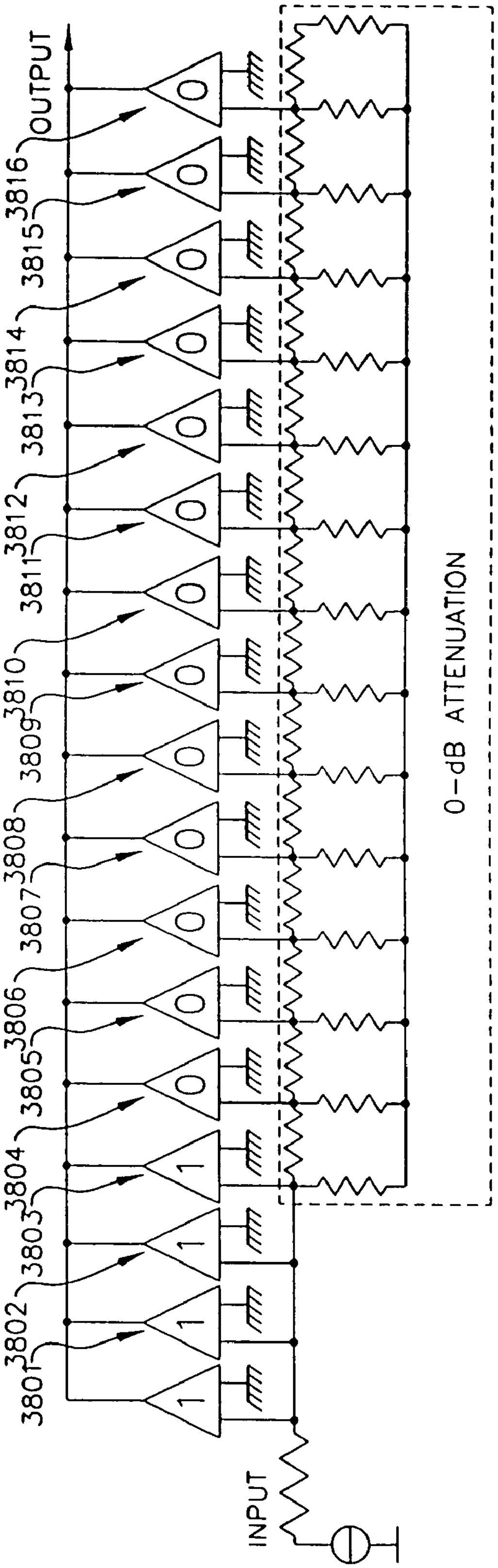
Figure 39:
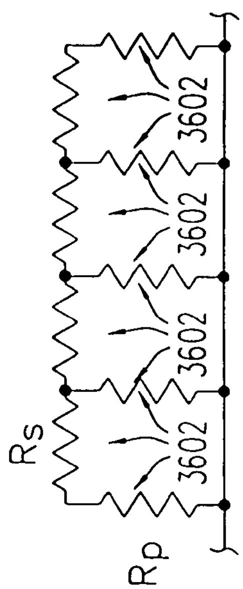
Figure 40:
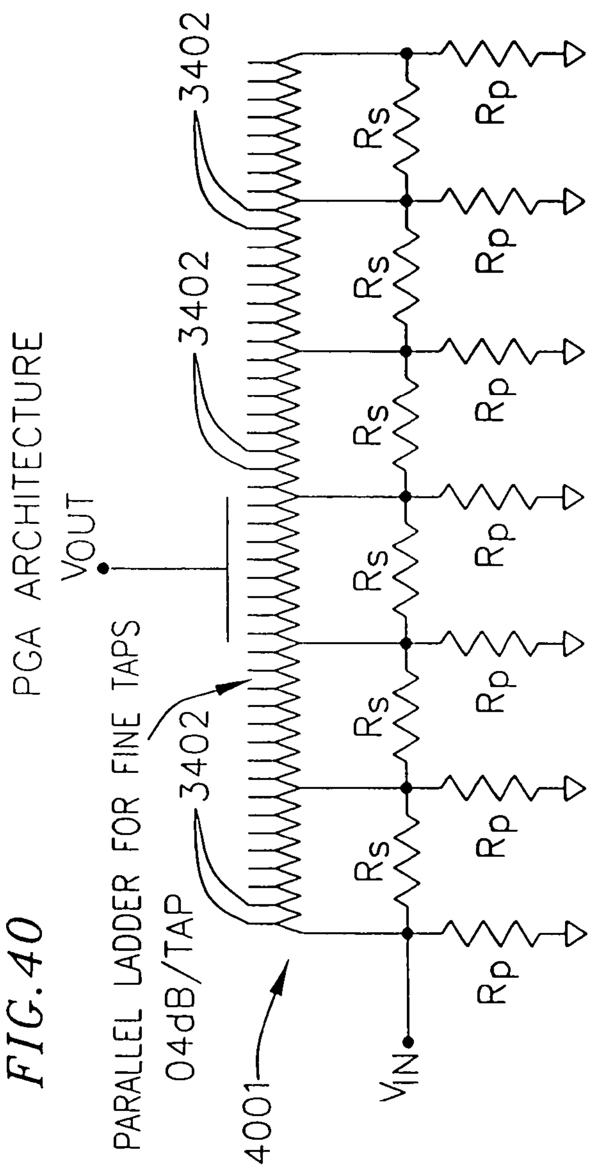
Figure 41:
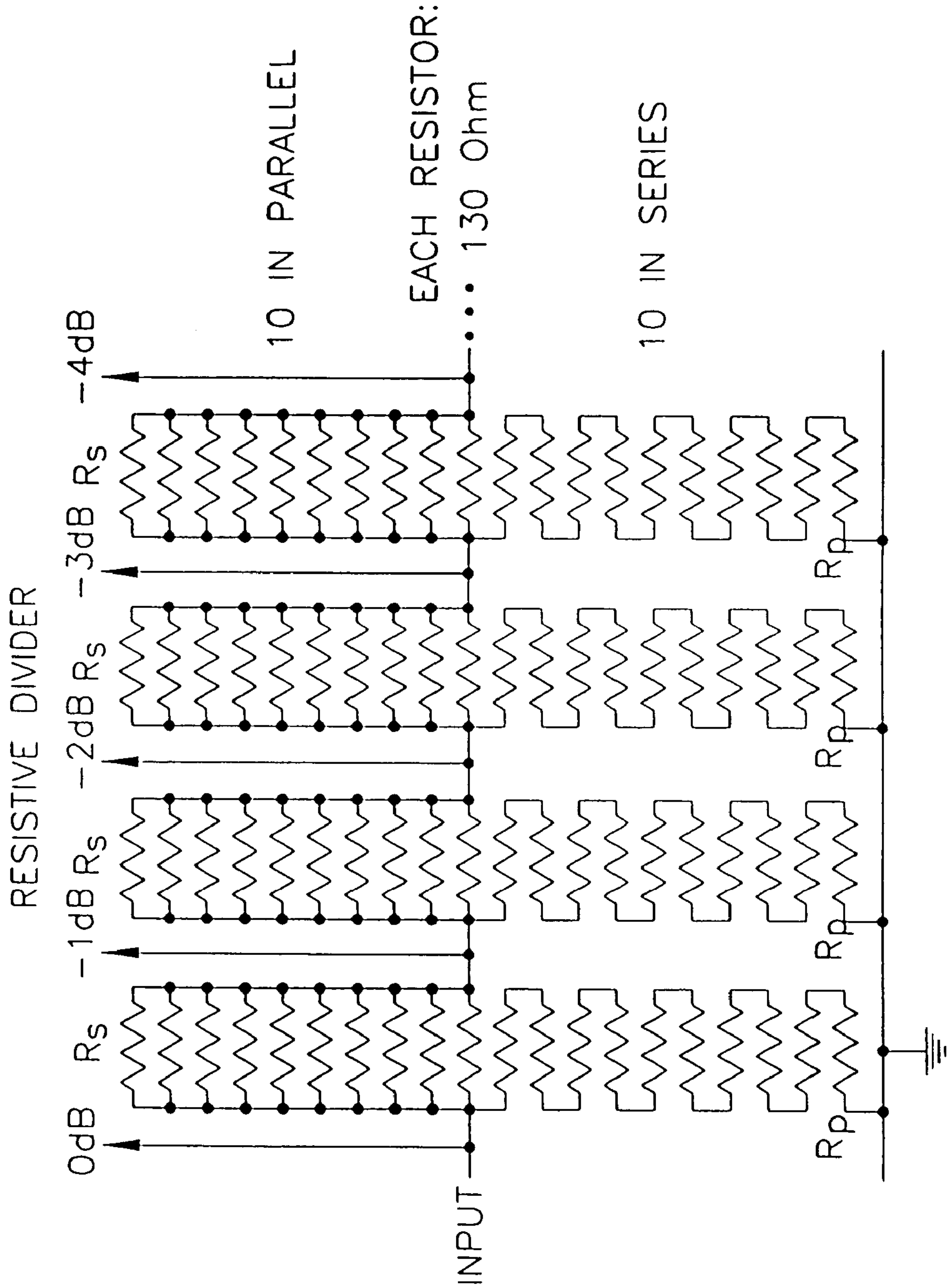
Figure 42:
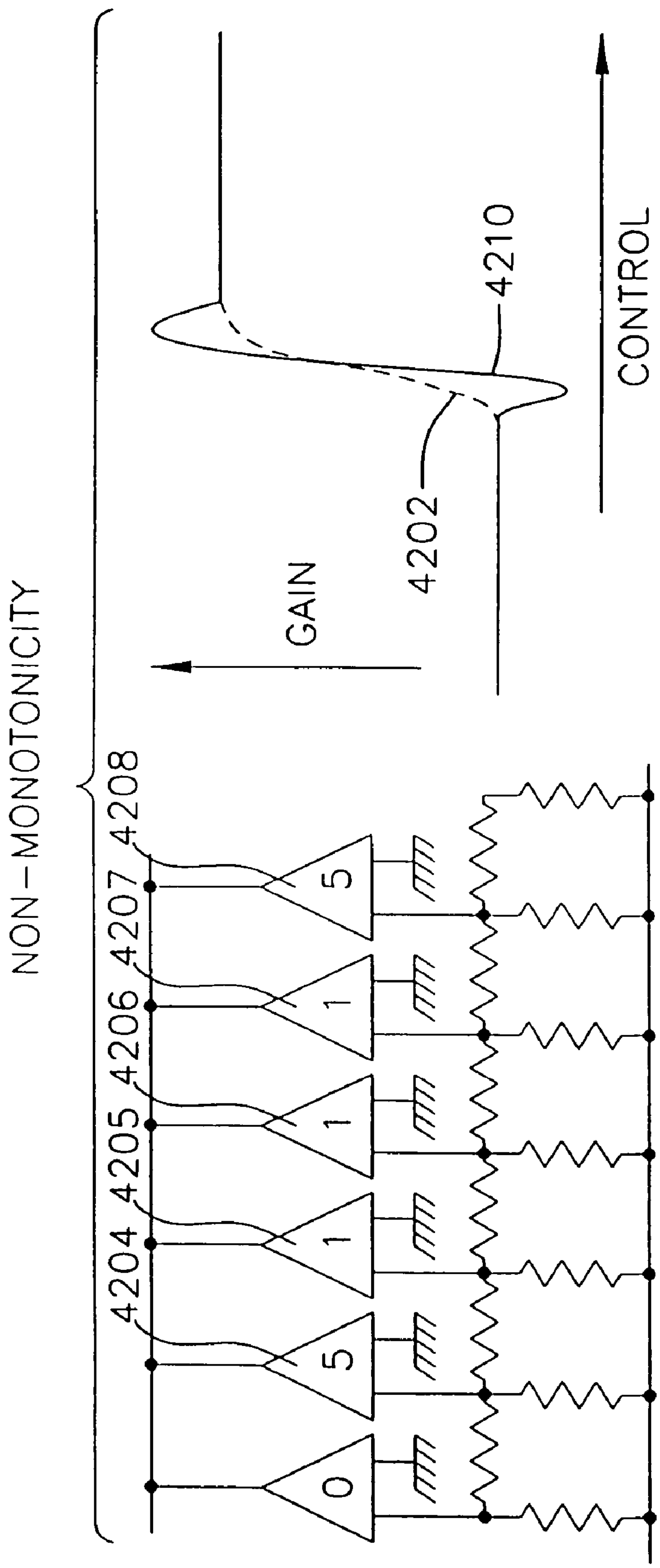
Figure 43:
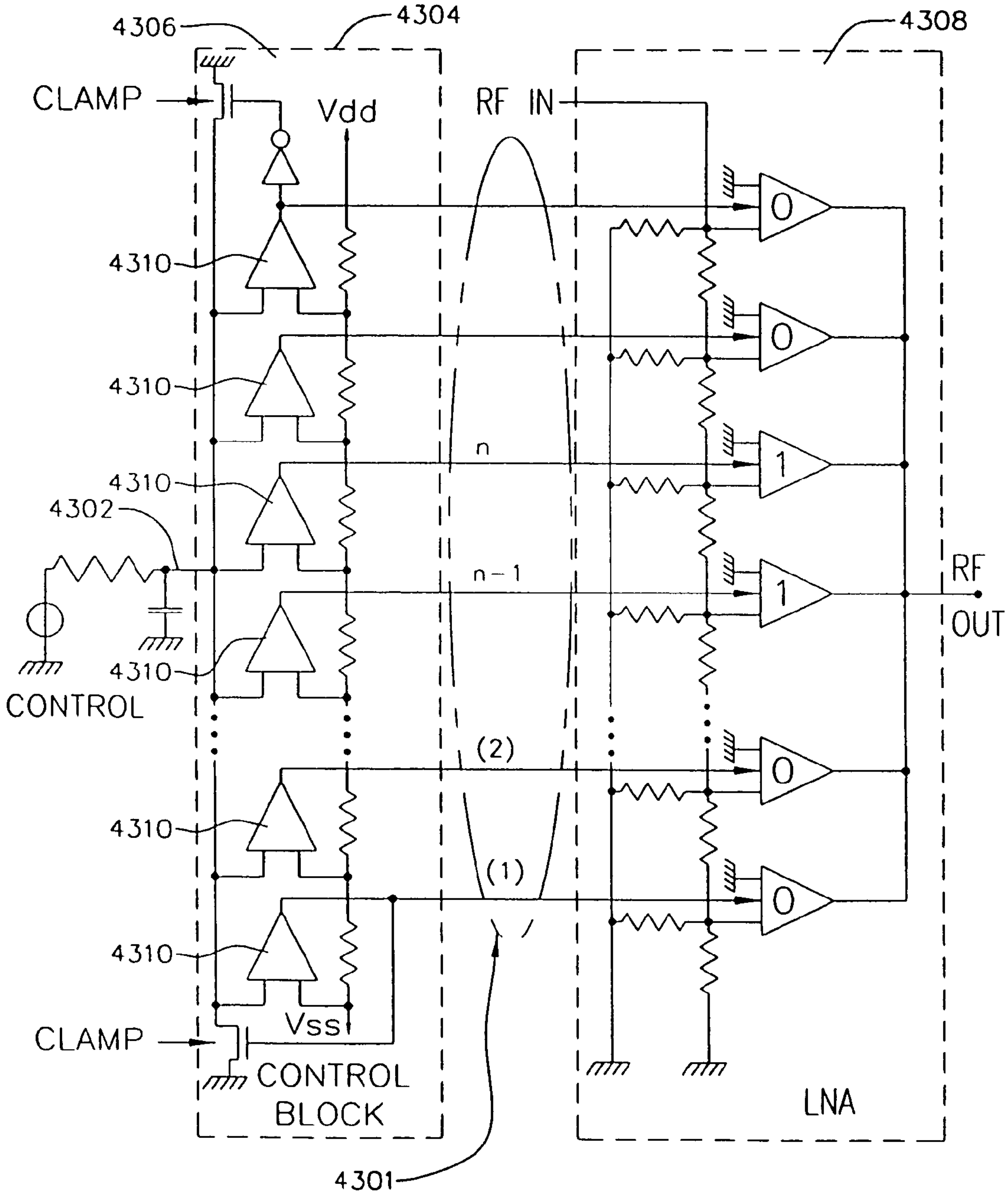
Figure 44A:
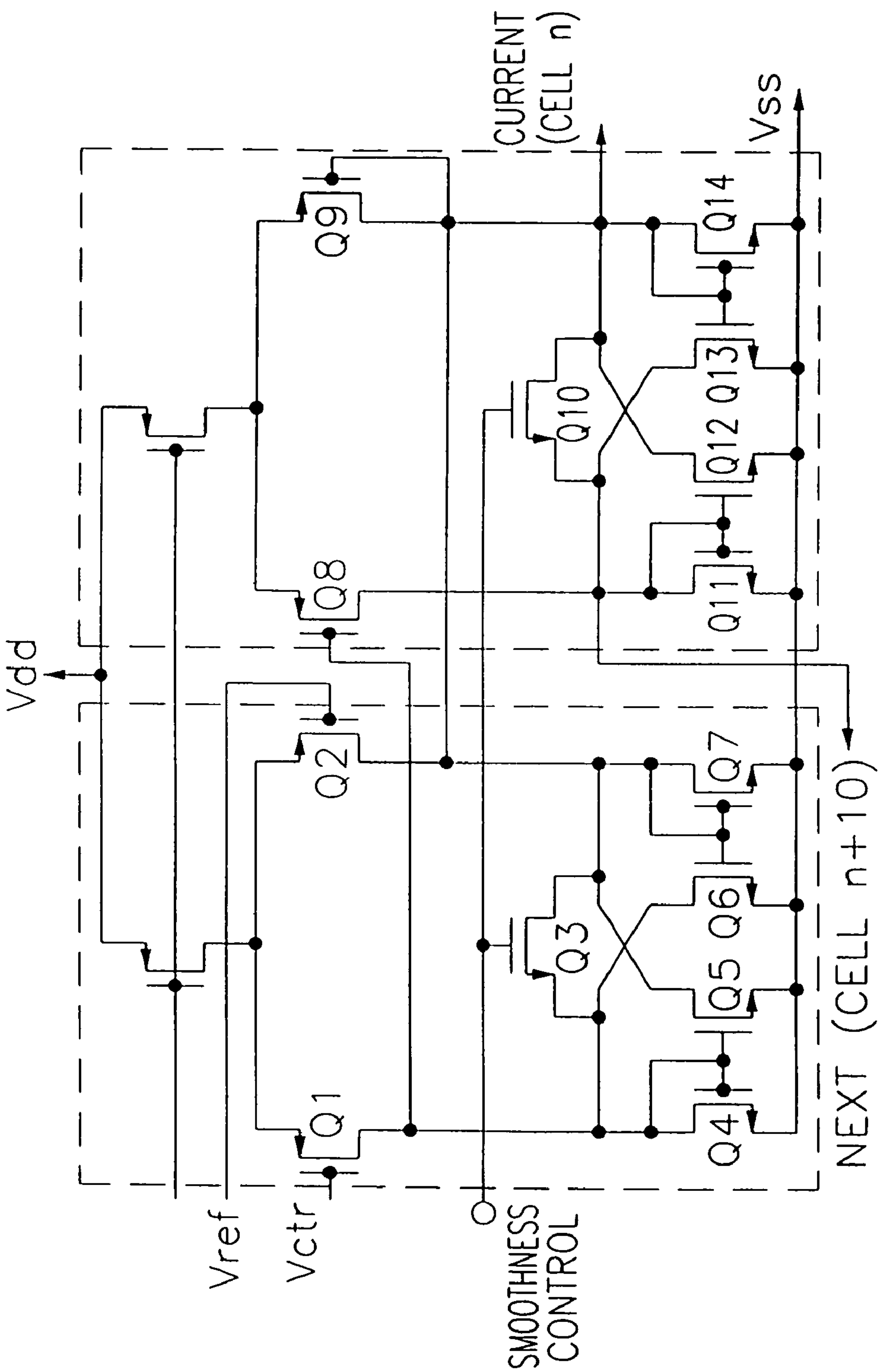
Figure 44B:
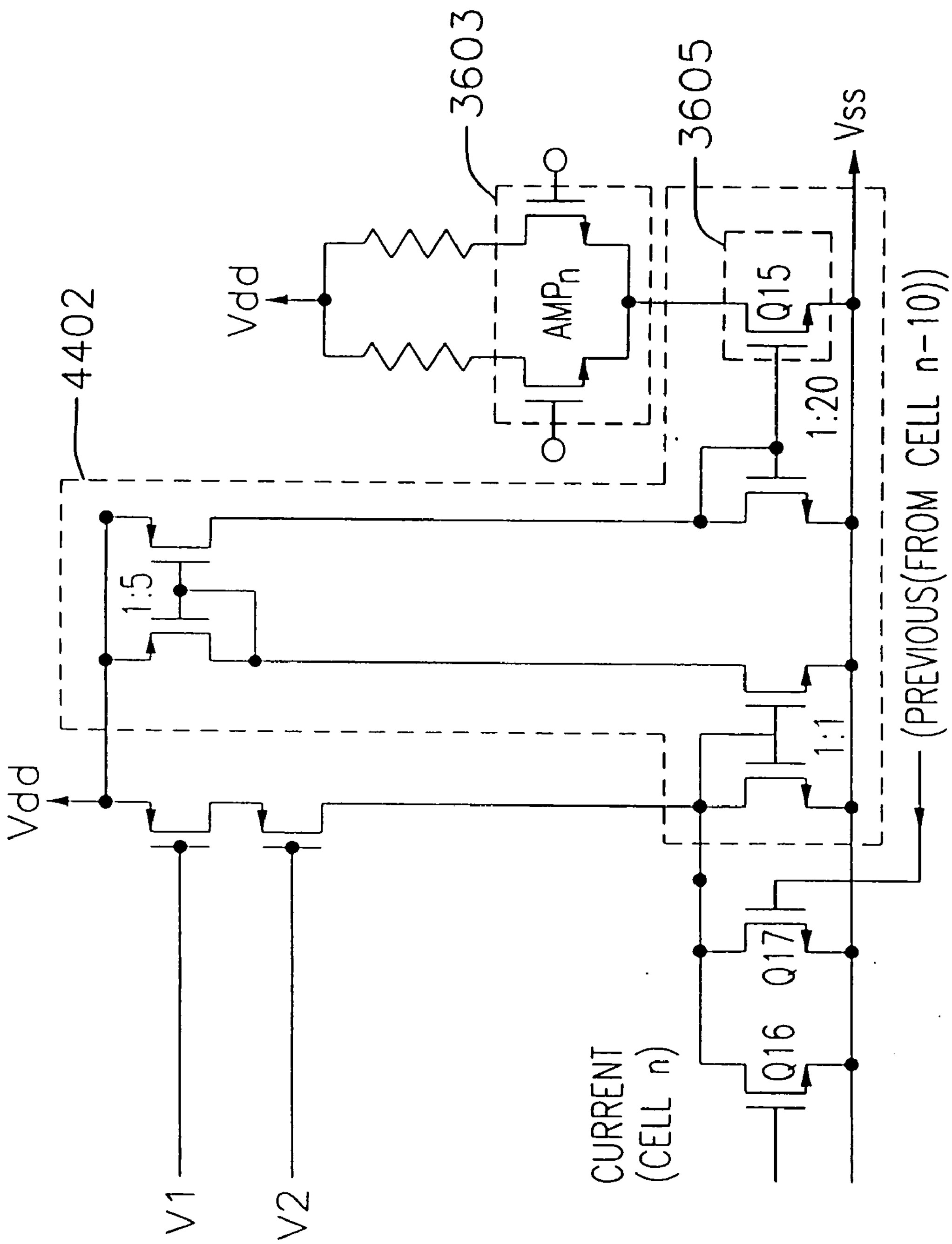
Figure 45A:
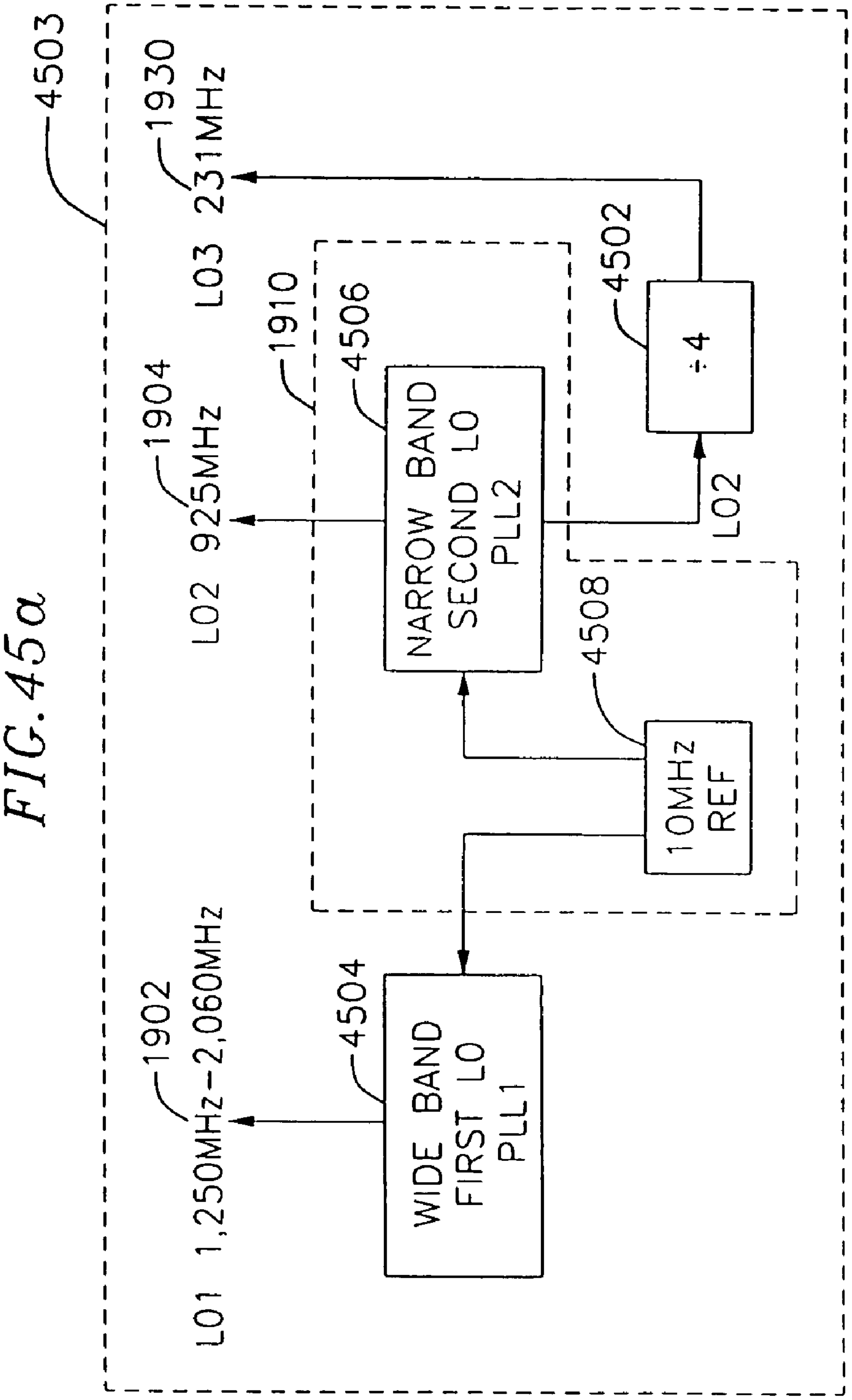

FIG. 35 is an is an illustration of the input and output signals of the integrated switchless programmable attenuator and low noise amplifier;

FIG. 36 is a functional block diagram of the integrated switchless programmable attenuator and low noise amplifier circuit;

FIG. 37 is a simplified diagram showing the connection of multiple attenuator sections to the output of the integrated switchless programmable attenuator and low noise amplifier;

FIG. 38 is an illustration of an exemplary embodiment showing how the attenuator can be removed from the circuit so that only the LNAs are connected;

FIG. 39 is an attenuator circuit used to achieve one dB per step attenuation;

FIG. 40 is an exemplary embodiment of an attenuator for achieving a finer resolution in attenuation then shown in FIG. 5;

FIG. 41 is an illustration of the construction of series and parallel resistors used in the attenuator circuit of the integrated switchless programmable attenuator and low noise amplifier;

FIG. 42 is an illustration of a preferred embodiment utilized to turn on current tails of the differential amplifiers;

FIG. 43 is an illustration of an embodiment showing how the individual control signals used to turn on individual differential pair amplifiers are generated from a single control signal;

FIGS. 44*a* and 44*b* are illustrations of an embodiment of comparator circuitry used to activate individual LNA amplifier stages;

Receiver Frequency Plan and Frequency Conversion Local Oscillator Relationship Figure FIG. 45*a* is a block diagram illustrating the exemplary generation of the local oscillator signals utilized in the embodiments of the invention;

Narrow Band PLL2 and VCO Figures

Figure 45B:
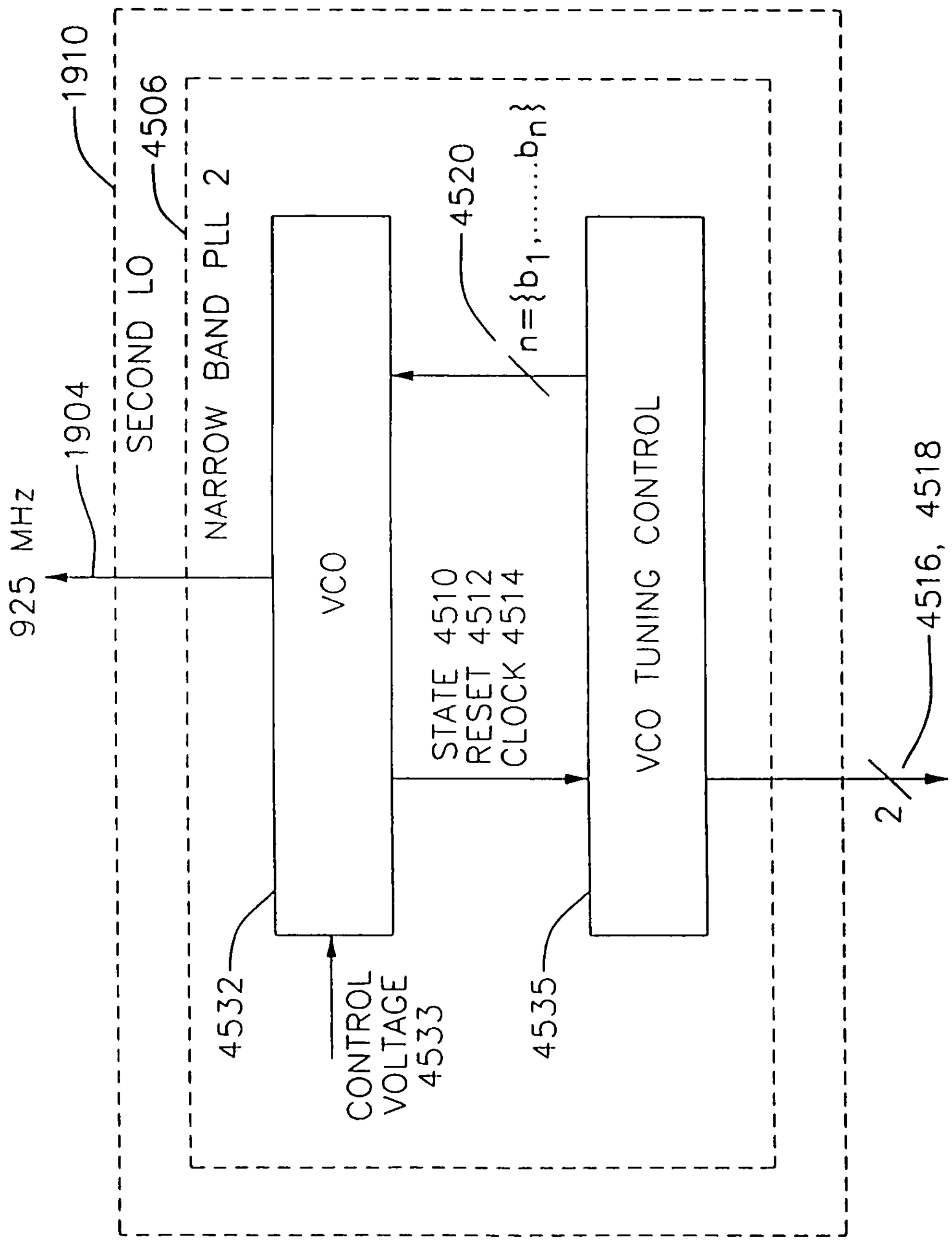

FIG. 45*b* is a block diagram that illustrates the relation of the VCO to the second LO generation by PLL2.

Figure 45C:
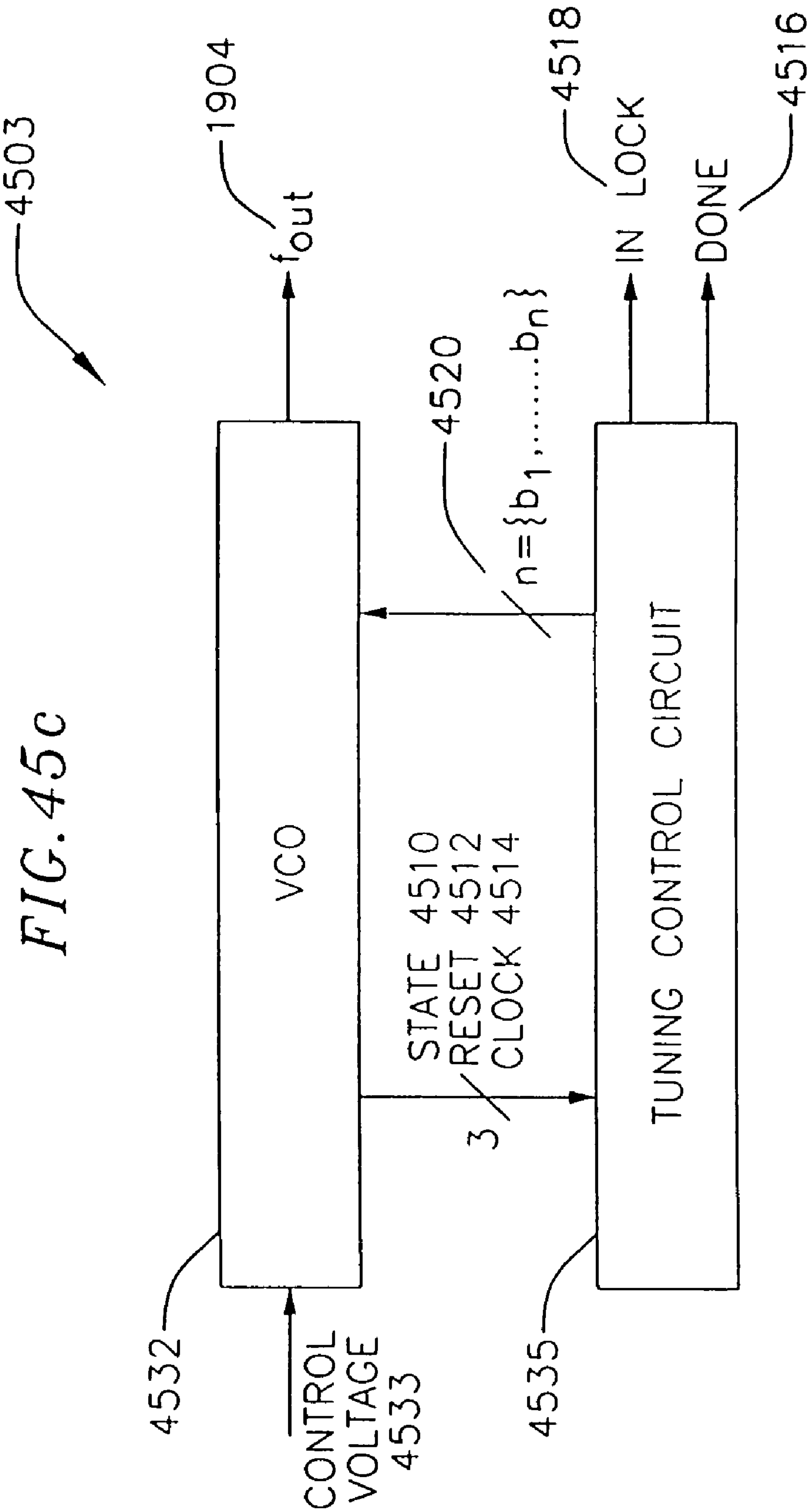
Figure 45D:
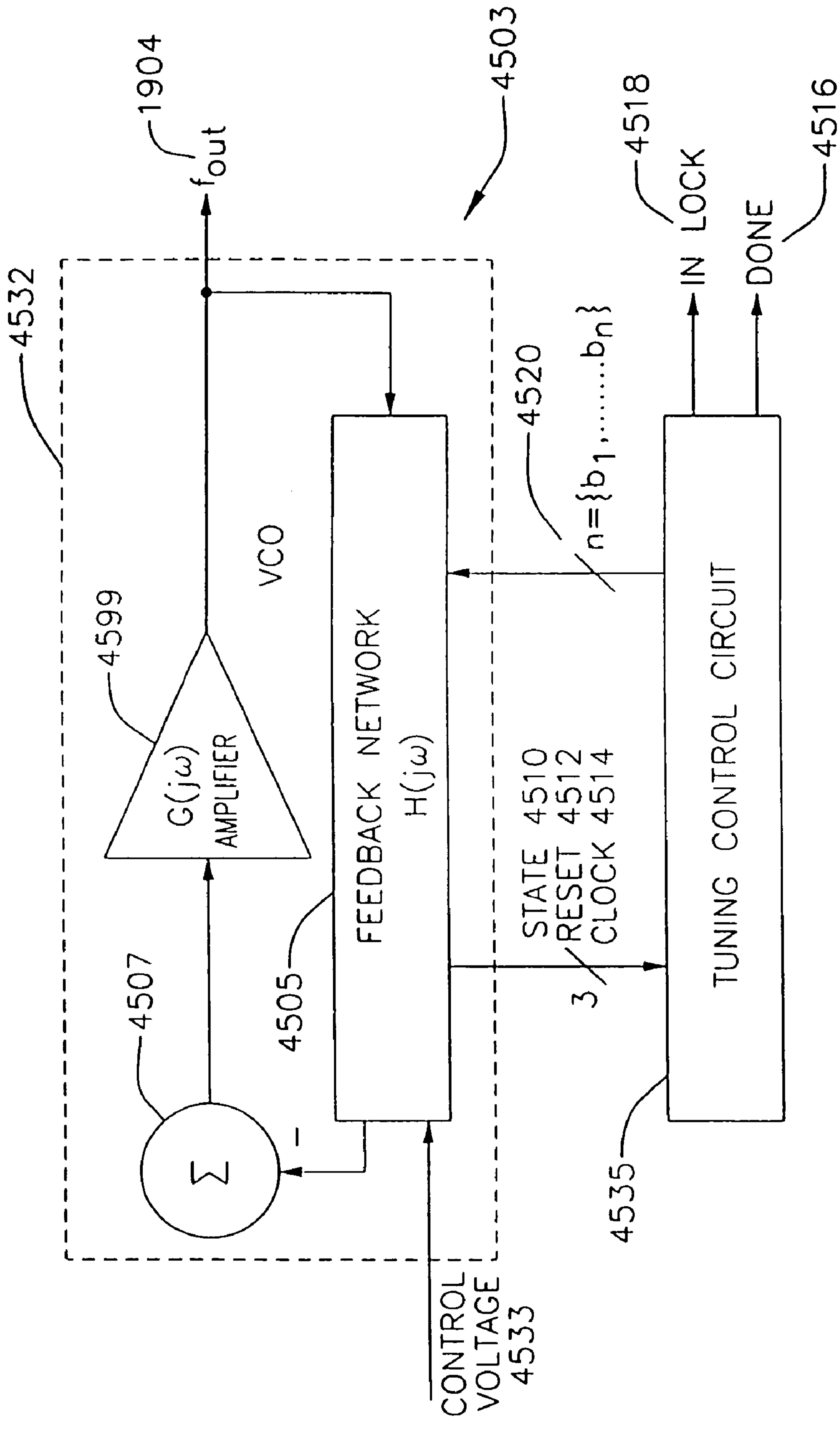
Figure 45E:
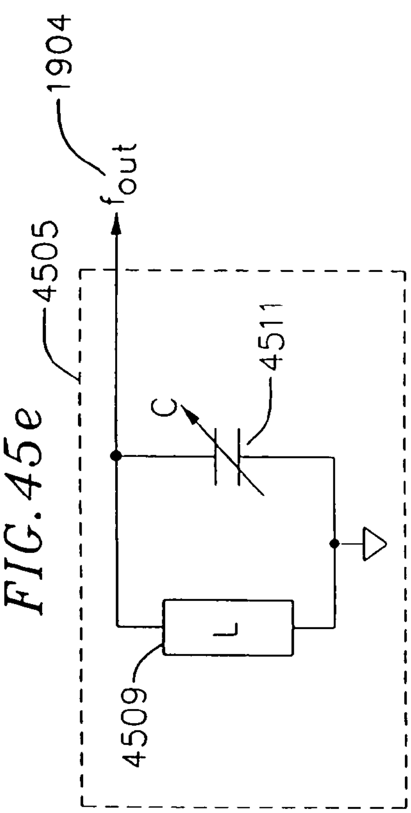
Figure 45F:
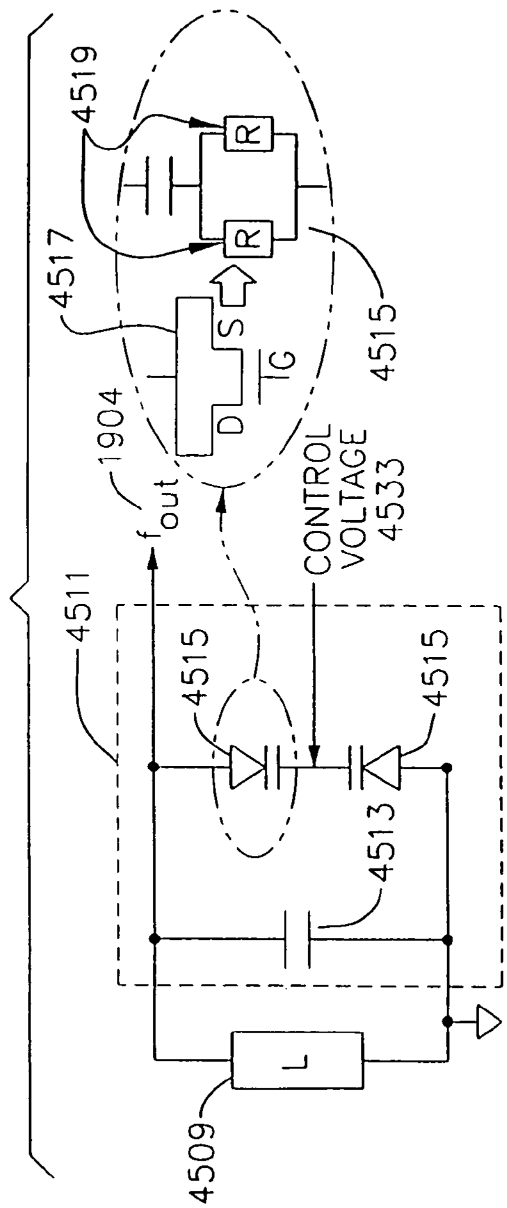
Figure 45G:
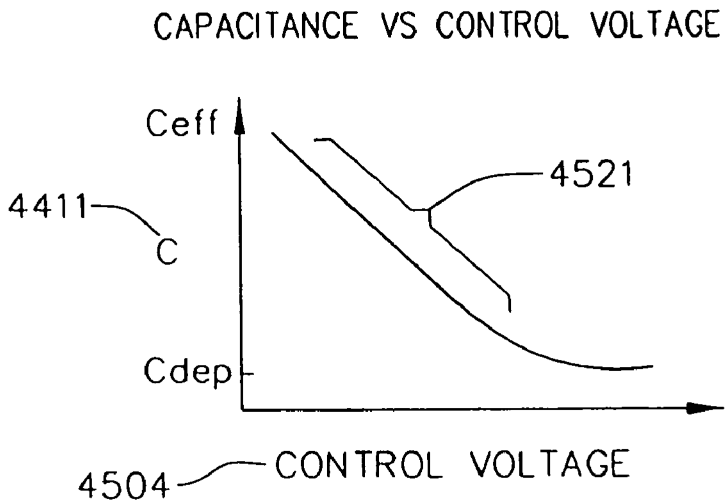
Figure 45H:
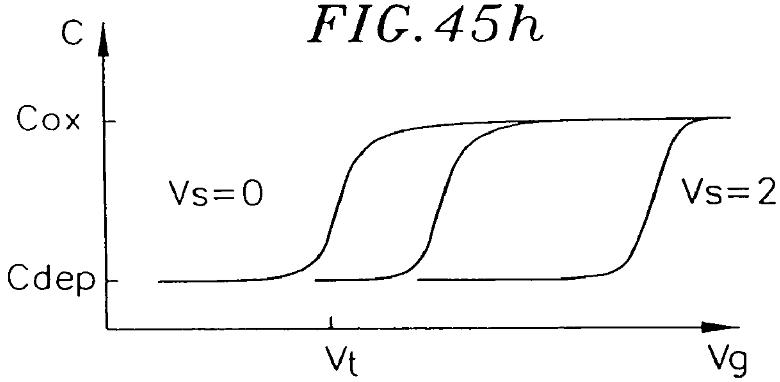
Figure 45J:
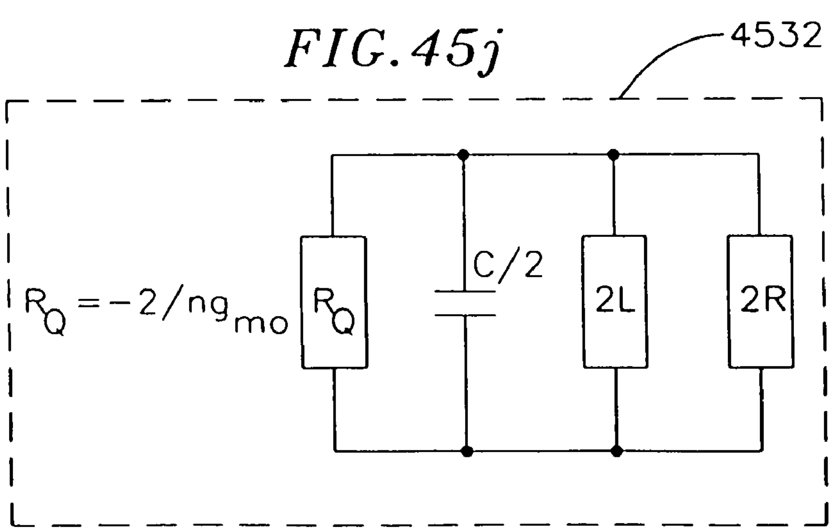
Figure 45I:
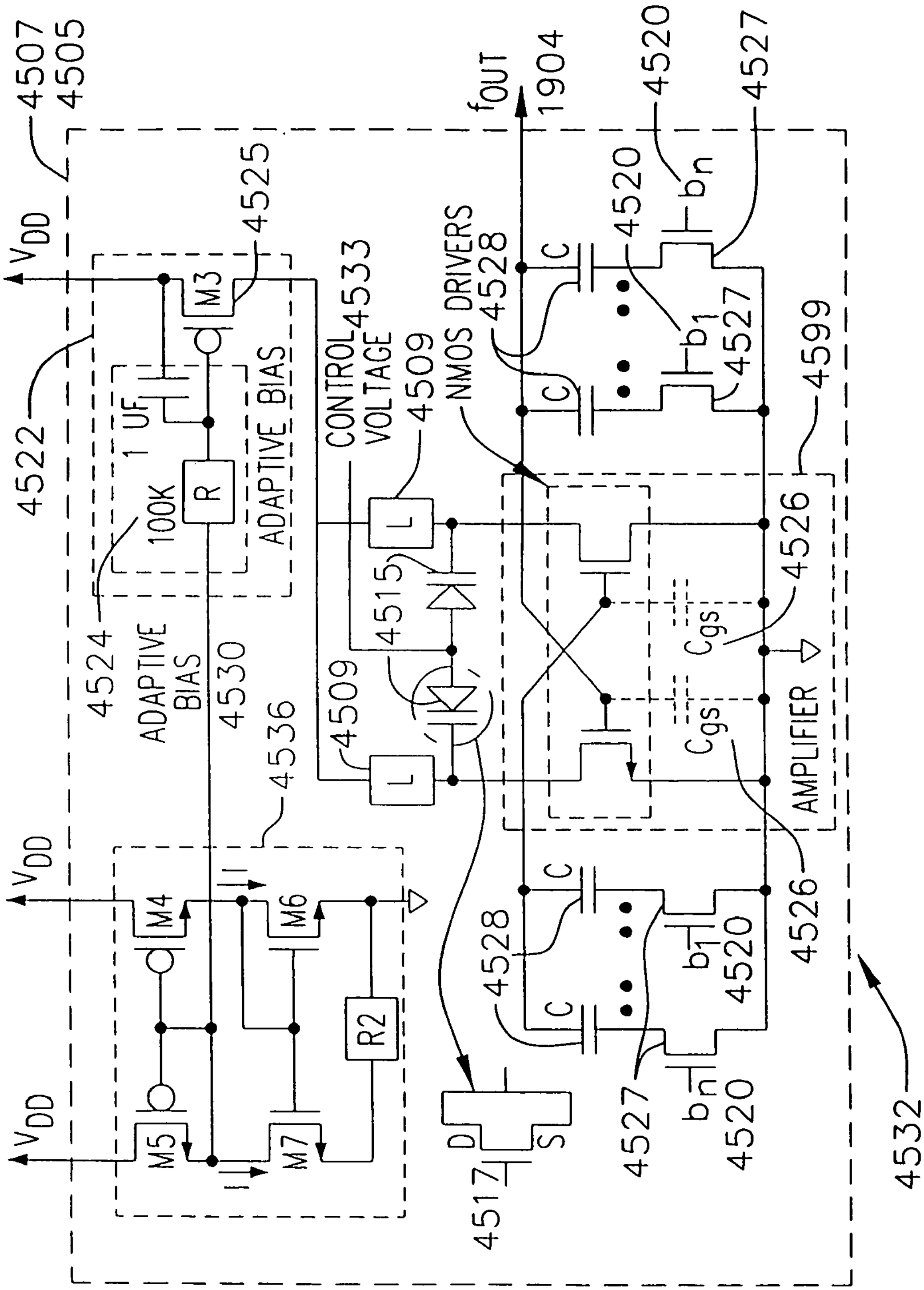

FIG. 45*c* is a block diagram of an embodiment of a VCO utilizing a tuning control circuit;

FIG. 45*d* is a block diagram of an embodiment of a VCO utilizing a tuning control circuit showing tuning control circuit interaction with major VCO components;

FIG. 45*e* is a schematic of a feedback network that allows the frequency of oscillation to be adjusted;

FIG. 45*f* is a schematic of a feedback network that allows the frequency of oscillation to be adjusted by varactor tuning including NMOS devices;

FIG. 45*g* is a graph of capacitance verses control voltage applied to an NMOS varactor;

FIG. 45*h* is a graph illustrating average capacitance achievable with an NMOS varactor;

FIG. 45*i* is a schematic of an embodiment of a VCO;

FIG. 45*j* is a schematic of an equivalent circuit of the VCO of FIG. 45*i;*

Figure 45K:
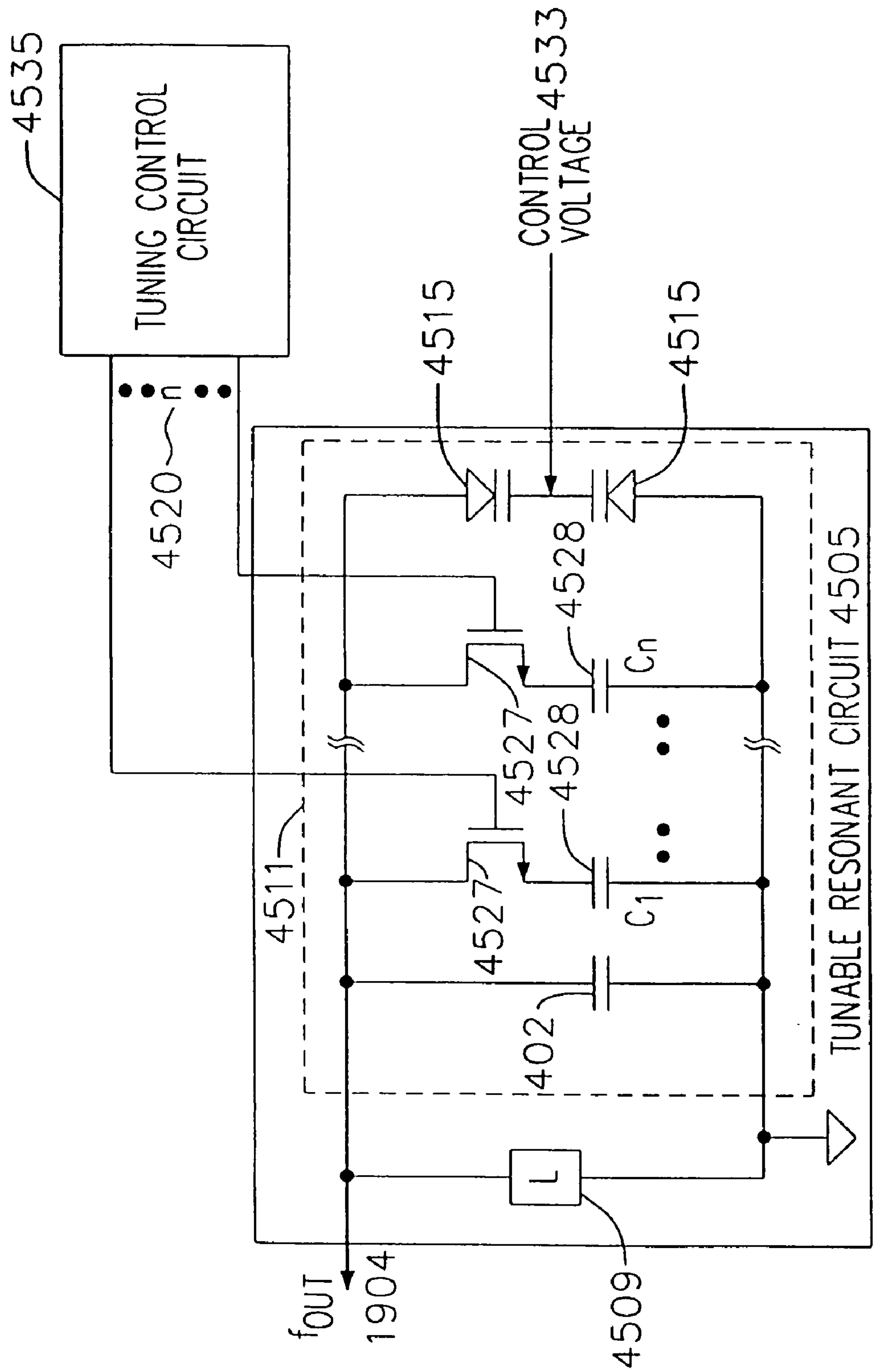
Figure 46A:
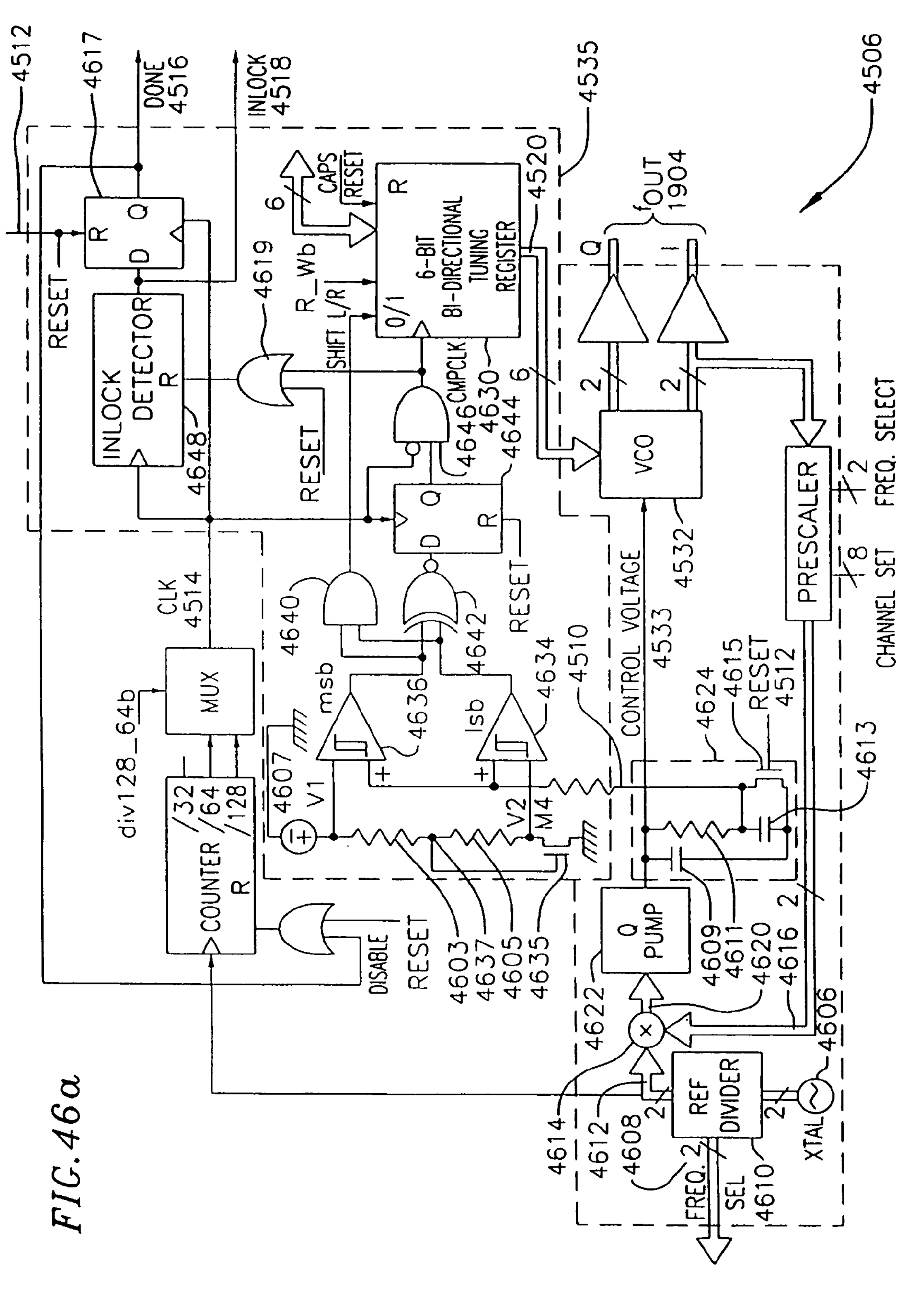
Figure 46B:
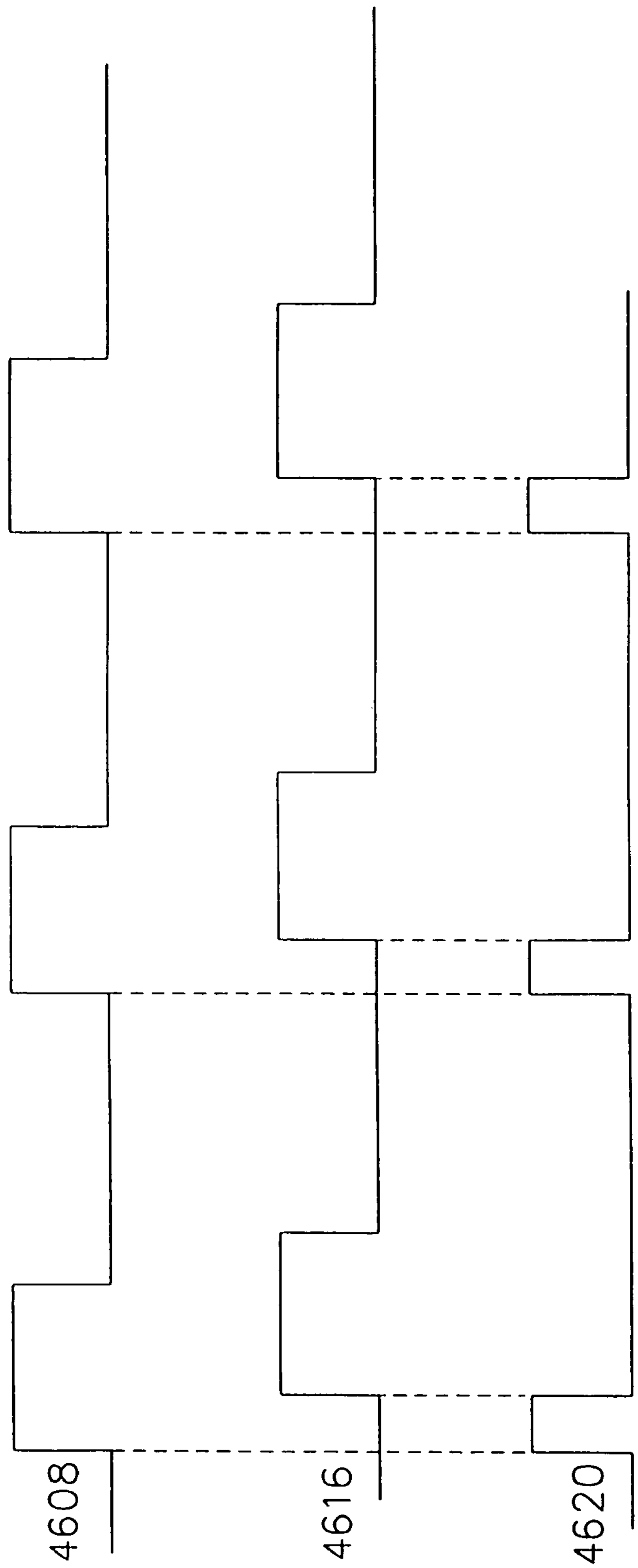

FIG. 45*k* is a schematic of a tuning control circuit controlling switched capacitors to center a varactor tuning range;

FIG. 46*a* is a schematic of a PLL having its VCO controlled by an embodiment of a VCO tuning control circuit;

FIG. 46*b* illustrates a pulse train output of the phase detector;

Narrow Band VCO Tuning Figures

Figure 47A:
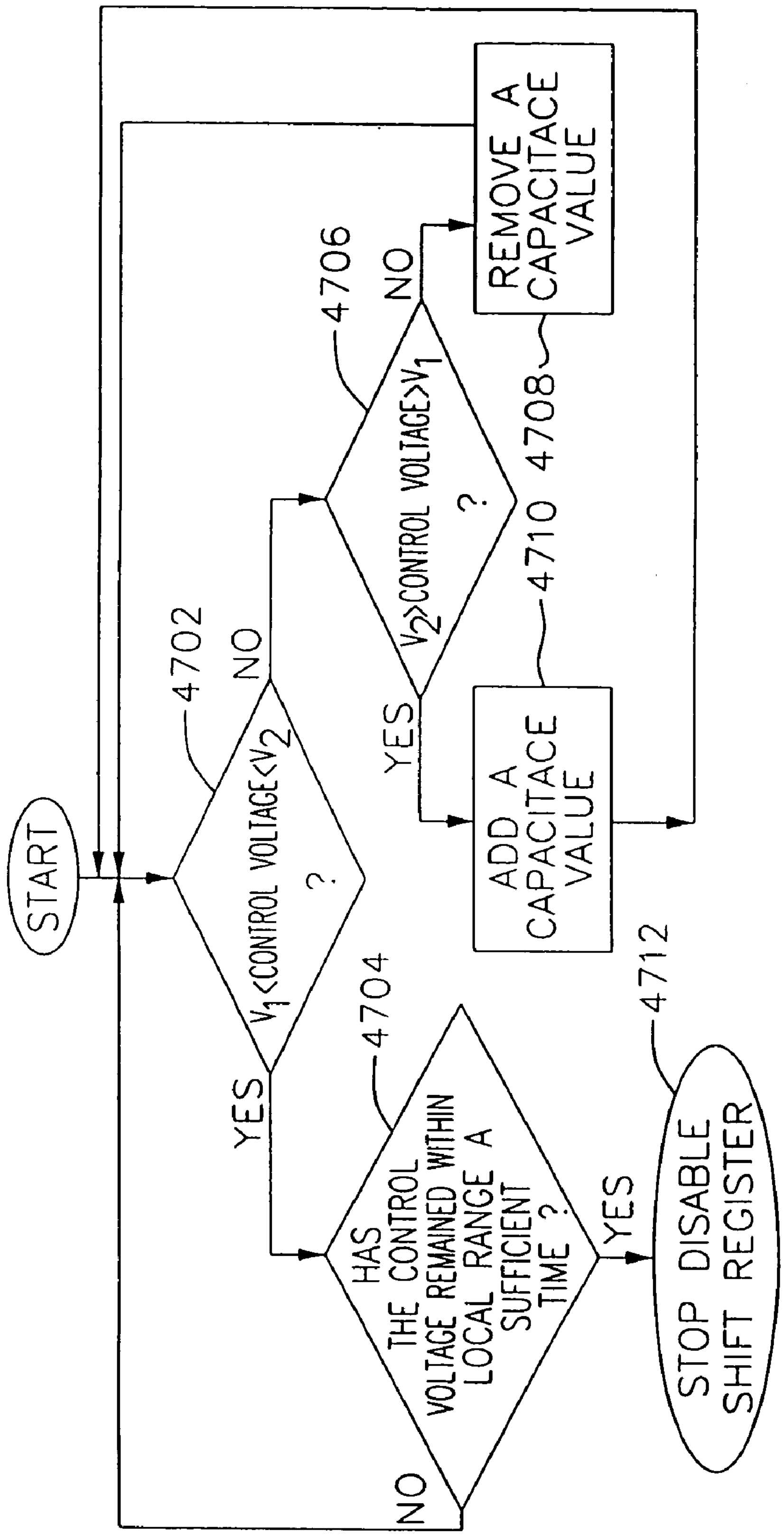
Figure 47B:
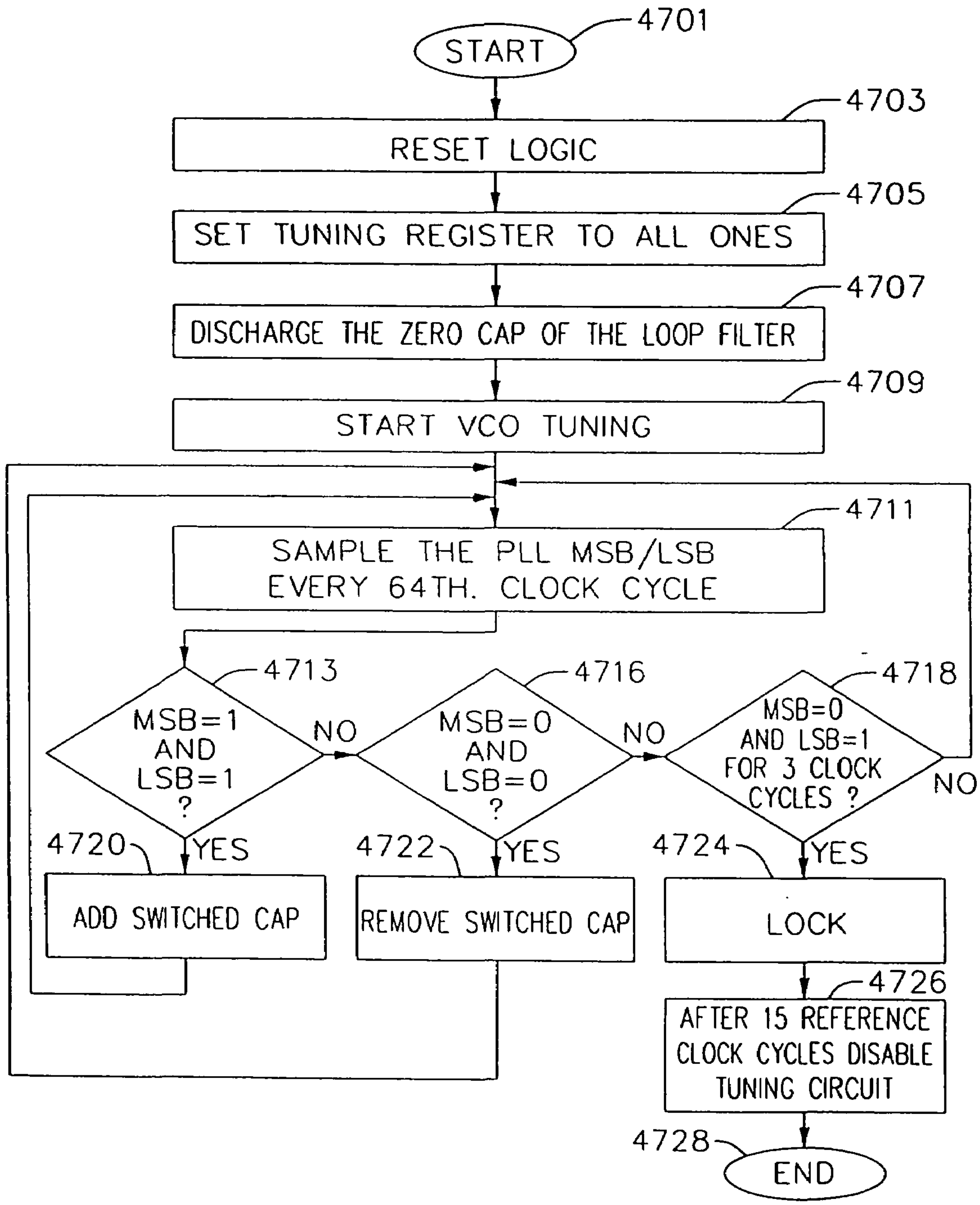
Figure 47C:
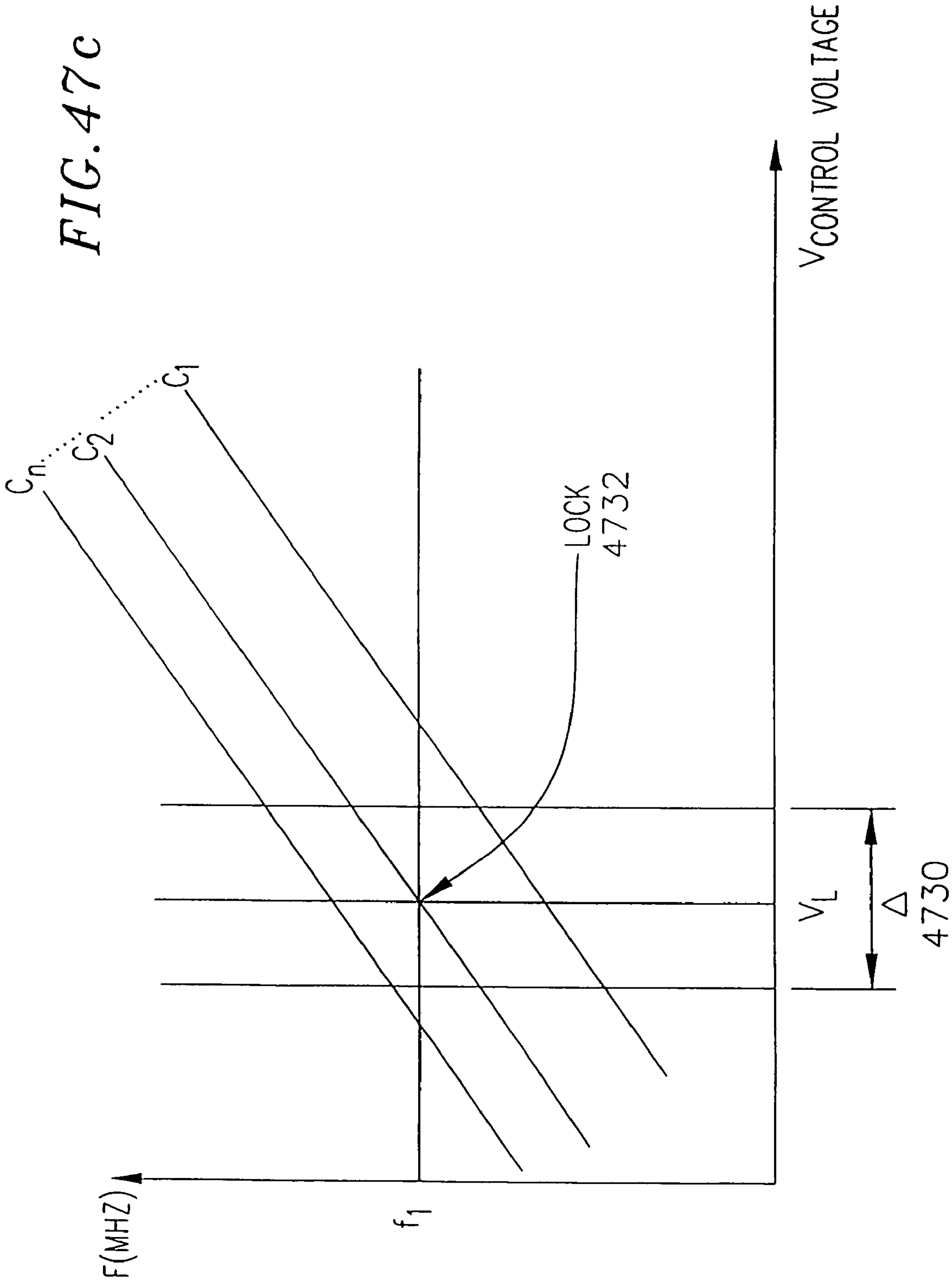
Figure 47D:
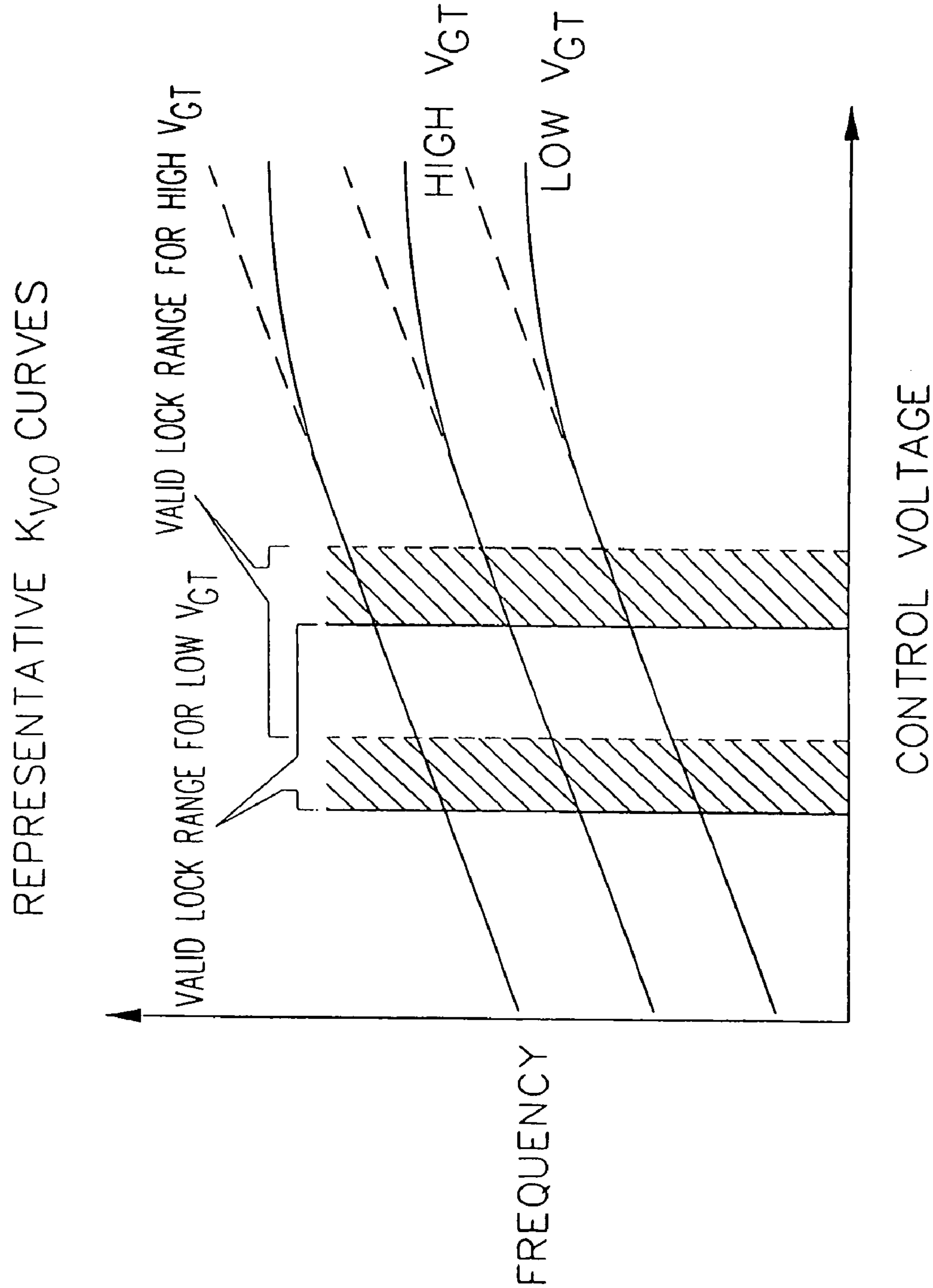

FIG. 47*a* is a process flow diagram illustrating the process of tuning the VCO with an embodiment of a VCO control circuit;

FIG. 47*b* is a flow diagram of a PLL start up and locking process for an embodiment of the invention;

FIG. 47*c* is a graph of a family of frequency verses control voltage for various capacitor values that illustrates the use of comparator hysteresis to aid in achieving a frequency lock condition:

FIG. 47*d* is a graph of a family of frequency verses control voltage for various capacitor values that illustrates the use of dual comparator windows to aid in achieving a frequency lock condition;

Receiver Figures

Figure 48:
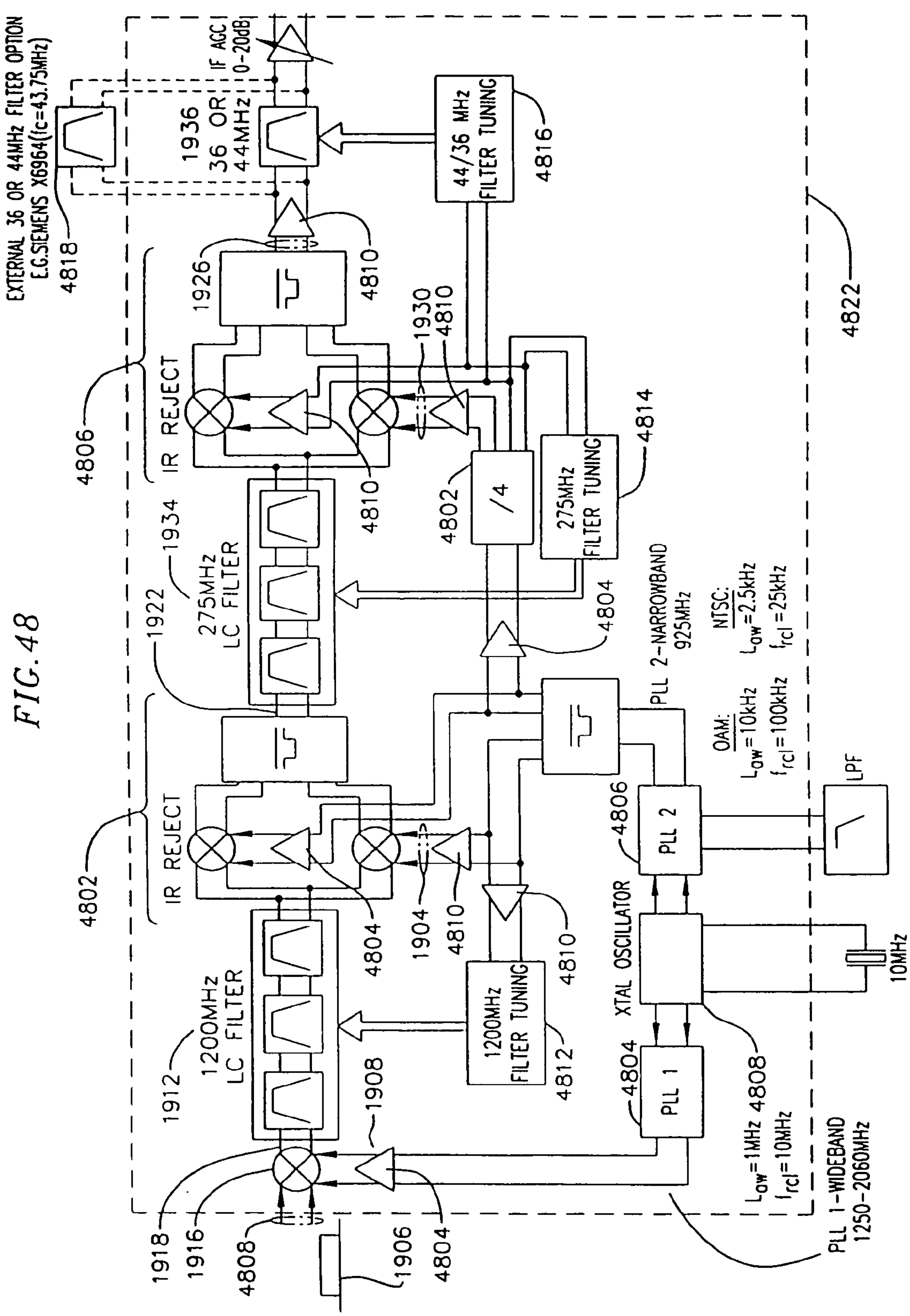
Figure 49:
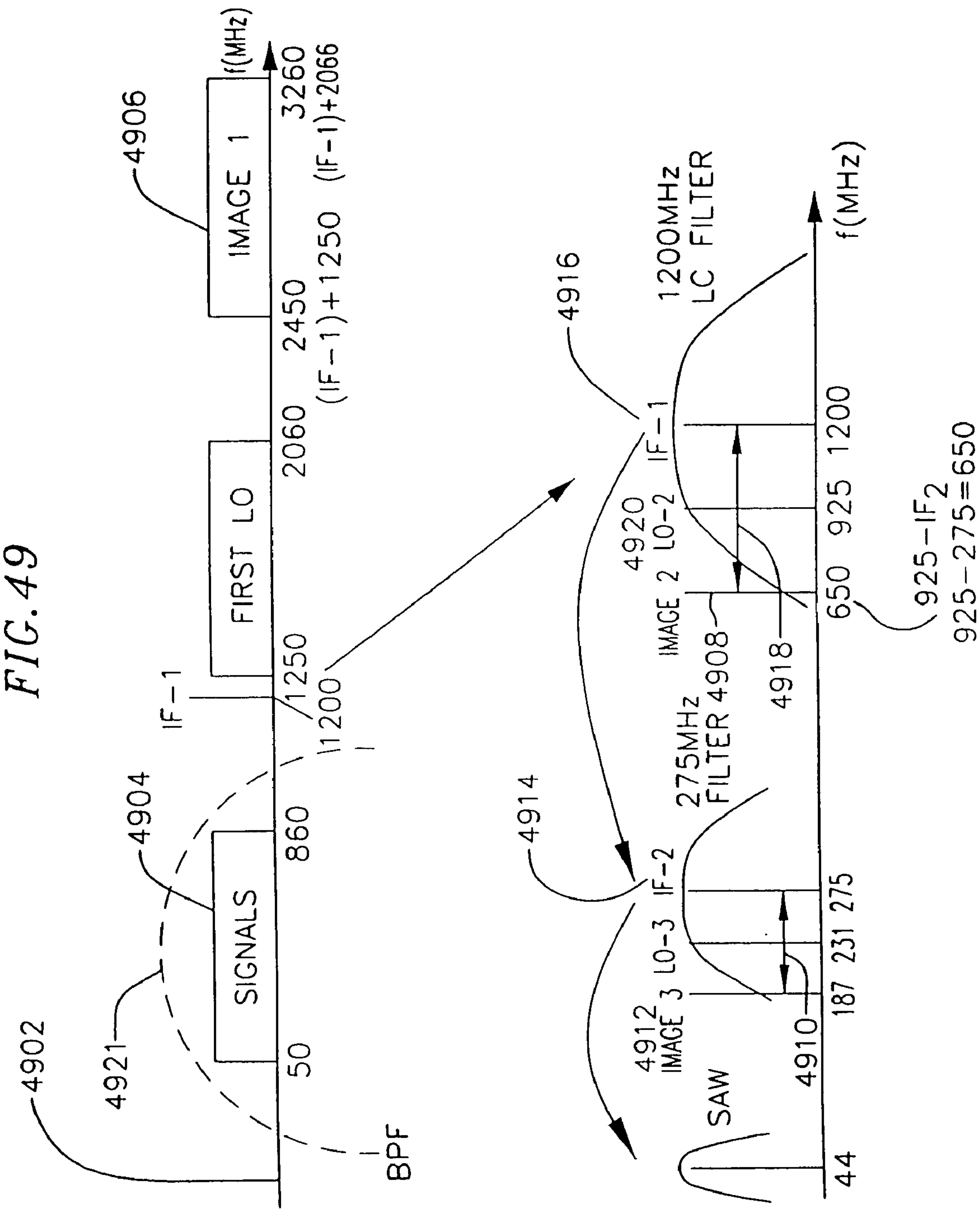
Figure 50:
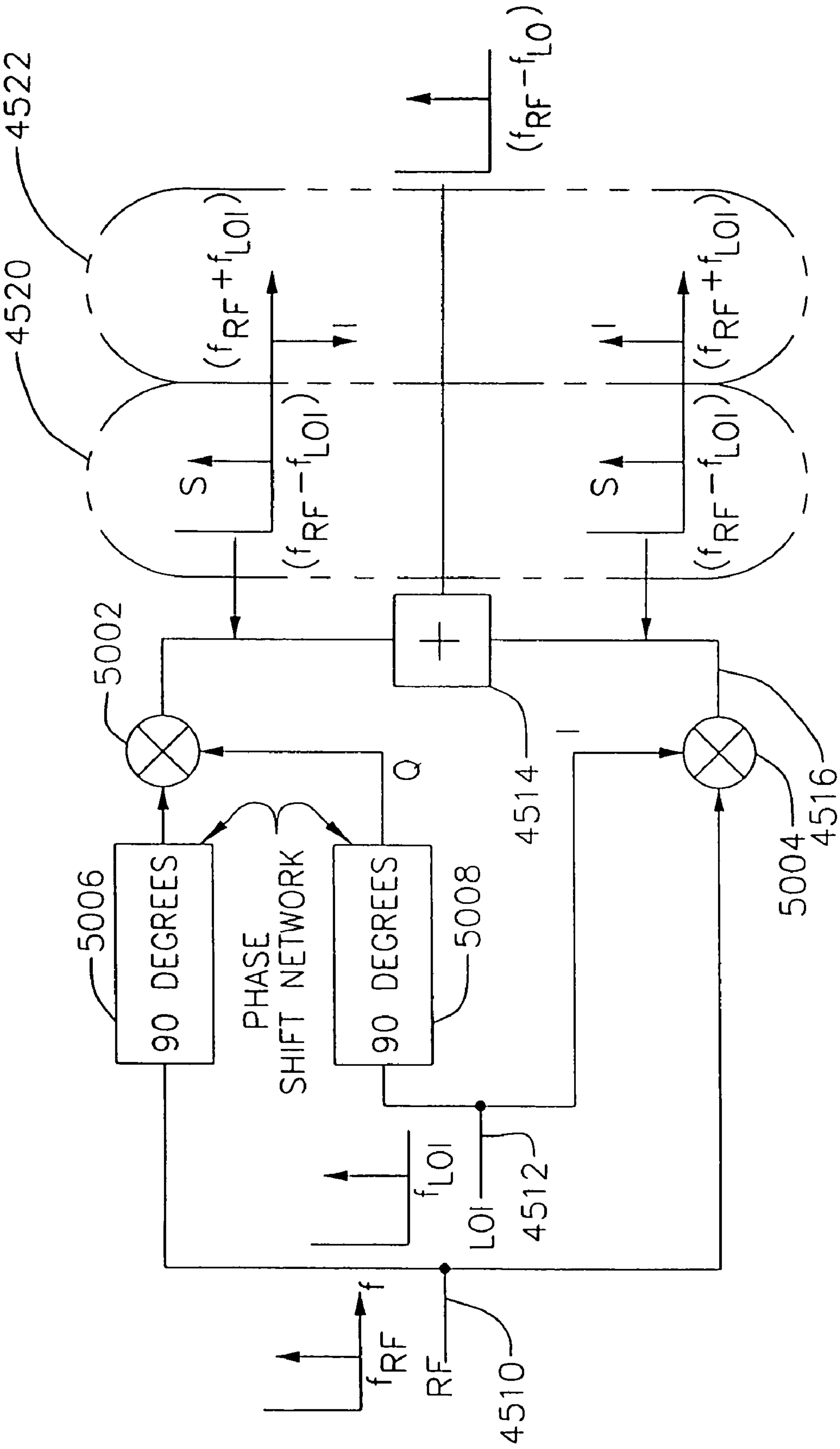
Figure 51:
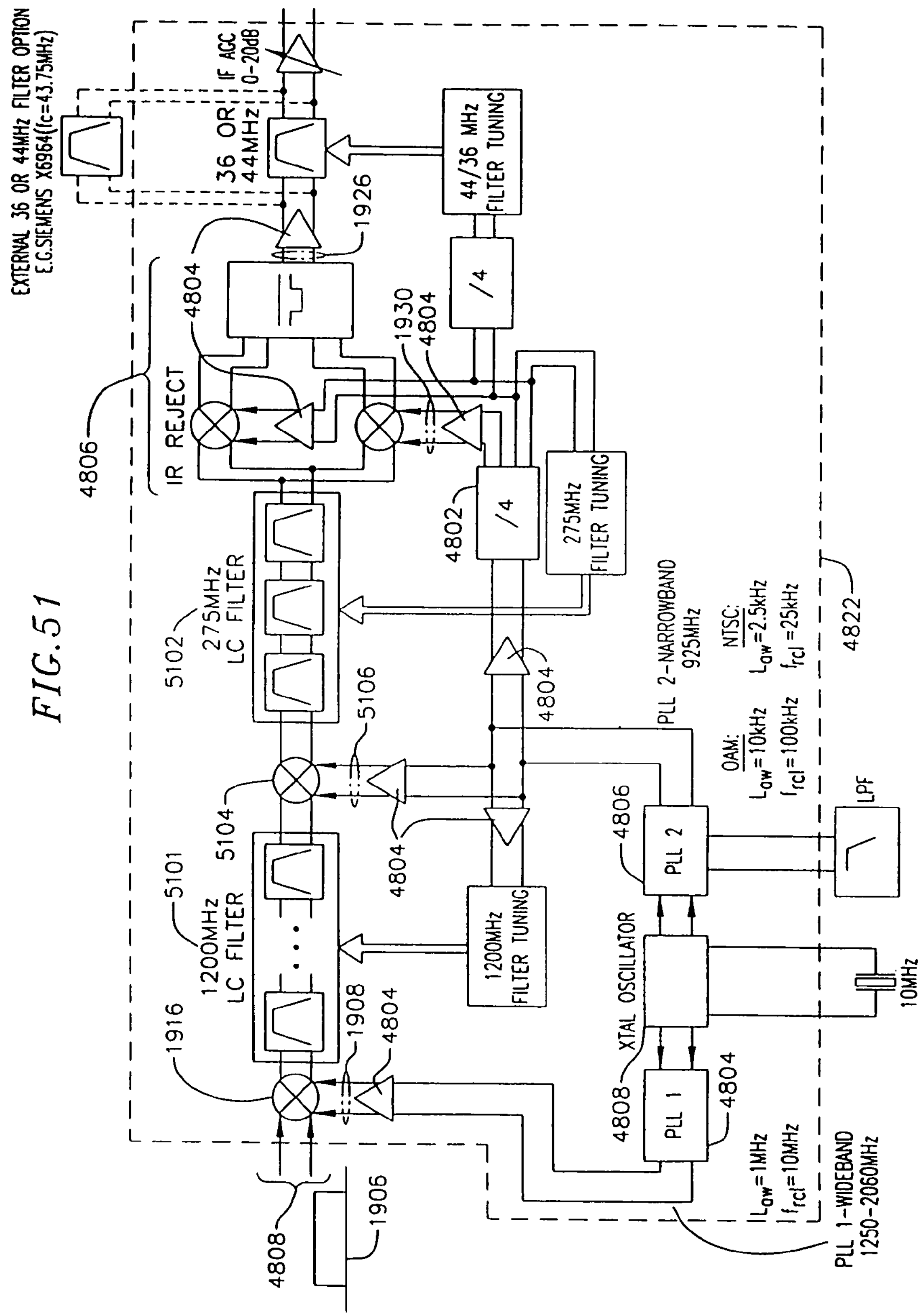
Figure 52:
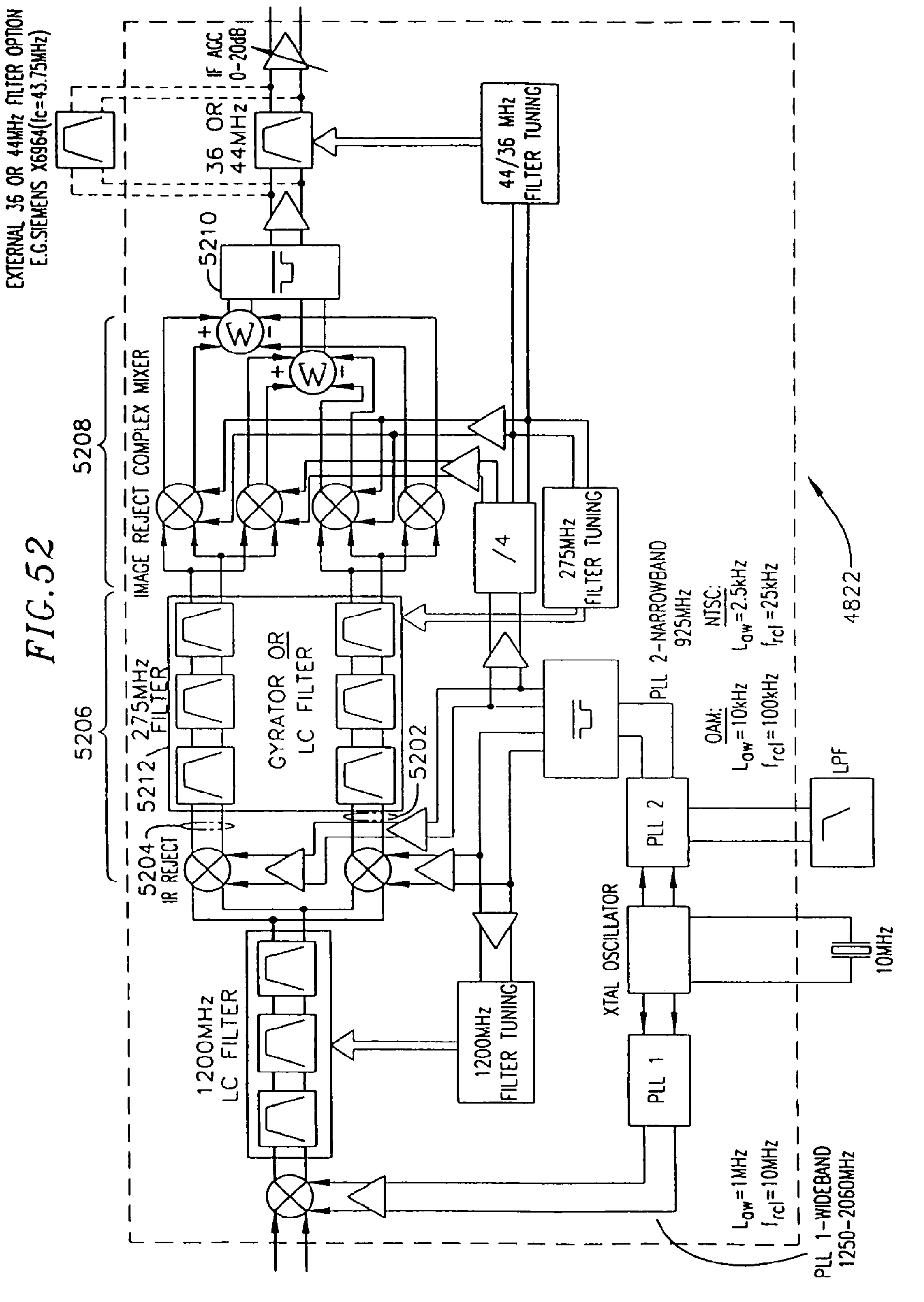
Figure 53:
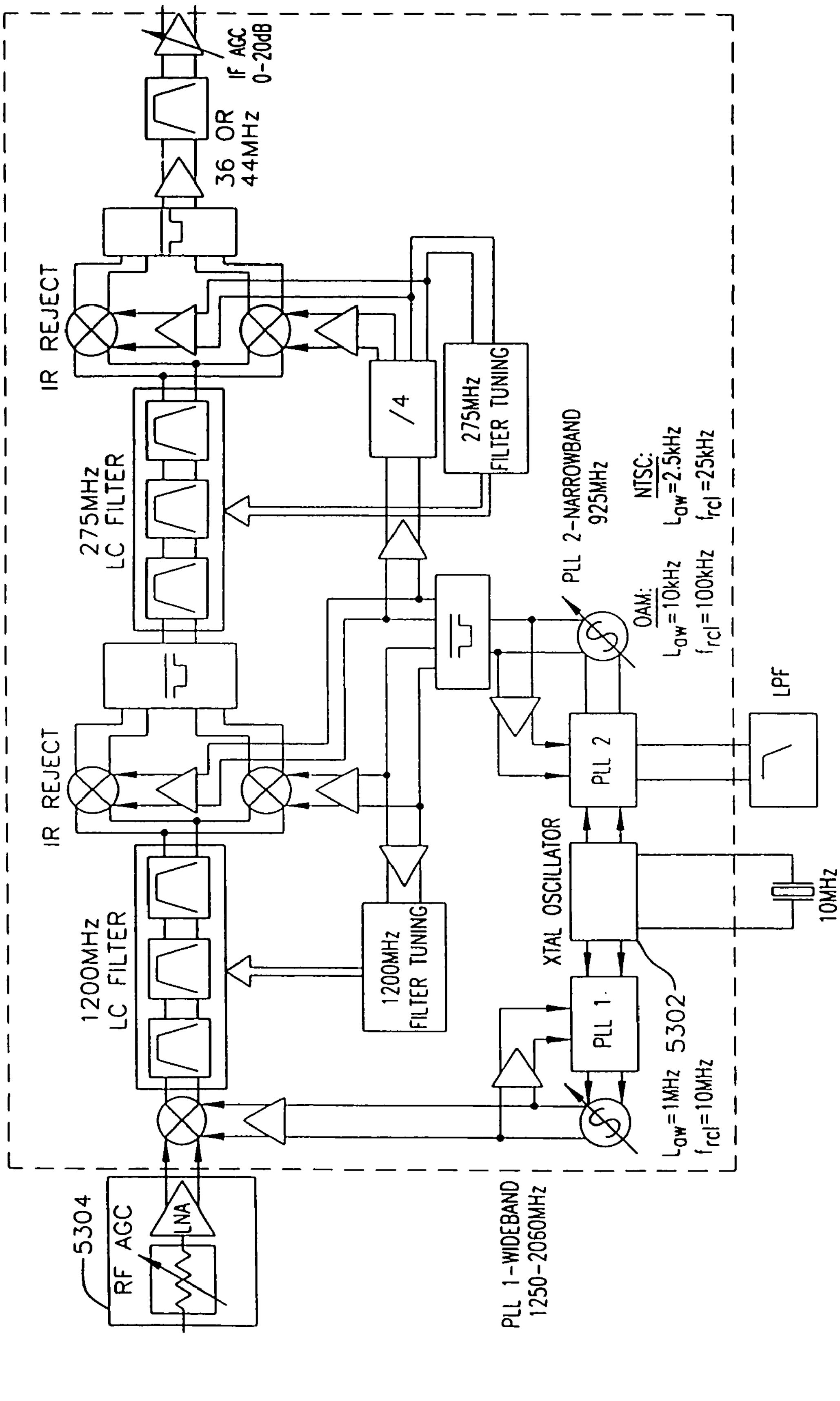

FIG. 48 is a block diagram of the first exemplary embodiment of the invention;

FIG. 49 is an illustration of the frequency planning utilized in the exemplary embodiments of the invention;

FIG. 50 is a block diagram showing how image frequency cancellation is achieved in an I/Q mixer;

FIG. 51 is a block diagram of the second exemplary embodiment of the present invention;

FIG. 52 is a block diagram of the third exemplary embodiment of the present invention;

FIG. 53 is a block diagram of a CATV tuner that incorporates the fully integrated tuner architecture;

Telephony Over Cable Embodiment Figure

Figure 54:
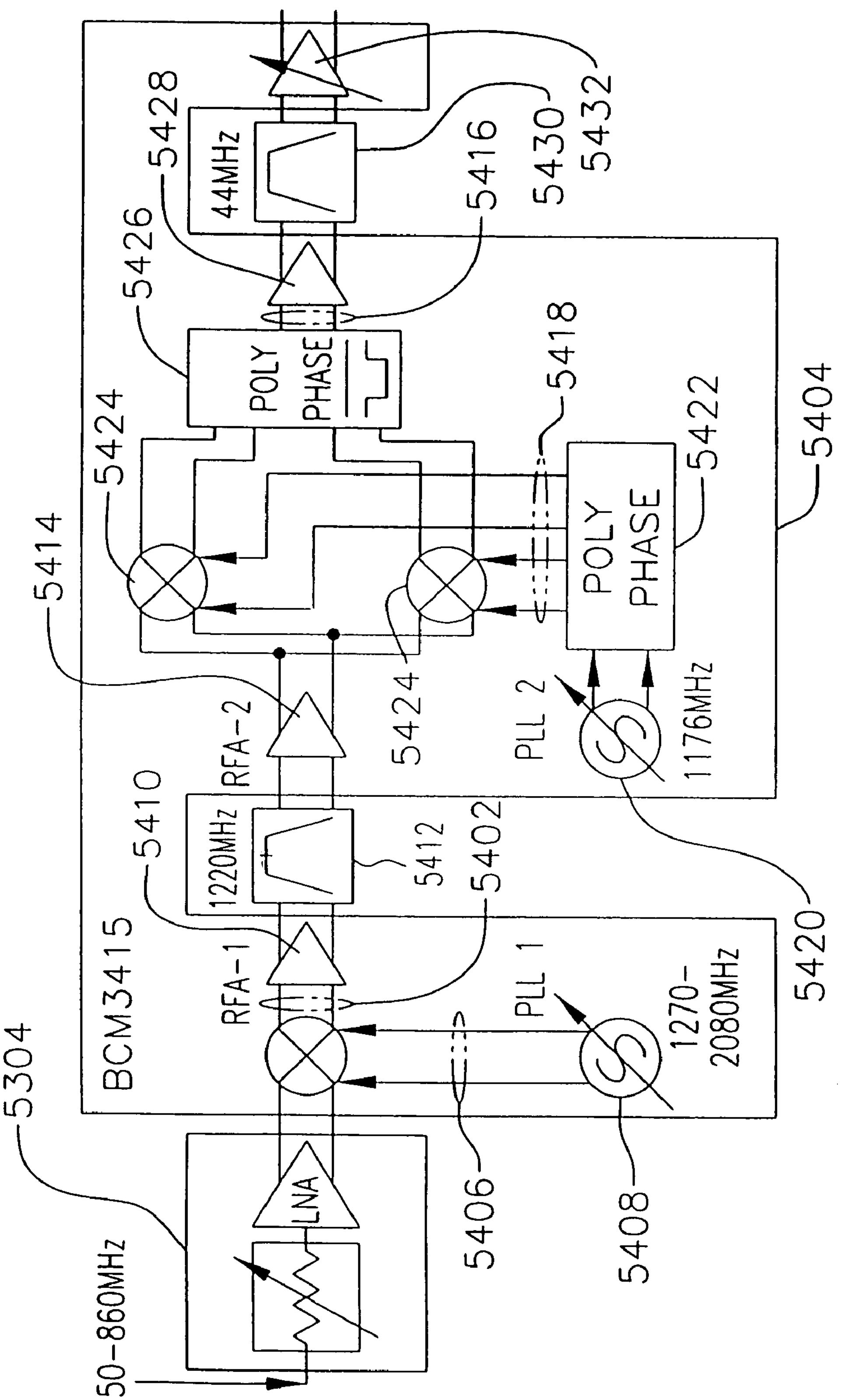

FIG. 54 is a block diagram of a low power embodiment of the receiver that has been configured to receive cable telephony signals.

Electronic Circuits Incorporating Embodiments of the Receiver Figures

Figure 55:
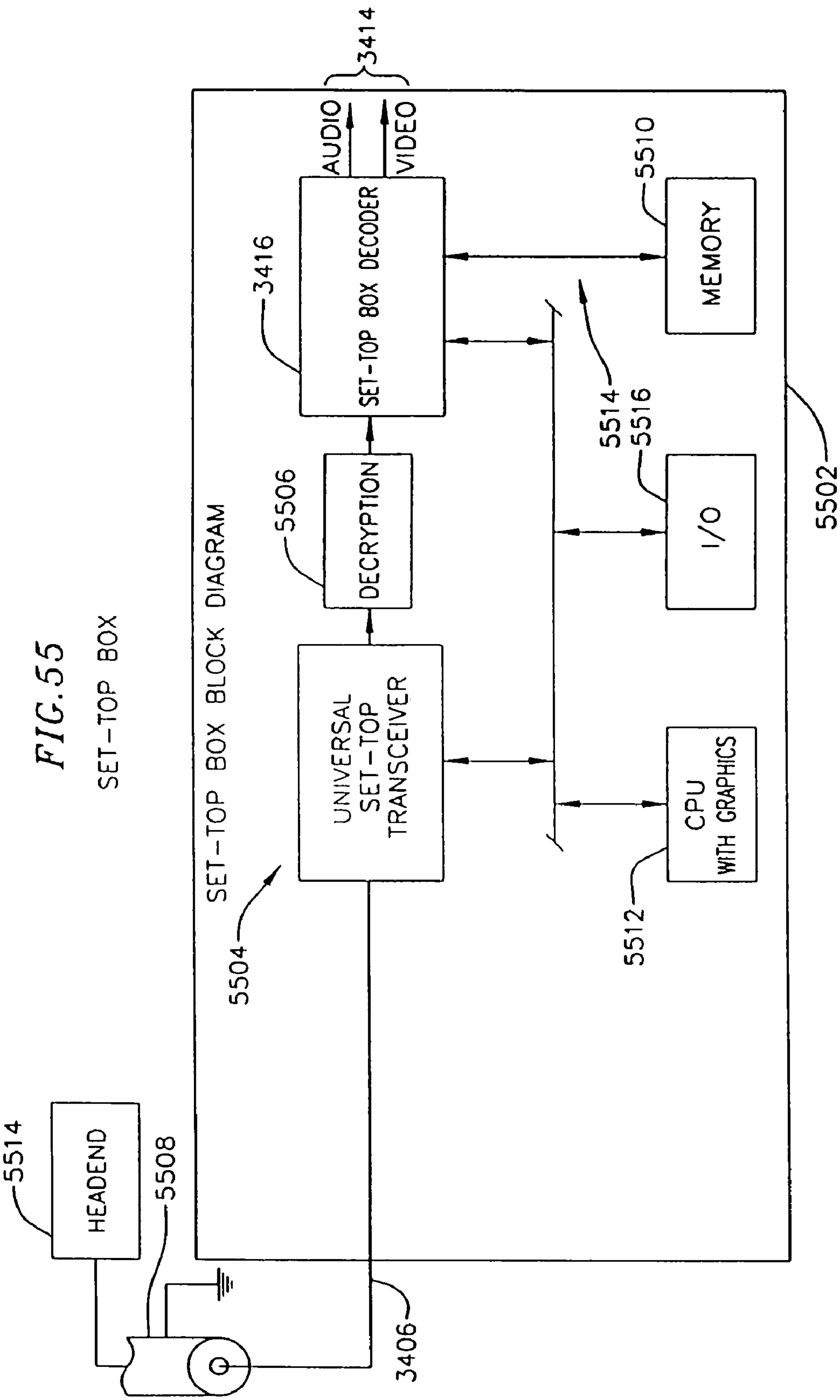
Figure 56:
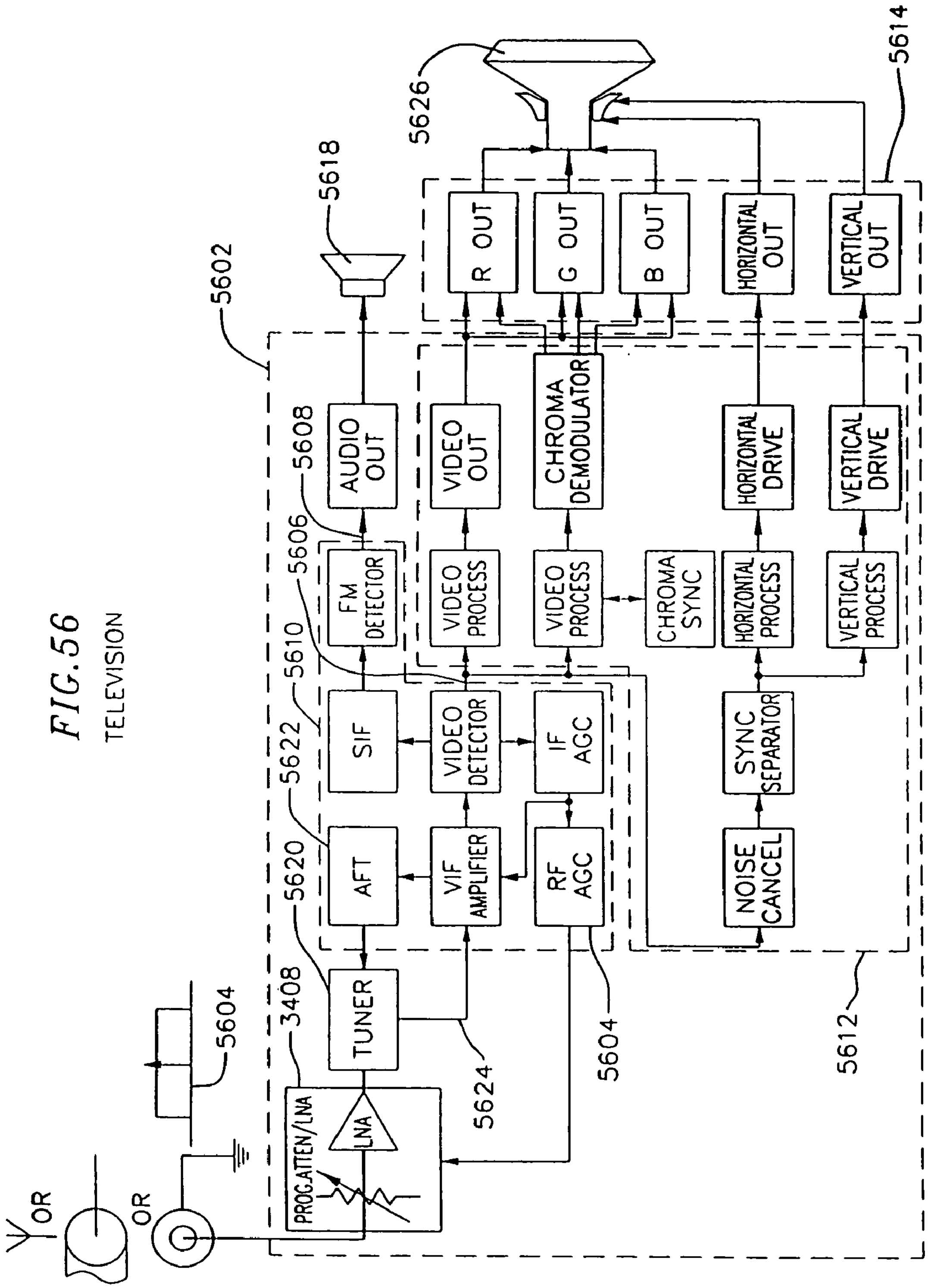
Figure 57:
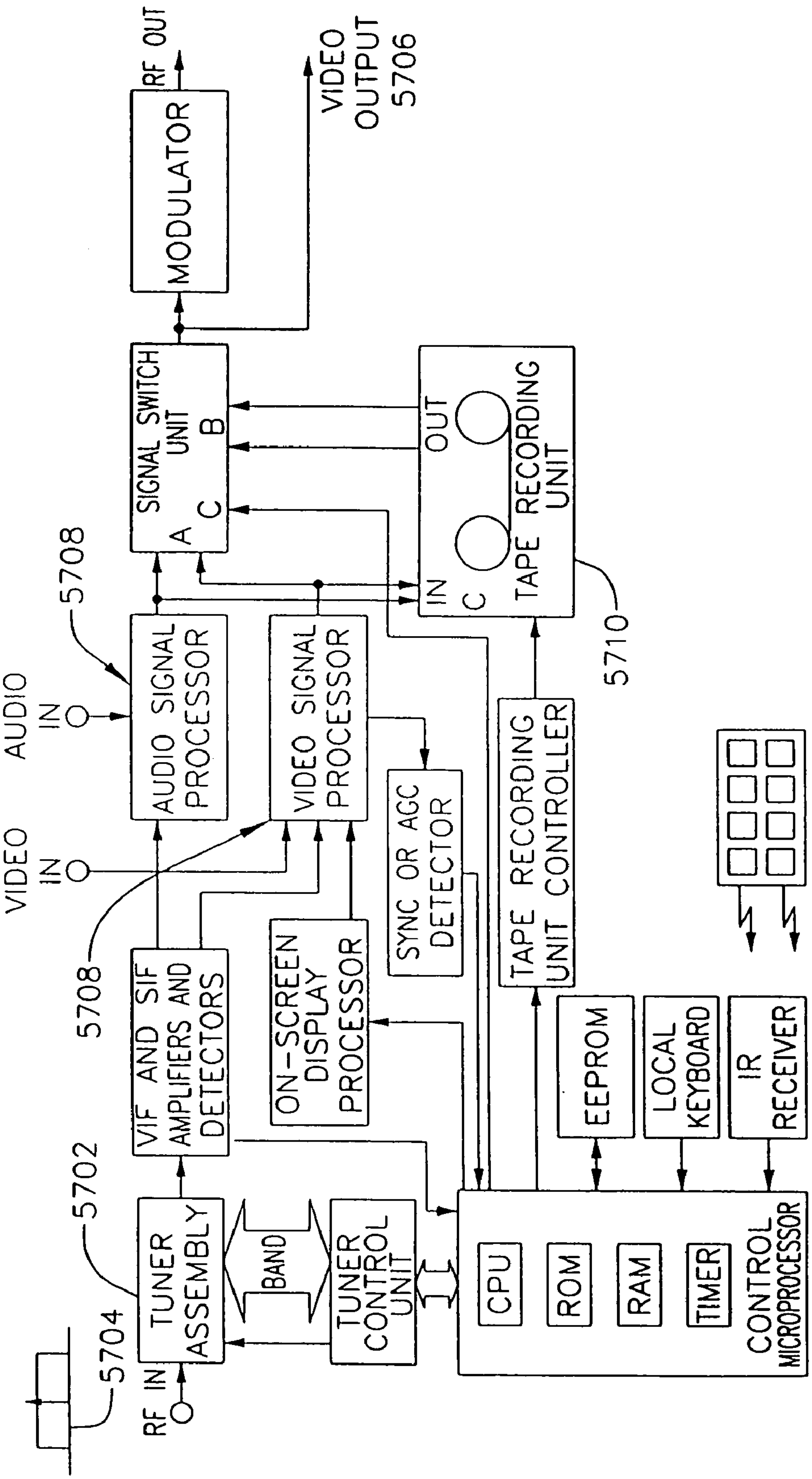
Figure 58:
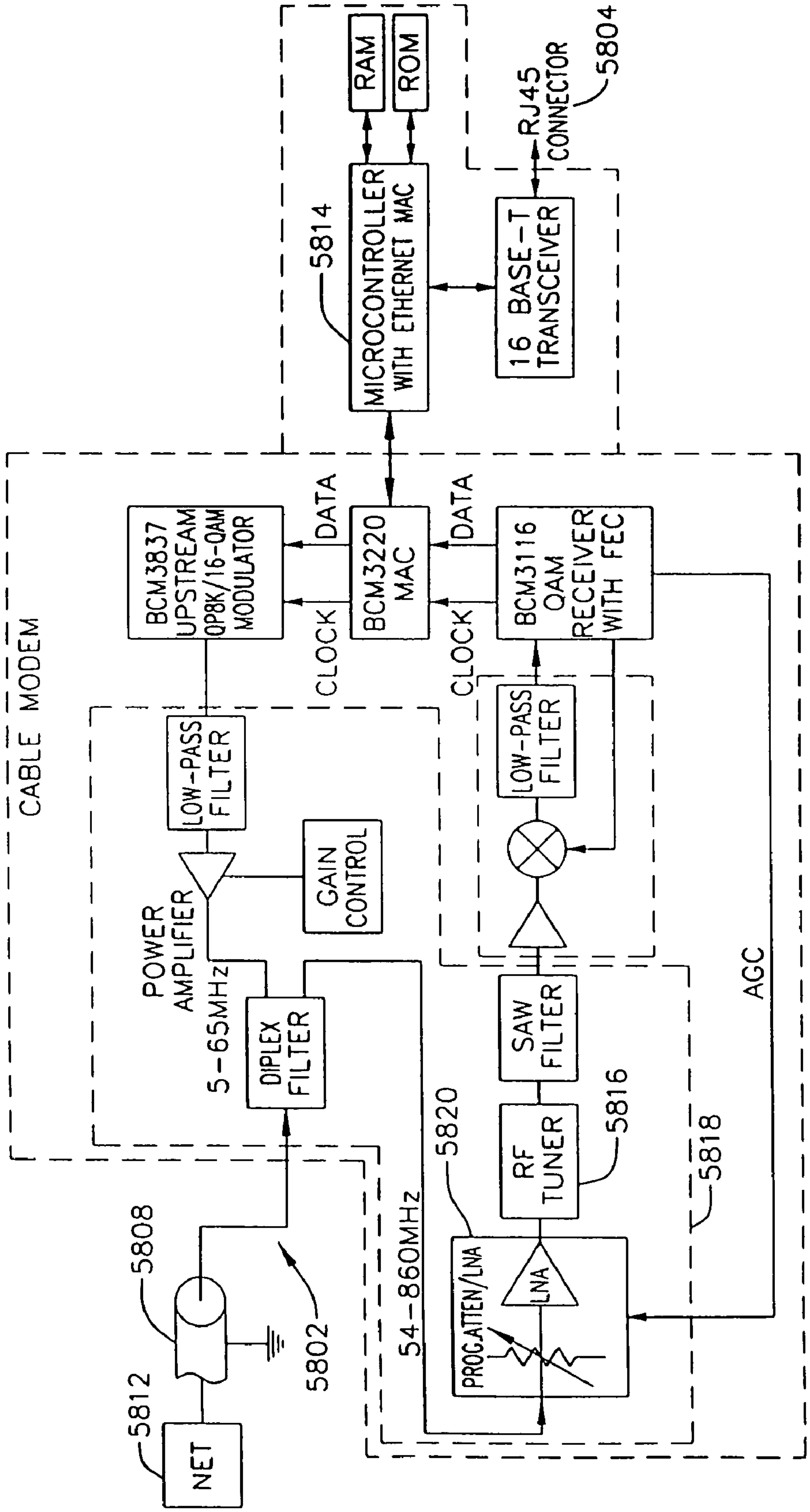

FIG. 55 is a block diagram of a set top box that incorporates the receiver embodiments;

FIG. 56 is a block diagram of a television that incorporates the receiver embodiments;

FIG. 57 is a block diagram of a VCR that incorporates the receiver embodiments;

FIG. 58 is a block diagram of a cable modem that incorporates the integrated switchless programmable attenuator and low noise amplifier;

ESD Protection Figures

Figure 59:
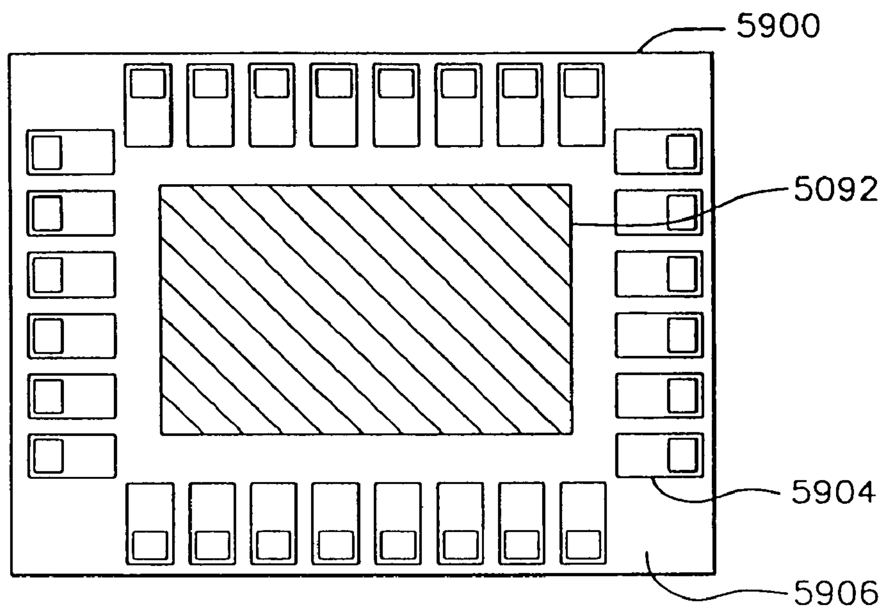
Figure 60:
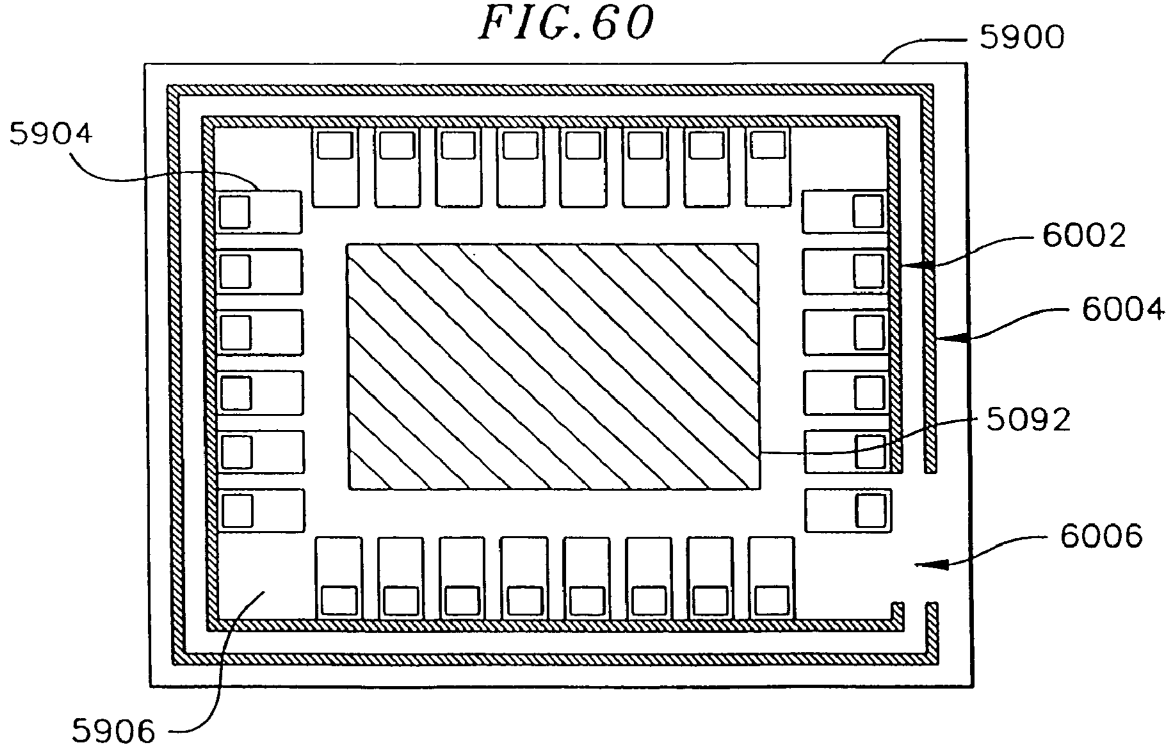
Figure 61:
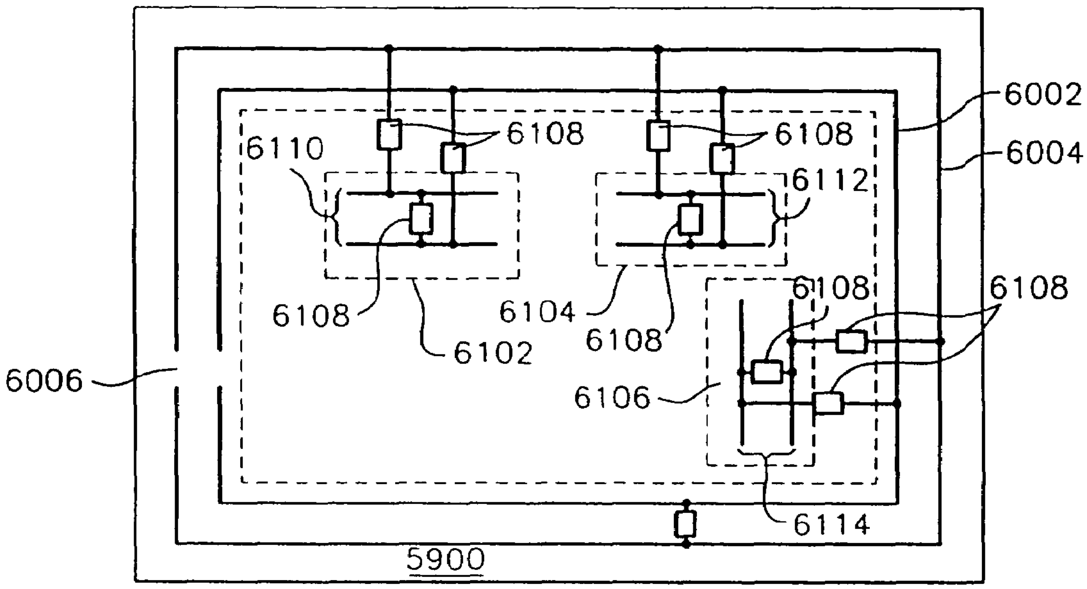
Figure 62:
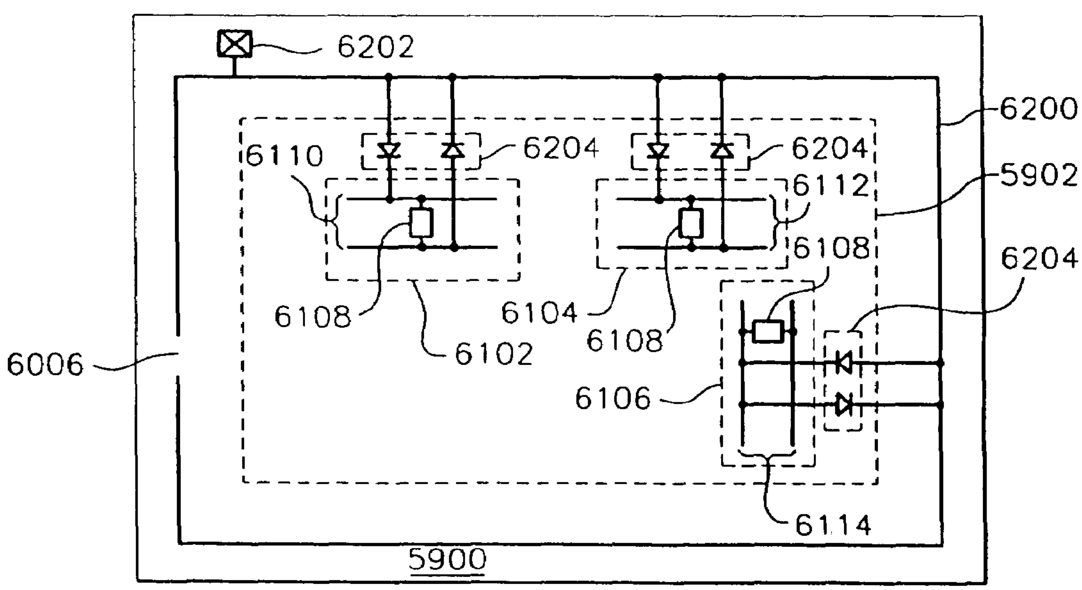
Figure 63:
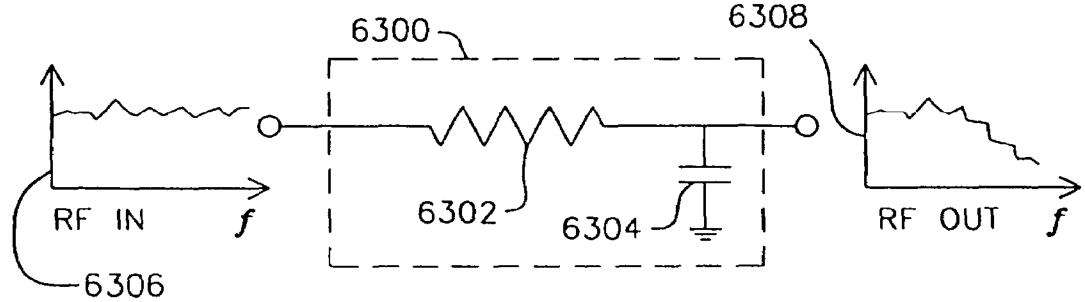
Figure 64:
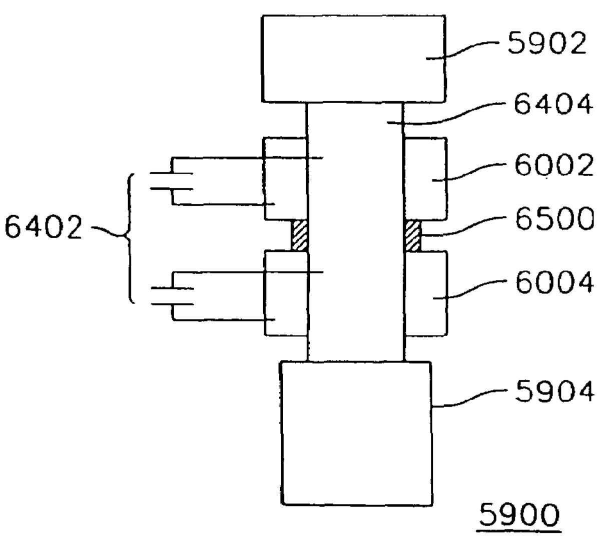
Figure 65:
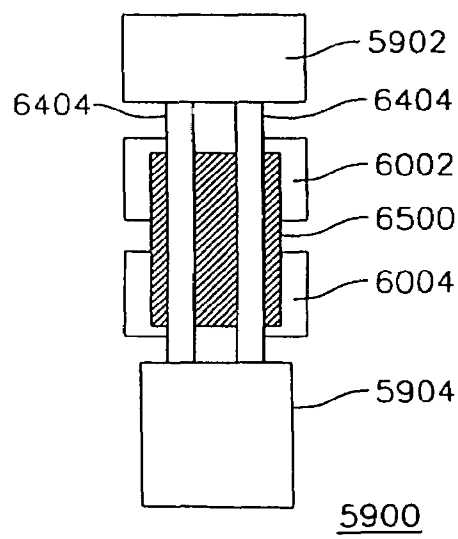
Figure 66:
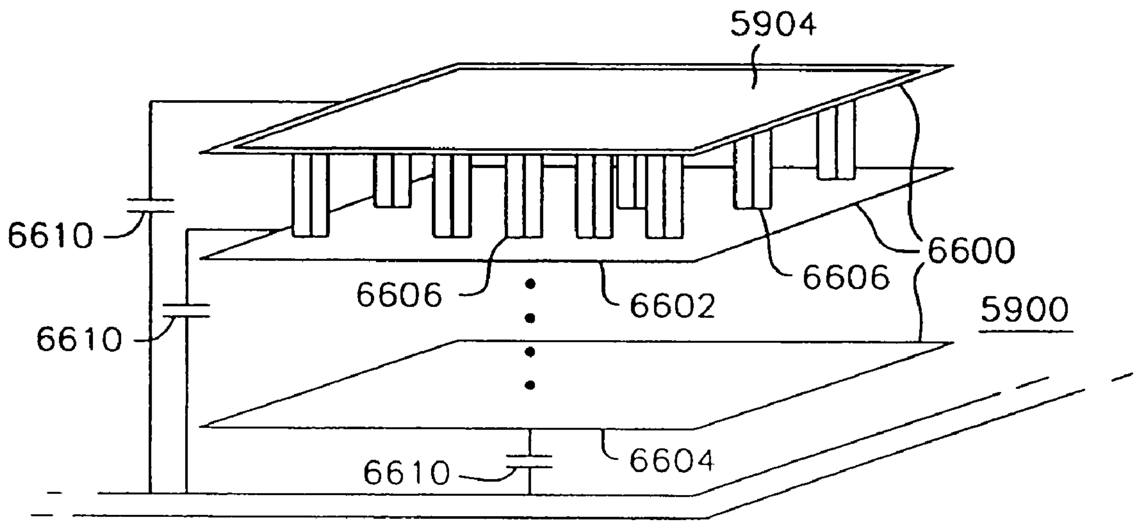
Figure 67:
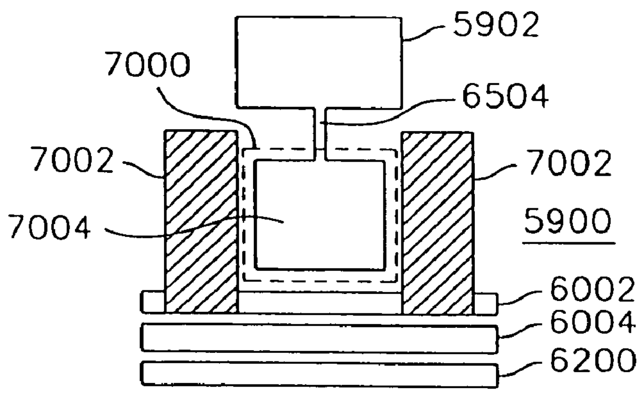
Figure 68:
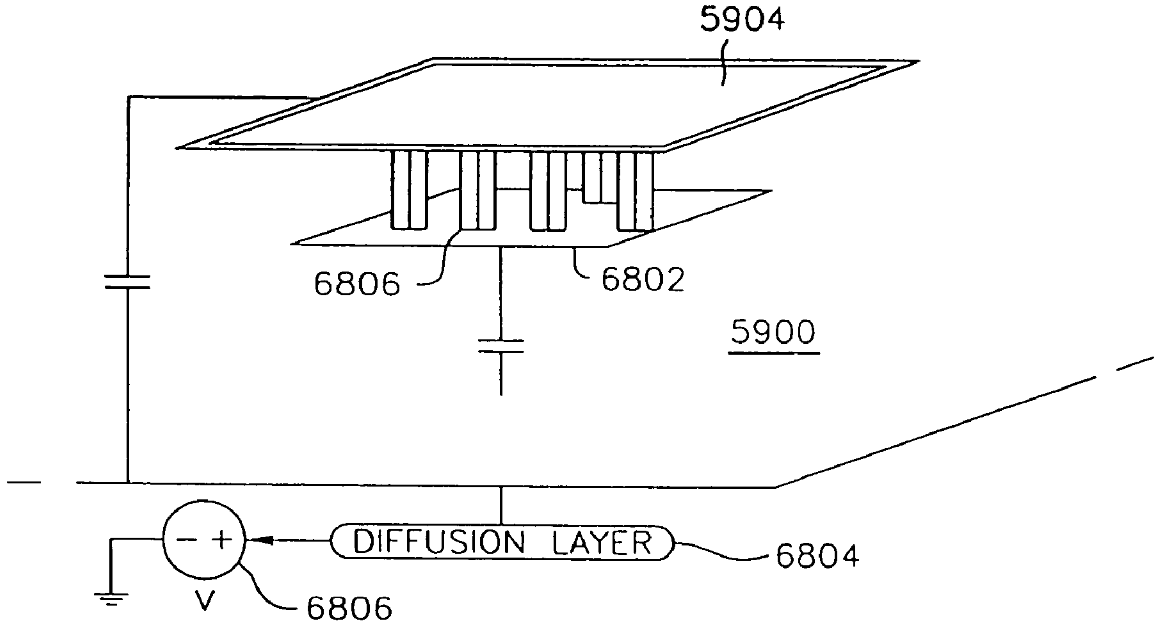
Figures 69A, 69B, 69C, 69D, 69E:
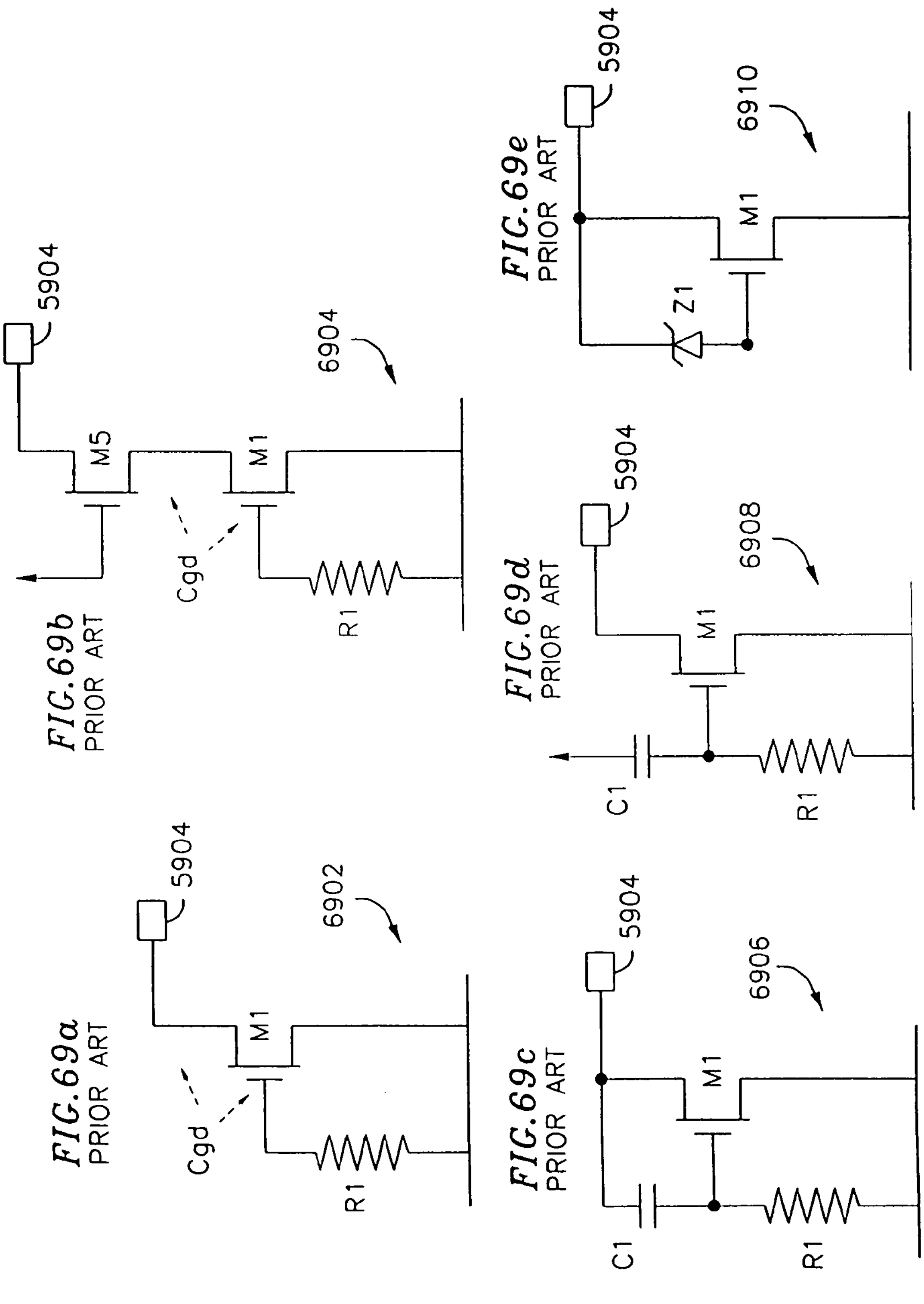
Figure 70:
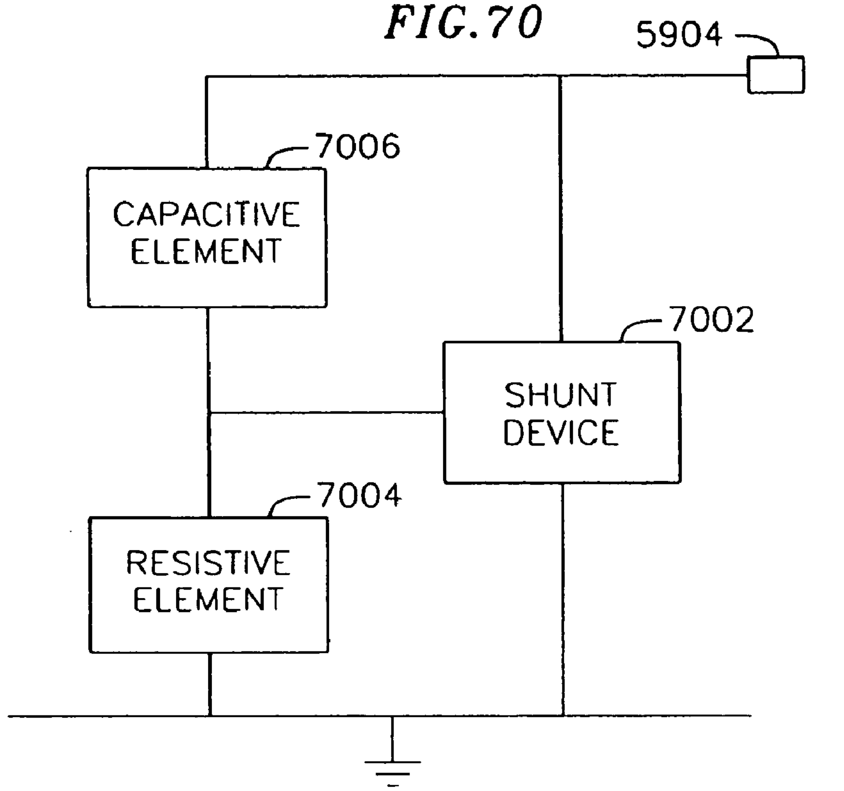
Figure 71:
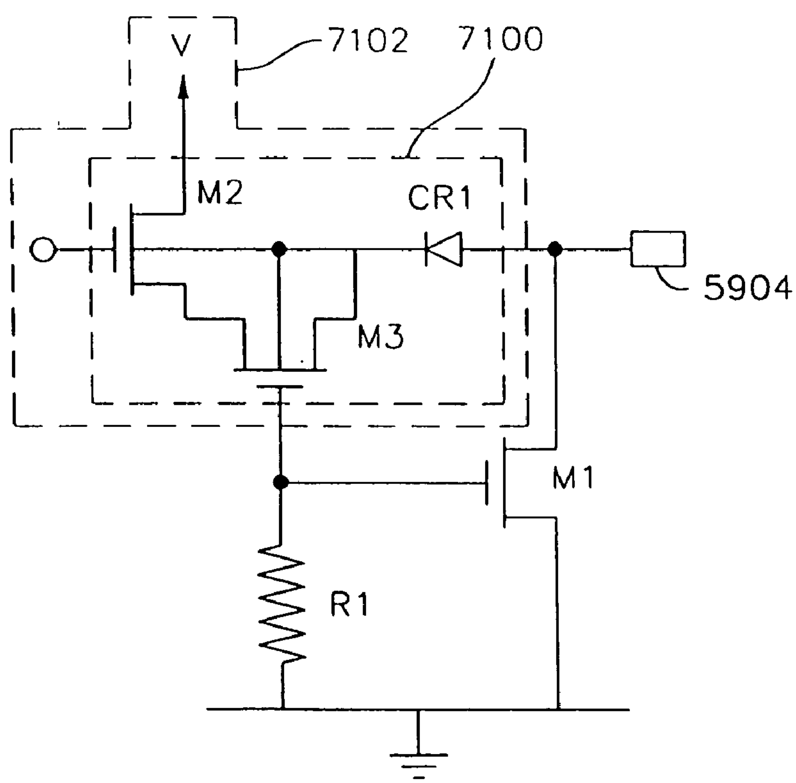
Figure 72:
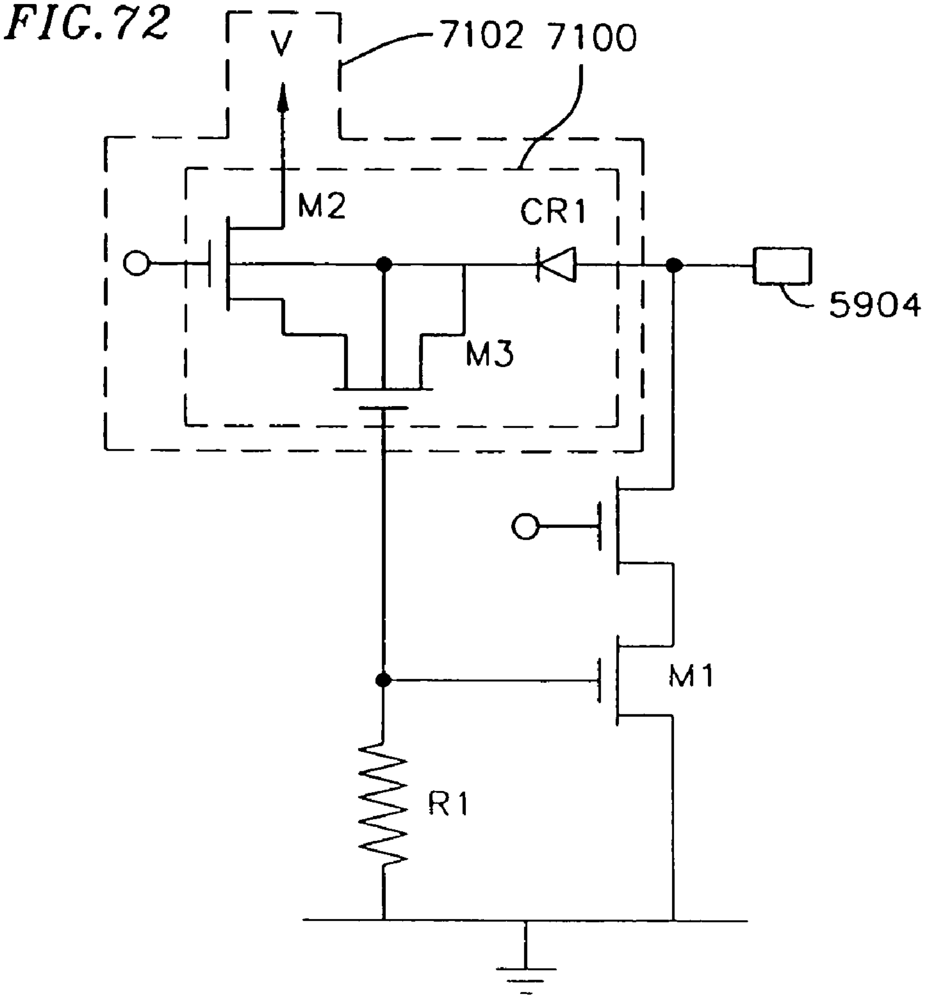
Figure 73:
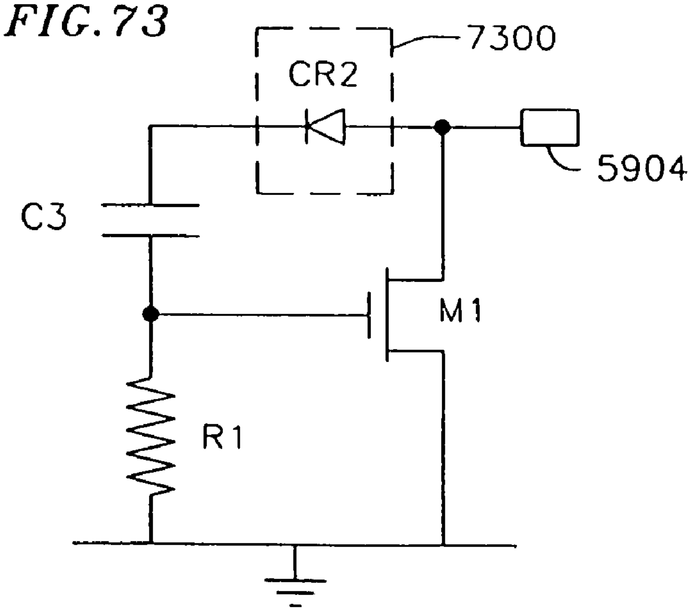

FIG. 59 is an illustration of a typical integrated circuit die layout;

FIG. 60 illustrates an embodiment of the invention that utilizes pad ring power and ground busses;

FIG. 61 is an illustration of the connection of a series of power domains to a pad ring bus structure;

FIG. 62 is an illustration of an embodiment utilizing an ESD ground ring;

FIG. 63 is an illustration of the effect of parasitic circuit elements on an RF input signal;

FIG. 64 illustrates a cross-talk coupling mechanism;

FIG. 65 is an illustration of an ESD device disposed between a connection to a bonding pad and power supply traces;

FIG. 66 is an illustration of parasitic capacitance in a typical bonding pad arrangement on an integrated circuit;

FIG. 67 is an illustration of a embodiment of a bonding pad arrangement tending to reduce parasitic capacitances;

FIG. 68 illustrates a cross section of the bonding pad structure of FIG. 67;

FIGS. 69*a*–69*e* illustrate various ESD protection schemes utilized in the state of the art to protect an integrated circuit from ESD discharge due to charge build up on a die pad;

FIG. 70 illustrates an approach to pad protection during ESD event;

FIG. 71 is a schematic of a circuit immune to noise that uses an ggNMOS' $C_{ad}$ and a gate boosting structure to trigger ESD protection;

FIG. 72 is a schematic of an alternative embodiment utilizing the gate boosting structure and a cascade configuration; and FIG. 73 is a schematic of an embodiment that does not require a quiet power supply.

IF AGC Amplifier Figures

Figure 74:
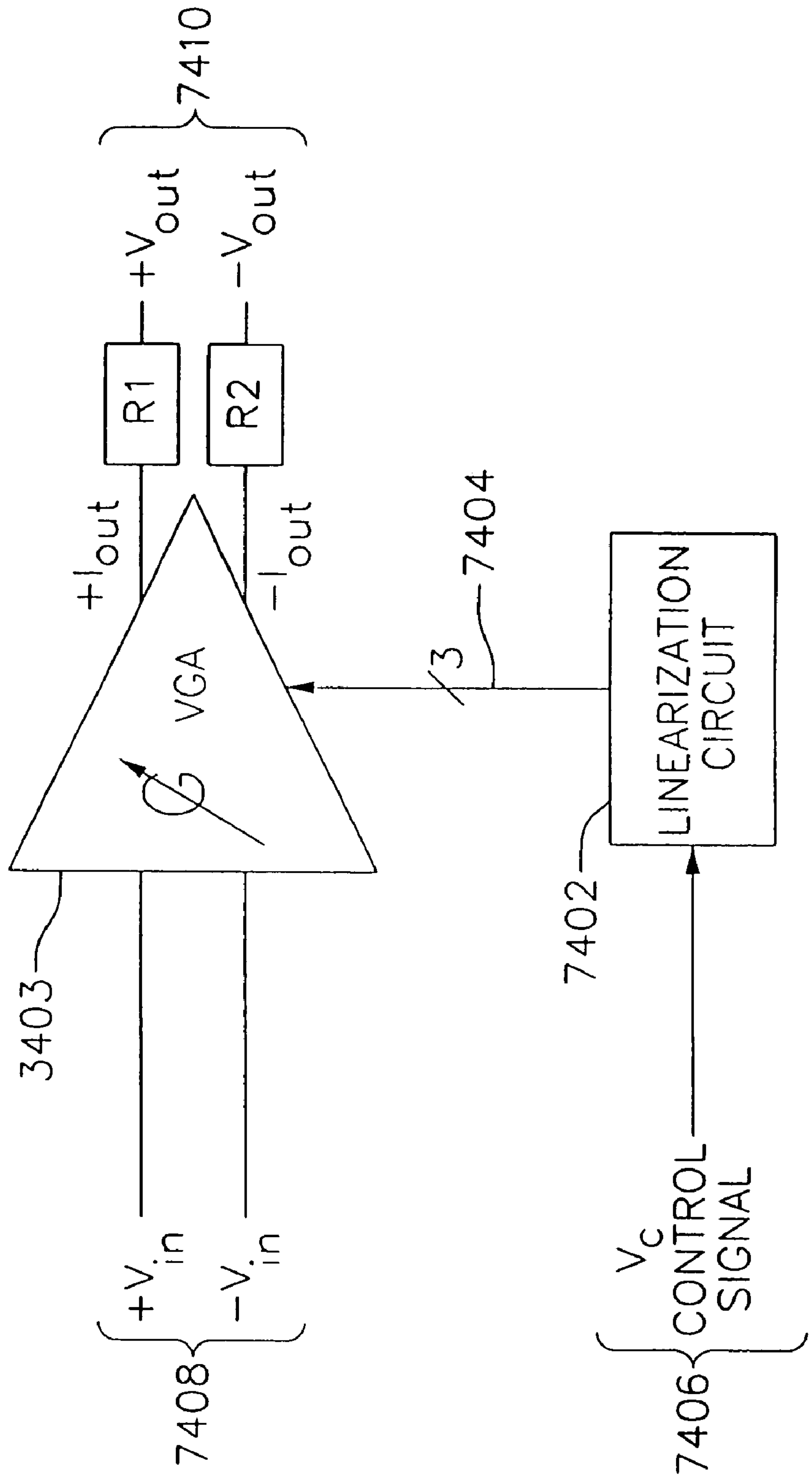
Figure 75:
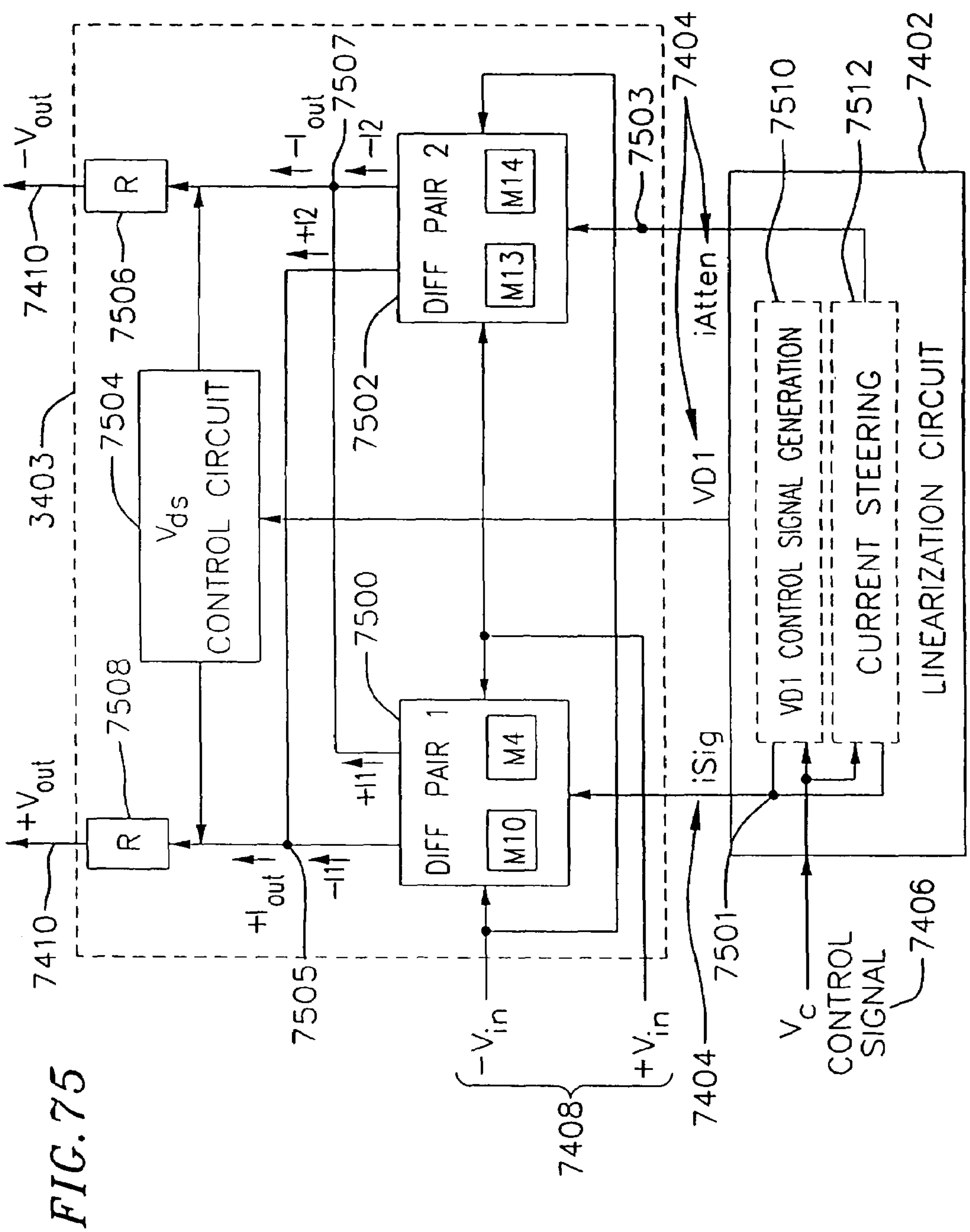
Figure 76:
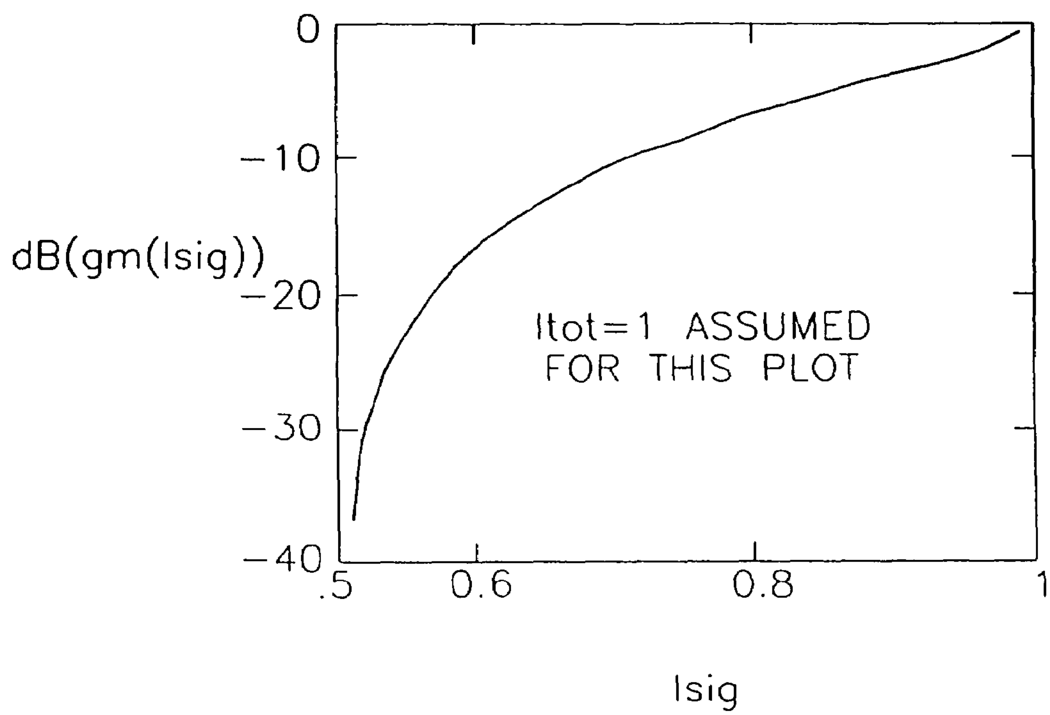
Figure 77:
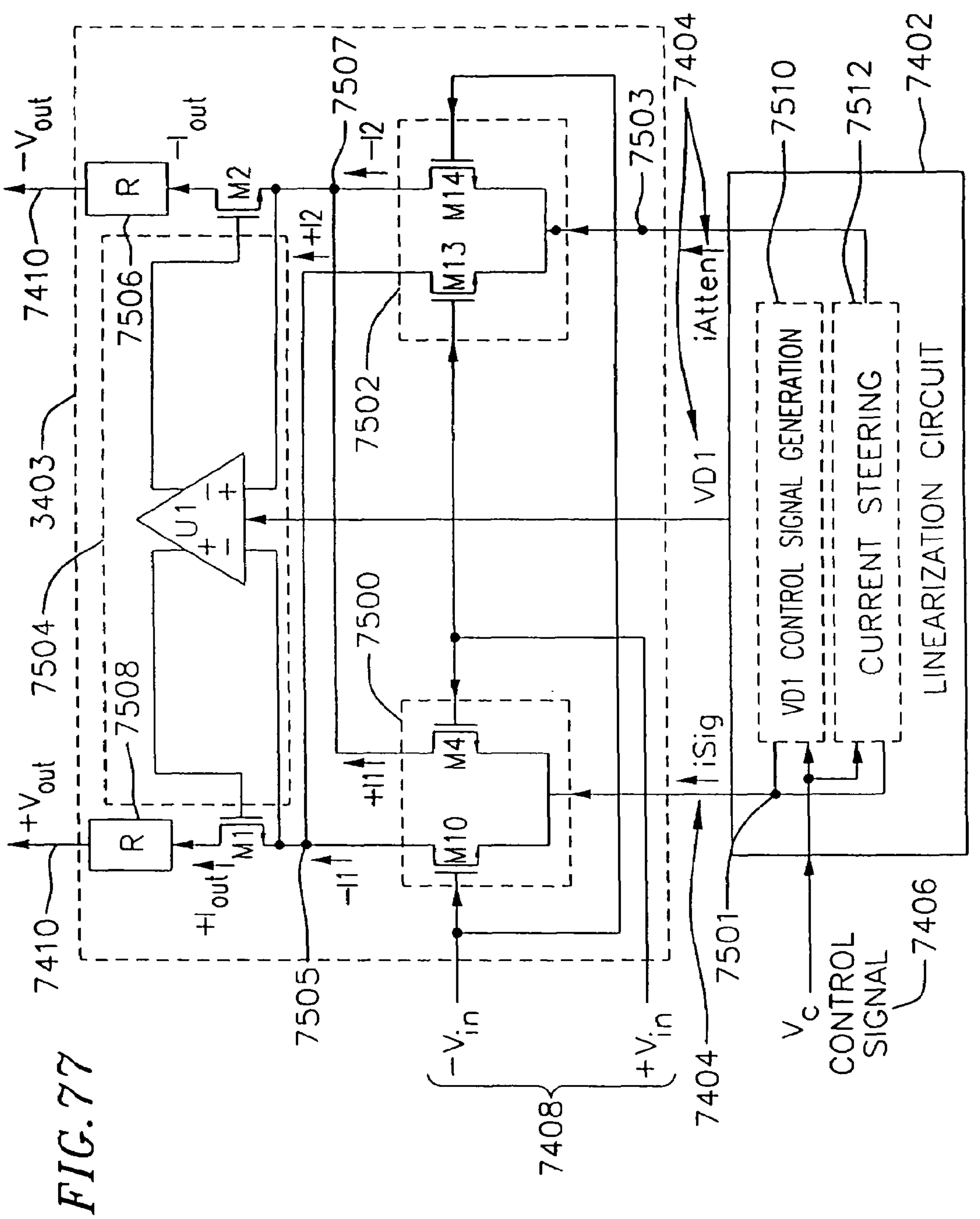
Figure 78A:
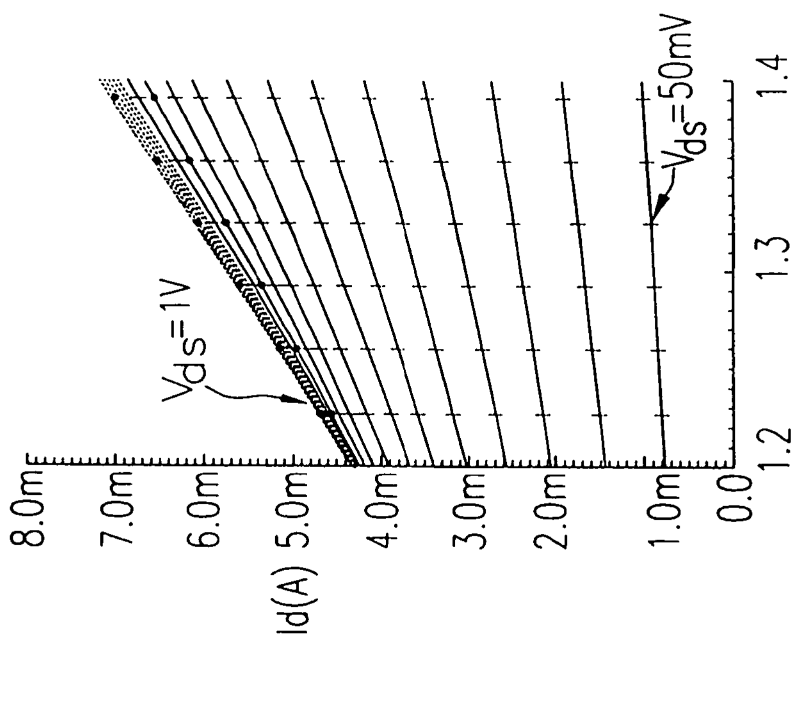
Figure 78B:
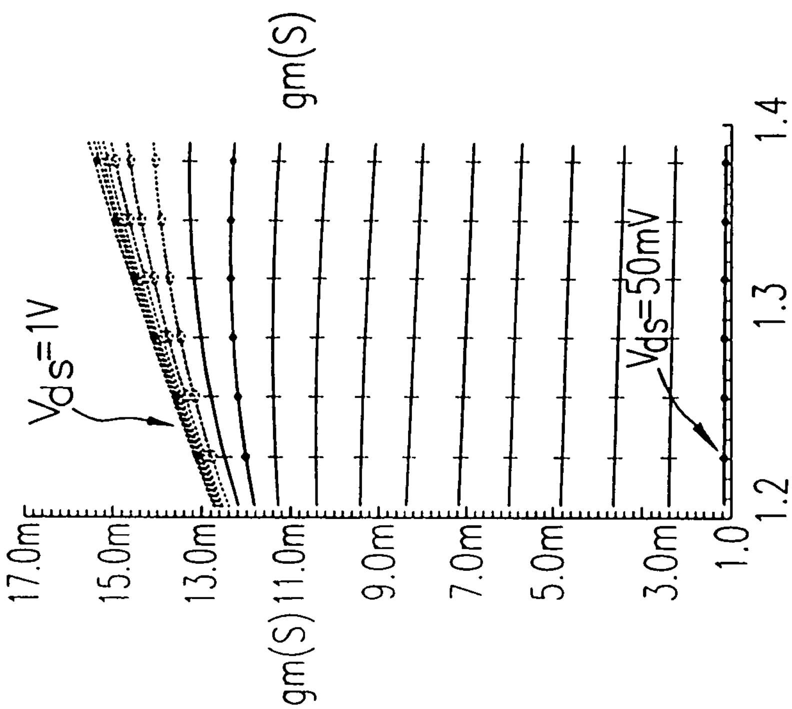
Figure 78C:
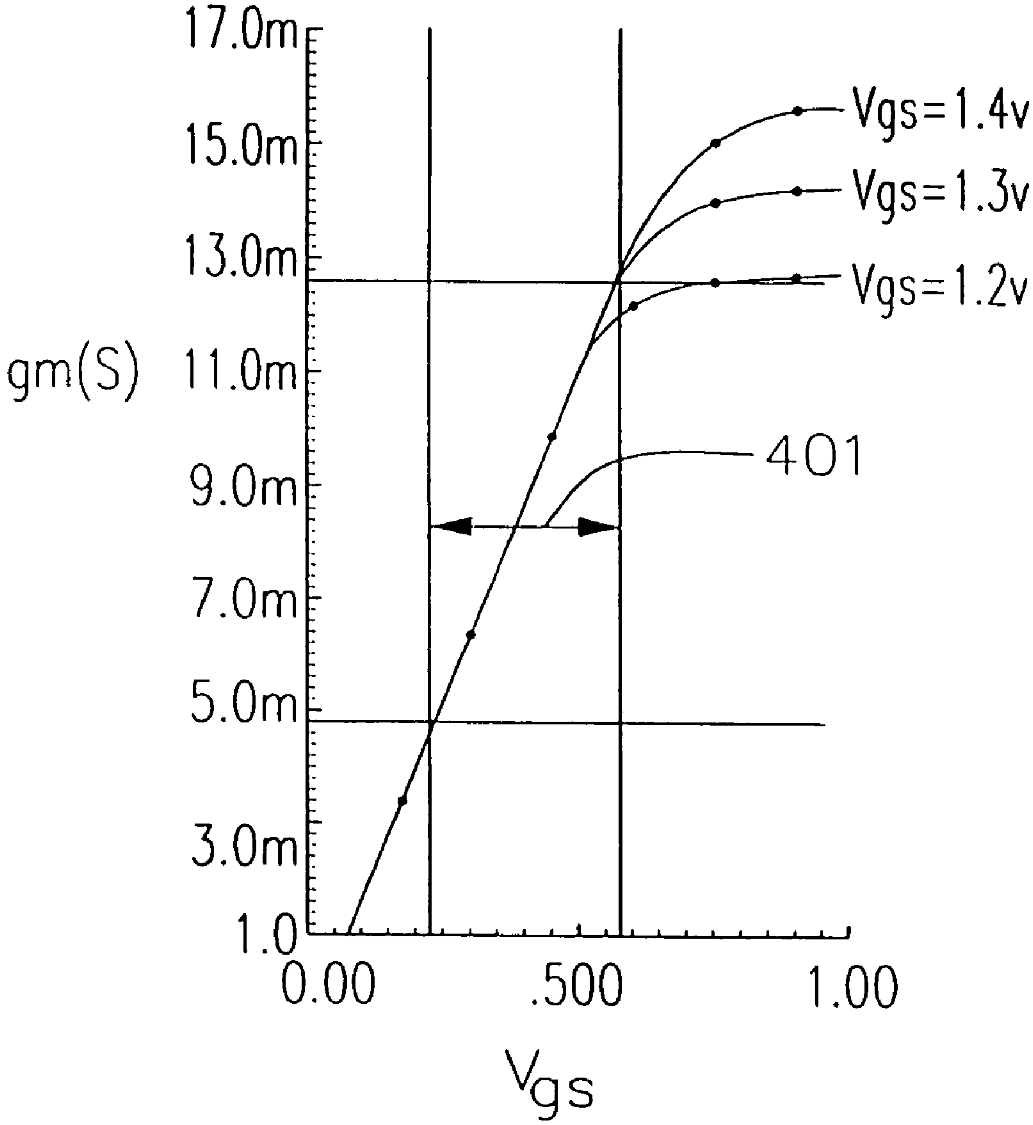
Figure 79:
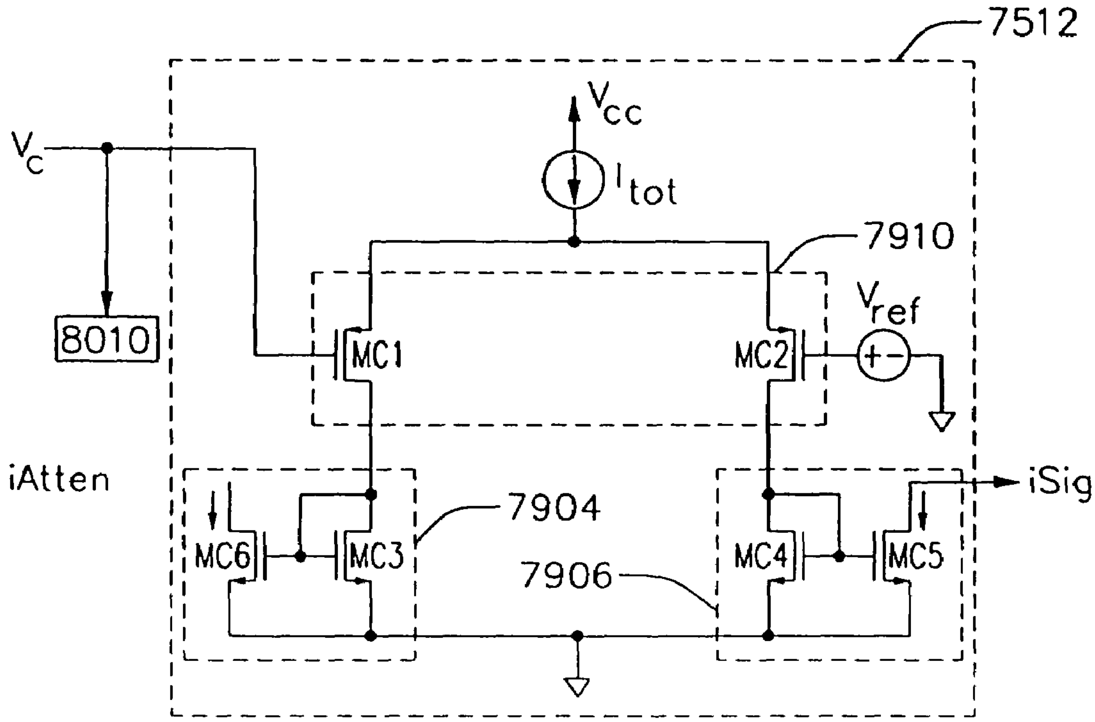
Figure 80A:
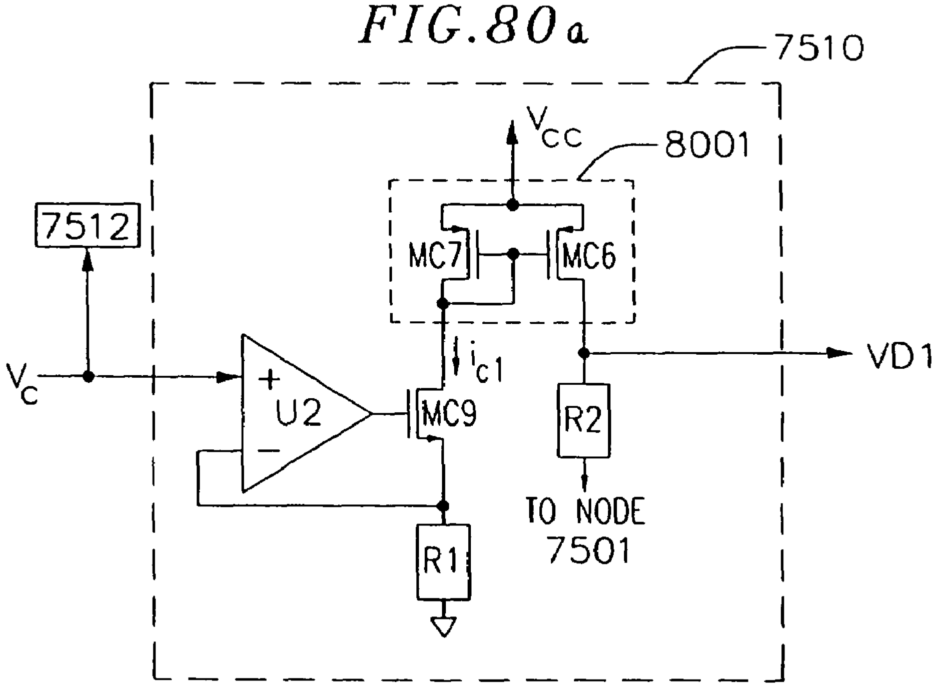

FIG. 74 is a block diagram of a variable gain amplifier ("VGA");

FIG. 75, is a block diagram of the internal configuration of the VGA and the liberalization circuit;

FIG. 76 is a graph of gain versus the control current iSig. Control current iSig is shown as a fraction of iAtten, with the total current being equal to 1, or 100%;

FIG. 77 is the schematic diagram of an embodiment of the VGA. The VGA has a control circuit to control the $V_{ds}$ of M10 and M13 at node 7505, and the $V_{ds}$ of M4 and M14 at node 7507;

FIG. 78*a* illustrates a family of curves showing the relationship of a transistor's drain current ("$I_d$") to its gate source voltage ("$V_{gs}$") measured at each of a series of drain source voltages ("$V_{ds}$") from 50 mV to 1 V;

FIG. 78*b* is a graph of $g_m$ verses $V_{gs}$ as $V_{ds}$ is varied from 50 mV to 1 V;

FIG. 78*c* is a graph of the cross-section of FIG. 78*b* plotting $g_m$ verses $V_{ds}$ for various values of $V_{gs}$;

FIG. 79 is a schematic of a current steering circuit;

FIG. 80*a* is a schematic of a VD1 control signal generation circuit.

Figure 80B:
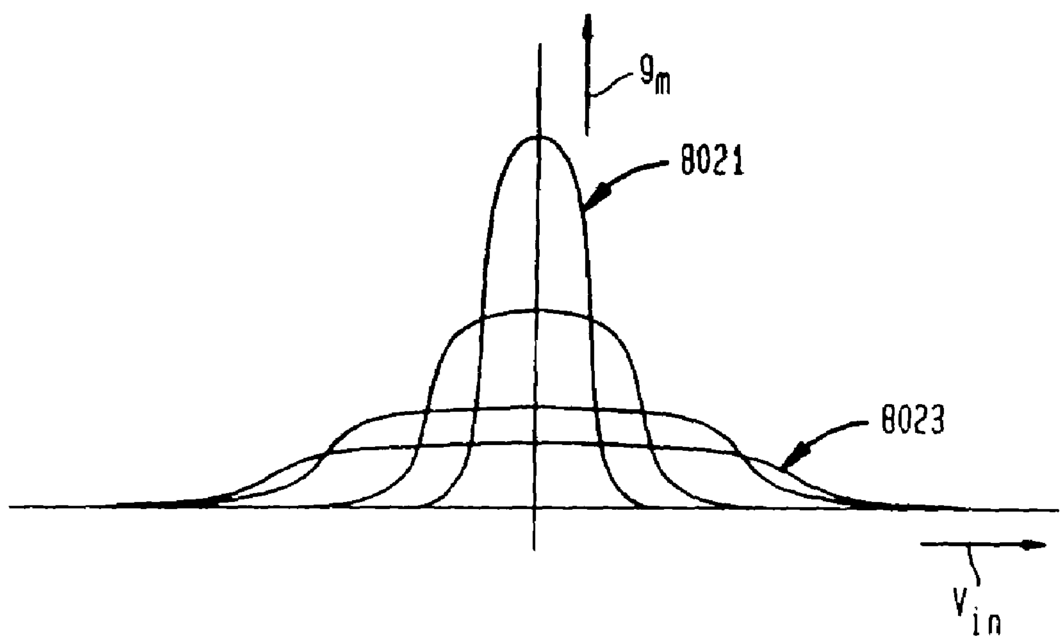
Figure 80C:
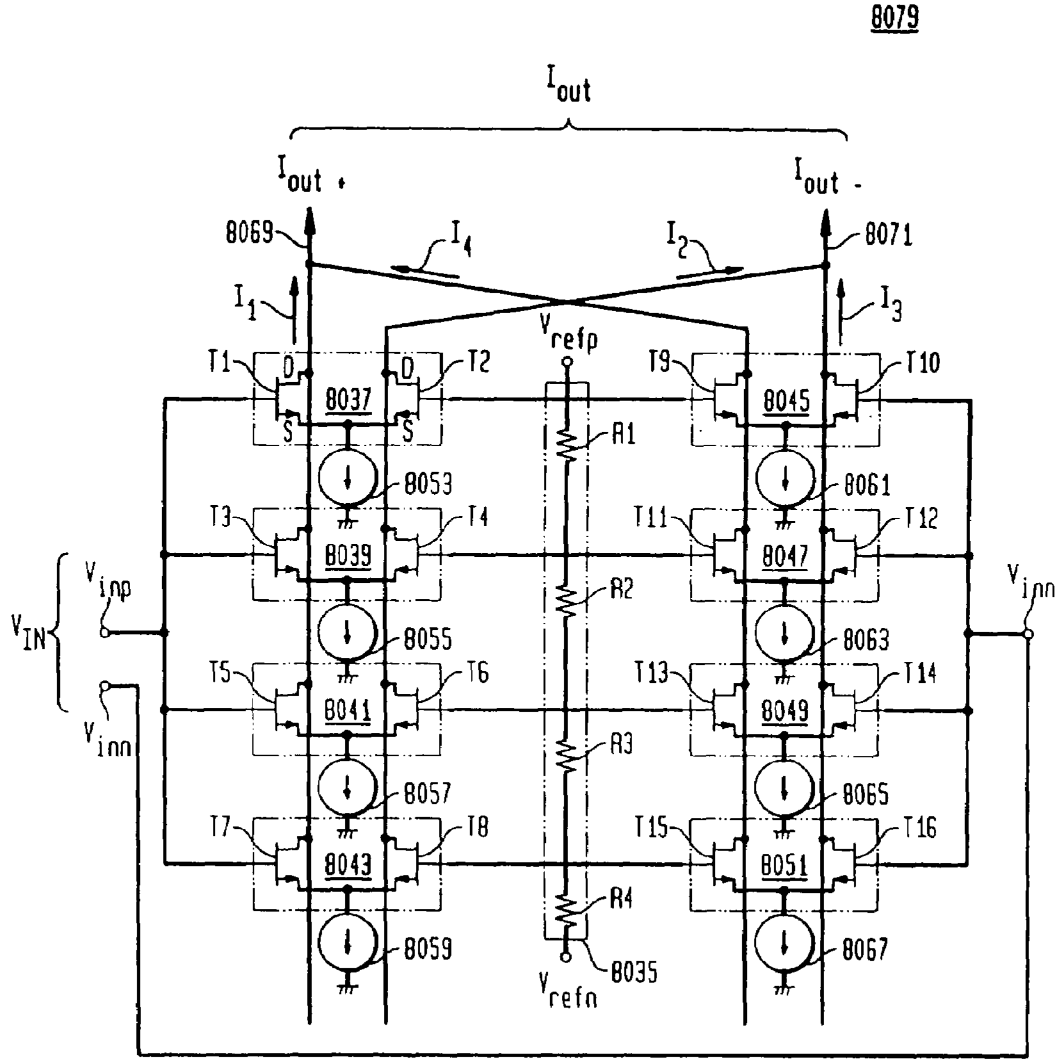
Figure 80D:
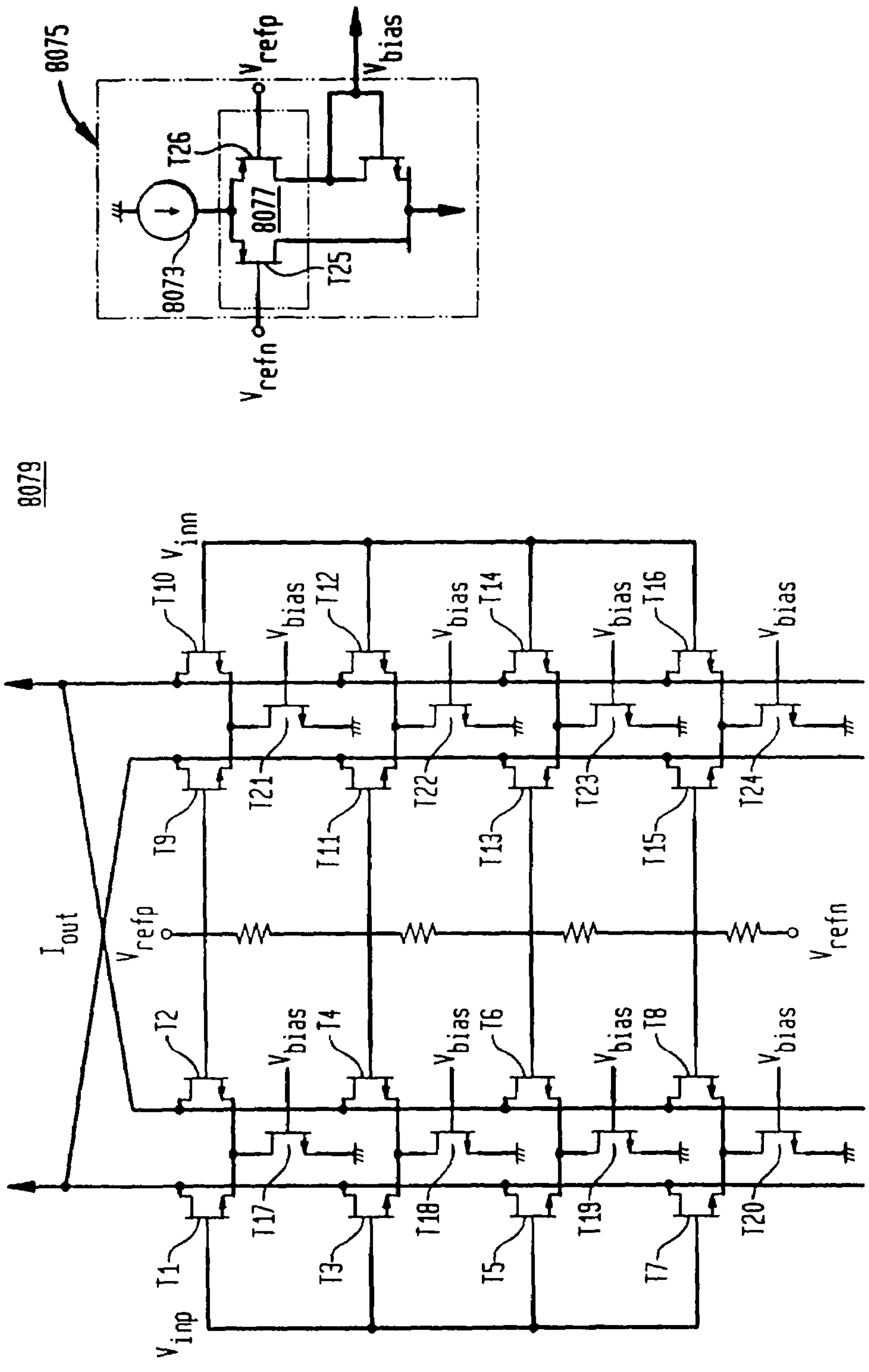

FIG. 80*b* is a graph of composite transconductance vs. differential input voltage $V_{in}$, for a set of differential pair transistors coupled in parallel, and having varying degrees of offset introduced at the gates of each differential pair;

FIG. 80*c* is a schematic of an embodiment of a low voltage VGA. the embodiment shown of the low voltage VGA is disposed upon a semiconductor substrate;

FIG. 80*d* is a schematic diagram of a low voltage VGA having an increased gain range;

Digital IF Demodulator Figures

Figure 81:
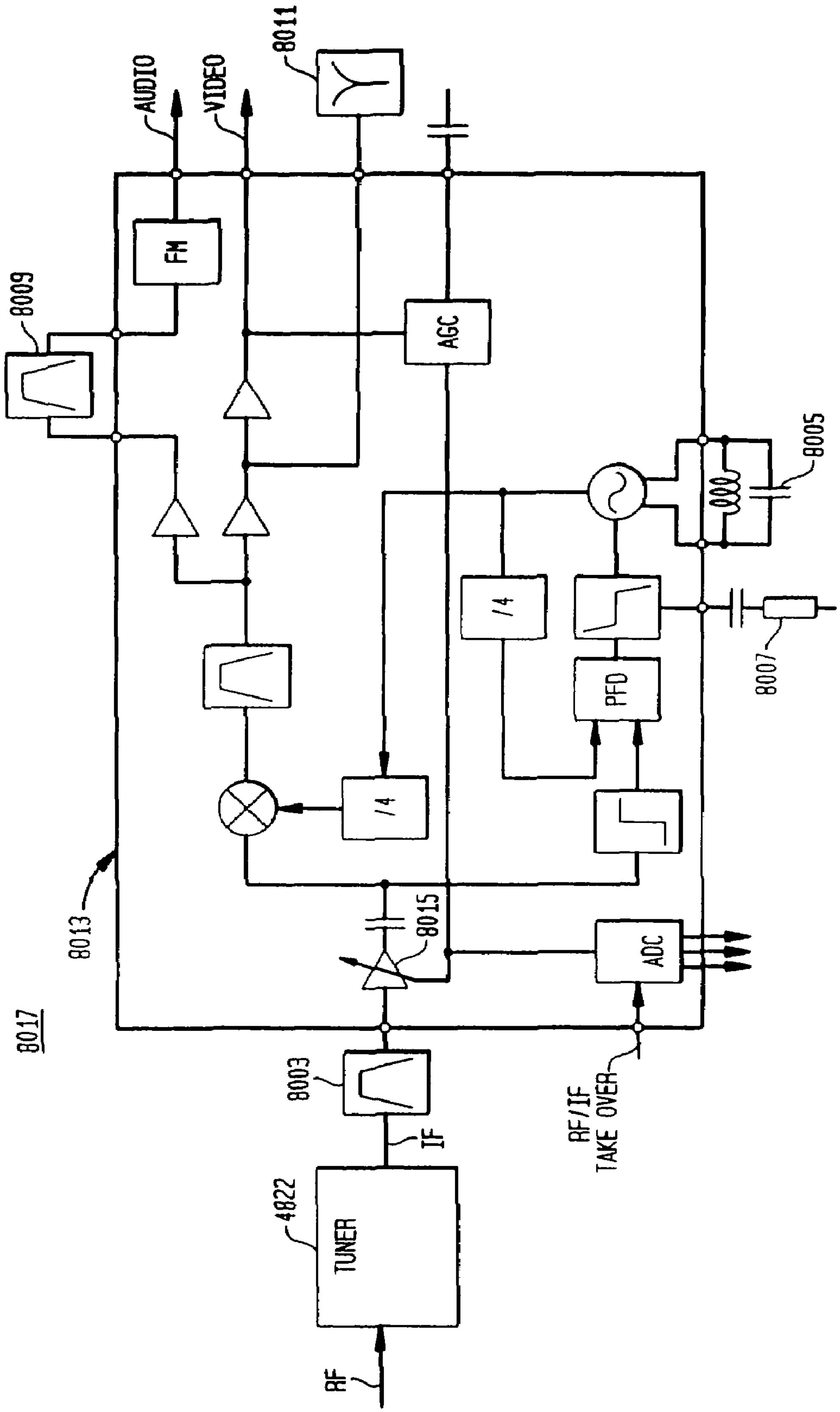
Figure 82:
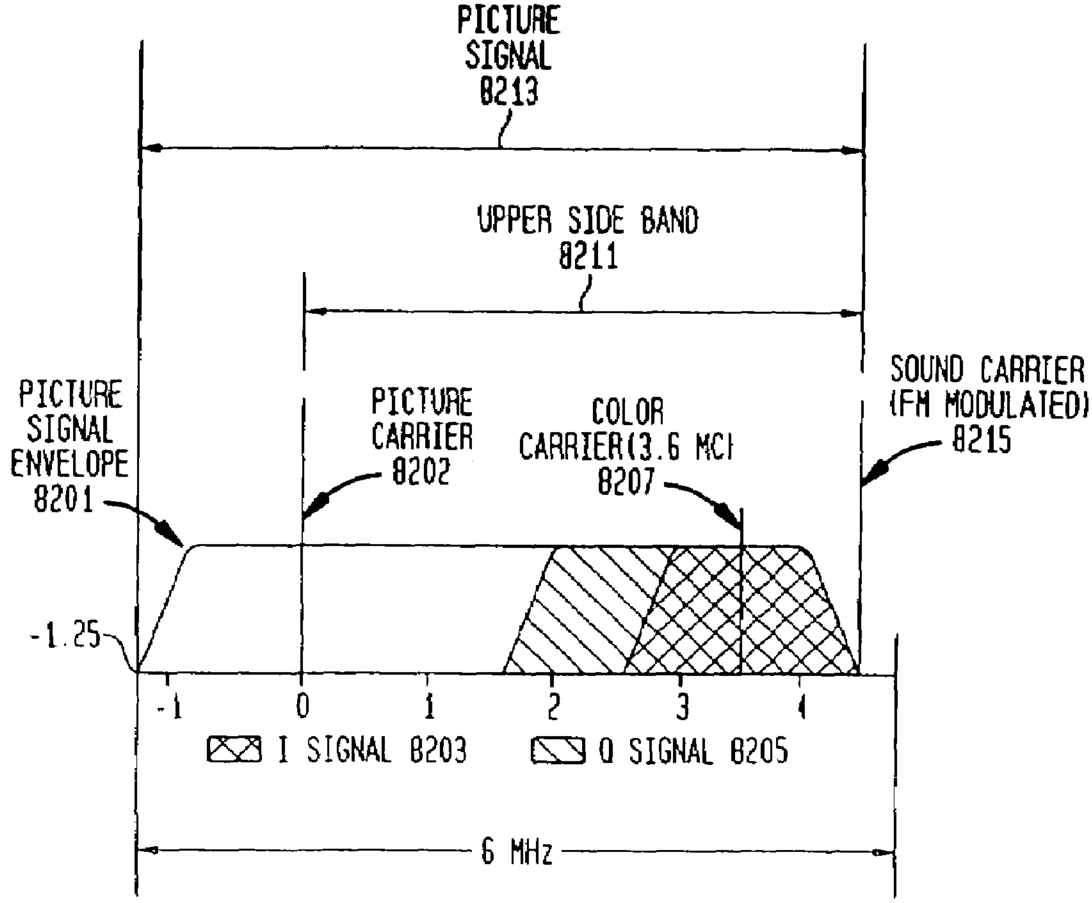
Figure 83:
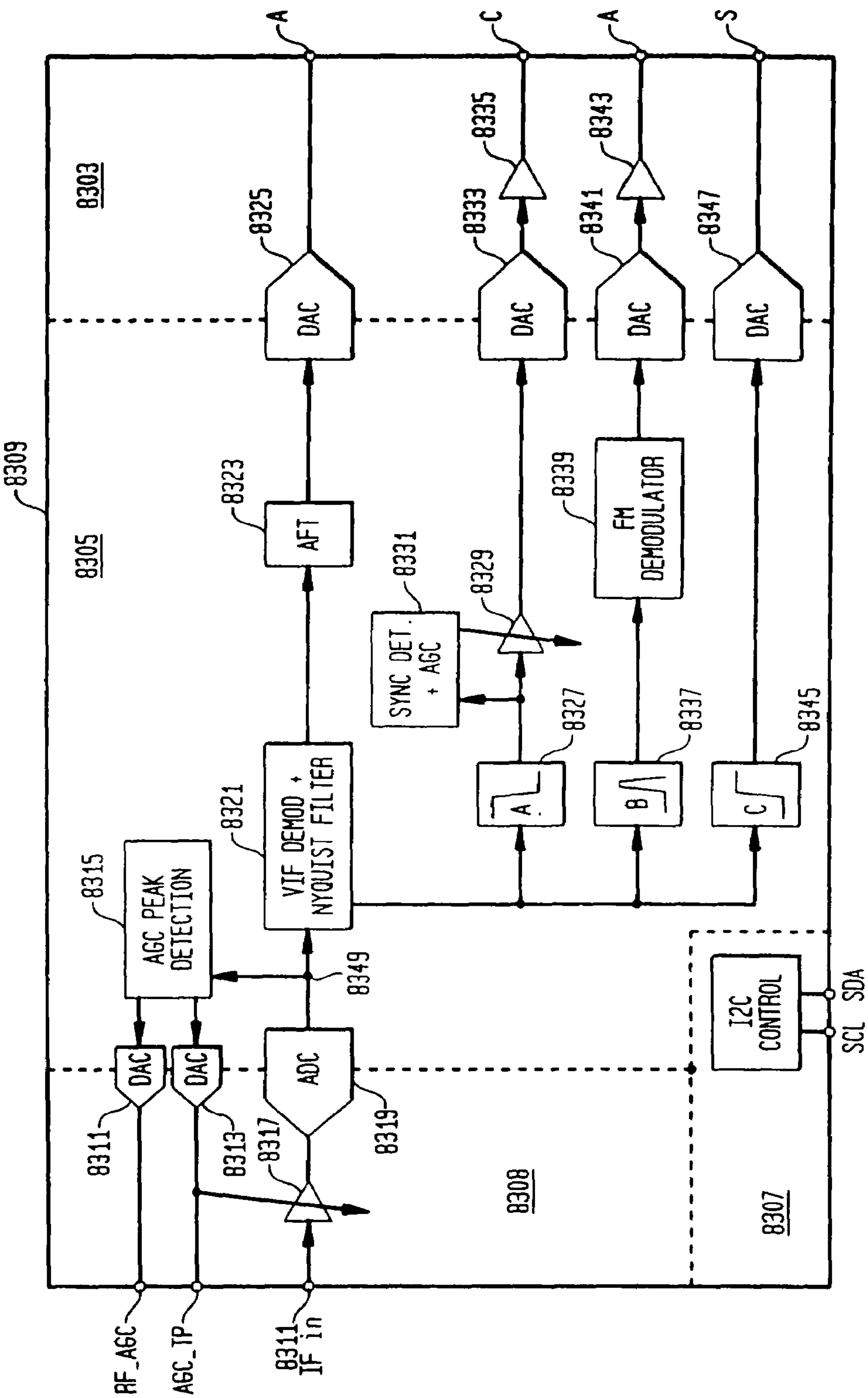
Figure 85:
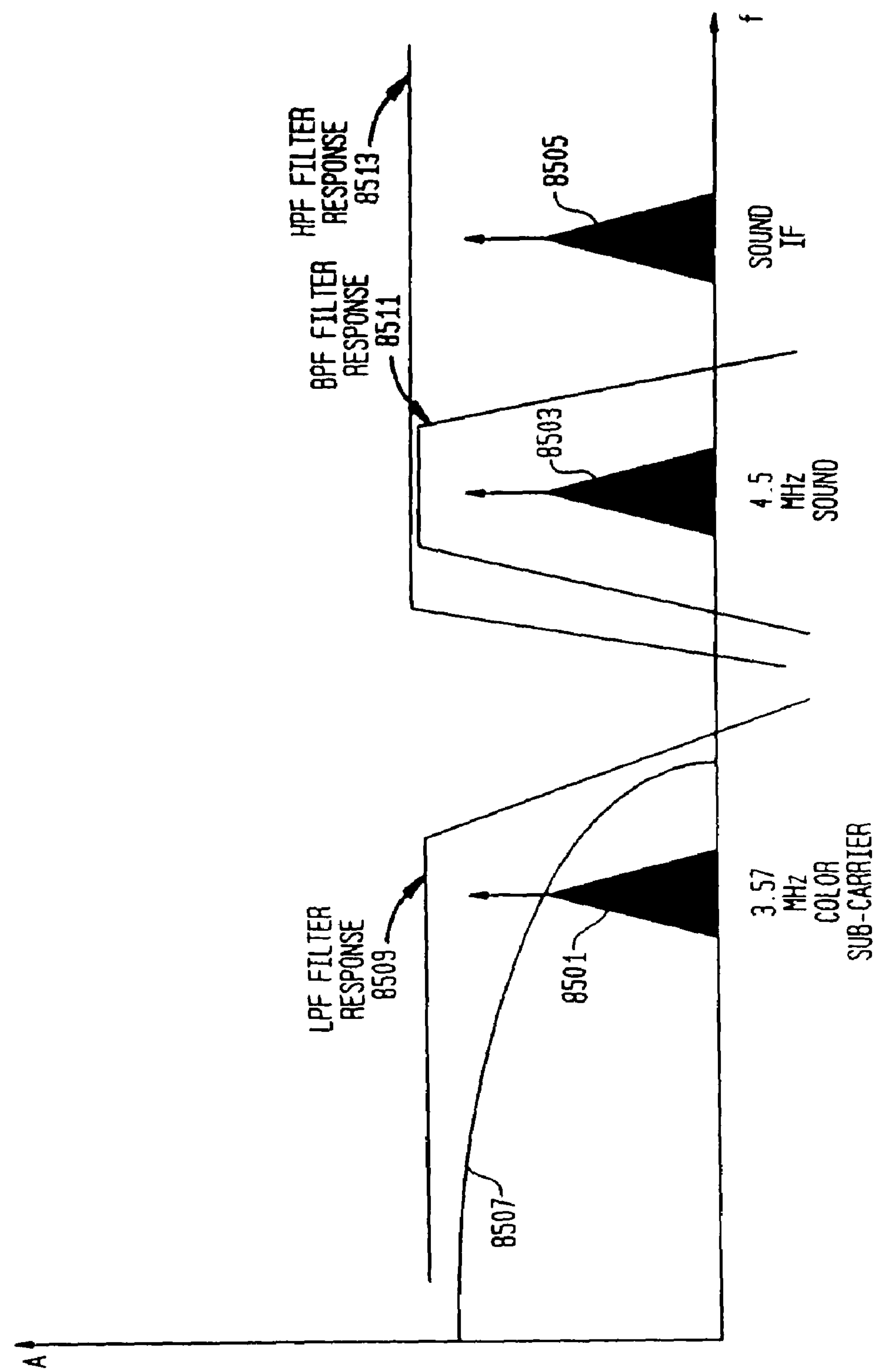

FIG. 81 is an is a block diagram of a typical prior art IF demodulator;

FIG. 82 is a frequency spectrum of a typical NTSC television signal;

FIG. 83 is a block diagram of an embodiment of a digital IF demodulator;

FIGS. 84*a*–84*d* are frequency spectra showing digital VIF demodulation and Nyquist filtering of an exemplary received band of television channels received at an IF frequency and presented to the VIF demodulator and Nyquist filter and the circuitry contained therein;

FIG. 85 is a spectrum of an NTSC television signal relative to the filter responses of filters 8327, 8337 and 8345;

DETAILED DESCRIPTION OF THE INVENTION

Figure 1:
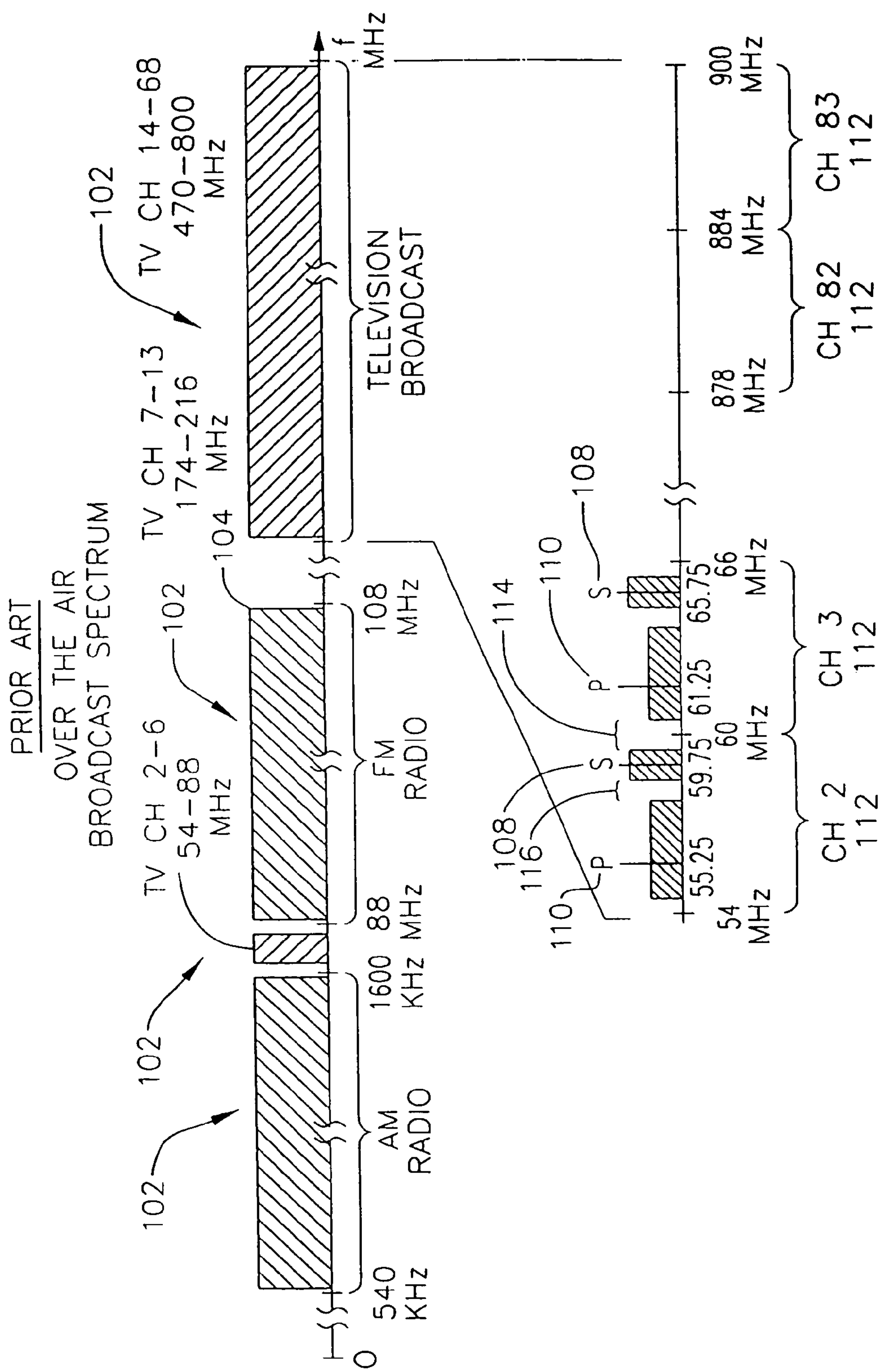
FIG. 1 is an illustration of a portion of the over-the-air broadcast spectrum allocations in the United States.

FIG. 1 is an illustration of a portion of the radio frequency spectrum allocations by the FCC. Transmission over a given media occurs at any one of a given range of frequencies that are suitable for transmission through a medium. A set of frequencies available for transmission over a medium are divided into frequency bands 102. Frequency bands are typically allocations of frequencies for certain types of transmission. For example FM radio broadcasts, FM being a type of modulation, is broadcast on the band of frequencies from 88 MHz to 108 MHz 104. Amplitude modulation (AM), another type of modulation, is allocated the frequency band of 540 kHz to 1,600 kHz 106. The frequency band for a type of transmission is typically subdivided into a number of channels. A channel 112 is a convenient way to refer to a range of frequencies allocated to a single broadcast station. A station broadcasting on a given channel may transmit one or more radio frequency (RF) signals within this band to convey the information of a broadcast. Thus, several frequencies transmitting within a given band may be used to convey information from a transmitter to a broadcast receiver. For example, a television broadcast channel broadcasts its audio signal(s) 108 on a frequency modulated (FM) carrier signal within the given channel. A TV picture (P) 110 is a separate signal broadcast using a type of amplitude modulation (AM) called vestigial side band modulation (VSB), and is transmitted within this channel.

In FIG. 1 channel allocations for a television broadcast band showing the locations of a picture and a sound carrier frequencies within a channel are shown. Each channel 112 for television has an allocated fixed bandwidth of 6 MHz. The picture 110 and sound 108 carriers are assigned a fixed position relative to each other within the 6 MHz band. This positioning is not a random selection. The picture and sound carriers each require a predetermined range of frequencies, or a bandwidth (BW) to sufficiently transmit the desired information. Thus, a channel width is a fixed 6 MHz, with the picture and sound carrier position fixed within that 6 MHz band, and each carrier is allocated a certain bandwidth to transmit its signal.

In FIG. 1 it is seen that there are gaps between channels 114, and also between carrier signals 116. It is necessary to leave gaps of unused frequencies between the carriers and between the channels to prevent interference between channels and between carriers within a given channel. This interference primarily arises in the receiver circuit that is used to receive these radio frequency signals, convert them to a usable frequency, and subsequently demodulate them.

Providing a signal spacing allows the practical design and implementation of a receiver without placing unrealistic requirements on the components in the receiver. The spaces help prevent fluctuations in the transmission frequency or spurious responses that are unwanted byproducts of the transmission not to cause interference and signal degradation within the receiver. Also, signal spacing allows the design requirements of frequency selective circuits in the receiver to be relaxed, so that the receiver may be built economically while still providing satisfactory performance. These spectrum allocations and spacings were primarily formulated when the state of the art in receiver design consisted of discrete components spaced relatively far apart on a printed circuit board. The increasing trend towards miniaturization has challenged these earlier assumptions. The state of the art in integrated circuit receiver design has advanced such that satisfactory performance must be achieved in light of the existing spectrum allocations and circuit component crowding on the integrated circuit. New ways of applying existing technology, as well as new technology are continually being applied to realize a miniaturized integrated receiver that provides satisfactory performance. Selectivity is a principal measure of receiver performance. Designing for sufficient selectivity not only involves rejecting other channels, but the rejection of distortion products that are created in the receiver or are part of the received signal. Design for minimization or elimination of spurious responses is a major objective in state of the art receiver design.

Figure 2:
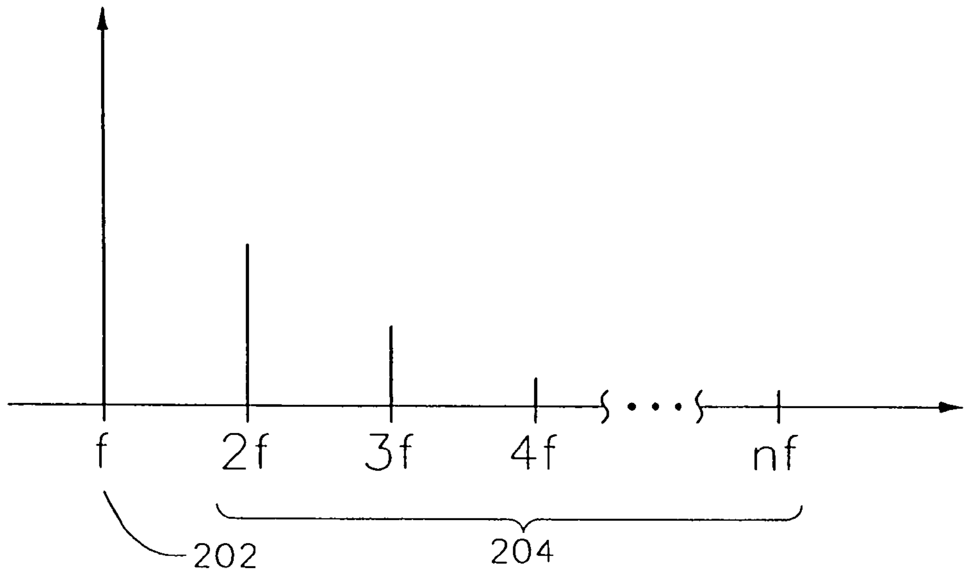
FIG. 2 is an illustration of the frequency spectrum of harmonic distortion products.

FIG. 2 is an illustration of harmonic distortion products. Transmitted spurious signals, and spurious signals generated in a receiver, most commonly consist of harmonics created by one frequency and intermodulation distortion, created by the interaction of multiple frequencies. Spurious signals at other than the desired frequency arise from the inherent nonlinear properties in the circuit components used. These nonlinearities can not be eliminated, but by careful engineering the circuitry can be designed to operate in a substantially linear fashion.

When a single frequency called a fundamental 202 is generated, unwanted spurious signals 204 are always generated with this fundamental. The spurious signals produced as a result of generating a single frequency (f) 202 are called harmonics 204 and occur at integer multiples of the fundamental frequency (2*f*, 3*f*, . . . ) The signal strength or amplitude of these harmonics decrease with increasing harmonic frequency. Fortunately these distortion products fall one or more octaves away from the desired signal, and can usually be satisfactorily filtered out with a low pass filter that blocks all frequencies above a pre-selected cut-off frequency. However, if the receiver is a wide band or multi octave bandwidth receiver, these harmonics will fall within the bandwidth of the receiver and cannot be low pass filtered, without also filtering out some of the desired signals. In this case, other methods known to those skilled in the art, such as reducing the distortion products produced, must be used to eliminate this distortion.

Radio signals do not exist in isolation. The radio frequency spectrum is populated by many channels within a given band transmitting at various frequencies. When a radio circuit is presented with two or more frequencies, these frequencies interact, or intermodulate, to create distortion products that occur at known frequency locations.

Figure 3:
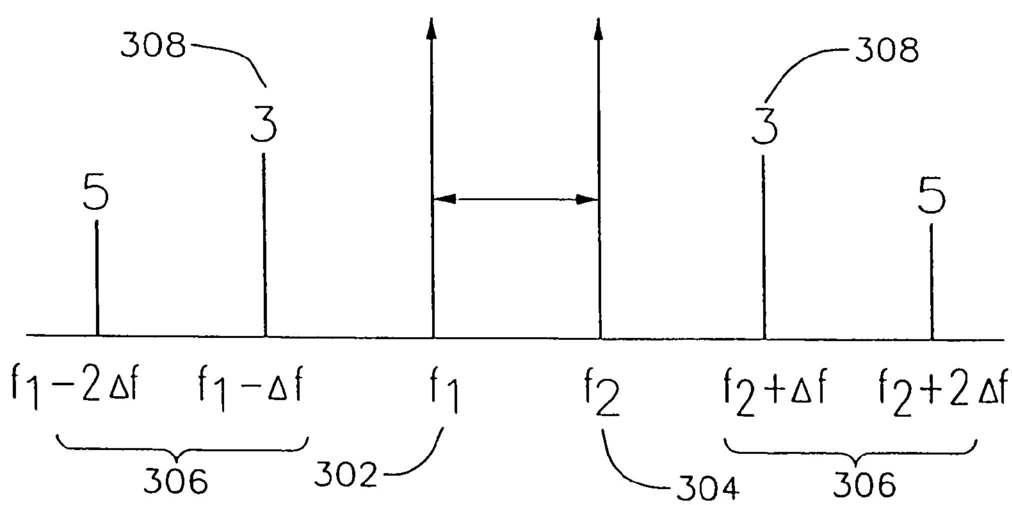
FIG. 3 is an illustration of a spectrum of even and odd order inter modulation distortion products.

FIG. 3 is an illustration of intermodulation distortion products. Whenever two or more frequencies are present they interact to produce additional spurious signals that are undesired. FIG. 3 illustrates a spurious response produced from the interaction of two signals, $f_1$ 302 and $f_2$ 304. This particular type of distortion is called intermodulation distortion (IMD). These intermodulation distortion products 306 are assigned orders, as illustrated. In classifying the distortion the IM products are grouped into two families, even and odd order IM products. Odd order products are shown in FIG. 3.

In a narrow band systems the even order IM products can be easily filtered out, like harmonics, because they occur far from the two original frequencies. The odd order IM products 306 fall close to the two original frequencies 302, 304. In a receiver these frequencies would be two received signals or a received channel and a local oscillator. These products are difficult to remove. The third order products 306 are the most problematic in receiver design because they are typically the strongest, and fall close within a receiver's tuning band close to the desired signal. IM distortion performance specifications are important because they are a measure of the receiver's immunity to strong out of band signal interference.

Third order products 308 occur at $(f_1-\Delta f)$ and at $(f_2+\Delta f)$, where $\Delta f=f_2-f_1$. These unwanted signals may be generated in a transmitter and transmitted along with desired signal or are created in a receiver. Circuitry in the receiver is required to block these signals. These unwanted spurious responses arise from nonlinearities in the circuitry that makes up the receiver.

The circuits that make up the receiver though nonlinear are capable of operating linearly if the signals presented to the receiver circuits are confined to signal levels within a range that does not call for operation of the circuitry in the nonlinear region. This can be achieved by careful design of the receiver.

For example, if an amplifier is over driven by signals presented to it greater than it was designed to amplify, the output signal will be distorted. In an audio amplifier this distortion is heard on a speaker. In a radio receiver the distortion produced in nonlinear circuits, including amplifiers and mixers similarly causes degradation of the signal output of the receiver. On a spectrum analyzer this distortion can be seen; levels of the distortion increase to levels comparable to the desired signal.

While unwanted distortion such as harmonic distortion, can be filtered out because the harmonics most often fall outside of the frequency band received, other distortion such as inter-modulation distortion is more problematic. This distortion falls within a received signal band and cannot be easily filtered out without blocking other desired signals. Thus, frequency planning is often used to control the location of distortion signals that degrade selectivity.

Frequency planning is the selection of local oscillator signals that create the intermediate frequency (IF) signals of the down conversion process. It is an analytical assessment of the frequencies being used and the distortion products associated with these frequencies that have been selected. By evaluating the distortion and its strength, an engineer can select local oscillator and IF frequencies that will yield the best overall receiver performance, such as selectivity and image response. In designing a radio receiver, the primary problems encountered are designing for sufficient sensitivity, selectivity and image response.

Selectivity is a measure of a radio receiver's ability to reject signals outside of the band being tuned by a radio receiver. A way to increase selectivity is to provide a resonant circuit after an antenna and before the receiver's frequency conversion circuitry in a "front end." For example, a parallel resonant circuit after an antenna and before a first mixer that can be tuned to the band desired will produce a high impedance to ground at the center of the band. The high impedance will allow the antenna signal to develop a voltage across this impedance. Signals out of band will not develop the high voltage and are thus attenuated.

The out of band signal rejection is determined by a quality factor or "Q" of components used in the resonant circuit. The higher the Q of a circuit in the preselector, the steeper the slope of the impedance curve that is characteristic of the preselector will be. A steep curve will develop a higher voltage at resonance for signals in band compared to signals out of band. For a resonant circuit with low Q a voltage developed across the resonant circuit at a tuned frequency band will be closer in value to the voltage developed across the resonant circuit out of band. Thus, an out of band signals would be closer in amplitude to an in band signals than if a high Q circuit were constructed.

This type of resonant circuit used as a preselector will increase frequency selectivity of a receiver that has been designed with this stage at its input. If an active preselector circuit is used between an antenna and frequency conversion stages, the sensitivity of the receiver will be increased as well as improving selectivity. If a signal is weak its level will be close to a background noise level that is present on an antenna in addition to a signal. If this signal cannot be separated from the noise, the radio signal will not be able to be converted to a signal usable by the receiver. Within the receiver's signal processing chain, the signal's amplitude is decreased by losses at every stage of the processing. To make up for this loss the signal can be amplified initially before it is processed. Thus, it can be seen why it is desirable to provide a circuit in the receiver that provides frequency selectivity and gain early in the signal processing chain.

Radio frequency tuners are increasingly being designed with major portions of their circuitry implemented as an integrated circuit. In the state of the art to minimize distortion products created in the receiver, exotic materials such as gallium arsenide (GaAs) are used. A receiver implemented on this type of material will typically have lower distortion and noise present than in a similarly constructed receiver constructed on silicon. Silicon, is an attractive material due to its low cost. In addition, a CMOS circuit implemented on silicon has the additional benefit of having known processing characteristics that allow a high degree of repeatability from lot to lot of wafers. The state of the art has not achieved a completely integrated receiver in CMOS circuitry. A reason for this is the difficulty of eliminating receiver distortion and noise.

The distortion products discussed above that are created in the receiver can, in the majority of cases, also be reduced by setting an appropriate drive level in the receiver, and by allowing a sufficient spacing between carriers and channels. These receiver design parameters are dependent upon many other factors as well, such as noise present in the system, frequency, type of modulation, and signal strength among others. Noise is one of the most important of these other parameters that determines the sensitivity of the receiver, or how well a weak signal may be satisfactorily received.

Noise is present with the transmitted signal, and also generated within a receiver. If excessive noise is created in a receiver a weak signal may be lost in a "noise floor". This means that the strength of the received signal is comparable to the strength of the noise present, and the receiver is incapable of satisfactorily separating a signal out of this background noise, or floor. To obtain satisfactory performance a "noise floor" is best reduced early in a receiver's chain of circuit components.

Once a signal is acquired and presented to a receiver, in particularly an integrated receiver with external pins, additional noise may be radiated onto those pins. Thus, additional added noise at the receiver pins can degrade the received signal.

In addition to the noise that is present on an antenna or a cable input to a receiver, noise is generated inside the radio receiver. At a UHF frequency range this internal noise predominates over the noise received with the signal of interest. Thus, for the higher frequencies the weakest signal that can be detected is determined by the noise level in the receiver. To increase the sensitivity of the receiver a "pre-amplifier" is often used after an antenna as a receiver front end to boost the signal level that goes into the receiver. This kind of pre-amplification at the front end of the amplifier will add noise to the receiver due to the noise that is generated inside of this amplifier circuit. However, the noise contribution of this amplifier can be minimized by using an amplifier that is designed to produce minimal noise when it amplifies a signal, such as an LNA. Noise does not simply add from stage to stage; the internal noise of the first amplifier substantially sets the noise floor for the entire receiver.

In calculating a gain in a series of cascaded amplifiers the overall gain is simply the sum of the gains of the individual amplifiers in decibels. For example, the total gain in a series of two amplifiers each having a gain of 10 dB is 20 dB for a overall amplifier. Noise floor is commonly indicated by the noise figure (NF). The larger the NF the higher the noise floor of the circuit.

A cascaded noise figure is not as easily calculated as amplifier gain; its calculation is non-intuitive. In a series of cascaded amplifiers, gain does not depend upon the positioning of the amplifiers in the chain. However, in achieving a given noise figure for a receiver, the placement of the amplifiers is critical with respect to establishing a receiver's noise floor. In calculating the noise figure for an electronic system Friis' equation is used to calculate the noise figure of the entire system. Friis' equation is:

$$NF_{total} = NF_1 + \frac{NF_2 - 1}{G_1} + \frac{NF_3 - 1}{G_1 G_2} + \dots + \frac{NF_n - 1}{G_1 G_2 \dots G_n} \tag{1}$$

$NF_{total}$=system noise figure
$NF_1$=noise figure of stage-1
$NF_2$=noise figure of stage-2
$NF_n$=noise figure of stage-nth
$G_1$=gain of stage-1
$G_2$=gain of stage-2
$G_N$=gain of nth stage What can be seen from this equation is that the noise figure of a first stage is the predominant contributor to a total noise figure. For example, the noise figure of a system is only increased a small amount when a second amplifier is used. Thus, it can be seen that the noise figure of the first amplifier in a chain of amplifiers or system components is critical in maintaining a low noise floor for an entire system or receiver. A low NF amplifier typically requires a low noise material for transistors, such as gallium arsenide. Later amplifiers that do not contribute significantly to the noise, are constructed of a cheaper and noisier material such as silicon.

The initial low noise amplifiers are typically constructed from expensive materials such as gallium arsenide to achieve sufficient performance. Gallium arsenide requires special processing, further adding to its expense. Additionally, GaAs circuits are not easily integrated with silicon circuits that make up the bulk of the receivers in use. It would be desirable to achieve identical performance with a less costly material, such as silicon. Silicon requires less costly processing. Further it is advantageous if a standard process, such as CMOS, could be used to achieve the required low noise design. Given the trend towards miniaturization and high volume production, it is highly desirable to be able to produce an integrated receiver with a low noise floor on silicon.

Within a receiver the layout and spacing of circuitry is critical to avoid the injection of noise generated in other portions of the circuit onto a received signal. If a tuner is placed on a semiconductor substrate noise generated in the substrate itself will interfere with, and degrade the received signal, this has been a problem preventing complete integration of a receiver on silicon.

Historically low noise substrates, fabricated from exotic and costly materials such as gallium arsenide have been used to reduce noise generated by the semiconductor substrate. However, it would be advantageous to be able to fabricate a receiver on a single CMOS substrate. CMOS advantageously is a known process that may be implemented economically for volume production. Currently a receiver fabricated completely in CMOS has not been available without utilizing external components in the received signal path. Each time the signal is routed on or off of the integrated circuit additional opportunities for the introduction of noise into a signal path are provided. Minimizing this introduction of noise is an ongoing problem in receiver design.

After preselection and low noise amplification that is performed in a front end of a receiver, the signal next enters the receiver's frequency conversion circuitry. This circuitry takes channels that have been passed through the front end and converts one of the selected channel's frequencies down to one or more known frequencies ($f_{IF}$ or IFs). This frequency conversion is accomplished through the use of a circuit called a mixer that utilizes a local oscillator signal ($f_{LO}$), usually generated in the receiver, to tune a received channel to an IF frequency while blocking the other channels. Spurious signals, previously described, are produced in this receiver circuitry, and an additional problem known as "image response" is encountered that must be considered in the receiver's design.

It is well known to those skilled in the art that when two sinusoidal signals of differing frequencies are multiplied together by their application to a nonlinear device, such as a mixer, that signals of a differing frequency are produced. A mixer has three ports: $f_{RF}$ receives a low level radio frequency signal that contains the desired modulation, $f_{LO}$ is a high level signal from a local oscillator, and $f_{IF}$ is the resultant mixer product or intermediate frequency produced. These frequencies are related:

$$f_{IF}=mf_{RF}\pm nf_{LO} \tag{2}$$

where m=0, 1, 2, 3, . . . and
n=0, 1, 2, 3, . . .

In a typical first order circuit (m=n=1) four frequencies are produced: $f_{RF}$, $f_{LO}$, $f_{IFLO}=f_{RF}-f_{LO}$ and $f_{IFHI}=f_{RF}+f_{LO}$. A $F_{IFLO}$ and $f_{IFHI}$ being termed intermediate frequencies. In receivers the common practice is to select either the sum or difference IF frequency by filtering out the undesired one. Since both signals contain the same information, only one is needed in the subsequent circuitry.

One or more mixers are advantageously used in radio receivers to convert a high frequency radio signal which is received into a lower frequency signal that can be easily processed by subsequent circuitry. Mixers are also used to tune multiple channels, so that different tuned circuits are not required for each channel. By changing a local oscillator frequency, differing radio frequencies received can be tuned to produce a constant intermediate frequency value regardless of the frequency of the received channel. This means that circuit components used to process the intermediate frequency may be fixed in value, with no tuning of capacitors or coils required. Thus, circuits in an IF strip are all fixed-tuned at an IF frequency. A receiver constructed in this manner, using one or more frequency conversions, is called a superheterodyne radio receiver.

A disadvantage of a superheterodyne radio receiver is that any of the one or more local oscillators within the receiver also acts as a miniature transmitter. A receiver "front end" alleviates this problem by isolating an antenna from the remaining receiver circuitry.

By positioning a radio frequency amplifier between the antenna and the frequency converting stages of a receiver, additional isolation between the receiver circuitry and the antenna is achieved. The presence of an amplifier stage provides attenuation for any of the one or more local oscillator signals from the frequency conversion stages that are radiated back towards the antenna or a cable distribution network. This increased isolation has the benefit of preventing radiation of a local oscillator signal out the antenna which could cause radio frequency interference from a local oscillator. If radiated these and other signals present could create interference in another receiver present at another location.

Figure 4:
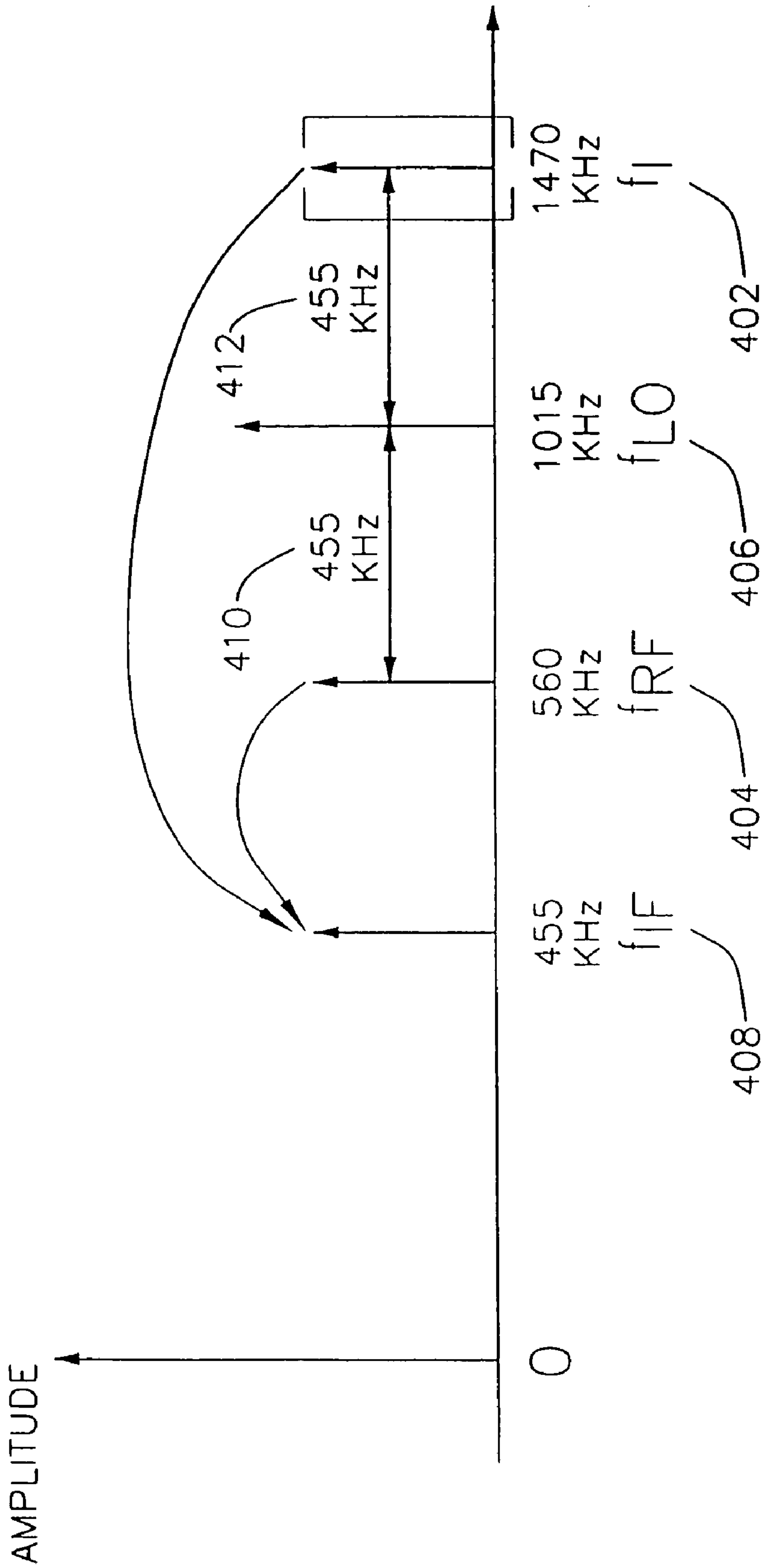
FIG. 4 is an illustration of interference caused at the IF frequency by a signal present at the image frequency.

FIG. 4 is an illustration that shows an image frequency's 402 relation to other signals present 404, 406, 408 at a mixer. Image frequency suppression is an important parameter in a receivers design. In a radio receiver two frequencies input to a radio receiver 404, 406 will yield a signal at the IF frequency 408. A receiver will simultaneously detect signals at the desired frequency 404 and also any signals present at an undesired frequency known as the image frequency 402. If there is a signal present at the image frequency, it will translate down to the IF frequency 408 and cause interference with the reception of the desired channel. Both of these signals will be converted to the IF frequency unless the receiver is designed to prevent this. The image frequency 402 is given by:

$$f_I=f_{RF}+2f_{IF} \tag{3}$$

where $f_I$ is the image frequency. This is illustrated in FIG. 4. A frequency that is spaced the IF frequency 410 below the local oscillator frequency ($f_{RF}$) 404, and a frequency that is spaced the intermediate frequency 412 above the local oscillator signal ($f_I$) 402, will both be converted down to the intermediate frequency ($f_{IF}$) 408. The usual case is that a frequency that occurs lower than the local oscillator signal is the desired signal. The signal occurring at the local oscillator frequency plus the intermediate frequency 402 is an unwanted signal or noise at that frequency that is converted to the IF frequency causing interference with the desired signal.

In FIG. 4 the exemplary 560 KHz signal 404 is a radio station that the tuner is tuned to receive. The exemplary 1470 KHz signal 402 is another radio station transmitting at that particular frequency. If a designer of the receiver had picked an exemplary local oscillator signal of 1015 KHz 406 then both of these radio stations would be simultaneously converted to an exemplary IF frequency of 455 KHz 408. The person listening to the radio would simultaneously hear both radio programs coming out of his speaker. This illustrates the need for the careful selection of local oscillator frequencies when designing a radio receiver. The selection of local oscillator frequencies is a part of frequency planning and used by those skilled in the art to design a receiver that will provide frequency conversions needed with minimal distortion.

FIG. 5 illustrates a dual (or double) conversion receiver 502. Such a multiple conversion receiver allows selectivity, distortion and stability to be controlled through a judicious frequency planning. In the double conversion receiver 502 a received signal 504 is first mixed 506 to a first intermediate frequency, and then mixed 508 down to a second intermediate frequency. In this type of receiver the first IF frequency is made to be high so that a good image rejection is achieved. The second IF is made low so that good adjacent channel selectivity is achieved.

If the first IF frequency is low an image frequency falls higher in frequency, or closer to the center of a pass band of an RF selectivity curve of a receiver "front end," 510 and undergoes little attenuation. If the IF frequency is high the image frequency falls far down on the skirt of the RF selectivity curve for the receiver "front end" receiving a required attenuation. Thus, the selectivity of the receiver acts to attenuate the image frequency when a high IF frequency is used. As an added benefit a high image frequency provides less of a chance for interference from a high powered station. This is because at higher frequencies transmitted power is often lower due to the difficulties in generating RF power as frequency increases.

A low second IF frequency produces a good adjacent channel selectivity. Frequency spacing between adjacent channels is fixed. To prevent interference from adjacent channels the receiver must possess a good selectivity. Selectivity can be achieved through a RF tuned circuit, and more importantly by the superior selectivity provided by a frequency conversion process. The selectivity improvement given by using a low IF is shown by considering a percent separation of a desired and an undesired signal relative to total signal bandwidth. If a separation between the desired and undesired signals is constant a second IF signal falling at the lower frequency will give a larger percent separation between the signals. As a result it is easier to distinguish between IF signals that are separated by a larger percentage of bandwidth. Thus, the judicious selection of two intermediate frequencies in a double conversion receiver is often used to achieve a given design goal, such as image frequency rejection and selectivity.

Additionally, the use of a second IF frequency allows gain in the receiver to be distributed evenly. Distributing gain helps prevent instability in the receiver. Instability usually is seen as an oscillating output signal 512. Distributing the gain among several IF amplifiers 514, 516, 518 reduces the chance of this undesirable effect. Often to further distribute the gain required in a system design a third frequency conversion, and a third IF frequency, will be utilized.

After a receiver front end that possibly contains a low noise amplifier, additional amplifiers are often seen in the various IF strips. An amplifier in an IF strip does not require frequency tuning and provides signal gain to make up for signal losses, encountered in processing a received signal. Such losses can include conversion loss in mixers and the insertion loss encountered by placing a circuit element, such as a filter or an isolator in the IF strip.

In receivers filters are used liberally to limit unwanted frequencies that have been escaped previous elimination in a "front end," or to eliminate unwanted frequencies that have been created immediately preceding a filter. In addition to attenuating unwanted frequencies, a desired signal will also undergo some attenuation. This attenuation results from an insertion loss of a filter, or some other component, and if uncompensated, will degrade a signal. This is especially true when a series of filters are cascaded, since the effect is additive.

Often a series of multiple filters are cascaded in a given IF strip. These filters typically have an identical response characteristic. The cascaded filters are used to increase the selectivity of the receiver. While it is true that the insertion loss in the pass band is the sum of individual filter insertion losses, as measured in decibels, a rejection improvement obtained outside of the pass band is the sum of the rejections at the given frequency. Thus, three cascaded filters, each having an insertion loss of 0.01 dB at a center frequency, would have a total insertion loss of 0.03 dB. If the rejection in the stop band, a given frequency away from the center frequency of the filter, were 20 dB, then a total rejection for 3 cascaded filters would be 60 dB, a great improvement in filter selectivity.

In choosing intermediate frequencies for IF strips in the receiver, no concrete design guidelines exist. Also because of a wide variance in design goals that are encountered in receiver design, concrete methodologies do not exist. Each receiver must be uniquely engineered to satisfy a series of system design goals taking into consideration design tradeoffs that must be made. In the current state of the art, design tradeoffs, and design methodologies used have been directed to integrating all parts of the receiver except for frequencies selective components. The conventional wisdom in receiver design is that filters are not easily integrated onto a silicon substrate and that filtering is best done off of a chip.

Some general design guidelines exist to aid an RF engineer in designing a receiver. One such rule is that designing for receiver selectivity is more important than designing for receiver sensitivity. Thus, when faced with conflicting design choices, the more desirable choice is to provide a design that will separate adjacent channels that interfere with each other rather than to design a receiver capable of picking up the weakest channels. Another rule of thumb in choosing intermediate frequencies is to choose the first intermediate frequency at twice the highest input frequency anticipated. This is to reduce the possibility of spurious second order intermodulation distortion. Depending upon a system performance desired, this rule can even be more restrictive, requiring an IF at greater than three times the highest input frequency. Thus, it may be seen that a wide variety of performance requirements exist in a receiver circuit, and that the range of choices for a given criteria may be utilized by those skilled in the art to produce a unique design that meets the challenges posed by an increasing trend towards integration.

When more than one IF is present in a receiver there is an image frequency associated with each IF that must be considered in the design. A good receiver provides an image rejection greater than 70 dB.

One of the first considerations in frequency planning a superheterodyne receiver is the selection of IF conversions. A frequency range of the local oscillator needs to be determined to establish the locations of spurious responses of various orders. Two choices are possible for each of two possible LO frequency and the selection is not subject to an easy generalization. The two available frequencies are the absolute value of the quantity $|f_{RF}\pm f_{IF}|=f_{LO}$. Selection depends on RF bands chosen to be received and frequencies present in these bands, the availability of fixed bandwidth filters at a desired IF and constraints imposed upon an engineer by the limitations of a material that will be used to fabricate a receiver.

Receiver planning is a process that is centered upon frequency planning and receiver level diagrams. After initial frequency selections for a frequency plan are made, a receiver level plan is used to calculate noise figures, intercept points (IP) and levels of spurious responses. Each is evaluated in light of design requirements. After each set of selections performance is evaluated and a next set of parameter selections is made until an appropriate compromise in receiver performance is achieved.

Once frequency planning and a level diagram yield a satisfactory design solution these tools are used to guide a detailed receiver design. Once parameters of a section of a receiver are defined, an engineer can use various circuit implementations to achieve a stated design goal. For example a frequency plan and level diagram may require a band pass filter with certain characteristics such as bandwidth, center frequency and insertion loss. The engineer would then either pick a single filter that meets all of these requirements or cascade one or more filters such that a composite response will yield the required design value.

Needless to say experience and knowledge of available technology plays a large part in achieving a successful receiver design blueprint. An engineer must have a rough idea of component availability and design methodologies that will yield a certain performance. If the engineer specifies a portion of the receiver that has performance characteristics that are not achievable with available components or design methods, then an impractical and unproduceable design has been proposed requiring replanning the architecture of the receiver.

A design process and a result achieved is very dependent upon technology available, materials and methodologies known at the time. New improvements in design techniques, computer simulation, processing and a push for increased miniaturization continually fuel achievement of new and innovative receiver designs to solve technological problems.

Once frequency conversions have been chosen and a receiver designed, with the distortion products created in the receiver found acceptable, the next step in receiver design is to design circuitry that will generate one or more local oscillator signals. These signals could be provided by a source that is external to a chip. However, this would not be practical in seeking to miniaturize an overall receiver design. A better approach is to generate the local oscillator frequencies near the receiver. In reducing an entire receiver onto a single chip, problems in maintaining signal purity, and stability are encountered.

An innovation that has allowed increased miniaturization in receiver design is the development of frequency synthesis. Local oscillator signals are required in receivers utilizing frequency conversion. These signals must be tunable and stable. A stable frequency is easily produced by a quartz crystal at a single frequency. A tunable frequency can be produced by an LC type oscillator. However, this LC oscillator does not have sufficient stability. Additionally using a large number of crystals to generate a range of local oscillator signals, or inductors required in an LC oscillator do not allow an easily miniaturized design. Frequency synthesis is space efficient.

Variable frequency local oscillator signals used in a receiver must be generated by appropriate circuits. These frequency synthesis techniques derive variable LO signals from a common stable reference oscillator. A crystal oscillator has a stable frequency suitable for use in a synthesizer.

Oscillators may provide a fixed or a variable output frequency. This fixed or variable frequency may be used for frequency conversion in a receiver as a local oscillator that is used to mix a received radio frequency (RF) input down to an intermediate frequency or a base band signal that is more easily processed in the following circuitry. Another way that a received signal can be converted down to a base band or intermediate frequency signal is by using frequency synthesizer outputs as local oscillator signals to mix the signal down. Synthesizers provide accurate, stable and digitally programmable frequency outputs, without the use of multiple oscillators to tune across a band. Accuracy is maintained by using feed back.

Three general techniques are used for frequencies synthesis. Direct synthesizers use frequency multipliers, dividers and mixers. Indirect synthesizers use phase-locked loops. Direct digital synthesizers use digital logic combined with a digital to analog converter to provide an analog output. Some designs combine the three techniques.

A direct synthesizer will use a frequency reference such as a crystal oscillator as disclosed in FIG. 5 to generate a reference frequency. To achieve a desired output frequency, the reference frequency is multiplied through a series of multipliers. Dividers may be used similarly to reduce the frequency output to the desired lesser value. Additionally, two signals generated from the chain of multipliers and dividers can be fed into a mixer to generate a third frequency. The mix and divide direct synthesis approach permits the use of many identical modules that produce fine resolution with low spurious output.

Indirect synthesis can take several forms. It can use divide by N to produce one or more of the digits, and mix and divide with loops imbedded among circuits. In each form of frequency synthesizer, the loops contained in it are governed by a derivative of a reference frequency. Indirect synthesis can be used to generate a frequency of $$\left(\frac{N}{M}\right)$$

$f_{in}$. Circuits of this type are often used as local oscillators for digitally tuned radio and television receivers.

Indirect synthesizers make use of a number of phase locked loops (PLLs) in order to create a variety of frequency outputs. Each loop present in the system makes use of a common frequency reference provided by a single oscillator. Frequency synthesizers provide the advantage of being digitally programmable to a desired frequency as well as providing an extremely stable frequency.

Frequency stability in a synthesizer is achieved with phase locked loops. A phase locked loop is programmed to generate a desired frequency. Once it approximates the frequency, the frequency is divided down to the value of a reference frequency, provided by an external oscillator, and compared to that reference frequency. When the difference reaches zero the phase locked loop stops tuning and locks to the frequency that it has just produced. The frequency reference used to tune the phase locked loop is typically provided by a single frequency oscillator circuit.

Frequency synthesizers in a radio frequency receiver often incorporate two phase locked loops. One PLL is used to provide coarse tuning within the frequency band of interest while the second PLL provides fine tuning steps.

In using this scheme, a coarse tuning must be such that a desired channel will initially fall within the selectivity of the receiver to produce a signal output. It would be an advantage in receiver design if tuning speed could be increased so that initially several channels would fall within the selectivity of the receiver. Tuning in this manner would allow an output to be created with an extremely coarse tuning range that could be dynamically adjusted. Currently this type of tuning is not seen in the state of the art.

Typically PLLs use a common reference frequency oscillator. Local oscillator signals produced by a frequency synthesizer's phase locked loops inject noise produced in the reference frequency oscillator and the PLLs into a the signal path by way of a PLL output.

A range of output frequencies from a synthesizer can span many decades, depending on the design. A "resolution" of the synthesizer is the smallest step in frequency that can be made. Resolution is usually a power of 10. A "lock up time" of the synthesizer is the time it takes a new frequency to be produced once a command has been made to change frequencies.

The more accurate the frequency required the longer the lock up time. The reduction of the lock up time is a desirable goal in synthesizer design. A modern trend is to use frequency synthesis in wide band tuners. To tune across a wide band width quickly the lock up time must be minimized. Current state of the art tuning times for jumps in frequencies can be as short as several microseconds. This is difficult to do when the required increment in frequency adjustment is small. In the state of the art indirect synthesis is capable of producing multi digit resolution. However, indirect synthesis is not capable of providing micro second switching speeds. For faster switching speeds direct analog and direct digital technologies are used. Therefore, it is desirable to construct an indirect frequency synthesizer that provides high resolution and improved switching speed.

The present embodiments of the invention allow all channel selectivity and image rejection to be implemented on an integrated circuit. Integration is a achievable by utilizing differential signal transmission, a low phase noise oscillator, integrated low Q filters, filter tuning, frequency planning, local oscillator generation and PLL tuning to achieve a previously unrealized level of receiver integration.

The embodiments of the invention advantageously allow a LC filters to be integrated on a receiver chip, resulting in an integrated circuit that contains substantially the entire receiver. By advantageously selecting a frequency plan, and utilizing the properties of complex mixers, an architecture is achieved that allows LC filters to be integrated on a receiver chip so that acceptable performance is produced when converting a received signal to one having a lower frequency that is easily processed.

The embodiments utilize particular aspects of an arbitrarily defined input spectrum to first shift the received frequencies to a higher frequency in order that interference may be more easily eliminated by filtering and then shifting the spectrum to a nominal IF for processing. This first shifting process advantageously shifts interfering image signals away from a center frequency of a first LC filter bank so that the LC filter bank is more effective in reducing the interfering signal strength. To further reduce the interfering signal strength, multiple LC filters that are tuned to the same frequency are cascaded, further reducing the interfering signal strength.

To reduce degradation of the desired signal the exemplary embodiments of the invention utilize a complex mixing stage following an LC filter bank to reduce the image frequency interference by an additional amount that might be necessary to meet a particular image rejection target (i.e., an about 60 dB to 65 dB rejection target). A complex mixer creates a signal as a result of its normal operation that cancels an image frequency interference by the remaining amount needed to achieve satisfactory performance with LC filters.

The ultimate goal of a receiver is to reduce the frequency of an incoming signal to a frequency that is lower than received, so that processing of the desired signal can be easily achieved. The receiver architecture utilizes two frequency down conversions to achieve this goal. Each frequency conversion is susceptible to interference that requires filtering. Frequency planning as described above used in conjunction with LC filters and complex mixers, provides the required image distortion rejection that allows LC filters to be used advantageously in an integrated receiver.

Radio receivers require one or more local oscillator (LO) signals in order to accomplish frequency conversion to an intermediate (IF) frequency. In a typical receiver these local oscillator signals must be stable and free from noise. When a receiver is fabricated as an integrated circuit, the chances of injecting noise via the LO signals increases. Local oscillator signals for a receiver are typically generated in close proximity to the frequency conversion circuitry. The close proximity of this frequency generation circuitry to the signal path creates an increased likelihood of noise being radiated or conducted to cause interference with the received signal.

In order to achieve improved noise immunity the exemplary embodiments of the invention may utilize circuitry to generate the local oscillator signals that possess superior noise performance. The local oscillator signals may also be advantageously transmitted differentially to the mixers present on the integrated circuit. It should be noted that in alternate embodiments of the invention that a single ended output can be produced from the differential signal by various techniques known in the art. This technique is used advantageously whenever external connections to the receiver are required that are single ended.

Oscillator

An exemplary embodiment of the present invention utilizes a differential oscillator having low phase noise or jitter and high isolation, as a frequency reference that substantially increases the performance of a tuner architecture integrated onto a single silicon substrate.

In accordance with the present invention, a crystal oscillator circuit is provided and constructed so as to define a periodic, sinusoidal, balanced differential signal across two symmetrical terminals of a crystal resonator which are coupled in a parallel configuration across symmetrical, differential terminals of a differential oscillator circuit.

The differential oscillator circuit is configured such that it is constructed of simple active and passive components which are easily implemented in modern integrated circuit technology, thus allowing the differential oscillator circuit to be accommodated on a monolithic integrated circuit chip for which the crystal oscillator (as a whole) is providing a suitable, stable periodic timing reference signal. Similarly, and in contrast to prior art implementations, only the resonating crystal (crystal resonator or quartz crystal resonator) is provided as an off-chip component. This particular configuration allows for considerable savings in component parts costs by partitioning more and more functionality into the integrated circuit chip.

Remote (off chip) mounting of the crystal resonator requires that electrical contact between the crystal resonator and the associated oscillator circuit, be made with interconnecting leads of finite length. In integrated circuit technology, these interconnecting leads are typically implemented as circuit pads and conductive wires formed on a PC board substrate to which package leads are bonded (soldered) in order to effect electrical connection between the crystal resonator and an associated oscillator circuit. External electrical connections of this type are well known as being susceptible to noise and other forms of interference that might be radiated onto the interconnecting leads and, thence, into the oscillator circuit, degrading its overall noise performance.

A sinusoidal signal source, having a differential output configuration, defines a pair of periodic sinusoidal signals, with the signal at one output terminal defined as being 180° out of phase with a similar periodic, sinusoidal signal appearing at the other output terminal. Classical differential signals are termed “balanced” in that both signals exhibit equal peek-to-peek amplitudes although they exhibit a 180° phase relationship. As illustrated in the simplified timing diagram of FIG. 6, differential signals have a particular advantage in that common-mode interference, that is injected on either terminal, is canceled when the signal is converted to single-ended. Such common mode interference is typically of equal amplitude on each pin and is caused by radiation into the circuit from external sources or is often generated in the circuit itself. In FIG. 6, a positive sinusoidal signal, denoted signal-P oscillates about a zero reference, but is shifted by a common-mode interference component, denoted $I_{CM}$. Likewise, a negative sinusoidal signal, denoted at signal-n, also oscillates about a zero reference, exhibiting a 180° phase relationship with signal-p, and is also offset by a common mode interference component denoted $I_{CM}$.

A superposition of the positive and negative periodic signals is illustrated in the timing diagram denoted "composite", which clearly illustrates that the peek-to-peek difference between the positive and negative signals remain in the presence of a common mode interference component $I_{CM}$ Turning now to FIG. 7, there is depicted a semi-schematic block diagram of a periodic signal generation circuit including a differential crystal oscillator driving a differential linear buffer amplifier. Advantageously, the present invention contemplates differential signal transmission throughout its architecture to maintain the purity of the derived periodic signal and to minimize any common mode interference components injected into the system. In particular, the present invention incorporates differential signal transmission in the construction of a differential crystal oscillator circuit, including a crystal resonator and its associated oscillator driver circuit. Differential signal transmission is maintained through at least a first linear buffer stage which functions to isolate the differential oscillator circuit switch transients and other forms of noise that might be generated by follow-on digital integrated circuit components.

In FIG. 7, a differential crystal oscillator circuit is configured to function as a source of stable, synchronous and periodic signals. According to the illustrated embodiment, a differential crystal oscillator 710 suitably incorporates a resonating crystal 712 and a pair of symmetrical load capacitors 714 and 716, each load capacitor respectively coupled between ground potential and one of the two symmetrical output terminals of the resonating crystal 712.

Resonating crystal 712 is coupled between differential terminals of a differential oscillator driver circuit 718, in turn connected to differential inputs of a differential linear buffer integrated circuit 720. The symmetrical terminals of the resonating crystal 712 are coupled across differential terminals of the resonator and linear buffer, with a first terminal of the crystal being shunted to ground by the first shunt capacitor 14. The second terminal of the crystal is shunted to ground by the second shunt capacitor 716.

The oscillator driver circuit portion of the differential crystal oscillator 710 functions, in cooperation with the crystal resonator 712, to define a pure sinusoidal and differential signal across the crystal's symmetrical terminals. As will be developed in greater detail below, this pure sinusoidal and differential signal is then used by the linear buffer 720 to develop an amplified representation of periodic signals synchronized to the crystal resonant frequency. These amplified signals are also contemplated as differential inform and are eminently suitable for driving digital wave shaping circuitry to define various digital pulse trains useable by various forms of digital timing circuitry, such as phase-lock-loops (PLLs), frequency tunable digital filters, direct digital frequency synthesizers (DDFS), and the like. In other words, the system depicted in FIG. 7 might be aptly described as a periodic function generator circuit, with the crystal oscillator portion 710 providing the periodicity, and with the buffer portion 720 providing the functionality.

Before entering into a detailed discussion of the construction and operation of the differential oscillator driver circuit and differential linear buffer amplifier, it will be useful to describe characteristics of a resonating crystal, such as might be contemplated for use in the context of the present invention.

FIG. 8 depicts the conventional representation of a resonating crystal 712 having mirror-image and symmetrical terminals 822 and 824, upon which differential periodic signals may be developed at the crystal's resonant frequency. Resonating crystals (also termed crystal resonators) may be formed from a variety of resonating materials, but most commonly are formed from a piece of quartz, precisely cut along certain of its crystalline plane surfaces and so sized and shaped as to define a particular resonant frequency from the finished piece. Resonating crystals so formed are commonly termed "quartz crystal resonators".

A typical representational model of the equivalent circuit of a quartz crystal resonator 712 is illustrated in simplified, semi-schematic form in FIG. 9. A quartz crystal resonator can be modeled as a two terminal resonator, with an LCR circuit, incorporating a capacitor $C_m$ in series with an inductor $L_m$ and a resistor $R_m$, coupled in parallel fashion with a capacitor $C_o$ across the two terminals. It will be understood that the particular component values of the capacitor, inductor and resistor, forming the LCR filter portion of the circuit, define the resonant characteristics of the crystal. These design values may be easily adjusted by one having skill in the art in order to implement a resonating crystal operating at any reasonably desired frequency.

For example, a particular exemplary embodiment of a crystal resonator might be desired to have a resonant frequency in the range of about 10 megahertz (MHz). In such a case, the equivalent circuit of such a crystal might have a typical value of about 20 femto Farads (fF) for the capacitor $C_m$. The inductor $L_m$ might exhibit a typical value of about 13 milli Henreys (mH), while the resistor might have a typical value of about 50 ohms. When used in a practical oscillator design, oscillation will be achieved for values of the capacitor $C_0$ that are less than a design worst case value. In the exemplary embodiment, worst case values of 7 pico Farads (pF) might be chosen in order to ensure a design that oscillates at the desired resonant frequency over a wide range of crystal equivalent circuit values. In a practical application, the typical range of capacitance values for $C_0$ might be from about 3 to about 4 pF.

FIGS. 10 and 11 are graphical representations depicting response plots of impedance and phase with respect to frequency, respectively, of a crystal resonator circuit constructed in accordance with the equivalent circuit model of FIG. 9 and using the values given above for the component $C_m$, $L_m$, $R_m$, and $C_0$ parts. FIG. 10 is a plot of the real portion of impedance, in ohms, as a function of the resonator's frequency and mega Hertz. FIG. 11 is a representational plot of the imaginary impedance component (expressed as phase), again expressed as a function of frequency in mega Hertz. From the representational plots, it can be understood that an exemplary crystal resonator constructed in accordance with the above values exhibits a resonant frequency in the range of about 10 MHz. Further, simulation results on such a crystal resonator exhibit a steep rise in the real impedance versus frequency plot of FIG. 10 in the resonance region about 10 MHz. A steep rise in real impedance in the resonance region is indicative of a high quality factor, Q, typically exhibited by quartz crystal resonators.

An example of a quartz crystal resonator having the aforementioned characteristics and exhibiting a resonance fundamental at about 10 MHz is a Fox HC49U, quartz crystal resonator, manufactured and sold by Fox Electronics of Ft. Myers, Fla. It should be noted, however, that the specific values of a quartz crystal resonator, including its resonant frequency, are not particularly important to practice of principles of the invention. Any type of crystal resonator may be used as the resonator component 712 of FIG. 7, so long as it is constructed with generally symmetrical terminals which can be driven, in a manner to be described in greater detail below, by an oscillator driver circuit 718 of FIG. 7 so as to develop a differential, sinusoidal signal with respect to the two terminals. Further, the resonator need not oscillate at a frequency of 10 MHz. The choice of resonant frequency is solely a function of a circuit designer's preference and necessarily depends on the frequency plan of an integrated circuit in which the system of the invention is used to provide periodic timing signals.

Turning now to FIG. 12, there is depicted a simplified schematic diagram of a differential oscillator driver circuit, indicated generally at 718, suitable for differential coupling to a crystal resonator in order to develop balanced, differential sinusoidal signals for use by downstream components.

In the exemplary embodiment of FIG. 12, the differential oscillator driver circuit 718 is constructed using common integrated circuit components and is symmetrical about a central axis. The oscillator driver 718 is constructed with a pair of P-channel transistors 1226 and 1228 having their source terminals coupled in common and to a current source 1230 connected, in turn, between the common source terminals and a positive supply potential $V_{DD}$. The gate terminals of each of the P-channel transistors 1226 and 1228 are coupled to the drain nodes of the opposite transistor, i.e., the gate terminal of P-channel transistor 1228 is coupled to the drain node of P-channel transistor 1226, and vice versa.

Output terminals are defined at each of the transistor's drain nodes, with the drain node of P-channel transistor 1226 defining the "negative" terminal (Von) and the drain terminal of P-channel transistor 1228 defining the "positive" output (Vop). Thus, it will be understood that the circuit is able to operate differentially by cross coupling the transistors 1226 and 1228 in order to provide feedback.

Because transistors exhibit some measure of gain at all frequencies, particularly DC, conventional cross coupled transistors are often implemented as latches in digital circuit applications where large DC components are present. In the differential oscillator driver circuit 718 of the invention, latching is prevented by removing the DC gain component, while retaining the system's high frequency gain, particularly gain in the desirable 10 MHz region.

In order to substantially eliminate the gain component at low frequencies, a high pass filter is interposed between the gate and output terminals of each symmetrical half of the circuit. In particular, a high pass filter 1232 is coupled between the "negative" output terminal and the gate terminal of P-channel transistor 1228. Likewise, the high pass filter 1234 is coupled between the "positive" output terminal and the gate terminal of P-channel transistor 1226. Further, each of the high pass filters 1232 and 1234 are coupled between a virtual ground, identified as Vmid and indicated in phantom in the exemplary embodiment of FIG. 12, and the corresponding gate terminal of the respective one of the differential pair P-channel transistors 1226 and 1228. Each of the high pass filters 1232 and 1234 are implemented as RC filters, each including a resistor and capacitor in a series-parallel configuration. Each capacitor is series-connected between an output terminal and the gate terminal of a corresponding differential pair transistor, while each resistor is coupled between a gate terminal and the virtual ground. Thus, the first high pass filter 1232 includes a capacitor 1236 coupled between the "negative" terminal and the gate terminal of P-channel transistor 1228. A resistor 1238 is coupled between the gate of P-channel transistor 1228 and virtual ground. Similarly, the second high pass filter 1234 includes a capacitor 1240 coupled between the "positive" terminal and the gate terminal of P-channel transistor 1226. A resistor 1242 is coupled between the gate of P-channel transistor 1226 and the virtual ground.

In operation, high pass filter 1232 filters the input from Von prior to applying that signal to the gate of its respective differential pair transistor 1228. In like manner, high pass filter 1234 filters the input from Vop prior to applying that signal to the gate of its respective differential pair transistor 1226. Each of the high pass filters are symmetrically designed and have component values chosen to give cutoff frequencies in the range of about 5 MHz. For example, filter capacitors 1236 and 1240 might have values of about 1.5 pF, and filter resistors 1238 and 1242 might have values in the range of about 718 Kohms. Which would give a filter yielding the desired 5 MHz cutoff. It will be thus understood that the differential oscillator driver circuit 18 will have negligible gain at DC, while exhibiting its design gain values in the desired region of about 10 MHz.

It should be understood that the component values for high pass filters 1232 and 1234 were chosen to give a particular cut off frequency of about 5 MHz, allowing the oscillator driver circuit to exhibit full design gain at a resonate frequency of about 10 MHz. If the resonant frequency of the crystal oscillator circuit were required to have a different value, the components of the high pass filters 1232 and 1234 would necessarily take on different values to accommodate the different operational characteristics of the circuit. Accordingly, the actual component values, as well as the cutoff frequency value of the exemplary embodiment, should not be taken as limiting the differential oscillator driver circuit according to the invention in any way. The values and characteristics of the differential oscillator driver circuit 18 of FIG. 12 are exemplary and have been chosen to illustrate only one particular application.

Because the common mode output signal of a differential amplifier is often undefined, the differential oscillator driver circuit 718 of FIG. 12 is provided with a common mode control circuit which functions to maintain any common mode output signal at reasonable levels. In particular, a differential pair of N-channel transistors 1244 and 1246 is provided with each having its drain terminal coupled to a respective one of the Von and Vop output terminals. The differential N-channel transistors 1244 and 1246 further have their source terminals tied together in common and to a negative supply potential $V_{ss}$. Their gate terminals are tied together in common and are further coupled, in feedback fashion, to each transistor's drain node through a respective bias resistor 1248 and 1250. The bias resistors 1248 and 1250 each have a value, in the exemplary embodiment, of about 100 Kohms, with the gate terminals of the N-channel differential pair 1244 and 1246 coupled to a center tab between the resistors. This center tab defines the virtual ground Vmid which corresponds to a signal midpoint about which the sinusoidal signals Von and Vop oscillate. Any common mode component present at the outputs will cause a voltage excursion to appear at the gates of the N-channel differential pair 1244 and 1246. In other words, virtual ground Vmid can be thought of as an operational threshold for the current mode control differential pair 1244 and 1246. Common mode excursions above or below Vmid will cause a common mode control differential pair to adjust the circuit's operational characteristics so as to maintain Vmid at a virtual ground level, thus minimizing any common mode component.

In operation, noise in such a linear differential oscillator driver circuit is filtered mainly by the crystal resonator, but also by the operational characteristics of the driver circuit. For example, noise at 10 MHz is amplified by the positive feedback characteristics of the circuit and will continue to grow unless it is limited. In the exemplary embodiment of FIG. 12, signals in the 10 MHz region will continue to grow in amplitude until limited by a non-linear self-limiting gain compression mechanism.

As the amplitude of the amplified signal becomes large, the effective transconductance $g_m$ of the P-channel differential pair transistors 1226 and 1228 fall off, thus limiting the gain of the differential amplifier. Amplifier gain falloff with increasing gate voltage excursions is a well understood principle, and need not be described in any further detail herein. However, it should be mentioned that as the gain of the oscillator driver circuit trends to 1 the crystal resonator begins to self-limit, thus defining a constant output amplitude sinusoidal signal. Constancy of the amplitude excursions are reflected to the control (gate) terminals of the P-channel differential pair 1226 and 1228 where the feedback mechanism ensures stability about unity gain.

It should be understood therefore that the differential oscillator driver circuit 718 in combination with a crystal resonator (712 of FIG. 7) function to define periodic, sinusoidal and differential signals across the terminals of the crystal resonator. The signals are differential in that they maintain a 180° phase relationship. Signal quality is promoted because the exemplary differential oscillator driver circuit is designed to be highly linear with a relatively low gain, thus reducing phase noise (phase jitter) to a significantly better degree than has been achieved in the prior art. Signal quality and symmetry is further enhanced by the symmetrical nature of the two halves of the oscillator driver circuit. Specifically, the oscillator driver circuit is symmetrical about a central axis and, when implemented in integrated circuit technology, that symmetry is maintained during design and layout. Thus, conductive signal paths and the spatial orientation of the driver's active and passive components are identical with respect to the "negative" and "positive" outputs, thereby enhancing signal symmetry and further minimizing phase jitter.

In accordance with the invention, differential crystal oscillator circuit is able to provide a periodic clock signal (approximately 10 MHz) that exhibits stable and robust timing characteristics with very low jitter. As depicted in the simplified semi-schematic block diagram of FIG. 13, a particular exemplary embodiment of a periodic signal generator circuit incorporates a differential crystal oscillator circuit according to the present invention, including a crystal resonator 12 and differential oscillator driver circuit 718. A resonant crystal circuit 12 includes first and second timing capacitors (714 and 716 of FIG. 7) which are not shown merely for convenience in ease of explanation. The resonant crystal circuit 712 is coupled, in parallel fashion, across the output terminals of the oscillator driver circuit 718 which incorporates the active device circuitry for pumping energy into the circuit in order to sustain oscillation. This parallel combination is coupled, differentially, into a linear buffer amplifier 720, which functions to provide a linear gain factor K to the differential signal provided by the crystal oscillator circuit.

Linear buffer amplifier 720 provides signal isolation, through high input impedance, as well as amplification of the oscillating (10 MHz) signal produced by the crystal resonator/oscillator driver combination. Linear buffer amplifier 720 is configured to output differential mode signals characterized by linear amplification of the input differential signals, that may then be used to drive one or more additional wave shaping-type devices, such as nonlinear buffer amplifiers 1352, 1354 and 1356.

In the exemplary embodiment of FIG. 13, the nonlinear buffers 1352, 1354 and 1356 function in order to provide signal translation (wave shaping) from the differential sign wave periodic signal present at the output of the linear buffer 720 to a digital pulse train at characteristic logic levels suitable for driving fall-on digital circuit blocks 1358, 1360 and 1362. In addition to its signal translation function, nonlinear buffers 1352, 1354 and 1356 also provide a measure of signal conditioning, transforming the purely sinusoidal signal at their inputs to a very low jittergetter square wave output.

Following digital circuitry 1358, 1360 and 1362 illustrated in the exemplary embodiment of FIG. 13 might be any type of digital circuitry that requires a stable periodic clock, such as a phase-lock-loop, a tunable filter, a digital frequency synthesizer, and the like. Characteristically, high speed switching circuits of these types generate a great deal of noise, particularly as a result of ground bounce, switch transients and ringing. In order to minimize feed through coupling of these noise sources back to the crystal oscillator circuit, and in contrast to the prior art, the system of the present invention utilizes two stages of buffering.

In the prior art, signal transformation from a sinusoidal signal to a square wave output is typically implemented by using an inverter to square sinusoidal input signal. A digital inverter function might be characterized as a nonlinear amplifier of a transformed sinusoidal input signal to a square wave by providing an extremely high gain, such that the input signal is driven to the rail during amplification (i.e., clipping). Thus, the output signal of a typical inverter might be characterized as a clipped sine wave. This particular nonlinearity characteristic of the inverter further provides opportunities for phase noise to be added to the output signal.

Phase noise (phase jitter) can also be introduced when the slope of a signal waveform going through a zero transition is not sharp. Thus, in the present invention, phase noise is minimized in the nonlinear buffer amplifiers 1352, 1354 and 1356 by amplifying the differential signal provided by the crystal oscillator circuit through the linear amplifier 720 in order to increase the amplitude, and thus the slew rate, of the signal prior to its conversion to a square wave. Phase noise resulting from zero crossings of the nonlinear buffer amplifiers is thereby minimized.

Further, in a very large scale integrated circuit, there are a great number of digital logic elements coupled to a common power supply. Switching of these digital logic elements causes the power supply voltage to move up and down, causing digital switching noise. This movement in the power supply induces a jitter component at each inverter that is used as a buffer in a conventional oscillator circuit. According to the present invention, maintaining a differential signal throughout the oscillator circuit, including the wave shaping buffers, allows the effects of power supply noise to be substantially eliminated from the oscillator, thus maintaining signal quality. In addition, the use of a differential signal throughout the oscillator's architecture allows common mode noise radiated onto the pins of the crystal resonator to be rejected.

The number of nonlinear buffers which might be cascaded in order to produce a suitable clock signal is an additional important feature in the design of a low phase noise oscillator circuit. In conventional oscillator circuits, multiple cascaded invertors are used to provide high isolation of the final, squared output signal. In such cases, each time the signal passes through a nonlinear inverter, zero crossing occurs which offers an additional opportunity for phase noise to be added to the circuit. In order to minimize phase noise, the present invention contemplates a single stage of nonlinear buffering which presents a high input impedance to the linear buffer 720 which proceeds it. Additionally, the linear buffer 720 is further provided with a high input impedance to further isolate the crystal resonator and its associated differential oscillator driver circuitry from noise loading.

An exemplary embodiment of a linear buffer suitable for use in connection with the periodic signal generation circuit of FIG. 13 is illustrated in simplified, semi-schematic form in FIG. 14. The exemplary embodiment of FIG. 14 illustrates the conceptual implementation of a differential-in differential-out amplifier. The differential implementation has several advantages when considered in practical applications. In particular, maximum signal swing is improved by a factor of 2 because of the differential configuration. Additionally, because the signal path is balanced, signals injected due to power supply variation and switch transient noise are greatly reduced.

The exemplary implementation of a differential-in, differential-out amplifier (indicated generally at 720) of FIG. 14 uses a folded cascade configuration to produce a differential output signal, denoted $V_{out}$. Since the common-mode output signal of amplifiers having a differential output can often be indeterminate, and thus cause the amplifier to drift from the region where high gain is achieved, it is desirable to provide some form of common-mode feedback in order to stabilize the common-mode output signal. In the embodiment of FIG. 14, the common-mode output signal is sampled, at each of the terminals comprising the output $V_{out}$ and fed back to the current-sink loads of the folded cascade.

Differential input signals $V_{in}$ are provided to the control terminals of a differential input pair 1464 and 1466, themselves coupled between respective current sources 1468 and 1470 and to a common current-sink load 1472 to $V_{ss}$. Two additional transistors (P-channel transistors in the exemplary embodiment of FIG. 14) define the cascade elements for current-sources 1468 and 1470 and provide bias current to the amplifier circuit.

High impedance current-sink loads at the output of the amplifier 1476 and 1478 might be implemented by cascoded current sink transistors (N-channel transistors for example) resulting in an output impedance in the region of about 1 Mohm. The common mode feedback circuit 1480 might be implemented as an N-channel differential pair, biased in their active regions and which sample the common-mode output signal and feedback a correcting, common-mode signal into the source terminals of the cascoded transistors forming the current-sinks 1476 and 1478. The cascade devices amplify this compensating signal in order to restore the common-mode output voltage to its original level.

It should be noted that the exemplary linear amplifier of FIG. 14 might be implemented as any one of a number of appropriate alternative amplifiers. For example, it need not be implemented as a fully differential folded cascade amplifier, but might rather be implemented as a differential-in, differential-out op amp using two differential-in single-ended out op amps. Further, the actual circuit implementation might certainly vary depending on the particular choices and prejudices of an analog integrated circuit designer. The input differential pair might be either an N-channel or a P-channel pair, MOS devices might be used differentially as active resistors or alternatively, passive resistor components might be provided, and the like. All that is required is that the linear amplifier 720 amplifies a differential input signal to produce a differential, sinusoidal signal at its output. Thus, the only frequency components reflected back through the linear amplifier 720 will be sinusoidal in nature and thus, will not affect the operational parameters of the differential crystal oscillator frequency. Further, the linear buffer 720 will necessarily have a relatively high output impedance in order to attenuate noise that might be reflected back from the square wave output of the following nonlinear amplifier stages.

Turning now to FIG. 15, there is depicted a simplified semi-schematic diagram of a nonlinear buffer, indicated generally at 1582, such as might be implemented as a wave shaping or squaring circuit 1352, 1354 or 1356 of FIG. 13. The nonlinear buffer 1582 receives a differential, sinusoidal input signal at the gate terminals of an input differential transistor pair 1584 and 1586. Drain terminals of the differential pair 1584 and 1586 are connected together in common and to a current sink supply 1588 which is coupled to a negative potential. Each of the differential pairs' respective source terminals are coupled to a bias network, including a pair of differential bias transistors 1590 and 1592 having their gate terminals tied together in common and coupled to a parallel connected bias network. The bias network is suitably constructed of a resistor 1594 and a current sink 1596 connected in series between a positive voltage potential such as Vdd and Vss. A bias node between the resistor 1594 and current sink 1596 is coupled to the common gate terminals of the bias transistor network 1590 and 1592 and defines a bias voltage for the bias network which will be understood to be the positive supply value minus the IR drop across bias resistor 1594. The current promoting the IR drop across the bias resistor 1594 is, necessarily, the current I developed by the current sink 1596.

A differential, square wave-type output (Vout) is developed at two output nodes disposed between the respective source terminals of the bias network transistors 1590 and 1592 and a respective pair of pull-up resistors 1598 and 1599 coupled, in turn, to the positive supply potential. It should be noted, that the bias network, including transistors 1590 and 1592, function to control the non-linear amplifier's common mode response in a manner similar to the linear amplifier's common mode network (transistors 1244 and 1246 and resistors 1248 and 1250 of FIG. 12).

Although depicted and constructed so as to generate a differential square wave-type output in response to a differential sinusoidal input signal, the non-linear buffer 1582 of FIG. 15 is well suited for single-ended applications as well as for differential applications. If a single-ended output is desired, one need only take a signal from one of the two symmetric outputs. The choice of whether to implement the depend solely on the input requirements of any follow-on digital non-linear buffer as a single-ended or a differential buffer will circuitry which the periodic signal generation circuit in accordance with the invention is intended to clock. This option is solely at the discretion of the system designer and has no particular bearing on practice of principles of the invention.

FIG. 16 is a semi-schematic illustration of an alternative embodiment of the differential oscillator driver circuit (718 of FIG. 12). From the exemplary embodiment of FIG. 16, it can be understood that the oscillator driver circuit is constructed in a manner substantially similar to the exemplary embodiment of FIG. 12, except that a crystal resonator is coupled across the circuit halves above the differential transistor pair, as opposed to being coupled across a circuit from the Von to Vop output terminals. The alternative configuration of FIG. 16 operates in substantially the same manner as the embodiment of FIG. 12 and produces the same benefits as the earlier disclosed oscillator. It is offered here as an alternative embodiment only for purposes of completeness and to illustrate that the specific arrangement of the embodiment of FIG. 12 need not be followed with slavish precision.

It should be understood that oscillator circuits with low phase noise are highly desirable in many particular applications. FIG. 17 illustrates one such application as a reference signal generator in a phase-lock-loop. The phase-lock-loop uses a low phase noise periodic signal generation circuit in accordance with the invention in order to generate a reference signal for use by a phase detector. Providing a clean reference signal to the phase detector is fundamental to providing a clean RF output from the PLL. Since noise and nonlinearities induced by signal generation circuit are carried through the PLL circuit, thus degrading the RF output, reducing phase noise and providing noise rejection early on in the signal processing chain is advantageous to maintaining a clean RF output. A differential crystal oscillator (710 of FIG. 7) advantageously provides this claim signal by maintaining a differential signal across the terminals of the resonating crystal, an improvement not currently available in state-of-the-art crystal oscillators. Additionally, the use of linear buffer amplifiers followed by nonlinear amplification in a reference oscillator circuit is a unique improvement over the prior art in reducing phase noise.

Since PLLs have become available in integrated circuit form, they have been found to be useful in many applications. Certain examples of advantageous application of phase-lock-loop technology include tracking filters, FSK decoders, FM stereo decoders, FM demodulators, frequency synthesizers and frequency multipliers and dividers. PLLs are used extensively for the generation of local oscillator frequencies in TV and radio tuners. The attractiveness of the PLL lies in the fact that it may be used to generate signals which are phase-locked to a crystal reference and which exhibit the same stability as the crystal reference. In addition, a PLL is able to act as a narrow band filter, i.e., tracking a signal whose frequency may be varying.

A PLL uses a frequency reference source in the control loop in order to control the frequency and phase of a voltage control oscillator (VCO) in the loop. The VCO frequency may be the same as the reference frequency or may be a multiple of the reference frequency. With a programmable divider inserted into the loop, a VCO is able to generate a multiple of the input frequency with a precise phase relationship between a reference frequency and an RF output. In order to maintain such a precise phase and frequency relationship, the frequency reference provided to the PLL must, necessarily, also be precise and stable.

FIG. 18 is a simplified block diagram of an illustrative frequency synthesizer that might incorporate the differential periodic signal generation circuit of the invention. The frequency synthesizer is a signal generator that can be switched to output any one of a discrete set of frequencies and whose frequency stability is derived from a crystal oscillator circuit.

Frequency synthesizers might be chosen over other forms of frequency sources when the design goal is to produce a pure frequency that is relatively free of spurious outputs. Particular design goals in frequency synthesizer design might include suppression of unwanted frequencies and the suppression of noise in a region close to the resonant frequency of the crystal that is a typical source of unwanted phase modulation. Synonymous terms for this type of noise are broadband phase noise, spectral density distribution of phase noise, residual FM, and short term fractional frequency deviation.

To reduce the noise produced in a synthesizer, crystal oscillators are commonly used due to their stability and low noise output. The use of a periodic signal generation circuit incorporating a differential crystal oscillator according to an embodiment of the present invention advantageously improves these performance parameters. Improved phase noise is achieved through the use of linear buffering followed by nonlinear amplification, while noise rejection is provided by the differential design utilized throughout the circuitry architecture.

It should be evident that a periodic signal generation circuit according to the invention has many uses in modern, state-of-the-art timing circuits and systems. The periodic signal generation circuit is constructed of simple active and passive components which are easily implemented in modern integrated circuit technology. Thus allowing substantially all of the components to be accommodated on one monolithic integrated circuit chip for which the crystal oscillator portion is providing a suitable, stable periodic timing reference signal. Only the resonating crystal portion (crystal resonator or quartz crystal resonator) is provided as an off-chip component. This particular configuration allows for considerable savings in component parts costs by partitioning more and more functionality into the integrated circuit chip itself.

A more detailed description of the oscillator is provided in U.S. patent application Ser. No. 09/438,689 filed Nov. 12, 1999 entitled "Differential Crystal Oscillator" by Christopher M. Ward and Pieter Vorenkamp; based on U.S. Provisional Application No. 60/108,209 filed Nov. 12, 1998, the subject matter of which is incorporated in its entirety by reference. The oscillator's output is a differential signal that exhibits high common mode noise rejection. Use of a low noise reference oscillator with differential signal transmission allows the synthesis of stable low noise local oscillator signals. Advantageously in the present exemplary embodiment of the invention a unique generation of the local oscillator signals allows complete integration of a receiver circuit on a CMOS integrated circuit by reducing noise in the signal path.

Frequency synthesizers and a radio frequency receiver often incorporate phase locked loops that make use of a crystal oscillator as a frequency reference. A PLL is used to provide coarse tuning within the frequency band of interest while a second PLL provides fine tuning steps. Advantageously, the present embodiments of the invention utilize a method of coarse/fine PLL adjustment to improve the performance of the integrated tuner.

Coarse/Fine PLL Adjustment

FIG. 19 is a diagram illustrating receiver tuning. The combination of a wide band PLL 1908 and a narrow band PLL 1910 tuning provides a capability to fine tune a receiver's LOS 1902, 1904 over a large bandwidth in small frequency steps. For the exemplary embodiments of QAM modulation a small frequency step is 100 kHz, and 25 kHz for NTSC modulation. Fine tuning is available over an entire exemplary 50 MHz to 860 MHz impact frequency band width 1906. The first PLL 1908 tunes a first LO 1902 in large 10 MHz frequency steps and the second PLL 1910 tunes a second LO 1904 in much smaller steps. The first intermediate frequency (IF) filter 1912 has a sufficiently wide band width to allow up to 10 MHz frequency error in tuning the first intermediate frequency, with the narrow band PLL providing final fine frequency tuning to achieve the desired final IF frequency 1914.

FIG. 20 is a block diagram of an exemplary tuner 2002 designed to receive a 50 to 860 MHz bandwidth signal 2004 containing a multiplicity of channels. In this exemplary band of frequencies, there are 136 channels with a spacing between channel center frequencies of six megahertz 2008. The tuner selects one of these 136 channels 2006 that are at a frequency between 50 and 860 MHz by tuning to the center frequency of the selected channel 2010. Once a channel is selected the receiver rejects the other channels and distortion presented to it. The selected channel is down converted to produce a channel centered about a 44 MHz intermediate frequency (IF) 2012. Alternatively the value of the intermediate frequency ultimately produced by the tuner may be selected utilizing the method of the invention to provide any suitable final IF frequency, such as 36 MHz.

In selecting one of these 136 channels, a maximum frequency error in the local oscillator (LO) frequency used to tune the channel to a given IF of plus or minus 50 kHz is allowable. Using one frequency conversion to directly tune any one of the 136 channels to 44 MHz would require a tuning range in the local oscillator of 810 MHz. This would require a local oscillator that tunes from 94 to 854 MHz, if utilizing high side conversion.

Achieving this with a single LO is impractical. Tuning range in local oscillators is provided by varactor diodes that typically require 33 volts to tune them across their tuning range. Additionally, within this tuning range a frequency tuning step of 100 kHz is required to ensure that the center frequency of a tuned channel is tuned within plus or minus 50 kHz. Thus, a large range of frequencies would have to be tuned in small increments over a 33 volt tuning signal range.

Returning to FIG. 19 illustrating the frequency tuning method of the invention an exemplary 50 to 860 MHz signal 1906 is presented to a first mixer 1916 that is tuned with a wide band PLL 1908 that tunes a first LO 1902 in frequency steps of 10 MHz. This local oscillator 1902 is set to a frequency that will nominally center a channels that has been selected at a first IF of 1,200 MHz 1918. The first IF 1918 is then mixed 1920 to the second IF of 275 MHz 1922. This is done by the narrow band PLL 1910 that tunes a second LO 1904 in frequency steps of 100 kHz. The second IF 1922 is next mixed 1924 down to a third IF 1926 of 44 MHz by a third local oscillator signal 1928. This third local oscillator signal 1930 is derived from the second local oscillator or narrow band PLL signal by dividing its frequency by a factor of four.

FIG. 21 is an exemplary table of frequencies utilizing coarse and fine PLL tuning to derive a 44 MHz IF ("IF-3"). A process is utilized to determine the wide and narrow band PLL frequencies. The relationship between the wideband PLL and narrowband PLL frequencies to yield the desired intermediate frequency is found from:

$$FLO1-Fsig-(5/4*FLO2)=Fif \tag{4}$$

where:

FLO1: PLL1 frequency (10 MHz steps)

FLO2: PLL2 frequency (e.g., 25 kHz/100 kHz/200 kHz or 400 kHz step)

Fsig: Input signal

Fif (e.g., 44 MHz or 36 MHz or whatever IF is required)

Example:

$$1250M-50M-(5/4*924.8M)=44M$$

where:

Fsig=50 MHz

FLO1=1250 MHz

FLO2=924.8 MHz

Fif=44 MHz

FIGS. 21 and 22 utilized this formula to derive the values entered into them to tune the exemplary cable TV signals "Frf". For example the first column 2102 of the table lists the frequencies needed to tune a signal centered at 50 MHz ("Frf") to a 44 MHz final IF ("IF-3"). To tune a received channel centered at 50 MHz a first LO of 1,250 MHz ("LO-1") is provided by a wide band, or coarse, PLL. This produces a first IF of 1,200 MHz ("IF-1"). Next utilizing 100 kHz tuning steps to adjust LO 2, it is set to 924.8 MHz ("LO-2"). Note this is not exactly 925 MHz. Dividing the second LO by 4 in this instance yields 231.2 MHz for a third LO ("LO-3"). When LO 3 is applied to the second IF of 275.2 a third IF of 44 MHz ("IF-3") is produced. This tuning arrangement is illustrated for received channels having a six MHz channel spacing as can be seen from the line entitled "Frf". In each case the coarse fine tuning approach yields a third IF ("IF-3") of 44 MHz.

FIG. 22 is an illustration of an alternative embodiment of the coarse and fine PLL tuning method to produce an exemplary final IF of 36 MHz. In this case as previously, a first IF (IF-1) is tuned to 1,200 MHz plus or minus 4 MHz. And second LO (LO-2) is close to 930 MHz, utilizing a small offset to yield a third IF of 36 MHz (IF-3). These predetermined tuning frequencies are stored in a memory and applied when a command is given to tune a given channel. Alternatively an algorithm may be supplied to produce the tuning frequencies. It is understood that these frequencies are exemplary and other frequencies that utilize this method are possible.

Thus, it can be seen that the interaction of course and fine PLL frequencies are utilized to produce a third IF of 44 MHz. A second LO (LO-2) is maintained close to a frequency of 925 MHz to tune each of the channels. However, it is slightly off by a very small tuning step of 100 kHz. Note that the first IF (IF-1) is not always right at 1,200 MHz. Sometime it is off by as much as 4 MHz either above or below 1,200 MHz. This error will still result in signal transmission through a first IF filter. The maximum error utilizing this scheme is plus or minus 4 MHz.

This method of PLL adjustment is described in more detail in U.S. patent application Ser. No. 09/438,688 filed Nov. 12, 1999, entitled "System and Method for Coarse/Fine PLL Adjustments" by Pieter Vorenkamp, Klaas Bult and Frank Carr; based on U.S. Provisional Application No. 60/108,459 filed Nov. 12, 1998, the subject matter of which is incorporated in its entirety by reference.

A coarse, and a fine PLL use a common reference frequency oscillator. Local oscillator signals produced by the frequency synthesizer's phase locked loops inject noise produced in the reference frequency oscillator and the PLLs into a signal path through the PLL output. Noise injected can be characterized as either phase noise or jitter. Phase noise is the frequency domain representation of noise that, in the time domain is characterized as jitter. Phase noise is typically specified as a power level below the carrier per Hertz at a given frequency away from the carrier. Phase noise can be mathematically transformed to approximate a jitter at a given frequency for a time domain signal. In a clock signal jitter refers to the uncertainty in the time length between zero crossings of the clock signal. It is desirable to minimize the jitter produced in an oscillator circuit and transmitted through the signal chain into the signal path to prevent noise degradation in the receiver path. Equivalently, any oscillator producing a stable output frequency will suffice to produce a reference frequency for the PLL circuitry.

Another obstacle to integrating an entire receiver on a single CMOS chip has been the inability to fabricate a satisfactory filter structure on the chip. As previously described, a multitude of unwanted frequencies created through circuit non linearities are a major obstacle in achieving satisfactory receiver performance. Filtering is one method of eliminating these unwanted spurious signals. An integrated filter's center frequency tends to drift, and needs calibration to maintain performance. To successfully use filtering on chip, an auto calibration loop is needed to center the filter response.

FIG. 23 is a block diagram of a dummy component used to model an operative component on an integrated circuit chips. According to one aspect of the invention, a dummy circuit on an integrated circuit chip is used to model an operative circuit that lies in a main, e.g. RF, signal path on the chip. Adjustments are made to the dummy circuit in a control signal path outside the main signal path. Once the dummy circuit has been adjusted, its state is transferred to the operative circuit in the main signal path. Specifically, as shown in FIG. 23, there is a main signal path 2201 and a control signal path 2202 on an integrated circuit chip. In main signal path 2201, a signal source 2203 is coupled by an operative circuit 2204 to be adjusted to a load 2205. Main signal path 2201 carries RF signals. Signal source 2203 generally represents the portion of the integrated circuit chip upstream of operative circuit 2204 and load 2205 generally represents the portion of the integrated circuit chip downstream of operative circuit 2204. The control signal path 2202, a control circuit 2206 is connected to a dummy circuit 2207 and to operative circuit 2204. Dummy circuit 2207 is connected to control circuit 2206 to establish a feedback loop. Dummy circuit 2207 replicates operative circuit 2204 in the main signal path in the sense that, having been formed in the same integrated circuit process as operative circuit 2204, its parameters, e.g., capacitance, inductance, resistance, are equal to or related to the parameters of operative circuit 2204. To adjust operative circuit 2204, a signal is applied by control circuit 2206 to dummy circuit 2207. The feedback loop formed by control circuit 2206 and dummy circuit 2207 adjusts dummy circuit 2207 until it meets a prescribed criterion. By means of the open loop connection between control circuit 2206 and operative circuit 2204 the state of dummy circuit 2207 is also transferred to operative circuit 2204, either on a one-to-one or a scaled basis. Thus, operative circuit 2204 is indirectly adjusted to satisfy the prescribed criterion, without having to be switched out of the main signal path and without causing disruptions or perturbations in the main signal path.

In one implementation of this dummy circuit technique described below in connection with FIGS. 24*a*–*c* and FIGS. 25–27, operative circuit 2204 to be adjusted is a bank of capacitors in one or more operative bandpass filters in an RF signal path, dummy circuit 2207 is a bank of related capacitors in a dummy bandpass filter, and control circuit 2206 is a phase detector and an on-chip local oscillator to which the operative filter is to be tuned. The output of the local oscillator is coupled to the dummy filter. The output of the dummy filter and the output of the local oscillator are coupled to the inputs of the phase detector to sense the difference between the frequency of the local oscillator and the frequency to which the dummy filter is tuned. The output of the phase detector is coupled to the dummy filter to adjust its bank of capacitors so as to tune the dummy filter to the local oscillator frequency. After the dummy filter is tuned, the state of its capacitor bank is transferred, either on a one-to-one or scaled basis, to the operative filter. Since the capacitor bank in the dummy filter replicates that of the operative filter, the frequency to which the operative filter is tuned can be easily scaled to the frequency of the dummy filter.

In another implementation of the dummy circuit technique described below in connection with FIGS. 28 to 33, operative circuit 2204 to be adjusted is a filter having a spiral inductor that has a temperature sensitive internal resistance. Dummy circuit 2207 has an identical spiral inductor. Control circuit 2206 has a controllable variable resistor in series with the inductor of dummy circuit 2207. The controllable resistor is driven by a feedback loop to offset changes in the internal resistance of the inductor of dummy circuit 2207. Operative circuit 2204 has a similar controlled resistor in series with its inductor to transfer the resistance value of the controllable resistor in control circuit 2206 to the resistor of the operative circuit 2204 in open loop fashion.

Filter Tuning

FIG. 24*a* is a block diagram illustrating the use of a tuning circuit outside of a signal path to tune bandpass filters present in a receiver. A tuning circuit 2302 utilizes a substitute or "dummy" filter stage 2310 to derive tuning parameters for a filter bank 2304 present in a signal path 2306. The tuning circuit utilizes a local oscillator signal 2308 available in the receiver to tune the dummy filter 2310 to the center frequency of the local oscillator. Once tuned, the dummy filters 2310 tuned component values that result in a tuned response at the local oscillator frequency are scaled in frequency and applied to the bandpass filter 2312. The filters are tuned at startup, and the tuning circuitry is turned off during normal operation. This prevents the injection of additional noise into the signal path during operation.

FIG. 24*b* is a flow diagram of the tuning process in operation receiver is initially powered up 2312 and local oscillator signals generated by PLLs are centered at their design frequency 2314. Once the PLLs are locked their frequency is a known condition. Next substitute filter tuning is initiated 2316 and performed. When finished a signal is received back from the filter tuning network indicating that it is ready 2318. Information from the tuning network is copied to the receive path filter circuit 2320. Next the filter tuning circuit is turned off 2322 disconnecting it from the filter circuit. In the embodiments of the invention the narrow band PLL (2308, of FIG. 24*a*) is used as reference frequency in the tuning circuit. However, it is understood that this tuning technique may be utilized with any readily available signal.

Returning to FIG. 24*a*, in an exemplary embodiment of the invention a 925 MHz signal is directly available from the narrow band PLL 2308. It is used to tune the dummy filter 2310 contained in the tuning circuit 2302 associated with the 1,200 MHz filter 2304. After the dummy filter is tuned to 925 MHz, frequency scaling is used to obtain the proper component values for the 1,200 MHz filter response to be centered. The exemplary 925 MHz signal generated by the narrow band PLL is divided by 4 to yield a 231 MHz third LO signal utilized in additional tuning circuitry.

Other divisions or multiplications may be equivalently used to tune dummy filters. A second exemplary filter tuning circuit 2302 for a 275 MHz filter contains a dummy filter 2310 that is tuned to a center frequency of 231 MHz. Once tuned, the component values used to center the 231 MHz dummy filter 2310 are scaled to yield a centered response for the 275 MHz filter 2304. At this point in time the tuning circuits 2302 are switched off. It is especially important to turn off the exemplary tuning circuits on the 275 MHz filter since the 231 MHz signal used to tune its dummy filter falls in an exemplary 50–860 MHz band.

It is to be understood that any available frequency may be used to tune a substitute filter so that another filter, that does not have an appropriate tuning signal present, may be tuned. This is done by scaling the component values of the tuned dummy filter to values appropriate for the filter not having the tuning frequency present. Tuning values obtained for a dummy filter may be applied to all filters present in a bank of filters having a common center frequency. Also tuning values obtained for a dummy filter may be applied to multiple filters present having differing center frequencies by applying differing scaling factors. Finally multiple filters at different locations in a signal path that have common center frequencies may be tuned by a common tuning circuit.

Capacitors disposed on an integrated circuit vary in capacitance value by as much as +/−20%. Thus, to provide a satisfactory receiver performance a method of tuning integrated filters that removes this variation in capacitance is needed. In an LC filter circuit either an inductance or a capacitance can be tuned. However, inductors are difficult to tune. Therefore, in the embodiments of the invention values of capacitance present in the filters are tuned. In tuning the exemplary embodiments, one or more capacitors are switched in and out of an LC filter circuit to tune it.

These capacitors are switched in and out of a filter circuit electronically. Capacitors with the same dimensions are provided in a bandpass filter and a dummy filter to provide satisfactory matching between the devices. Switch able caps in the embodiments of the invention are MOS caps that are all of the same value and from factor. However, it is to be recognized that other weighting of capacitor values could be provided to achieve an equivalent function. For example, binary or 1/x weighted values of capacitors could be disposed in each filter to provide tuning. In the embodiments of the invention a bank of fixed capacitors and a bank of electronically tunable capacitors are provided. The adjustable capacitors in the exemplary embodiment represent 40% of the total capacitance provided. This is done to provide for the ±20% variance in center frequency due to manufacturing variances. To accommodate other ranges of manufacturing variations or alternative tuning schemes any fraction or all of the capacitors may be switch able. It is also understood that any type of switch able capacitor, in addition to a MOS capacitor type may be utilized.

FIGS. 24*a*–24*c* are exemplary illustrations of a tuning process utilizing switched capacitors. Filter responses shown at the bottom plot 2402 illustrate a tuning of a dummy filter 2310 that is contained in a tuning circuit 2302 of FIG. 24*a*. A frequency response being tuned in the upper graph 2404 shows the tuning of the exemplary 1,200 MHz bandpass filter 2304 of FIG. 24*a*. Initially none of the switched capacitors are applied in a dummy filter circuit. This places the filter response initially 2406 above the final desired tuned response frequency 2408. In this example capacitors are added until the filter response of the dummy filter is centered about 925 MHz. However, the tuned response of the 925 MHz dummy filter 2408 is not the desired center frequency of the bandpass filter in the signal path. The values used in to tune the dummy filter would not tune the 1,200 MHz filter to the correct response. Frequency scaling is used to tune the desired response. This can be achieved because identical capacitors disposed on a chip are very well matched in value and parasitics. In particular capacitor matching is easy to achieve by maintaining similar dimensions between groups of capacitors. In scaling a response to determine a capacitance to apply in a bandpass filter, identical inductance values have been maintained in the dummy and bandpass circuits. Thus, only a scaling of the capacitors is necessary. The frequency relation in the exemplary embodiment is given by the ratio:

$$\frac{1}{2} \approx \sqrt{\frac{(L_2)(C_2}{(L_1)(C_1}} \tag{5}$$

For this particular embodiment utilizing identical inductor values $L_1=L_2$. This reduces to:

$$\frac{f_1}{f_2} \approx \sqrt{\frac{(C_2)}{(C_1)}} \tag{6}$$

For the exemplary embodiment this is equal to 925/1200, or a capacitance ratio of 3:5. However, it is understood that other ratios will allow tuning to be performed equivalently.

Returning to FIG. 24*a* various control signals applied to the tuning circuit are shown. In the event that the tuning is slightly off after the tuning procedure, an offset control circuit is provided within the tuning circuit of FIG. 24*a* to move the tuning of the filters up or down slightly by providing a manual means of adding or removing a capacitor. This control is shown by an "up/down" control line 2324 of FIG. 24*a*. The exemplary tuning circuit of FIG. 24*a* is additionally provided with a "LO" 2308 tuning frequency to tune the dummy filter. The "10 MHz reference" signal 2326 is utilized as a clock in the tuning circuit that controls the sequence of adding capacitors. The "reset" signal 2328 resets the tuning circuit for the next tuning cycle.

FIG. 25 is a block diagram of an exemplary tuning circuit. A reset signal 2502 is utilized to eliminate all the capacitors from the circuit at power up by resetting a counter 2504 that controls the application of the switched capacitors. The reset signal may be initiated by a controller or generated locally. This provides a known starting point for filter tuning. Next a filter figure of merit is examined to determine iteratively when to stop tuning.

FIG. 26 illustrates the amplitude 2602 and phase 2604 relationship in an LC filter tuned to its center frequency, fc. In tuning a filter to a center frequency two responses are available for examination. Amplitude and phase response are parameters that may be used to tune the filter. For a wide band LC filter amplitude response 2602 is not the optimal parameter to monitor. At the center frequency the top of the response curve is flat making it difficult to judge if the response is exactly centered. The phase response 2604 however, has a rather pronounced slope at the center frequency. The steep slope of the phase signal provides an easily discernable transition for determining when the center frequency has been reached.

Returning to FIG. 25, phase detection is used to detect when a dummy filter 2506 has been tuned. An exemplary 925 MHz input from a narrow band PLL is input 2508 to a phase detector 2510. The phase detector compares the phase of a signal input to a dummy filter 2508 to a phase of the output 2512 of that filter 2506. The phase detector produces a signal that is internally low pass filtered to produce a DC signal 2514 proportional to the phase difference of the two input signals 2512, 2508. When tuned there is a 90 degree phase shift across capacitors internal to the phase detector, that corresponds to 0 degrees of phase shift across the filter. Zero (0) degrees of phase shift produces a 0 volt output. Since it is known that with the capacitors switched out of the filter circuit 2506 that the center frequency of the filter is high, the comparator 2516 following the low pass filter is designed to output 2518 a high signal that enables filter capacitors to be switched in until the phase detector 2510 indicates no phase difference is present across the filter 2506 at the tuned frequency. With a zero degree phase shift detected the comparator 2516 disables the counter preventing any further capacitors from being switched into the filter circuit.

The phase detector 2510 of the exemplary embodiment utilizes a gilbert cell mixer 2512 and an integral low pan filter 2525 to detect phase. However, other phase detectors may be equivalently substituted for the mixer circuit. The 90° phase shift between an i port 2508 and a q port 2512 is being detected by the mixer. A 90° phase shift between the i and the q signals in the mixer provides a 0 volt output indicating that those signals are in quadrature relation to each other. The signals are shown as differential signals, however single ended signals may equivalently be used.

The phase detector out 2514 is next fed into a comparator 2516 that is set to trip on a zero crossing detected at its input. When a zero crossing is encountered as the phase detector output approaches zero, the comparator latches and a counter 2504 is shut off and reset 2518. The comparator function is equivalently provided by any standard comparator circuit known by those skilled in the art.

The counter 2504 counts based on the 10 MHz reference clock 2524, although many periodic signals will suffice as a clock. As the counter advances more filter capacitors are switched into the circuit. In the embodiments of the invention 15 control lines 2526 are used to simultaneously switch the capacitors into the dummy filter and the bandpass filter bank. The control lines remain hard wired to both filters 2528, 2506, and are not switched off. However, once the comparator 2516 shuts the counter 2504 off the tuning circuit 2530 is inactive and does not affect the band pass filter 2520 in the signal path.

FIG. 27 is a schematic diagram showing the internal configuration of switch able capacitors in a differential signal transmission embodiment of the dummy filter 2506 and the construction of the phase detector 2510. A set of fifteen control lines 2526 are utilized to switch fifteen pair of MOS capacitors 2702 on and off. The capacitors are switched in and out by applying a given control signal to a virtual ground point 2704 in this configuration. Thus, when the capacitors are connected as shown the control signal is being applied at a virtual ground. Thus, parasitic capacitances at this point will not affect the filter 2506 performance. A gain producing LC stage 2706 of the dummy filter is of a differential configuration and has its LC elements 2708 connected in parallel with the MOS capacitors 2702.

Thus, with a capacitance ratio of 3:5 being utilized in the exemplary one line of embodiment a hard wired bus 2526 going to the dummy filter 2506 will switch in 5 unit capacitors, while the other end of the line that goes to the bandpass filter (2528 of FIG. 25) in the signal path will switch in 3 unit capacitors.

In the mixer circuit that is used as a phase detector 2710 in the exemplary embodiment, differential image ("i") signals $I_P$ and IN and differential quadrature ("q") signals $Q_P$ and $Q_N$ are input to the phase detector. A conventional Gilbert cell mixer configured as a phase detector 2710, as shown, has delay between the i port 2508 and q port 2512 to the output 2514. The i delay to the output tends to be longer due to the fact that it must travel through a greater number of transistors than the q input to output path. Thus, even if i and q are exactly 90 degrees out of phase a DC offset tends to produced due to the path length differences causing a phase error. To remedy this situation a second Gilbert cell mixer is duplicated 2710 and connected in parallel with the first 2710. However, the i port and the q port connected to the mixer 2712 are swapped to average out the delay thus tending to reduce the offset. This results in an almost 0° output phase error that is independent of frequency. Other types of phase detectors and other means of equalizing the delay, such as a delay line are understood by those skilled in the art to provide an equivalent function.

In the embodiment shown, the loss pass filter is implemented by a single capacitor 2714 at each output. However, other equivalent methods of achieving a low pass filter known to those skilled in the art are acceptable as well.

A method of filter tuning the advantageously uses the frequency synthesizer output is fully described in U.S. patent application Ser. No. 09/438,234 filed Nov. 12, 1999 entitled "System and Method for On-Chip Filter Tuning" by Pieter Vorenkamp, Klaas Bult and Frank Carr; based on U.S. Provisional Application No. 60/108,459 filed Nov. 12, 1998, the subject matter of which is incorporated in its entirety by reference.

Filters contain circuit elements whose values are frequency and temperature dependent. The lower the frequency, the larger the size of the element required to realize a given value. These frequency dependent circuit elements are capacitors and inductors. The fabrication of capacitors is not as problematic as the fabrication of inductors on an integrated circuit. Inductors require relatively more space, and because of their size has a temperature dependent Q.

Active Filter Multi-Track Integrated Spiral Inductor

FIG. 28*a* is a plan view of a multi-track spiral inductor 2800 suitable for integration onto an integrated circuit, such as one produced with a CMOS process. A standard CMOS process often utilizes a limited number of layers and a doped substrate. These conditions do not provide optimum conditions for fabrication an on chip inductor. Currents induced in the heavily doped substrate tend to be a source of significant losses. The multi-track inductor 2800 is made from several long narrow strips of metal 2804, 2806 connected in parallel 2808, 2810 and disposed upon an integrated circuit substrate 2802. A multi-track integrated spiral inductor tends to produce an inductance with a higher Q. High Q is desirable to achieve lower noise floors, lower phase noise in oscillators and when used in filters, a better selectivity. To reduce series resistance and thus improves the Q of a spiral inductor, a single wide track width in the spiral is typically used by those skilled in the art.

Skin effect is a frequency dependent phenomena, occurring where a given current is present in a conductor, that produces a current density in the conductor. At DC, where the frequency is zero, the current density is evenly distributed across a conductor's cross section. As the frequency is increased the current crowds to the surface of the conductor. At high frequency substantially all of the current tends to flow in the surface of the conductor. Thus, the current density at the center of the conductor is very low, and at the surface it is greater. A skin depth is the depth in the conductor (δ) at which the current is 1/e=0.368 the value of the current on the surface. The equation for skin depth is:

$$\delta=(2\pi f\sigma\mu)^{-1/2} \quad (7)$$

where:

f=frequency in Hz

σ=conductivity of the conductor in mhos/m

μ=permeability in Henrys/m

As can be seen from the equation (7) the frequency increases the skin depth decreases.

When track width is increased beyond 10–15 μm the skin effect causes the series resistance of a spiral inductor to increase at high frequencies. Thus, Q is reduced even though a wide track has been used. This trend tends to limit the maximum Q achievable in integrated spiral inductors.

Reduced Q at high frequencies in spiral inductors having a wide track width tends to be caused by eddy currents induced in a spiral inductor's inner sections 2812. Multiple narrow tracks placed side-by-side 2804, 2806 tends to reduce the eddy currents produced. In a spiral inductor eddy currents tend to produce a magnetic field opposing a desired magnetic field that produces a desired inductance. Thus, by reducing the eddy currents the desired inductance is more efficiently produced with less loss, hence raising the inductor's Q.

The multi-track technique is advantageously utilized in applications requiring a winding. Examples of devices utilizing multi-track windings comprise: planar spiral inductors (rectangular, octagonal or circular patterns) transformers, and baluns. These devices are suitable for incorporation into architectures comprising: integrated circuits, hybrid circuits, and printed circuit boards.

The first exemplary embodiment shown in FIG. 28*a* is of a square spiral inductor 2800 that is wound in two turns with several narrow tracks 2804, 2806 disposed in parallel upon a substrate 2802. Equivalently any number of track may be used to achieve a multi-track design. A turn is counted each time the track is wound around in a spiral such that a starting point 2814 is passed. Typically 5 to 20 turns are utilized in a spiral, with 3 to 10 producing optimum performance. Alternative embodiments of the invention equivalently utilize one or more turns as required to achieve a desired inductance for a given track width.

For example a single track spiral inductor is designed to have a single track width of 30 μm in a given number of turns to produce a desired inductance. By splitting an exemplary 30 μm wide track into two 15 μm tracks 2804, 2806 disposed in parallel on the substrate, the inductor Q tends to increase. A typical Q for the single track inductor with a track-width of 30 mm is 5.14. The Q of the exemplary dual track inductor 2800 with two 15 mm tracks 2804, 2806 in parallel is typically 5.71. Thus, utilizing two narrower tracks in parallel tends to yield an improved Q over a single wider track. A typical improvement in Q for splitting an inductor's track is in excess of 10%. A further splitting of an inductor's tracks into multiple narrower parallel tracks tends to further increase the measured Q.

FIGS. 28*b*–28*g* illustrate various planar devices comprising inductor 2820, 2822, 2824, 2816 and transformer 2826, 2818 configurations suitable for incorporating multiple tracks into their designs. The devices are shown with single tracks for clarity. However, it is understood that each of the tracks shown in the devices may comprise multiple tracks constructed as described below. The method is advantageously used in, various planar inductor topologies comprising square 2820, octagonal 2822, and circular 2824.

An example of a 3-turn symmetric inductor is shown 2816. Each of the single tracks shown is sub-divided into multiple tracks as described below. The multiple tracks are joined only at the ends 2826. A series of phantom lines 2828 indicate tracks on a different layer, connected to a track shown by a solid line using one or more vias. When routing multiple vertical tracks 2825 that are tied in common with vias 2827 to a different layer the tracks being routed may be reduced to one track 2829, or the multiple vertical structure may be maintained 2831. This method is suitable for suitable for symmetric inductors of any number of turns.

The symmetric inductor 2816 may be used as a building block to construct a transformer 2818. A second symmetric inductor 2833 is wound in parallel with the symmetric inductor shown 2816. The ends of the first inductor 2830, 2832 are kept separate from the second symmetric inductor 2834, 2836. The resulting four ends 2830, 2832, 2834, 2836 comprise the transformer connections. The symmetric inductor with a parallel winding 2818 is suitable for use as a balun for converting single-ended signals to differential signals and vice versa. The coupling is provided by the winding arrangement.

Alternatively two symmetric inductors of the type shown 2816 are placed substantially on top of each other, on different layers to produce a transformer, or balun as previously described.

FIG. 28*h* is an illustration of a second embodiment of an inductor having a single winding comprising five tracks 2838 per layer. The tracks are a maximum of 5 μm wide. The embodiment comprises one or more layers. The second embodiment further comprises a square spiral form factor constructed from five conductive tracks 2838 per layer formed into a single turn. Individual tracks are kept at a maximum width of 5 μm. A 0.6 μm gap between adjacent tracks 2840 is maintained. The minimum gap is a requirement for a given process. Here it is a limitation of the CMOS process. At frequencies between 2 GHz and the inductor's self-resonant frequency an inductor constructed of multiple tracks of widths up to the maximum width tends to exhibit improved performance in quality factor (Q). Utilizing multiple narrower tracks in parallel tends to yield an improved Q over a single wider track, and a single double track inductor. The tracks in each layer are connected at their ends by a conductive strip 2842.

In a third exemplary embodiment six tracks are disposed on a layer. In the embodiment, a 30 mm track inductor is split into six parallel tracks of 5 mm each. Utilizing 6 tracks tends to improve the Q from 5.08 to 8.25, a 62% increase in Q. Improvements in an inductor's quality factor tends to improve the suitability of spiral inductors for use in high frequency circuits. For example multi-track spiral inductors are advantageously used in high frequency voltage-controlled oscillator (VCO) and tuned amplifier circuits.

FIG. 28*i* illustrates the placement of tracks 2844, 2848 in a layered structure 2846. In constructing an inductor according to this technique a set of parallel tracks 2844, 2848 are disposed side-by-side in a arraignment similar to that of coupled transmission lines. The side by side pattern is disposed in multiple layers M5, M4, M3. Each track disposed in a common layer has a starting point and an ending point. Each track's starting point 2850 in a layer is coupled together, and each track's ending point is coupled together in the layer 2852. A pass through track 2854 is disposed in a layer to provide access to the end of an inner turn.

The placement of conductive via holes V2, V3, V4 in the embodiments of the invention couple the tracks in adjacent layers M2, M3, M4, M5. In the multiple track inductors described, the multi-tracks are joined together at the beginning of a winding 2850 and again joined together at the end of the winding 2852 by a conductive material. Vias between layers are formed to couple a bottom track to one or more tracks disposed in layers above it. Vias are utilized along the length of the track.

Thus, by utilizing this technique a group of multiple tracks are formed in a first embodiment by disposing tracks in a combination of vertical layers M2, M3, M4, M5 and side-by-side in the same layer 2856, 2858. In a second embodiment an inductor is formed by disposing tracks side by side in the same layer. In a third embodiment an inductor is formed by layering tracks on top of each other vertically. By connecting the track layers vertically using vias, the series resistance loss tends to be decreased due to increased conductor thickness.

For example, in an embodiment three layers are utilized in which individual track width is limited to 5 to 6 μm in width, with four to six tracks disposed in parallel in each layer. In the embodiment vias are used vertically between metal layers to connect the tracks. The vias are used in as many places as possible along the length of each track to couple the layers. However, the parallel tracks in the same layer are joined to each other only at the ends.

FIG. 28*j* is an illustration of an embodiment utilizing a shield 2860 disposed beneath an inductor 2862. A shield tends to double inductor Q in the 3~6 GHz frequency range for a lightly doped substrate, such as is utilized in a non-epi process, a 100% improvement. If a heavily doped substrate, such as is found in an epi-process is utilized, the shield tends not to improve inductor Q. The embodiment shown utilizes an $n^+$ shield 2860. An n+ diffusion advantageously tends to possess less capacitance between the inductor and ground plane than if polysilicon is used as the shield material. The ground planes are silicided $n^+$ material possessing a low resistivity. Silicided $n^+$ material is available in the fabrication process utilized in CMOS.

FIG. 28*k* is an illustration of a patterned shield 2864 that is utilized beneath a multi-track inductor. A patterned $n^+$ shield is utilized beneath the inductor to reduce losses to the substrate. In the embodiment an n+ diffusion is provided in a fingered pattern of n+ regions 2866. Polysilicon is disposed in a series of gaps 2868 between the n+ fingers. The patterned shield provides shielding equivalent to a solid ground plane, but without undesirable eddy currents. The shield is disposed in a fingered pattern 2866 to prevent having a single large surface as a ground plane. Fingering tends to prevent the inducement of eddy currents flowing in one or more ground loops. Ground loops tend to cancel the inductance produced in the spiral.

The finger structure of the patterned shield is constructed from an $n^+$ diffusion layer. The gaps between the fingers are filled with polysilicon material. The $n^+$ diffusion fingers and polysilicon fingers formed by the filling are not coupled to each other, thus preventing eddy current flow in the shield. An interdigitated shield 2864 as described above tends to be an improvement over an $n^+$ only shield 2860 of FIG. 28*j*. The interdigitated n+ finger shield also tends to be an improvement over a higher capacitance fingered polysilicon shield having gaps between the fingers, which is known in the art.

The individual fingers of like material are connected 2870. To suppress eddy currents and break ground loops care is taken in the connection of individual fingers 2886 in a ground shield pattern. The ends of the fingers in a row are connected by a conductive strip of metal 2870. This connection is repeated at each grouping. The groupings are connected 2870 to a single ground point 2874. In an embodiment a ring of conductive material is disposed on the substrate to connect the finger patterns.

A cut 2876 in the ring is added to suppress ground loop currents. The cut maintains a single point ground by only allowing the flow of current in one direction to reach the single point ground 2874.

One or more spirals of metal have a series resistance associated with them. A spiral can be quite long, thus, the series resistance of the inductor is not negligible in the design of the circuit even with a parallel connection of tracks. As the temperature of the circuit rises, such as would occur after the initial power-up of an integrated circuit, the series resistance of the inductor increases, thus causing the Q to decrease. Circuitry is provided to continuously compensate for this increasing series resistance.

An inductor, or coil, has always been a fabrication problem in integrated circuitry. Inductors are typically not used in integrated circuits due to the difficulty of fabricating these devices with high Q's and due to the large amount of area required to fabricate them.

It is a rule of thumb that the higher the frequency the smaller the dimensions of the integrated circuit component required in a filter to achieve a given set of circuit values. A spiral inductor of the type described in the embodiments of the invention allows an inductor with improved Q's to be satisfactorily fabricated on a CMOS substrate. Many alternative embodiments of the spiral are known to those skilled in the art. The realization of inductance required in any embodiment of the invention is not limited to a particular type of integrated inductor.

The details of multi-track spiral inductor design are disclosed in more detail in U.S. patent application Ser. No. 09/493,942 filed Jan. 28, 2000, entitled "Multi-Track Integrated Spiral Inductor" by James Y. C. Chang; based on U.S. Provisional Application No. 60/117,609 filed Jan. 28, 1999 and U.S. Provisional Application No. 60/136,654 filed May 27, 1999, the subject of which is incorporated in this application in its entirety by reference.

FIG. 29 is an exemplary illustration of the possible effects of inductor Q on filter selectivity in a parallel LC circuit, such as shown in 2706 of FIG. 27. The Q of a spiral inductor tends to be low. In order to advantageously control the Q so that the maximum performance of an integrated filter may be obtained, calibration of inductor Q is used.

The overall effect of this is that when a device with high series resistance and thus, low Q is used as a component in a filter that the overall filter Q is low 2902. A high Q filter response is sharper 2984. The goal of a filter is to achieve frequency selectivity. The filter selectivity is the same electrical property as selectivity in the "front end" of the receiver previously described. If the filter has a low Q frequencies outside the pass band of the filter will not achieve as great of an attenuation as if the filter contained high Q components. The high degree of selectivity is required to reject the multitude of undesirable distortion products present in a receiver that fall close to the tuned signal. Satisfactory inductor dimensions and device Q have been obstacles in integrating filters on a CMOS substrate.

Prediction of the inductance yielded by the spiral is closely approximated by formula. However, prediction of the inductor's Q is more difficult. Three mechanisms contribute to loss in a monolithically implemented inductor. The mechanisms are metal wire resistance, capacitive coupling to the substrate, and magnetic coupling to the substrate. Magnetic coupling becomes more significant in CMOS technologies with heavily doped substrates, because the effect of substrate resistance appears in parallel with the inductor. The first four or five turns at the center of the spiral inductor contribute little inductance and their removal helps to increase the Q. In spite of extensive research inductors implemented in CMOS possess Qs after limited to less than five.

FIG. 30 is an illustration of a typical filter bank 3002 utilized in embodiments of the invention for filtering I and Q IF signals 3208. Band pass filters utilized in the embodiments of the invention have a center frequency $f_c$ and are designed to provide a given selectivity outside of the pass bond. The exemplary filters 3002 also incorporate gain. Gain and selectivity are provided by an amplification ("transconductance") stage with an LC load, resulting in an active filter configuration that gives the filter response shown. Selectivity is provided principally by the LC load. The gain is attributable to the transconductance stage. The transconductance stage comprises a linearized differential pair amplifier that has an improved dynamic range. Over temperature the filter response degrades as indicated in FIG. 30. This degradation is typically attributed to inductors.

With the spiral inductors utilized in the embodiments of the invention the gain of this filter stage is substantially determined by the Q or quality factor of the inductor. The Q is in turn substantially determined by the series resistance of the metal in the spiral of the inductor. The Q decreases as temperature increases causes an increase in inductor series resistance. The decrease in Q with increasing temperature adversely affects the filter characteristics. As can be seen in 306 at FIG. 30 as the temperature increases from 50° C. 3004 to 100° C. 3006 overall gain decreases, and selectivity is degraded.

Active Filter Utilizing a Linearized Differential Pair Amplifier

A linearized differential pair amplifier is used in the active filters present in the receiver. The technique utilized to linearize the CMOS differential pair described in light of application to active filters may be utilized in any application in which a differential amplifier having a linear response is desirable.

FIG. 31*a* is a diagram of an exemplary differential transconductance stage 3102 with an LC load 3104. Together the transconductance stage and LC load make up a filter 3002 that is a part of filter bank 3001. The exemplary embodiment of the filter is disposed on a CMOS substrate that is part of an integrated receiver.

FIG. 31*b* is a block diagram of a linearized differential pair amplifier that is coupled to distortion canceling liberalization circuit. Gain stage 3102 comprises a differential pair amplifier 3103 that has a liberalization circuit 3105 coupled to form a linearized differential pair. In the embodiment shown the liberalization circuit is coupled in parallel to the differential pair amplifier.

The linearized differential pair typically improves maximum signal handling capability over that of a differential pair in excess of 19 dB. In the past, typical improvements with prior art liberalization schemes applied to differential pair amplifiers tended to be around 7 dB. Thus, the approach described in the embodiment tends to have a dynamic range advantage of 12 dB over the prior art.

An embodiment of the differential pair amplifier 3103 comprises a first and second FET transistor M1, M2. Equivalently, other type of transistor are contemplated as satisfactory substitutes. A differential input comprises signals $V_{i1}$ and $V_{i2}$ coupled to the inputs of the amplifier 3103 and liberalization circuit 3105. A differential output comprises signals $V_{o1}$ and $V_{o2}$.

An embodiment of the liberalization circuit 3105 comprises two or more auxiliary differential pairs 3107, 3109 respectively. Each auxiliary differential pair comprises a first and a second FET transistor. Auxiliary differential pair 3107 comprises transistors M3 and M4. Auxiliary differential pair 3109 comprises transistors M5 and M6. Equivalently, other type of transistor are contemplated as satisfactory substitutes. Further improvements in liberalization is possible by adding more auxiliary differential pairs. However, as liberalization is increased the size of transistors contained in the additional auxiliary differential pairs decreases. Thus, a limit in the liberalization that may be obtained is set by the practical aspects of device matching and scaling.

FIG. 31*c* is an illustration depicting a representative channel of any one of the typical field effect of transistors M1, M2, M3, M4. A channel of length l, and a width w and a thickness t is disposed on a substrate to form a field effect transistor (FET) as shown in FIG. 31*c*. The channel is provided with ohmic contacts 3111 for a drain connection and a source connection.

In an exemplary embodiment of a filter designed to operate at 275 MHz the channel lengths of M1, M2, M3, M4, M5, and M6 were chosen to have l=0.6 μm. In Table I for an $I_{ss}$=9 mA and n=16 the channel widths for the transistors in the exemplary embodiment of the 275 MHz filter are shown.

TABLE I

| Device Width | | | | |
|---|---|---|---|---|
| $W_{1,2}$ | $W_{4,5}$ | $W_{3,6}$ | Iss | n |
| 1.9 um × 20 | 2 um × 5 | 1.95 um × 2 | 9 mA | 16 |

The subscripts in table I refer to the transistor that is associated with a given channel width. For example $W_{1,2}$ refers to the channel width of transistor M1 and M2. $I_{ss}$ is the main pair tail current source, and n refers to the ratio of the main pair tail current source.

Transistor M1 and M2 has a width of 1.9 μm×20, transistor M4 and M5 have a channel width of 2.0 μm×5, and transistors M3 and M6 have a channel width of 1.95 μm×2. In the notation used the dimension with an "x" refers to the number of transistors coupled in parallel. For example 2.0 μm×5 refers to 5 transistors with a 2 μm channel width coupled in parallel, to form an overall 10 μm channel width. An exemplary filter constructed with these channel widths and the fixed length exhibits a third order intermodulation typically less than −70 dB when fed with a two-tone input, each tone having a magnitude of 125 $mV_p$.

The channel widths and lengths of the exemplary embodiment were chosen through an optimization process. The transistors in the auxiliary differential pair amplifiers, when stimulated by the amplifier input will produce a signal that when added to the gain stage output, will tend to reduce distortion.

FIG. 31*d* is a block diagram showing the interconnection of a differential pair amplifier 3103 to a liberalization circuit 3105. Gain stage 3103 is made up of a differential pair amplifier comprising a pair of transistors M1 and M2, each transistor having a drain, a source and a gate. Transistors M1 and M2 tend to contribute to the majority of an overall amplifier gain produced.

In the differential pair amplifier the sources of M1 and M2 are each coupled to a first terminal of a current source $I_{SS}$. A second terminal of $I_{ss}$ is coupled to ground. Current source $I_{ss}$ is a conventional current source implemented in a manner known to those skilled in the art. The drain of M1 is coupled to an output current $I_1$. The drain of M2 is coupled to an output comprising current 12. A differential input voltage is applied across a pair of terminals $V_{i1}$, $V_{i2}$ that are coupled to the gates of M1 and M2, respectively.

The two auxiliary pair differential amplifiers 3107, 3109 are present as shown. The auxiliary amplifiers tend to linearize the currents $I_1$ and $I_2$. Currents 3113 and 3115 tend to subtract non-linear currents from current $I_1$ and current $I_2$ respectively. The gates of the differential pairs 3107, 3109 are also driven by the input differential voltage that is supplied to the differential pair amplifier 3103.

The relationship of transistor parameters of channel length and width (of FIG. 31*c*) in transistors M1, M2 to the transistor parameters of M3, M4, M5, M6, contained in the auxiliary differential pair amplifiers 3107 and 3109 of the linearization circuit, is to minimize distortion. The transistors function in relation to each other such that distortion created by the transistors in the differential pair amplifier generating current outputs $I_1$ and $I_2$, tends to be reduced by the currents generated by the transistors M3, M4, M5, M6 of the auxiliary differential pair amplifiers 3113, 3115. In order to select appropriate transistor parameters a new CMOS differential pair linearization technique is utilized. The technique is found from examining the operating parameters of a differential pair amplifiers and cross coupled differential pair amplifiers.

FIG. 31*e* is a schematic illustrating a CMOS differential pair of transistors. In the exemplary embodiment the transistors are biased to operate in the saturation region. The differential pair of transistors generate a differential current output $I_{d1}$ and $I_{d2}$, that is proportional to a differential input voltage, supplied by a pair of voltages $V_{i1}$ and $V_{i2}$ as referenced to a circuit ground potential. The differential pair of transistors is comprised of a first transistor M1 and a second transistor M2.

Each transistor M1, M2 has a drain, a source and a gate terminal. The sources of M1 and M2 are coupled to a first terminal of a current source $I_{ss}$. The current source $I_{ss}$ has a second terminal which is coupled to the circuit ground. Current source $I_{ss}$ is constructed conventionally as is known to those skilled in the art. The voltages $V_{i1}$ and $V_{i2}$ are applied to the gates of transistors M1 and M2 respectively. The drains of transistors M1 and M2 supply the current outputs $I_{d1}$ and $I_{d2}$ respectively.

The differential pair of FIG. 31*e* is biased so that each transistor M1 and M2 operates in the saturation region defined by $(V_{GS}-V_{th})_{M1,2} \leqq V_{DS}$ for each transistor M1 and M2 Derivation of this relationship is disclosed in "Analysis and Design of Analog Integrated Circuit Design", by P. R. Gray and R. G. Meyer, 3rd ed. John Wiley and Sons, 1983, the disclosure of which is herein incorporated in its entirety by reference. Where $V_{GS}$ is a gate source voltage as measured across the gate and source terminals of M1 and M2, $V_{DS}$ is a drain source voltage as measured across the drain and source terminals of M1 and M2, and $V_{th}$ is a threshold voltage associated with M1 and M2. A derived term $V_{gt}$ is defined in conjunction with equation (7.1) and is equal to on $V_{gs}-V_{th}$. The superscript notation M1,2 associated with $V_{gt}$ indicates the parameter is associated with transistors M1 and M2. When the differential pair shown in FIG. 31*e* is biased in the saturation region the current and voltage relationship is given by equation (7.1).

$$\Delta I_d = I_{ss} \times \frac{\Delta V_i}{V_{gt}^{M1,2}} \times \left\{1 - \frac{1}{4}\left(\frac{\Delta V_i}{V_{gt}^{M1,2}}\right)^2\right\}^{0.5} \text{ for } \Delta V_i \leq \sqrt{2} \times V_{gt}^{M1,2} \quad (7.1)$$

where:

$\Delta I_d = I_{d1} - I_{d2}$ $\Delta V_i = V_{i1} - V_{i2}$ $V_{gt}^{M1,2} = (V_{GS}-V_{th})_{M1,2}$ @ $\Delta V_i = 0$ Note that $\Delta V_i$ denotes the peak signal level for each of the two signals.

A series expansion for $(1-x^2)^{05}$ is applied to equation (7.1) to obtain equation (7.2) as a current output defined in terms of a sum of a series of input voltages each raised to progressively greater exponential powers.

$$\Delta I_d = I_{ss} \times \left\{\left(\frac{\Delta V_i}{V_{gt}^{M1,2}}\right) - \frac{1}{8}\left(\frac{\Delta V_i}{V_{gt}^{M1,2}}\right)^3 - \frac{1}{128}\left(\frac{\Delta V_i}{V_{gt}^{M1,2}}\right)^5 - \frac{1}{1024}\left(\frac{\Delta V_i}{V_{gt}^{M1,2}}\right)^7 \ldots\right\} \quad (7.2)$$

For small input signals $\Delta V_i$ satisfying the condition, $\Delta V_i << \Delta V_{gt}^{M1,2}$, the first linear term of equation 2 is much larger compared to the higher order terms. Under this condition, the output current $\Delta I_d$ is almost a linear function of input voltage $\Delta V_i$.

However, as the input signal level approaches $V_{gt}^{M1,2}$ higher order terms tend to contribute more to the output current. The contribution of the higher order, nonlinear terms gives rise to spurious harmonic components and intermodulation distortion (IM3). Thus the differential amplifier behaves linearly for small input signals and begins to distort when large signals are applied.

In filter design the more significant spurious response tends to be third order intermodulation distortion. The following process for minimizing distortion is carried out by considering only intermodulation distortion present in a differential pair amplifier.

For the differential pair of FIG. 31*e*, third order intermodulation distortion (IM3) is given in equation (7.6).

To calculate IM3, the coefficients in the following equation must first be found:

$$\Delta I_d = a_1 v_i + a_2 v_i^2 + a_3 v_i^3 + a_4 v_i^4 + a_5 v_i^5 + a_6 v_i^6 + \ldots \quad (7.3)$$

Where $v_i$ denotes the input voltage.

By comparing equation (7.3) to equation (7.6) the coefficients of equation (7.3) are determined:

$$a_1 = \frac{I_{ss}}{(V_{GS}-V_{th})} \quad a_2 = 0$$
$$a_3 = -\frac{I_{ss}}{8(V_{GS}-V_{th})^3} \quad a_4 = 0 \quad (7.4)$$
$$a_5 = -\frac{I_{ss}}{128(V_{GS}-V_{th})^5} \quad a_6 = 0$$

The third order intermodulation components IM3, are known to be generated by the odd coefficients Thus, by collecting the terms having odd coefficients, and defining their sum to be the third order intermodulation ("IM3") the following equation (7.5) is obtained.

Peak input voltage is denoted by a caret over the letter $\hat{v}_i$.

$$IM3 \approx \frac{3}{4}\frac{a_3}{a_1}\hat{v}_i^2 + \frac{25}{8}\frac{a_5}{a_1}\hat{v}_i^4 + \dots \tag{7.5}$$

Inserting the values for $a_1$ and $a_3$ and $a_5$ from eq 4.22 into equation (4.23) yields an expression for third order intermodulation (IM3) that is expressed in terms of a differential pair amplifiers transistor parameters.

$$IM_3 \approx \frac{3}{32} \times \left(\frac{\Delta V_i}{V_{gt}^{M1,2}}\right)^2 + \frac{25}{1024}\left(\frac{\Delta V_i}{V_{gt}^{M1,2}}\right)^4 + \frac{735}{2^{16}}\left(\frac{\Delta V_i}{V_{gt}^{M1,2}}\right)^6 + \dots \tag{7.6}$$

The $\Delta V_i$ of FIG. 31*e* denotes peak signal level for each of the two input signals.

A large signal transconductance ("$G_m$") is the rate of change of input current ($\Delta I_d$) with respect to the rate of change of the input voltage ($\Delta V_i$). Large signal transconductance is found by differentiating equation (7.2) with respect to $\Delta V_i$ to yield an expression for large signal transconductance.

$$G_m = \frac{d\Delta I_d}{d\Delta V_i}$$

$$\approx \frac{I_{ss}}{V_{gt}^{M1,2}}\left\{1 - \frac{3}{8} \times \left(\frac{\Delta V_i}{V_{gt}^{M1,2}}\right)^2 - \frac{5}{128}\left(\frac{\Delta V_i}{V_{gt}^{M1,2}}\right)^4 - \frac{7}{1024}\left(\frac{\Delta V_i}{V_{gt}^{M1,2}}\right)^6 \dots\right\} \tag{7.7}$$

The first term of equation (7.7) represents a small signal transconductance ("$g_m$")

$$g_m = \frac{I_{ss}}{V_{gt}^{M1,2}} \tag{7.8}$$

A deviation of large signal transconductance ($G_m$) from small signal transconductance ($g_m$) is defined to be:

$$\frac{\Delta G_m}{g_m} \approx -\frac{3}{8} \times \left(\frac{\Delta V_i}{V_{gt}^{M1,2}}\right)^2 - \frac{5}{128}\left(\frac{\Delta V_i}{V_{gt}^{M1,2}}\right)^4 - \frac{7}{1024}\left(\frac{\Delta V_i}{V_{gt}^{M1,2}}\right)^6 \tag{7.9}$$

Transconductance variations are given by equation (7.9) which represents a fractional change in transconductance for variations in input signal level.

By examining the equations derived for relatively small signals, a relationship between two of the equations is noted. There is a relationship between the equation for third order intermodulation distortion and the equation for transconductance variations. The equations have common terms, and are directly proportional to each other. For a given input level, on examining equations and the third order intermodulation distortion level of equation (7.6) is approximately one-quarter of the transconductance variations of equation (7.7). This relationship for small signals is expressed in equation (7.10):

$$IM_3 \approx \frac{1}{4} \times \frac{\Delta G_m}{g_m} \text{ for } \Delta V_i \langle\langle V_{gt}^{M1,2} \tag{7.10}$$

The relationship in equation (7.10) suggests that third order intermodulation distortion is controlled by controlling variations in transconductance that typically occur when the input voltage changes. Thus, to a first order of approximation, minimization of transconductance variations over a range of input signal levels tends to reduce third order intermodulation distortion (IM3). The minimization of transconductance variations is found by applying calculus to minimize the functional relationship.

FIG. 31*f* is a graph of a differential current ($\Delta I_{1,2}=\Delta I_d$) and normalized transconductance ($G_m/g_m$) as input voltage ($V_{in}=\Delta V_i$) is varied in the differential pair of FIG. 31*e*. From this curve an exemplary baseline intermodulation distortion for an uncompensated differential pair amplifier of FIG. 31*e* is found. In creating this graph values of, $V_{gt}^{M1,2}=0.7$V and $I_{ss}=2.4$ mA were used. The graph shows the increasing non-linearities present in the output current ($\Delta I_{1,2}=\Delta I_d$) as the input voltage ($V_{in}=\Delta V_i$) driving the amplifier increases.

For an input voltage of 250 mv the large signal transconductance is 0.96 times the small signal transconductance 3117. Thus, $\Delta G_m/g_m=0.04$. By substituting 0.04 into equation (7.10) the third order IM level is 1/100, or −40 dB (−40=20Log(1/100)). A differential pair amplifier comprises a baseline from which improvements in linearity are measured. Interconnected linearizing circuitry is next added to the differential pair amplifier of FIG. 31*e* to improve its linearity.

FIG. 31*g* is a schematic diagram of a differential pair amplifier 3127 with a second cross coupled differential pair error amplifier 3129 added that tends to reduce distortion.

Linearity of a differential pair amplifier may be improved by using large values of an applied gate overdrive voltage $(V_{GS}-V_{th})_{M1,2}$ that is applied to transistors M1 and M2. A limiting factor in utilizing large values of gate overdrive voltage is a maximum available supply voltage. With a reduced scaling of device sizes common in today's more compact circuit layouts, a maximum available supply of voltage tends to be reduced. Since a higher voltage required for a gate overdrive condition is not present, alternative linearization techniques are desirable. One technique is the addition of a cross-coupled differential pair 3129, that functions as an error amplifier, to a differential pair amplifier 3127.

A preferable linearization process takes the form of adding error currents $I_{d3}$ $I_{d4}$ to differential amplifier currents $I_{d1}$ $I_{d2}$ in a way that tends to improve the linearity of output currents 3131 3133. The error currents $I_{d3}$ and $I_{d4}$ are subtracted tend to become non-linear more rapidly than the currents of the differential pair amplifier $I_{d1}$ and $I_{d2}$.

Subtraction is achieved by cross coupling the amplifiers 3127 and 3129. A differential signal may be referenced to ground by considering it to be made up of two signals. The equivalent signal is a set of two individual signals, 180 degrees out of phase and of equal amplitude referenced to ground. In a differential voltage signal the voltages have opposite polarities of equal amplitude at any given time.

In a differential current signal the currents flow in opposite directions and are of equal magnitude at any given time. In the case of a current one signal flows into the terminal, the other out of it. If the two differential signals are coupled to the same terminal the resultant signal would be canceled since each signal is equal and opposite. If the signals are unequal the cancellation is not total.

Thus, by cross coupling the differential pair amplifier 3127 to the error amplifiers 3129 in parallel the currents $I_{d3}$ $I_{d4}$ present in each drain of the error amplifier are coupled to the drain currents $I_{d2}$ $I_{d1}$ of the differential pair amplifier respectively. Paired signals $I_{d3}$ $I_{d2}$ and $I_{d4}$ $I_{d1}$ are 180 degrees out of phase and unequal in amplitude, causing a subtraction of The error amplifier current from the differential pair amplifier current in each lead.

The differential pair amplifier 3127 has a differential input $V_{i1}$ and $V_{i2}$. The differential pair amplifier has a differential current output provided by currents 3131 and 3133. By Kirchhoff's current law the current 3133 flowing out of node 3121 is equal to a sum of branch currents $I_{d3}$ and $I_{d2}$ into node 3121. Similarly, current 3131 flowing out of node 3119 is equal to a sum of branch currents $I_{d1}$ and $I_{d4}$ flowing into node 3119. To provide the branch currents a main differential pair 3127 and an auxiliary differential amplifier alternatively termed an error amplifier 3129 are provided.

The main differential pair 3127 comprises transistors M1 and M2. The gates of transistors M1 and M2 are driven by differential input voltage $V_{i1}$ and $V_{i2}$. The sources of M1 and M2 are coupled to a first terminal of a conventional current source $I_{ss}$. A second terminal of $I_{ss}$ is coupled to ground. The drains of M1 and M2 provide output currents $I_{d1}$ and $I_{d2}$, respectively.

The auxiliary cross-coupled differential pair 3129 comprises transistors M3 and M4. The gate of M3 is coupled to the gate of M1, and the gate of M4 is coupled to the gate of M2. The sources of M3 and M4 are coupled together. The coupled sources of M3 and M4 are in turn coupled to a first terminal of a current source $I_{ss}/n$. Current from source $I_{ss}/n$ is a fraction of $I_{ss}$ in order to control the current output $I_{d3}$ $I_{d4}$ of The auxiliary amplifier. A second terminal of $I_{ss}/n$ is coupled to ground. The drain of M3 is coupled to the drain of M2. The drain of M4 is coupled to the drain of M1. This connection of gates and drains creates the desired cross coupling.

The current and voltage relationships in the cross coupled differential amplifier are as follows:

where:

$$\Delta I_d^{1,2} = \tag{7.11}$$

$$\Delta I_d^{3,4} =$$

$$\Delta I_{Total} = \Delta I_d^{1,2} - V I_d^{3,4}$$

The $\Delta I_d^{1,2}$ is given by:

$$\begin{aligned}\Delta I_d^{1,2} &= \Delta I_d = I_{d1} - I_{d2} \\ &= I_{ss} \times \left\{ \left( \frac{\Delta V_i}{V_{gt}^{M1,2}} \right) - \frac{1}{8} \left( \frac{\Delta V_i}{V_{gt}^{M1,2}} \right)^3 - \frac{1}{128} \left( \frac{\Delta V_i}{V_{gt}^{M1,2}} \right)^5 - \frac{1}{1024} \left( \frac{\Delta V_i}{V_{gt}^{M1,2}} \right)^7 \cdots \right\}\end{aligned} \tag{7.12}$$

The $\Delta I_d^{3,4}$ is given by:

$$\begin{aligned}\Delta I_d^{3,4} &= \Delta I_{d3} - I_{d4} \\ &= \frac{I_{ss}}{n} \times \left\{ \left( \frac{\Delta V_i}{V_{gt}^{M3,4}} \right) - \frac{1}{8} \left( \frac{\Delta V_i}{V_{gt}^{M3,4}} \right)^3 - \frac{1}{128} \left( \frac{\Delta V_i}{V_{gt}^{M3,4}} \right)^5 - \frac{1}{1024} \left( \frac{\Delta V_i}{V_{gt}^{M3,4}} \right)^7 \cdots \right\}\end{aligned} \tag{7.13}$$

Assuming that $$\frac{V_{gt}^{M1,2}}{V_{gt}^{M3,4}} = m$$

and thus $$\frac{W^{M1,2}}{W^{M3,4}} = \frac{n}{m^2},$$

the total current is found to be:

$$\Delta I_{Total} = I_{ss} \times \left\{ \begin{matrix} \left( \frac{\Delta V_i}{V_{gt}^{M1,2}} \right)\left(1 - \frac{m}{n}\right) - \frac{1}{8} \left( \frac{\Delta V_i}{V_{gt}^{M1,2}} \right)^3 \left(1 - \frac{m^3}{n}\right) - \\ \frac{1}{128} \left( \frac{\Delta V_i}{V_{gt}^{M1,2}} \right)^5 \left(1 - \frac{m^5}{n}\right) - \frac{1}{1024} \left( \frac{\Delta V_i}{V_{gt}^{M1,2}} \right)^7 \left(1 - \frac{m^7}{n}\right) \cdots \end{matrix} \right\} \tag{7.14}$$

Where the ration of the channel widths comes from the current sources having a ratio of n, and the $v_{gt}$s have a ratio of m. Thus, for a MOS transistor operating in saturation:

$$I_{ds} = \frac{\mu CoxW}{2L} (V_{gs} - V_{th})^2 \tag{7.15}$$

$$\frac{I_{ds}^{M1,2}}{I_{ds}^{M3,4}} = \frac{W^{M1,2}((V_{gs} - V_{th})^2)^{M1,2}}{W^{M3,4}((V_{gs} - V_{th})^2)^{M3,4}} \tag{7.16}$$

$$- > \frac{W^{M1,2}}{W^{M3,4}} = \frac{n}{m^2} \tag{7.17}$$

The third order term of equation (7.14) that controls the contribution of third order intermodulation goes to zero when $m^3/n=1$. The cross coupled differential amplifier is described in more detail in P. R. Gray and R. G. Myer, "*Analysis and Designs of Analog Integrated Circuit Design*," Third Edition, John Wiley & Sons, 1993. Utilizing a value of n=9.5 and m=2, a dynamic range of the input to the amplifier is increased by 6.5 dB, for an IM3 level of −40 dB. Where n is the ratio of current source values, and the ratio of m to n was previously defined.

The dynamic range of the input to maintain a −40 dB third order intermodulation level may be further extended. Extension of dynamic range is possible by using two or more differential pairs cross-coupled in parallel to a main differential pair. In an embodiment, the main differential pair has two auxiliary differential pairs associated with it to linearize the main differential pairs output.

FIG. 31*h* is a graph illustrating The linearized output current of a cross coupled differential output amplifier. The auxiliary differential pair amplifier 3129 of FIG. 31*g* subtracts a small current $I_{d3}$, $I_{d4}$ from the output current of the differential pair amplifier $\Delta I_d^{3,4}$. The currents $I_{d3}$, $I_{d4}$ are subtracted from The output currents $I_{d1}$ and $I_{d2}$, respectively. This small amount of current tends to become nonlinear more rapidly than $\Delta I_d^{1,2}$.

The derivation above for the circuit of 31*h* utilized a ratio of channel widths to adjust The proper error amplifier currents to cancel the third order intermodulation distortion. A chosen channel width for transistors M1 and M2 was selected, and a channel width was found for transistors M3 and M4 that tends to yield an IM3 level of −40 dB. This yields an increase in dynamic range of approximately 6.5 dB. Increasing the number of auxiliary differential pairs present and utilizing a linearization optimization process tends to improve overall amplifier linearity.

FIG. 31*i* is a schematic of a differential pair amplifier 3102 incorporating two auxiliary cross-coupled differential pairs 3107 3109 to improve linearization of the output response $I_1$ and $I_2$. The main differential pair 3103 comprises transistors M1 and M2. The gates of M1 and M2 are coupled to a differential input voltage $V_{i1}$ and $V_{i2}$. The sources of M1 and M2 are coupled to a first terminal of current source $I_{ss}$. A second terminal of $I_{ss}$ is coupled to ground. Current source $I_{ss}$ is typically constructed as known to those skilled in the art. The drains of M1 and M2 supply currents $I_{d1}$ and $I_{d2}$, respectively. The drains of M1 and M2 are coupled to current outputs $I_1$ and $I_2$, respectively.

The first auxiliary differential pair 3107 comprises transistors M3 and M4. The gate of M3 is coupled to differential input voltage $V_{i1}$. The gate of M4 is coupled to differential input voltage $V_{i2}$. The sources of M3 and M4 are coupled together and then to a first terminal of a first current source $I_{ss}/n$. A second terminal of $I_{ss}/n$ is coupled to a ground potential. Current source $I_{ss}/n$ is typically constructed as a conventional current source as is known to those skilled in the art. The drain of M3 is coupled to the drain of M2. The drain of M4 is coupled to the drain of M1.

The second auxiliary differential pair 3109 comprises transistors M5 and M6. The gate of M5 is coupled to differential input voltage $V_{i1}$. The gate of M6 is coupled to differential input voltage $V_{i2}$ The sources of M5 and M6 are tied together to a first terminal of a second current source $I_{ss}/n$. A second terminal of $I_{ss}/n$ is coupled to ground. The source of M5 is coupled to the source of M2. The source of M6 is coupled to the source of M1.

FIG. 31*j* is a graph of the currents present in the main and two auxiliary differential pair amplifiers graphed against input voltage as measured across the input terminals where $V_{in}=V_{i1}-V_{i2}$. This graph illustrates an offset between currents $\Delta I_{3,4}$ *and* $\Delta I_{5,6}$. An offset is present where the input voltage passes through zero 3135. The currents $\Delta I_{3,4}$ and $\Delta I_{5,6}$ from the auxiliary differential pair amplifiers are much smaller than the main differential pair amplifier current $\Delta I_{1,2}$. It is desired to produce an output current that varies a linear relationship to the input voltage. The differential currents from the auxiliary differential pairs $\Delta I_{5,6}$ and I $\Delta_{3,4}$ are subtracted from $\Delta I_{1,2}$ to produce curve of total differential output current $\Delta I_{Total}$.

The composite curve $\Delta I_{Total}$ is a more linear curve than $\Delta I_{1,2}$. Thus, by subtracting the currents produced by the auxiliary differential pair amplifiers, The linearity of The current versus voltage response is improved. The amount of current produced in auxiliary cross-coupled differential pairs over a range of input voltage Vin is related to a transconductance characteristic of each of a set of transistors in the amplifier.

Thus, to shape The $\Delta I_{Total}$ curve is necessary to fabricate M3, M4, M5, and M6 so that the currents they produce will contribute to The linearization of The $\Delta I_{Total}$ curve. Shaping is done through manipulating transconductance. Transconductance is an inherent transistor parameter related to drain current $I_d$. It is defined as follows:

$$g_m = \frac{dI_d}{dV_{gs}} \tag{7.18}$$

Thus, by controlling the transconductance of the transistors in the auxiliary differential pairs, the output current of the main differential pair is linearized by superposition of the currents. To reduce third order inter modulation close to zero, a flat $G_m$ curve for the amplifier tends to be advantageous.

FIG. 31*k* is a graph of transconductance curves for the differential amplifier made up of a main differential pair amplifier 3103 and a linearization circuit 3105 comprising differential pair amplifiers 3107 and 3109. The main differential pair amplifier possesses a transconductance characteristic shown by the curve $G_m^{M1,2}$ having a peaked response.

To reduce third order air modulation distortion, it is desirable to shape the transconductance curve $G_m^{M1,2}$ so that the peak of is flattened as shown by the curve $G_m^{Total}$, flattening is accomplished by subtracting or decreasing the $G_m$ in the peak region of the curve. The decrease is achieved by The linearization circuit 3105.

Auxiliary differential pair amplifier 1 3107 exhibits a characteristic transconductance curve centered about a voltage offset $V_{os}$ from zero input volts, and is denoted $G_m^{M3,4}$ on the graph. The transconductance curve for auxiliary differential pair amplifier 2 3109 is offset in the negative direction from zero input voltage by an amount that is equal to the first auxiliary pair $V_{os}$, this curve is denoted $G_m^{M3,6}$.

FIG. 31*l* illustrates an equivalent circuit that provides an offset voltage $V_{os}$ that permits shaping of The $G_m^{Total}$ curve. The addition of an offset voltage in The auxiliary differential pair amplifiers allows a more accurate cancellation of nonlinearities. The introduction of offset voltage $V_{os}$ is illustrated by the addition of a voltage source in the gate leads of M3 and M6. The voltage source adds in series with The input voltages $V_{i1}$ and $V_{i2}$ to create the offset. The voltage source is shown as a battery. However, the offset voltage is equivalently added in a number of ways comprising building it into the semiconductor circuit parameters and providing biasing circuitry. The offset voltages are built into the circuit by choosing different widths for the auxiliary differential pair devices.

Returning to FIG. 31*k*, the transconductance curves of the auxiliary differential pairs add to form a $G_m$, curve shown by $G_m^{M3,4}+G_m^{M5,6}$. The composite curve $G_m^{M3,4}+G_m^{M5,6}$ is subtracted from the main differential pair curve $G_m^{M1,2}$ to produce a final composite transconductance curve $G_m^{Total}$ that controls the overall amplifier current response and linearity. The current relationships for a differential pair amplifier that includes offsets in The linearization circuit are as follows:

$$G_m^{Total} = G_m^{M1,2} - (G_m^{M3,4} + G_m^{M5,6}) \tag{7.19}$$

The current in the auxiliary pairs is given by:

$$\Delta I_d^{3,4} = I_{d3} - I_{d4} \tag{7.20}$$

$$= \frac{I_{ss}}{n} \times \left\{ \begin{array}{l} \left(\frac{\Delta V_i + V_{os}}{V_{gt}^{M3,4}}\right) - \frac{1}{8}\left(\frac{\Delta V_i + V_{os}}{V_{gt}^{M3,4}}\right)^3 - \\ \frac{1}{128}\left(\frac{\Delta V_i + V_{os}}{V_{gt}^{M3,4}}\right)^5 - \frac{1}{1024}\left(\frac{\Delta V_i + V_{os}}{V_{gt}^{M3,4}}\right)^7 \dots \end{array} \right\}$$

$$\Delta I_d^{5,6} = I_{d5} - I_{d6} \tag{7.21}$$

$$= \frac{I_{ss}}{n} \times \left\{ \begin{array}{l} \left(\frac{\Delta V_i - V_{os}}{V_{gt}^{M5,6}}\right) - \frac{1}{8}\left(\frac{\Delta V_i - V_{os}}{V_{gt}^{M5,6}}\right)^3 - \\ \frac{1}{128}\left(\frac{\Delta V_i - V_{os}}{V_{gt}^{M5,6}}\right)^5 - \frac{1}{1024}\left(\frac{\Delta V_i - V_{os}}{V_{gt}^{M5,6}}\right)^7 \dots \end{array} \right\}$$

And the total current is:

$$\Delta I_{Total} = \Delta I_d^{1,2} - (\Delta I_d^{3,4} - \Delta I_d^{5,6}) \tag{7.22}$$

$$= I_{ss} \times \left\{ \begin{array}{l} \left(\frac{\Delta V_i}{V_{gt}^{M1,2}}\right) - \frac{1}{8}\left(\frac{\Delta V_i}{V_{gt}^{M1,2}}\right)^3 - \\ \frac{1}{128}\left(\frac{\Delta V_i}{V_{gt}^{M1,2}}\right)^5 - \frac{1}{1024}\left(\frac{\Delta V_i}{V_{gt}^{M1,2}}\right)^7 \dots \end{array} \right\} -$$

$$\frac{I_{ss}}{n} \times \left\{ \begin{array}{l} \left(\frac{\Delta V_i - V_{os}}{V_{gt}^{M5,6}}\right) - \frac{1}{8}\left(\frac{\Delta V_i - V_{os}}{V_{gt}^{M5,6}}\right)^3 - \\ \frac{1}{128}\left(\frac{\Delta V_i - V_{os}}{V_{gt}^{M5,6}}\right)^5 - \frac{1}{1024}\left(\frac{\Delta V_i - V_{os}}{V_{gt}^{M5,6}}\right)^7 \dots \end{array} \right\} -$$

$$\frac{I_{ss}}{n} \times \left\{ \begin{array}{l} \left(\frac{\Delta V_i + V_{os}}{V_{gt}^{M3,4}}\right) - \frac{1}{8}\left(\frac{\Delta V_i + V_{os}}{V_{gt}^{M3,4}}\right)^3 - \\ \frac{1}{128}\left(\frac{\Delta V_i + V_{os}}{V_{gt}^{M3,4}}\right)^5 - \frac{1}{1024}\left(\frac{\Delta V_i + V_{os}}{V_{gt}^{M3,4}}\right)^7 \dots \end{array} \right\}$$

The desired end result is to choose variables Vos, $V_{gt}^{M4,4,5,6}$ and n for equation (7.22) so that a plot of $\Delta_{Total}$ verses $V_{in}$ results in a straight line. An optimization package to aid calculations is equivalently utilized to determine the desired parameters. A straight line has constant slope. The slope of the line is found by taking the first derivative. For The best possible linearity equation (7.22) is differentiated with respect to input voltage. Equation (7.22) is symmetrical with respect to input voltage. Thus, the even order derivative terms are set to zero when evaluated at zero input voltage. Next, optimal values are derived for the three parameters n, $V_{os}$, and $V_{gt}^{M3,4,5,6}$. The result is a maximally flat transconductance curve that yields a linear current verses voltage curve.

For example in a design that requires an IM3 better than 65 dB is required. From equation (7.10) a transconductance curve to achieve the desired IM3 has a flatness tending to be no greater than +/−0.25 dB. To find the desired values the optimization process is carried out by inspection coupled with a process of trial and error. In using an iterative optimization process the following values were selected as a starting point:

$$V_{gt}^{M3,4} \approx V_{gt}^{M1,2}/2 V_{os} \approx V_{gt}^{M3,4}/3 \tag{7.23}$$

The offset voltages are built into the integrated circuit by choosing the W/L ratio so that transistors that comprise the same differential pair have differing widths. For example as previously shown in Table I. In the case of a linearization circuit 3105, as shown in FIG. 311 the W/L ratio of M3 and M6 is different from M4 and M5.

$$V_{os} \approx \left(\frac{V_{gt}^{M3,4}}{2}\right) \times \frac{\Delta(W/L)}{W/L} \tag{7.24}$$

The widths are found from equations (7.23) and (7.24). This completes a first pass of The design. Next the simulation program is utilized. In the simulation transconductance verses voltage and transistor channel widths are optimized to yield the targeted flatness.

In an alternative embodiment, a high degree of linearity is not be necessary. Ripple is allowed in the transconductance curve to produce satisfactory linearity.

In an embodiment the maximally flat transconductance curve for small signals zero IM3 distortion is produced. However, if the curve must be maximally flat, the range of values for $V_{in}$ is reduced. In the alternative embodiment allowing some ripple in the transconductance curve, allows the range of input voltage $V_{in}$ is that produces a finite intermodulation distortion to be extended.

FIG. 31*m* is a graph of the transconductance curve for The exemplary differential pair amplifier that extends the input voltage range by allowing ripple in the overall $G_m$ of the amplifier. The transconductance curve for a single differential pair amplifier 3137 is compared to one of FIG. 31*i* that utilizes The parameters of Table I3139. By allowing ripple in the transconductance the range of $V_{in}$ has been extended.

In an embodiment a number of additional auxiliary differential pairs are added to control IM3 distortion. However, if the devices required to implement the function obtained for a given linearity are too small than the amplifier cannot be built successfully.

Table II compares to tone intermodulation distortions simulation results for a differential pair against a structure described in an embodiment of the invention.

TABLE II

| Two Tone Intermodulation Distortion Simulation Results | | | | | | | |
|---|---|---|---|---|---|---|---|
| Vi_peak each | 40 mV | 50 mV | 100 mW | 200 mV | 250 mV | 300 mV | 350 mV |
| Simple diff. pair | −73 dB | −69.5 dB | −57 dB | −45 dB | −41 dB | −37 dB | −34.5 dB |
| New structure | 80 dB | −80 dB | −75 dB | −73 dB | −73 dB | −73 dB | −57 dB |

Initially, at a 40 mV peak input strength for each of two signals input to the amplifier, linearity in the embodiment is improved to −80 dB. At approximately, a 100 mV input signal strength, the difference in inter modulation between the prior art structure and the embodiment of the invention approaches 20 dB. The amplifier provides a layer response up to approximately a 350 mV peak input signal. Extending the linear input range by approximately 12 dB results in four times the signal handling capability of that available in the prior art.

The details of linearizing a CMOS differential pair are disclosed in more detail in U.S. patent application Ser. No. 09/573,356 filed May 17, 2000, entitled "System and Method for Linearizing a CMOS Differential Pair" by Haideh Khorramabadi; based on U.S. Provisional Application No. 60/136,115 filed May 26, 1999, the subject of which is incorporated in this application in its entirety by reference.

FIG. 32 shows a transconductance stage 3102 with an LC load 3104 that is provided with Q enhancement 3202 and Q compensation over temperature 3206. Q enhancement 3202 tends to increase the circuit Q thus, increasing the frequency selectivity of the circuit. A Q enhancement is provided by the transconductance element's $G_m$, 3202 connected as shown. Addition of this transconductance element is equivalent to adding a negative resistance 3024 that is temperature dependent in parallel with R'(T). This negative resistance tends to cause cancellation of the parasitic resistance thus, tending to increase the circuit Q.

The details of Q enhanced filters are disclosed in more detail in U.S. patent application Ser. No. 09/573,356 filed May 17, 2000 entitled, "System and Method for Linearizing a CMOS Differential Pair" by Haideh Khorramabadi; based on U.S. Provisional Application No. 60/136,115 filed May 26, 1999, the subject matter of which is incorporated in this application in its entirety by reference. Once an improved Q is achieved it is desirable to maintain it over the range of temperatures encountered in circuit operation with temperature compensation circuitry 3206.

Due to a large positive temperature coefficient inductor quality factor (Q) is proportional to temperature. As temperature increases the resistance in the spiral increases, degrading the Q. The addition of transconductance from the $G_m$ stage 3102 tends to increase the Q of the filter. However, the effects of temperature on quality factor tends to cause wide gain variation tending to need further improvement. In an embodiment of the invention for a temperature range from 0 to 100° C., Q and gain vary +/−15% in an unenhanced filter. In an embodiment with a Q enhanced filter, the Q and gain variation is doubled. In multiple stages of filtering used in the embodiments, over 20 db of gain variation is thus encountered over temperature with the Q enhanced filters. This results in an unacceptable change in the conversion gain of the receiver. A further means of reducing the variation in Q (and thus gain) over temperature is desirable 3206.

Active Filter Inductor Q Temperature Compensation

FIG. 33 shows a method of stabilizing inductor Q over temperature 3206. This method advantageously uses a DC calibration loop 3202 and a dummy inductor 3304 to control the value of inductor series resistance R(T) and a resistive element R(1/T) 3314 to produce a net constant resistance. Thus, Q induced variation in filter response due to temperature are controlled. This method advantageously does not require the use of any high frequency signals in the tuning process. An inductor 3306 as utilized in the filters of FIG. 30's filter bank 3002 with its associated series resistance R(T) is shown as an element in a temperature compensation circuit 3208. An electronic device that supplies a variable resistance 3310 of an amount inversely proportional to temperature is added into the circuit 3314. The decreasing resistance of the additional resistance 3314 with increasing temperature counteracts the increasing resistance of the inductor's series resistance R(T). In the circuit diagram this decreasing resistance is shown schematically as R(1/T). This resistance is provided by the active resistance of a PMOS transistor biased accordingly 3314. However any device capable of producing the desired resistance characteristic described above is an acceptable substitute.

A PMOS resistor is used in two places 3312,3314 to place the control element 3314 in the circuit and remove the control circuit 3208 from a main circuit 3308. In the embodiment shown, the PMOS transistor's gate to source connection is placed in series with the spiral inductor 3306 of the LC circuit 3308 making up an active filter stage. The active filter stage is controlled from a remotely located control circuit 3208 that contains a duplicate PMOS resistor 3312 and inductor 3304. Inductor 3304 is advantageously fabricated with the same mask pattern as used for inductor 3306. The control circuitry 3208 is not a part of the filter circuitry 3308 in order to prevent undesirable interactions with the radio frequency signals present in the filter. In the control circuit shown, the active resistor 3312 in series with the spiral inductor 3304 is duplicated remotely from the filter circuit 3308. To communicate the control signal 3316 the gate of the PMOS resistor 3312 is coupled to the gate of the PMOS resistor in the filter 3314.

The control circuit provides a conventional constant current and a conventional constant voltage source function to maintain a constant current through and voltage across the dummy spiral inductor 3304 duplicated in the control circuit. An exemplary constant current and constant voltage source is shown 3302 incorporating a dummy inductor 3304.

However, any circuit that maintains a constant voltage across, and current through the inductor 3304 in the control circuit 3208 is sufficient for the design.

As gate voltage 3316 changes to maintain the constant current and voltage across the inductor in the control circuit 3304, the gate control signal 3316 is simultaneously fed to the LC filter stage 3308 PMOS transmitter 3314 to control the resistance, and thus the Q, of the inductor in the filter circuit 3308.

An exemplary constant current and voltage source is illustrated 3302 comprising dummy inductor 3304. A temperature independent voltage reference $V_{ref}$ is established by resistor R and conventional current sources I. Amplifier A's negative input is connected to the voltage reference, and its positive input is connected to a symmetrical point between an identical current source and the dummy inductor. The output of amplifier A is fed into the gate of the transistor functioning as a variable resistor 3312. The constant voltage drop over temperature at the node $V_{ref}$ is compared to the voltage at the positive amplifier terminal. The amplifier controls the resistance of the PMOS transistor so that a constant current and constant voltage are maintained across the dummy inductor.

The calibration of inductor Q is described in more detail in U.S. patent application Ser. No. 09/439,156 filed Nov. 12, 1999 entitled "Temperature Compensation for Internal Inductor Resistance" by Pieter Vorenkamp, Klaas Bult and Frank Carr; based on U.S. Provisional Application No. 60/108,459 filed Nov. 12, 1998, the subject matter of which is incorporated in its entirety by reference.

Communications Receiver

FIG. 34 is a block diagram of a communications network utilizing a receiver 3402 according to an exemplary embodiment of the invention. A communications network, such as a cable TV network 3404, capable of generating signals provides radio frequency ("RF") signals 3406 over the air waves, through a cable or other transmission medium. Such a signal is typically single ended, although differential transmission is contemplated. A receiver front end 3408 next converts the RF single ended signal to a differential signal. In the embodiment shown the front end provides low noise amplification of a weak received signal by a low noise amplifier. The embodiment shown also includes an attenuator to reduce a strong received signal's level. An externally supplied control signal 4302 controls the amount of attenuation, or gain of the RF signal. A receiver front end, or a Balun may be used to convert a single ended signal 3406 to a differential signal or vise versa 3410.

The receiver block 3402 which contains an exemplary embodiment of the invention next converts the differential radio frequency signal 3410 to a differential intermediate frequency (IF) 3412. Equivalently, single ended signals, or a mixture of differential and single ended signals are utilized in the receiver block 3402.

A large gain range high linearity, low noise MOS variable gain amplifier ("VGA") 3403 is present to adjust the IF signal level 3412. A control voltage 3407 controls the gain of the IF signal such that a linear control voltage verses gain response is produced. A linearization circuit 3405 produces the linear control voltage from the control signal input 4302.

The IF signal 3412 is next converted down to DC and demodulated into a base band signal 3414 by a demodulator 3416. At this point the base band signal 3414 is suitable for presentation to the video input of a television receiver, the audio inputs to a stereo, a set top box, or other such circuitry that converts the base band signal into the intended information output.

The communication system described is contemplated to provide the function described above in one or more circuit assemblies, integrated circuits or a mixture of these implementations. In particular, the RF front end 3408 may be integrated in a single chip with receiver 3402. Alternatively, the front end and receiver may be implemented as individual integrated circuits, on any suitable material such as CMOS.

In addition, the receiving system described utilizes additional exemplary embodiments that incorporate one or more transmitters and one or more receivers to form a "transceiver" or "multiband transceiver." The transceiver contemplated may transmit and receive on differing frequencies or the same frequency with appropriate diplexer, transmit receive switching or functionally equivalent circuitry.

The frequency bands and modulation described in the specification are exemplary with the inventions not being limited in scope to any particular frequency band or modulation type.

Receiver Front End-Programable Attenuator and LNA

To achieve a low noise figure what is left out of the circuit is often as important as what is included in it to achieve a low noise figure. A circuit containing few components in desirable since each component in a circuit adds to noise generated in the circuit. Switches are often included early in a signal path to switch in attenuator sections, reducing the level of a signal present. The reduction in signal level is necessary to prevent a following receiver circuit from being over driven into distortion.

In an embodiment a large gain range, high linearity, low noise MOS VGA 3403 is used as an automatic gain control ("AGC") amplifier. Additionally, the circuit described as a front end circuit may also be employed as an AGC amplifier. The AGC amplifier may advantageously be used at any point in the signal processing chain where an adjustable gain and adjustable attenuation according to an external control signal is desired.

In one specific embodiment, a control signal 4302 from an external pin on the integrated circuit is applied to RF front end 3408 and an IF AGC amplifier 3404. The control signal applied to the IF AGC amplifier 3403 is first conditioned by a linearization circuit 3405 so that a linear control of the IF AGC amplifier's gain is produced by varying the control signal 4302. The signal output by the linearization circuit 3405 is a control voltage 3407.

By way of example, control signal 4302 could be formed by sampling the sync pulses of the base band television signal and averaging the amplitude of the sync pulses over a period of time.

Advantageously, the present invention has eliminated the need for switches, reducing a major contributor to increased noise figure. In an integrated switchless programmable attenuator and low noise amplifier only two elements are present in the signal path to contribute to the noise figure.

First an attenuator is present in the circuit path. The next element in series with the attenuator in the signal path is a differential pair low noise (LNA) amplifier. In the differential pair noise figure is lowered by introducing a sufficient bias current to increase a transconductance $g_m$ associated with the, amplifier. The increased $g_m$ decreases the noise contribution of the differential pair.

By eliminating the need for switches it is possible to integrate the programmable attenuator and LNA onto a single CMOS integrated circuit. An additional advantage can be realized in using an integrated programmable attenuator and LNA as a "front end" of an integrated receiver. A single integrated circuit can be economically fabricated on CMOS that contains an entire tuner circuit including the front end and the tuner. Alternatively, the front end and tuner circuits may be on separate interconnected substrates.

FIG. 35 is an illustration of the input and output characteristics of an integrated switchless programmable attenuator and low noise amplifier 3502. Attenuator/amplifier 3502 simulates a continuously variable potentiometer that feed a linear amplifier. As the potentiometer setting changes the signal level at the input to the amplifier changes, and the output of the amplifier changes accordingly. The exemplary embodiment is a two radio frequency (RF) port device—the input port 3504 is configured to receive a single ended input signal from a source 3508 and the output port 3506 is configured to present a differential signal. In the single ended input configuration one terminal upon which a signal is carried is above ground reference 3510. In the differential output configuration the signal is divided and carried on two terminals above ground reference 3510.

In the exemplary embodiment multiple control signals 3512 are applied to the integrated switchless attenuator and LNA 3502. For example these signals are used to program the attenuator to various levels of attenuation, and for an output smoothness control.

In the exemplary embodiment the differential output 3506 advantageously tends to provide noise rejection. In a differential output configuration, the signal at one terminal is 180° out of phase from the signal at the other terminal and both signals are of substantially equal amplitude. Differential signals have the advantage that noise that is injected on either terminal tends to be canceled when the signal is converted back to a single ended signal. Such common mode noise is typically of equal amplitude on each pin and is typically caused by radiation into the circuit from external sources, or it is often generated in the circuit substrate itself. Advantageously, the present invention uses differential signal transmission at its output. It should be noted that in alternate embodiments of the invention, that a signal ended output can be produced from the differential signal by various techniques known in the art. Also, equivalently a differential input may be substituted for the single ended input shown.

FIG. 36 is a functional block diagram of the integrated switchless programmable attenuator and low noise amplifier circuit. This embodiment illustrates how it is possible to eliminate switches that would be required in a conventional attenuator and LNA.

A resistive attenuator 3601 is configured as a ladder circuit made up of resistors configured as multiple pi sections 3602. A method of selecting resistor values such that a constant impedance is presented to the signal source is accomplished as is conventionally known in the art. An exemplary embodiment utilizes an R/2R configuration. Each pi section 3602 of the attenuator 3601 is connected to one input to a differential pair amplifier 3603. The other input to amplifier 3603 is grounded. The resulting attenuation produced at the output 3604 is controlled by the number of differential amplifier stages that are turned on and the degree to which they are turned on.

Individual amplifiers 3603 are turned on or off by tail-current generators 3605 associated with each stage 3603, respectively. Generation of the tail currents is discussed in more detail below in connection with FIGS. 44*a* and 44*b*. In FIG. 36 a zero or one is used to indicate if the corresponding tail-current generator 3605 is turned on or off, that is whether or not a tail-current is present. For example, a zero is used to show that no tail-current is present and the corresponding generator 3605 is turned off. A one represents a tail-current generator 3605 that is turned on rendering the corresponding amplifier 3603 functional. The zeroes or ones are provided by the control lines 3512 of FIG. 35 in a manner described in more detail in FIG. 43. All of the individual amplifier outputs 3506 are differential. Differential outputs 3506 are tied in parallel with each other. The resulting output 3604 is the parallel combination of the one or more amplifiers 3608,3610,3612 that are turned on. In an exemplary embodiment of the circuit 55 amplifiers have been implemented, with various combinations turned on successively. By using tail currents to selectively turn amplifiers 3603 on and off, the use of switches is avoided.

In this configuration any combination of amplifiers 3603 could be turned on or off to achieve a given attenuation before amplification of the signal. However, in a exemplary embodiment of the circuit, adjacent pairs of amplifiers are turned on and off. Groupings of amplifiers in the on state can be of any number. In an embodiment ten contiguous amplifiers are turned on. The attenuation is adjusted up or down by turning an amplifier tail current off at one end of a chain of amplifiers, and on at the other to move the attenuation in the desired direction. The exemplary circuit is controlled such that a group of amplifiers that are turned on slides up and down the chain according to the control signals 3512 of FIG. 35.

Any number of amplifiers 3603 can be grouped together to achieve the desired resolution in attenuation. By using the sliding configuration, input signals 3614 that are presented to attenuator pi sections 3602 whose amplifiers are not turned on do not contribute to the output signal 3604. It can be seen from FIG. 36 that the signal strength of the output is dependent upon where the grouping of generators 3605 are turned on.

FIG. 37 is a simplified diagram showing the connection 3702 of multiple attenuator sections 3602 to the output 3604. An attenuator 3601 is made up of multiple pi sections 3602 cascaded together. Each pi section consists of two resistances of 2R shunted to ground, with a resistor of value R connected between the non grounded nodes. Tap points 3702 are available at the nodes of the resistor R. In FIG. 37 the first set of nodes available for tap points in the first pi section would be nodes 3706 and 3708. After cascading all of the pi sections to form a ladder network, a variety of tap points are available, these are noted as node numbers 3706–37150 in FIG. 37. A path from the input 3614 to any of the tap points, or nodes on the ladder network yields a known value of attenuation at the output 3604. If multiple tap points are simultaneously connected to the attenuator, the resulting attenuation is the parallel combination of each connection. The combined or average attenuation at the output terminal can be calculated mathematically or, it can be determined using circuit simulation techniques available in computer analysis programs.

In addition it can be seen from FIG. 37 that by providing multiple tap points on a ladder network that in effect a sliding multiple contact action can be implemented contacting a fixed number of contacts, for any given position of the simulated slide 3716. The slide 3716 is implemented electronically in the embodiments of the invention The average attenuation by contacting a fixed number of these tap points 3706–3715 will increase as the slide or switch is moved from the left to the right on the ladder network. For example, minimum attenuation will be present when the slider 3716 contacts the force tap points 3706,3707,3708,3709 at the far left of the ladder network 3601. The maximum attenuation will be achieved when the slider 3716 is positioned to contact tap points 3712,3713,3714,3715 at the far right of the network. In the exemplary embodiment 4, contacts are shown, however, in practice any number of contacts may be utilized.

Mechanical switches are noisy. Mechanical switches are also unreliable and difficult to integrate on a semiconductor device. Returning to FIG. 36, in order to be able to integrate a switching function, and to eliminate mechanical parts, a predetermined number of attenuator taps are switched to the output by using tail current switching of differential amplifiers 3603,3605. The differential amplifiers have the advantage of being able to be switched electronically with low noise and reliability. The differential amplifiers also provide the opportunity to introduce a gain into the circuit thereby increasing the signal strength available at the output to produce a low noise amplification. The gain achieved depends upon the number of amplifiers switched in. By changing the values of resistance in the ladder network and also by increasing or decreasing the number of amplifier stages that are turned on, the resolution of the attenuator can be varied to suit the needs of the system that an integrated switchless programmable gain attenuator and LNA is used in.

FIG. 38 is an illustration of an exemplary embodiment showing how the attenuator 3601 can be removed from the circuit, so that only the LNAs or differential stages 3605 are connected. Reference numerals 3801 to 3816 each represent a differential amplifier 3603 and a generator 3605 in FIG. 36. In the 0 dB attenuation case shown the signal strength of the output would be equal to the gain of the parallel combination of the four amplifiers that are turned on 3801,3802,3803, 3804. The four activated amplifiers are indicated by a “1” placed on the circuit diagram. In an exemplary embodiment in which the sliding tap arrangement is used such that a given number of amplifiers are always turned on the configuration of FIG. 38 is necessary such that zero decibels of attenuation can be achieved when the required number of amplifiers are always turned on.

In an exemplary embodiment according to FIG. 38, a full 14 dB gain from a combination of ten amplifiers is seen when a ten tap configuration is used with the top set to the 0 dB attenuation position. As the attenuation is “clicked” so that one amplifier at a time is switched, a 1 dB per pi section attenuator is placed in series with an amplifier, a full 1 dB of attenuation is not seen/click. In a graph of the control voltage versus attenuation curve this would be seen as a change in slope after the tenth amplifier is switched in. After the 10th amplifier is switched in the curve will show a 1 dB/adjustment step.

FIG. 39 shows an exemplary attenuator circuit used to achieve 1 dB/step attenuation. Each resistive pi section 3602 makes up one step. The characteristic impedance of the embodiment shown is 130 ohms. Using calculation methods well known in the art of attenuator design a pi pad having a characteristic impedance of 130 ohms may be realized utilizing series resistors $R_s$ of 14 ohms or parallel or shunt resistors of 1,300 ohms $R_p$.

FIG. 40 illustrates an exemplary embodiment of an attenuator for achieving a finer resolution in attenuation. In this embodiment a resolution of 0.04 dB/tap is achieved. In the embodiment shown each series resistor $R_s$, connected between the shunt resistors in the ladder network has a string of series resistors connected in parallel with it. Each interconnection point between the added resistors 3402 provides a tap point that provides a finer adjustment in attenuation values.

In implementing an integrated, switchless, programmable attenuator and low noise amplifier, calculating the overall gain of a parallel combination of amplified and attenuated signals is analytically complex to calculate. For example, consider an embodiment utilizing 10 differential pair amplifiers in the output, connected to 10 different tap points. Ten signals receiving varying attenuations are fed into individual differential pair amplifiers. Gain of the amplifiers varies according to an adjustment for monotonicity. The amplified signals are then combined in parallel to yield the output signal.

Tail currents in the differential output amplifiers are not all equal. The tail currents determine the gain of a differential pair, and are adjusted to provide a specific degree of monotonicity. Thus, the gain of each of the differential pair amplifiers varies across the 10 interconnected amplifier. The attenuation varies since each tap is taken at a different point to be fed into each of the differential amplifiers. In such an arrangement it would be expected that the middle signal line would represent the average, yielding an approximate figure for the attenuation and gain of the combination of 10 signal lines. However, this is not the result. Through the use of computer simulation the behavior of this network has been simulated. In simulating behavior of this network it is found that the first tap predominates in defining a response from the sum of the 10 taps. The first tap has the least attenuation and this yields the predominant signal characteristics.

In an embodiment utilizing 10 sliding taps the amplifier gain is a constant 14 dB. The attenuator range is from 0–25 dB in 1 dB steps. This yields an overall range of −11 dB to +14 dB for the combination of attenuator and amplifiers.

FIG. 41 illustrates the construction of the series and parallel resistors used an integrated attenuator. In this embodiment all of the resistors used are 130 ohms. This is done to control the repeatability of the resistor values during fabrication. Ten of these resistors are connected in parallel to yield the 13 ohm resistor used as the series attenuator element $R_s$ of FIG. 39. Ten of these 130 ohm resistors are connected in series to yield 1,300 ohms to realize the parallel resistance legs $R_p$ of FIG. 39 of the attenuator. Building the attenuator from unit resistors of 130 ohms also, provides improved matching. By matching resistor values in this method variability is minimized to that of the interconnections between the resistors. This allows the ratio between series and parallel resistances to remain constant from pi section to pi section 3602 in the ladder network that makes up the attenuator 3601 of FIG. 36.

FIG. 42 is an illustration of an exemplary embodiment utilized to turn on each of the differential amplifiers. This arrangement produces a monotonically increasing output verses control voltage 4202. In this illustration, five amplifiers 4204–4208 grouped together make up the electronically sliding tap arrangement. Numbers on the illustration indicate the fractions of tail-currents relative to the full value used to turn on each amplifier. Amplifiers are partially turned on at the ends of the group. Gradual turn on of the amplifiers at the ends of the group is done to control overshoots and undershoots in the amplifier gain. These over shoots and under shoots are seen upon the application of a control voltage applied.

Varying a smoothness control provided in a programmable attenuator and LNA to one extreme yields good linearity in the frequency response but overshoots in gain with increases in control voltage. Varying the smoothness control to the other extreme yields a very smooth gain verses control voltage curve with more nonlinearity. The optimum value for the smoothness control yields a value of monotonicity that is the maximum that the system can tolerate in the form of data loss throughout the circuit.

If all five amplifiers of FIG. 42 were turned on with the full value of tail-currents, the gain versus control voltage curve would be as shown in the solid line 4210. By not fully turning on some of the differential pair amplifiers the overshoot and undershoot in the gain versus control voltage curve may be minimized. With the tail-currents configured on the sliding tap as shown in FIG. 42, the gain versus control voltage curve will appear as shown by the dotted line 4202. In this configuration, the middle three amplifiers have their tail-currents fully turned on with the remaining two amplifiers at the beginning and end of the chain only having their tail-currents half turned on. Equivalently, other weighing of total currents may be used to achieve substantially the same effect.

A plot of gain versus control voltage for the entire integrated switchless programmable attenuator and low noise amplifier would preferably appear as a staircase over the entire control voltage range. By controlling the turn on of the tail-current, the non-monotonicity of the gain versus the control voltage curve is reduced so that the gain monotonically increases with the application of an increasing control voltage to yield the desired stair step shape response, where FIG. 42 illustrates one “step” 4202 in the response.

Non-monotonicity in gain versus control voltage is not a time dependent phenomenon. The shape of the curve tends to depends on the physical implementation of a circuit and a switching arrangement for turning tail-currents on and off.

Non-monotonicity is an undesirable characteristic tends to degrade overall systems performance. In receiving QAM data the degradation is seen as a loss in received data. By improving the monotonicity characteristic of an amplifier linearity of the amplifier is degraded. Gradual switching of the tail-currents causes some differential pairs to only partially turn on. Differential pairs that are partially turned on introduce more nonlinearities into the circuit output than a fully turned on differential pair.

A transistor that is only partially turned on is only capable of handling a smaller signal than one that is more fully turned on. A transistor that is only partially turned on receiving a large input signal over drives the transistor producing a distorted output. Thus, by gradually turning on the tail-currents in some of the differential pair amplifiers, the linearity tends to be degraded, however, this degradation in linearity allows a monotonically increasing gain versus control voltage curve to be achieved.

Monotonic increase of gain versus control voltage tends to improve system performance. In the case of the QAM television signal being transmitted through the amplifier a view of a QAM constellation would actually be seen to wiggle with tail-currents of all differential pair amplifiers simultaneously and fully turned on. With gradual tail-current switching, the constellation is not seen to wiggle, and data is not lost. The problem with the non-monotonicity causing the constellation to wiggle is that each time an attenuator value is switched into the circuit QAM data tends to be lost, thus degrading overall system performance of the signal transmitted through the circuit.

As part of an exemplary embodiment's operation, an automatic gain control (AGC) 3512 of FIG. 35 would be generated as one of the control signals by external receiver circuitry to adjust the input signal level presented to the receiver. This AGC control voltage would be fed into a control voltage input 3512 to select a value of attenuation through the circuit assembly. It is desirable to switch the attenuator such that when the attenuation is adjusted, the data is not lost due to the switching period. In an exemplary embodiment of the present invention it is necessary to switch a maximum of 0.04 dB per step in attenuation value.

FIG. 43 is an illustration of an embodiment showing how individual control signals 4301 used to turn on individual differential pair amplifiers are generated from a single control signal 4302. There are many ways to generate control signals to turn on the differential pair amplifiers, individual control lines may be utilized, or a digital to analog converter may be used to transform a digital address to an analog control voltage.

In the embodiment of FIG. 43 to generate the control signals resistors 4304 are connected in series between a power supply voltage and ground to create a series of reference voltages at each interconnecting node. The voltages at each node between the resistors is the reference input for one of a series of comparators 4306. The reference input of the comparator connects to a node providing the reference voltage setting. The other input of the comparator is connected to the control voltage 4302. When the value of the control voltage exceeds that of the reference voltage for a given comparator the comparator goes from a zero state to a one state at its output. The zero state is typically zero volts and the one state is typically some voltage above zero. The voltage generated to produce the logic one state is such that when applied to a gate of a transistor making up the current tail 4308 it is sufficient to turn on the differential pair of amplifiers that constitute the low noise amplifier (LNA) controlled by that current tail.

As can be seen from FIG. 43, all the LNA amplifiers set to be activated with a control voltage of the current setting will be turned on. In this arrangement simply increasing the control voltage simply turns on more LNA amplifier stages. Additional circuitry is required to deactivate previously activated amplifiers such that only a fixed number of amplifiers remain turned on as the control voltage increases. This is done so that the sliding potentiometer function can be implemented with this circuit.

FIGS. 44*a* and 44*b* illustrate an embodiment of one of the individual comparator stages 4308 of FIG. 43 used to turn on or off individual LNA amplifier stages. In the integrated switchless programmable attenuator and low noise amplifier the circuitry used to activate individual cells is duplicated at each attenuator's tap point and interconnected so that a sliding tap can be simulated using a single control voltage, $V_{ctr}$ 4302. In describing a cell's operation it is convenient to start with the control voltage 4302 that is being applied to achieve a given attenuation value.

To illustrate the comparators operation, a control voltage is applied to each of a series of comparators, as is shown in FIG. 43. The circuit of FIGS. 44*a* and 44*b* makes up one of these comparators. FIGS. 44*a* and 44*b* show the control voltage as $V_{ctr}$, and the reference voltage as $V_{ref}$. These voltages are applied to the gates of a differential pair of transistors (Q1 Q2). The circuit in FIGS. 44*a* and 44*b* surrounding Q1 and Q2 functions as a comparator with low gain. The gain of the comparator is kept low to control the speed of switching on and off the tail-currents of the low noise amplifiers.

In FIGS. 44*a* and 44*b* when the control voltage input $V_{ctr}$ passes the reference level set at $V_{ref}$ the amplifier with its reference set closest to, but less than $V_{ctr}$ remains deactivated. (The n+1 amplifiers where $V_{ctr}$ has not exceeded $V_{ref}$ remain turned off, until activated by $V_{ctr}$.) First the comparator output "current (cell n)" goes high. When "current (cell n)", which is connected to the gate of Q15, goes high it switches the transistor on. Transistors Q16 and Q17 are used to deactivate the adjoining current mirror circuit. Amplifier, $Amp_n$ is turned off by shunting current away from the current mirror 4402, shutting off the tail current Q15. Thus, the current amplifier cell with a comparator that has just been tripped remains turned off.

Comparator output signal "next (cell n+10)" is the opposite state of "Current (cell n)". The next 10 cells are turned on by the control signal "next (cell n+10)". These cells have not yet had their comparators tripped by the control voltage present on their inputs. Thus the bottom of the sliding tap is pushed up and down by the control voltage, $V_{ctr}$. In this state transistors Q16 and Q17 in the next 10 cells are not conducting current away from the current mirror. This allows the current tails of each amplifier, Q15 to conduct causing amplifier $Amp_n$ to be turned on in each of the 10 cells.

Note that as a larger number of cells are grouped together, for simultaneous turn on, a larger number of differential amplifier cells in the integrated switchless programmable attenuator and low noise amplifier are required to achieve the same attenuation range.

Once the control voltage has been exceeded for a given cell, the default state for all the previous amplifiers $Amp_n$ is to be turned on, unless the cell is deactivated by either Q1 or Q2 being activated.

The signal "previous (from cell n−10)" deactivates amplifier cells when it is in the high state. This signal is supplied from the previous identical comparator.

In FIGS. 44*a* and 44*b*, a provision for adjusting the abruptness of amplifier gain is provided. Transistors Q3 and Q10 are being used as variable resistors. These variable resistors are used to change the gain of the comparator. Varying the gain of the comparator allows the abruptness in the overall amplifier gain to be controlled. Putting a high voltage on "smoothness control" causes the drain of Q5 and Q6 to be shorted together. The gain is reduced and a very gradual transition between states is provided by doing this.

A receiver front end such as previously here is described in more detail in U.S. patent application Ser. No. 09/438,687 filed Nov. 12, 1999 entitled "Integrated Switchless Programmable Attenuator and Low Noise Amplifier" by Klaas Bult and Ramon A. Gomez; based on U.S. Provisional Application No. 60/108,210 filed Nov. 12, 1998, the subject matter of which is incorporated in its entirety by reference, may be used before the fully integrated tuner architecture.

Receiver Frequency Plan and Frequency Conversion

Returning to FIG. 19 a block diagram illustrating the exemplary frequency conversions utilized in the embodiments of the invention. An RF signal 1906 from 50 MHz to 860 MHz that is made up of a plurality of CATV channels is mixed 1916 down by a first LO ($LO_1$) 1912 that ranges from 1250 MHz to 2060 MHz, depending upon the channel tuned, to a first IF signal 1918 that is centered at 1,200 MHz. This 1,200 MHz first IF signal is passed through a first filter bank 1912 of cascaded band pass filters to remove undesired spurious signals. The first frequency conversion in the receiver is an up conversion to a first intermediate frequency 1918 higher than the received RF frequency 1906. The first intermediate frequency is next mixed 1932 down to a second IF 1922.

A second local oscillator signal at 925 MHz ($LO_2$) 1904, is used to mix 1932 the first IF 1918 down to a second IF 1922 signal centered at 275 MHz. A second bank of band pass filters 1934 removes spurious outputs from this second IF signal 1922, that have been generated in the first two frequency conversions.

A third frequency conversion 1924, or the second down conversion to the third IF 1926 is accomplished with a third LO ($LO_3$) 1930 of 231 MHz. A third filter 1936 removes any spurious responses created by the third frequency conversion and any remaining spurious responses that have escaped rejection through the previous two filter banks. This third band pass filter 1936 may have its response centered at 36 or 44 MHz. A 44 MHz IF produced by the 231 MHz LO is used in the United States while a 36 MHz IF is used in Europe. The $LO_3$ is adjusted accordingly to produce the 36 MHz IF. The local oscillator's signals are advantageously generated on chip in the described embodiments. However, in alternative embodiments the receiver implementation need not necessarily be limited to on chip frequency generation. In the embodiment shown the second LO 1904 is advantageously generated by a narrow band PLL circuit 1910 that includes a VCO and a control circuit that tends to keep the VCO centered.

Local Oscillator Relationship

FIG. 45*a* is a block diagram illustrating the exemplary generation of local oscillator signals utilized in the embodiments of the invention. In the embodiment shown the local oscillator circuitry is disposed upon a semiconductor substrate 4503. Equivalently the local oscillator signals may be produced by circuitry that is not disposed upon a semiconductor substrate. Other suitable materials are printed circuit boards comprising ceramic, Teflon, glass epoxy, and so on. In the embodiment shown the oscillator circuitry is integrated as a part of a tuner integrated circuit on a common substrate. The frequency plan utilized in the embodiments utilizes a pure third local oscillator signal (LO3) 1930, created by direct synthesis 4502 that falls within the band of received signals. The first two local oscillator signals ("LO1") 1902, ("LO2") 1904 are generated using indirect synthesis techniques utilizing a pair of phase locked loops 4504,4506.

A third local oscillator ("LO3") 4502 uses direct synthesis, to divide the second local oscillator frequency L02 down to create the third local oscillator signal LO3 1930. The local oscillator signals LO1:1902 LO2:1904 LO3:1930 utilize differential signal transmission in transmitting the local oscillator signals to the desired mixers 1916, 1932, 1924 of FIG. 19 respectively. In alternative embodiments single ended transmission is utilized to conduct the signals to their intended locations.

The indirect synthesis of the first and second LOs utilizes a frequency reference generated by a 10 MHz crystal oscillator 5408. The 10 MHz crystal oscillator utilizes the previously disclosed differential signal transmission and a unique design that advantageously tends to provide an extremely low phase noise reference signal.

The PLLs utilize tuning methods to change frequencies, as required when tuning a desired channel or maintaining a desired frequency once set to a desired frequency. The first local oscillator ($LO_1$) 1902 is produced by utilizing a method of wide band tuning. The second local oscillator ($LO_2$) 1904 is produced by narrow band tuning. The embodiments advantageously utilize a narrow band tuning circuit and method to achieve frequency lock in the narrow band PLL.

Narrow Band PLL 2 and VCO

FIG. 45*b* is a block diagram that illustrates the relation of the VCO to the second LO generation by PLL2. Circuitry to generate the second LO frequency of 925 MHz 1904 includes a narrow band PLL 4506. A component of the PLL loop is a voltage controlled oscillator ("VCO") 4532 that changes the second LO frequency in response to a control signal 4533. The VCO also operates under the control of a VCO tuning control circuit 4535. The VCO tuning control circuit generates a set of control signals 4520 that tend to maintain an optimal range of control voltage in the VCO that in turn tends to provide a valid frequency lock state in the PLL. The VCO tuning control circuit is controlled via external signal lines that accept external commands and provide status indications 4510 4512 4514 4516 4518 that tend to be useful for controlling receiver operation.

FIG. 45*c* is a block diagram of an embodiment of a VCO 4532 utilizing a tuning control circuit 4535. A control voltage 4533 acts on the VCO circuit 4532 to produce an output frequency 1904. In the VCO circuit an increasing control voltage typically produces an increasing output signal frequency $f_{out}$. The control voltage typically provides a fine resolution in setting the VCO frequency. The fine setting is susceptible to disruption due to temperature and process variations typical in VCO implementations. Typically a predetermined control voltage designed to fall near the middle of a VCO's tuning range places the VCO at the center of a tuning range. It is desirable to have a VCO that tends to have a linear relationship between control voltage 4533 and frequency output 1904. However, a linear relationship tends to be difficult to maintain, especially in an integrated circuit.

In an integrated circuit, process variations and temperature effects tend to work against maintaining the linear relationship. It is desirable to provide a VCO having performance that tends to be immune to these effects. A sliding window function that is capable of tracking variations in circuit performance is provided by a VCO tuning control circuit 4535. The sliding function is provided by changing a VCO tank circuit's resonant frequency by varying its capacitance.

A VCO that tunes linearly at one temperature may fail to maintain linearity at an elevated temperature. Likewise, a linearly tuning VCO fabricated in one lot run may be found to tune non-linearly when produced in a subsequent production run. Temperature and process effects may also cause a controlled voltage range to produce a range of output frequencies at $F_{OUT}$ that are outside of a desired tuning range. A VCO integrated onto a semiconductor substrate 4503 tends to require an improved phase noise specification over a particular tuning range.

In an exemplary PLL, with a lock range of 922 MHz to 929 MHz, suitable for use in a cable tuner disposed on a CMOS integrated circuit substrate, a phase noise specification sufficient for NTSC and QAM reception tends to be desirable.

To counteract temperature in process variations in an integrated VCO, the tuning control circuit 4535 is utilized. In an embodiment the tuning control circuit 4535 is disposed upon the same substrate 4503 as an integrated VCO 4532. In an alternative embodiment the tuning control circuit 4535 is implemented off of the substrate.

The tuning control circuit has multiple inputs. It is supplied with a "clock" input 4514 to provide sequencing in performing its internal operations. In the exemplary embodiment the clock signal is derived from the 10 MHz reference signal 4508 of FIG. 45*a*. An indication of external circuitry state 4510 is input to the tuning controls circuit. The "state"

signal is derived from the VCO's loop filter. A "reset" line 4512 is provided as an input to reset the internal tuning controls circuitry prior to commencement of a new tuning process cycle.

The tuning control circuit produces an output to the VCO 4532 comprising one or more ("n") control lines 4520 that control VCO 4532 tuning circuitry. Such tuning circuitry may be one or more circuit component that sets the VCO tuning range. In an embodiment of the invention six control lines 4520 are provided.

The tuning control circuit 4535 provides two additional outputs. An "in lock" output 4518 provides an external indication that a phase lock condition in the VCO has been achieved. The output labeled "done" 4516 provides an indication that the tuning control circuit has finished performing its function of centering a VCO tuning range.

FIG. 45*d* is a block diagram of an embodiment of a VCO having a tuning control circuit and showing tuning control circuit interaction with major VCO components. A typical VCO as known to those skilled in the art comprises circuitry that implements the subsystems shown in FIG. 45*d*. Typical VCO subsystems comprise a gain block 4599, a feedback network 4505 and a summing junction 4507 that couples the amplifier output, as modified by the feedback network, to the amplifier input. These functions are often implemented by circuit components that poses interconnections that are not as easily identifiable as shown. However, in any functioning oscillator the functional subsystem and interconnections as illustrated are present.

A VCO is an oscillator that produces a variable frequency output $f_{OUT}$, that is proportional to a control voltage input 4533. A VCO is typically integrated on an integrated circuit substrate 4503. Major components of a VCO comprise an amplifier 4599 a source of feedback, such as feedback network 4505 typically comprising a resonant tank circuit and a path to couple the feedback to the amplifier's input represented by a summing junction 4507.

The VCO shown 4532 illustrates in block diagram form the concept that for oscillations to be sustained an energy producing element, such as amplifier 4599, provides energy to a feedback network 4505 that by virtue of its interconnections feeds back a portion of signal $F_{out}$ back to the input of amplifier 4599. Feedback is typically provided by a direct connection. However, feedback is also accomplished through radiation, or a parasitic path, such as through a power supply coupling. To sustain oscillations, the feedback loop must satisfy the Barkhausen criteria at $f_{out}$: $G(j2\pi f_{out}) H(j2\pi f_{out})=-1$, where $G(j2\pi f_{out})$ is an amplifier transfer function and $H(j2\pi f_{out})$ is a feedback network transfer function. If Barkhausen criteria is satisfied, the oscillator will oscillate to produce an output frequency, $f_{out}$ 1904.

Feedback network 4505 typically comprises frequency selective elements 4509 4511 that form a tuned circuit exhibiting resonance in parallel (as shown in FIG. 45*e*), series or a combination of series and parallel. Such a circuit is often referred to as a resonant tank. By varying the tuned circuit element's value contained in feedback network 4505 the output frequency of oscillation $f_{out}$ may be varied. Variation of circuit element values is accomplished with control voltage 4533 and control lines 4520. The control lines set a frequency tuning range and the control voltage adjusts the frequency within a frequency range set through the control lines.

FIG. 45*e* is a schematic of the feedback network 4505 that allows the frequency of oscillation to be adjusted. The feedback network comprises capacitive 4511 and inductive 4509 circuit elements having frequency dependent responses. The feedback network typically comprises multiple circuit elements to produce an overall frequency response. Equivalently the feedback network is intertwined with the amplifier circuit (or gain stage)(4599 of FIG. 45*d*). For example, a feedback network comprising an LC tank circuit as shown in FIG. 44*e* will resonate at a frequency dependent upon the combined values of inductance 4509 and capacitance 4511. If a variable capacitance 4515 is included, as shown, a resonant frequency may be tuned over a range of frequencies by adjusting the capacitance 4515. Alternatively, an inductor 4509 may be of the variable type to adjust the output frequency 1904. However, an adjustable capacitance 4511 is typically easier to fabricate on an integrated circuit substrate than a tuned inductor 4509.

FIG. 45*f* is a schematic of a feedback network that allows the frequency of oscillation to be adjusted continuously by varactor tuning. Varactors typically provide a fine tuning range of adjustment in a VCO. In an embodiment a continuously adjustable capacitance is provided by varactor diodes 4515. A varactor diode is a diode that poses a varying amount capacitance. The amount of capacitance depending upon a level of direct current biasing the varactor diode. To set the varactors tuning range a fixed capacitance 4513 is typically used. The fixed capacitor typically gets the tuned circuit close to a desired frequency, and the varactor fine tunes the desired frequency. In an alternate embodiment a network of discreetly switched capacitors may be used in place of fixed capacitor 4513. In the later described arrangement utilizing discreetly switched capacitors, discrete ranges of tunable frequencies, with each range being continuously tunable is provided.

With discrete capacitor tuning it is desirable to select the value of capacitance by electronically adding or removing a capacitor, without mechanical switching. With electronic switching of capacitor values a resonant center frequency for the network is defined by one or more capacitances that are switched in, combined with the capacitance as set by the varactor's current bias voltage. The capacitance range of the varactor sets the tuning range of the feedback network.

The varactors in the embodiments of the VCO are fabricated from NMOS transistors 4517. The feedback network 4505 shown provides a tuning range defined by a series combination of capacitance provided by one or more varactors 4515 combined in parallel with a fixed capacitor 4513. The varactors provide a capacitance that is variable in response to a biasing control voltage 4533 applied. The varactors are disposed such that when a control voltage 4533 is applied to a varactor diode, it is back biased and no current flows. In an embodiment appropriate DC blocking capacitors may be utilized to prevent current flow from the control voltage line 4533.

A varactor is typically constructed as a diode having two leads. However, a discrete device package is incompatible with integrated circuit construction. In an integrated circuit a varactor may be compactly constructed from an NMOS transistor.

In the embodiments a varactor diode is constructed by shorting a drain ("D") and a source ("S") leads (or terminals) of an NMOS transistor 4517. The coupled drain and source form one terminal of the varactor, and the gate forms a second terminal of the varactor. By shorting the drain and source leads of an NMOS device 4517 a bulk resistance 4519 from drain to source is present. The bulk resistance is modeled 4519 by a parallel combination of two resistors each of value R. In an NMOS transistor current does not substantially flow from gate ("G") to either of the drain D or source S terminals. Therefore, a separation of charge or capacitance is created from the first terminal formed by the gate to the second terminal formed by the shorted drain and source through the parallel combination of two resistors R. A DC voltage applied to the NMOS varactor produces a variable capacitance that is inversely proportional to the applied DC voltage.

NMOS transistors are a type of MOSFET transistor, which in turn is a type of field effect transistor, or FET. Equivalently, other types of FETs could be utilized to form a varactor, such as a PMOS device.

FIG. 45*g* is a graph of capacitance verses control voltage applied to an NMOS varactor. As can be seen from this graph, varactor capacitance 4511 tends to be inversely proportional to an applied control voltage 4533. A portion of the curve tends to be linear 4521. It is desirable to utilize the linear portion of the tuning curve to tune the VCO. Such a curve is often referred to as a C-V curve.

FIG. 45*h* is a graph illustrating average capacitance achievable with an NMOS varactor. Here, a family of various C-V curves are presented for different control, or source voltages.

Equivalent series resistance or ESR is a figure of merit for a capacitor. The ESR of an NMOS varactor is the drain source resistance of the shorted leads. In an exemplary design, the NMOS FETS used to form the varactors have an atomic W/L equals (20/0.35) that is repeated 36 times.

$V_S$ is the controlled, or source voltage applied to the shorted source and drain leads of an NMOS varactor. $V_g$ on the horizontal axis represents the voltage applied to the gate of an NMOS varactor. As the gate voltage is varied from zero to a maximum voltage, the capacitance switches between a depletion capacitance ("$C_{dep}$") and an oxide capacitance ("$C_{ox}$"). The total charge transferred during each cycle of voltage variation on the gate, such as when a varying noise or RF signal is present in the circuitry, is a measure of the effective capacitance. The effective capacitance is represented by the area under the C-V curve. Thus, voltage variations in the C-V switch thresholds modifies the effective capacitance of an NMOS varactor. Thus, flicker noise in the NMOS device tends to cause frequency modulation of the VCO by changing the capacitance and in turn changing the frequency produced by the VCO.

The capacitance produced from an NMOS connected to form a varactor is an average value of the device's capacitance. When the NMOS' applied gate to source voltage ("$V_{gs}$") is less than an inherent threshold voltage ("$V_t$") of an NMOS transistor, the transistor is in the "off state" and has a capacitance equal to a depletion capacitance ("$C_{dep}$") of the NMOS. This is a relatively small value of capacitance.

When $V_{gs}$ exceeds $V_t$, the NMOS is in an "inverted state" where a greater oxide capacitance ("$C_{ox}$") is produced. A changing gate voltage produces a capacitance that is not linear, but rather an average capacitance. The capacitance switches between a low capacitance and a high capacitance value depending upon signal swing present across the NMOS, such as is present in an RF signal.

The value of average capacitance depends upon the time the MOSFET is "inverted" compared to the time that it is "off". The voltage gating the varactor on and off is the voltage swing across the varactor. For example the voltage swing across the varactor is the result of the VCO output's RF signal swing being present across the varactor. Effective capacitance depends upon a charge transfer which is equal to the area underneath the CV curve. Thus, an integration of the area under the CV curve for a given voltage swing ("$V_g$") represents the effective capacitance obtained.

Further, this average capacitance is a linear function of the signal swing and the control voltage. As the voltage on the source drain connection ("$V_s$"), which is the control node, is changed, the switching point is changed, since the voltage on the gate $V_g$ must exceed the voltage on the control node by $V_t$ before the large oxide capacitance is formed. Thus, by changing the control voltage $V_s$, the capacitance of the NMOS varactor is changed.

FIG. 45*i* is a schematic of an embodiment of a VCO 4532 that includes an amplifier 4599, a feedback network 4505 and summing function 4507 in its circuitry. The embodiment shown utilizes NMOS varactors 4517 to provide frequency control.

The amplifier circuit 4599 consists of a pair of NMOS driver transistors M1 M2. The NMOS drivers each poses an inherent capacitance $C_{gs}$ that tends to contribute to the tuning of the VCO.

Transistor M1 has its source coupled to ground. The drain of M1 is coupled to the gate of M2, a first terminal of a first inductor 4509, the first terminal of a first varactor 4515 and a set of first terminals of a first bank of six capacitors 4528. A set of second terminals of the first bank of six capacitors are each coupled to one of a first set of six transistor switches 4527 drains. The sources of the switching transistors are coupled to ground. The gates of each of the switching transistors are coupled to individual control lines $b_1$ through $b_n$ 4520 that make up the n control lines that originate from the tuning control circuit (4535 of FIG. 45*d*).

Transistor M2 has its source coupled to ground. The drain of M2 is coupled to the base of M1, a first terminal of a second inductor 4509, the first terminal of a second varactor 4515 and a set of first terminals of a second bank of six capacitors 4528. A set of second terminals of the second bank of six capacitors are each coupled to one of a second set of six transistor switches 4527 drains. The sources of the second set of switching transistors are coupled to ground. The gates of each of the switching transistors are coupled to individual control lines $b_1$ through $b_n$ 4520 that emanate from the tuning control circuit (4535 of FIG. 45*d*).

The second terminals of the first and second varactors are coupled together and to the control voltage 4533 supplied by the tuning control circuit (4535 of FIG. 45*d*). The second terminals of the first and second inductors are each coupled to the source of transistor M3 of the adaptive bias circuit 4522.

The Adaptive bias circuit 4522 comprises a PMOS transistor M3 with its drain coupled to a voltage supply $V_{DD}$ and a first terminal of a capacitor 4531. The second terminal of capacitor 4531 is coupled to the gate of M3. The gate of M3 is also coupled to the first terminal of a resistor 4524. The second terminal of resistor 4524 is coupled to the adaptive bias control line 4530 that is supplied by a constant $G_m$ bias cell 4536.

Adaptive bias causes the transconductance of transistors M1 and M2 to remain fixed. Adaptive bias 4522 is provided by a PMOS transistor M3 that tracks temperature and process variations by virtue of being fabricated by common IC processing. Variations in process and temperature create a varying voltage at the gate of PMOS transistor M3.

The adaptive bias control line 4530 is coupled to the gates of transistors M4 and M5 in the constant Gm bias cell 4536. The constant G bias cell is representative of the functions needed to implement adaptive bias and is conventionally constructed as is known to those skilled in the art. The constant $G_m$ bias cell tends to maintain the transconductance of M6 ($g_m$) at a value of 1/R2 through local feedback. Current I varies with temperature and process to ensure this. The value of R2 is scaled through an amplifier gain. Appropriate scaling of M1 and M2 with respect to M6, and of M3 to M5 gives a $g_{mM1/M2}$=k(1/R2)=k($g_{mM3}$). Thus, a constant $g_m$ tends to be maintained in transistors M1 and M2.

In the constant $G_m$ bias cell the drains of M5 and M4 are coupled to $V_{DD}$. The gate of M5 is coupled to the source of M5. The source of M5 is also coupled to the drain of M7. The source of M7 is coupled to a first terminal of R2. The second terminal of R2 is coupled to ground. The source of M4 is coupled to the drain of M6 and the gate of M6. The source of M6 is coupled to ground.

Maintaining a constant transconductance in M1 and M2 assists in maintaining a sliding window. The sliding window that is being maintained is the upper and lower limits of the VCO control voltage range. For the transconductance of M1 and M2 to remain constant, their $V_{gs}$ must move in response to temperature and process variations. As $V_{gs}$ moves, it is desired to have the window move to track this change. The capacitance obtained across the varactor is dependent upon the $V_{gs}$ of M1 and M2. Thus, if the $V_{gs}$ of M1 and M2 changes, it is desirable to have the window change in a manner responsive to the change of the $V_{gs}$ of M1 and M2.

FIG. 45*j* is a schematic of an equivalent circuit model of the VCO of FIG. 45*i*. In an embodiment, a design provides specific phase noise performance. The noise contributions is primarily due to flicker noise of the transistors, varactors, and the bias circuit.

In modeling an equivalent circuit as long as the tuneable capacitance is a small fraction of the fixed tank capacitance the flicker noise ("1/f") contribution of the varactors is minimal.

Up-conversion of 1/f noise is minimized by maximizing the gate threshold voltage ("Vgt") of M1 and M2 of FIG. 45*j*, and making the transistors reasonably large. In making the transistors large the total gate capacitance present in the circuit is a constraint. The biasing transistor M3 of FIG. 44*j* is made wide and short to maximize gate area and minimize its head room impact. Headroom impact refers to the fact that to reduce power consumption the inductors 4509 are not coupled directly to $V_{DD}$. As the W/L ratio of M3 is reduced, a larger voltage is dropped across the drain and source terminals of M3. To provide sufficient headroom in the described embodiment it is desired to maintain $V_{DS}$>($V_{SG}$−$V_t$). In a final effort to reduce 1/f noise, the gate of transistor M3 of FIG. 44*j* is filtered by a 100 k OHM on chip resistor 4524 and a 0.1 μF external capacitor 4531, both of FIG. 45*j*. The filtering ensures that noise from the small bias devices does not adversely affect the overall noise performance of the VCO core shown in FIG. 44*j*. The low pass filter possesses a 10 ms time constant that does not affect startup as the external 0.1° F. capacitor is initially charged through a switch having a worse case on-resistance of substantially 50 OHMS. The 0.1 μF and 50 OHM resistance provide an acceptable time constant for circuit performance.

The small signal circuit model shown in FIG. 45*k* is a reasonable approximation of the VCO since the switched capacitors and varactors are designed to have a Q that is much greater than the inductors. Thermal noise arising from the substrate and gate resistance is minimized through careful design and layout techniques known to those skilled in the art. The equivalent parallel resistance of the tank is 2R, where R is approximately equal to ($Q^2$)r.

FIG. 45*k* is a schematic of a tuning control circuit controlling switched capacitors tending to center a varactor tuning range. In FIG. 441 variable capacitors 4511 of FIG. 44*f* is represented by a single fixed capacitor 4509 and a series of switched capacitors $C_1$ through $C_n$ and a continuously variable capacitance provided by a pair of varactors 4515. The capacitors utilized in the circuit may be of any type including those suitable for integrated circuit fabrication. In an embodiment metal fringe capacitors are used for the switched capacitors. The parallel combination of the capacitors provides the required overall capacitance C as shown in FIG. 44*f*. In alternative embodiments capacitance in the tuned circuit may be made up of any number or combination of fixed capacitors and switched capacitors. Capacitors $C_1$ through $C_n$ are discrete capacitors that are added or removed from the tuned circuit by a field effect transistor ("FET") switch.

Each switch is activated through an individual control line that is part of a bus of control signals 4520 emanating from the tuning control circuit 4535. In alternative embodiments the number of control lines may be reduced to less than one per switch by addressing a demultiplexer through a one or more multiplexed lines. The presence of a voltage on any one of the given control lines sufficient turn on the channel of the field effect transistor effectively couples the capacitors 4528 to the tunable resonance circuit 4505.

FIG. 46*a* is a schematic of a PLL having its VCO controlled by an embodiment of the VCO tuning control circuit. A VCO tuning control circuit 4535 is provided to tune a VCO 4532 that is contained in an exemplary narrow band PLL 4506 that generates an I and a Q 925 MHz local oscillator signal 1904. In the embodiment shown the local oscillator signal is a differential signal. However, in alternate embodiments a single ended signal is equivalently utilized.

The tuning control circuit makes use of a temperature and process dependent moving window of acceptable control voltages defined by a range of voltages that vary with temperature and process. The moving window tends to aid in optimally choosing a range of valid control voltages for the PLL that tend to aid in attaining a frequency lock. The control circuit uses the moving window to center a varactor diode's (4415 of FIG. 45*k*) tuning range by adding or removing capacitance. Centering tends to avoid gross varactor non-linearities by causing a range of control voltage being utilized to fall on a linear operating region of a C-V curve. Also, the circuit tends to mitigate dead band conditions and tends to improve loop stability over process and temperature variations.

Process and temperature variations cause variations in VCO performance. Process variations refer to inconsistencies in the manufacturing process that can result in wafer-to-wafer and/or chip-to-chip differences. A VCO integrated on a chip can be up to ±20% off in its frequency range. Environmental effects primarily consist of temperature. Pressure and humidity can have a second order effect on performance. Immediate calibration at power up is done to center the varactor diodes at the middle of their tuning range. This is done by switching in capacitors and monitoring loop voltage. To center the VCO's frequency tuning range that is provided by the variable capacitance of the varactors, the embodiments of the invention immediately calibrate the VCO by adding or removing capacitance. Switching capacitors in or out of the circuit centers the varactor's capacitance range at the middle of the VCO's tuning range. To monitor centering of the varactors a window comparator is used to evaluate the state of a control voltage that is used to tune the VCO. The window comparator determines when the control voltage is within the VCO's preferred control voltage range to improve the PLL performance.

The VCO tuning control circuitry 4535 controls the VCO 4532 of a conventional PLL 4506. The PLL is conventionally constructed as is shown in FIGS. 17–18. A reference divider 4610 is controlled by externally supplied frequency select lines 4608. The PLL comprises a crystal oscillator 4606 that inputs a stable frequency to the programmable reference divider 4610. In the embodiment shown the crystal oscillator is constructed as shown in FIGS. 7–16. In alternative embodiments the crystal oscillator is conventionally constructed as is known by those skilled in the art. The reference divider is conventionally constructed as is known by those skilled in the art. The reference divider in turn outputs a frequency 4612 that is based upon the reference frequency to a first input of a phase detector 4614. The phase detector is conventionally constructed as is known by those skilled in the art. A second input 4616 to the phase detector is a current output of the VCO 4532.

FIG. 46*b* illustrates a pulse train output of the phase detector. A pulse train 4620 is derived from the VCO output signal 4616 and the reference oscillator signal 4608 as shown.

Returning to FIG. 46*a* the phases of the two phase detector inputs 4612,4616 are compared in the phase detector. A pulse train representing the phase difference is output 4620 from the phase detector and coupled to the input of a charge pump 4622. The charge pump is conventionally constructed as is known by those skilled in the art. The output of the charge pump is fed into a low pass filter 4624. The output of low pass filter 4624 is fed into the control voltage input of the VCO 4618. The VCO outputs an image and quadrature signal 1904 at a frequency as set by the frequency select line 4608.

The voltage controlled oscillator 4532 is conventionally constructed, and comprises a variable capacitance used to tune the output frequency. VCO 4532 additionally comprises a series of switchable capacitors utilized to center the tuning range of the variable capacitance elements comprising the VCO. The switchable capacitors are controlled by signals emanating from the VCO tuning control circuitry 4535. The control signals 4520 are routed from tuning register 4630 to the VCO 4532.

The VCO tuning control circuitry 4535 utilizes a control signal called "state" 4510 taken from low pass filter 4624. The voltage signal "state" 4510 is input to the positive inputs of a first LSB comparator 4634 and the positive input of a second MSB comparator 4636. The negative inputs of comparators 4634 and 4636 are coupled to DC reference voltages V1 and V2. These reference voltages shift depending upon temperature and process conditions.

Voltages V1 and V2 are taken from a resistive divider circuit that utilizes a transistor to track process and temperature variations. A conventional voltage reference 4607 outputting voltage at level V1 is applied to a first terminal of a first resistor 4603 and the negative input of msb comparator 4636. A second terminal of the first resistor is coupled to a first terminal of a second resistor 4605 at node 4637. A second terminal of the second resistor 4605 defines voltage threshold V2 is coupled to a drain of a transistor M4. The drain of M4 is coupled to the negative terminal of lsb comparator 4634. A source of M4 is coupled to ground, and a gate of M4 is coupled to node 4637.

Comparator 4634 outputs signal lsb and comparator 4636 output signal msb. Voltages V1 and V2 set thresholds to form a sliding window which monitors the state of the closed PLL by monitoring voltage 4510 at low pass filter 4624. Control voltage 4510 is taken as the voltage across a capacitor in the low pass filter that induces a zero in the loop filter 4624. Thus, the control voltage is a filtered version of the control voltage of the PLL loop, and thus tends to have eliminated spurious components present on the VCO control line.

Signals msb and lsb are fed in parallel to a 2 input AND gate 4640 and a two input exclusive NOR gate 4642. The output of exclusive NOR gate 4642 is fed into the D input of a DQ flip-flop 4644. The Q output of the flip-flop is fed into a two input AND gate 4646, whose output is in turn fed into the clock input of a 6-bit bi-directional tuning register 4630. Returning to AND gate 4640 its output is fed into the shift left/right input port of the 6-bit bi-directional tuning register 4630.

The reset signal 4512 is based on the output of low pass filter ("LPF") 4624 and is applied to the VCO control circuit as described below. Low pass filter 4624 takes its input from charge pump 4622's output. A first shunt capacitor 4609 has a first terminal coupled to the LPF input it has a second terminal that is shunted to ground. Resistor 4611 has a first terminal coupled to the LPF input and a second terminal coupled to the first terminal of a capacitor 4613. A second terminal of capacitor 4613 is coupled to the second terminal of capacitor 4609. Transistor 4615 has a source coupled to ground, a drain coupled to the first terminal of capacitor 4613, and a gate that defines a reset signal 4512 utilized throughout the VCO control circuit. The reset signal is coupled to an R terminal of DQ flip-flop 4644, a reset terminal "R" of the 6-bit bi directional tuning register 4630, the "R" input of DQ flip-flop 4617, and a first input of a two input OR gate 4619.

Clock signal 4514 is based on the divided reference oscillator signal 4612. Division of the reference signal is accomplished in any conventional manner, known by those skilled in the art. Clock signal 4514 is coupled to the clock inputs of DQ flip-flops 4644 and 4617, a clock input of the 6-bot bi-directional tuning register 4630, and in-lock detector 4648. The clock signal is also applied to an inverted second input of the two input and gate 4646.

Threshold voltages V1 and V2 are in fixed relationship to each other but vary in their voltage levels. The pair of voltage thresholds, V1 and V2, utilize a MOSFET transistor M4 4635 to provide a sliding window function. The window is formed by the voltages V1 and V2. The actual location of the window is set by the $V_{gs}$ of MOSFET M4 since the temperature and process changes present in M4 cause the value of V1 and V2 to change. However, the difference in voltage between V1 and V2 remains constant.

For example, a change in temperature, the $V_{gs}$ of M1 and M2 would change. A change in the $V_{gs}$ of M1 and M2 causes the capacitance of the varactor to change. If a window that did not track the change of $V_{gs}$ was not provided, then at elevated temperature the loop would not lock. At start-up, when the chip is at room temperature, V1 is set to 1.5 volts and V2 is set to 1.0 volt. The phase lock loop will attempt to lock with a voltage between 1.0 and 1.5 volts. Over time, the chip temperature increases causing the $V_{gs}$ of M1 and M2 to change. The capacitance changes in the varactor causes the VCO to move away from the preset window. If the PLL tried to acquire lock at the elevated temperature, it would not be able to do so within a voltage range of 1.0 to 1.5 volts.

MOSFET M4 has the effect of making the voltages at V1 and V2 not absolute values. However, the difference between V1 and V2 remains constant and fixed. At room temperature, V1 and V2 may be 1.5 and 1.0 volt, respectively. However at 85° C., they may drift to 2.0 and 1.5 volts, respectively. The $V_{gs}$ of M4 changes with the elevated temperature. The voltage at the tap point 4637 also increases with temperature forcing the position of the window defined by V1 and V2 to move tracking the $V_{gs}$ of M1 and M2.

Narrow Band VCO Tuning

FIG. 47*a* is a process flow diagram illustrating the process of tuning the VCO with an embodiment of a VCO control circuit. Initially the control voltage (4510 of FIG. 46*a*) is evaluated to see if it falls within a predetermined window 4702. If the voltage is within the desired range, the time it has remained so is determined 4704. The PLL tends to be in a state of lock when the control voltage applied to the VCO has remained unchanged for a predetermined period of time. If the voltage does not remain in range for the predetermined time, the process is reinitiated by looping back to the beginning. If the control voltage remains in the range for the predetermined time, the loop is deemed in lock, and the process is ended 4712.

Returning to block 4702, if the control voltage is out of range a decision is made 4706 based on, wether the control voltage is above or below the desired range. If the control voltage is greater than the control voltage range, a capacitance is removed from the VCO circuit 4708. The process flow is routed to the beginning of the process, where the control voltage is again reevaluated 4702.

Returning to block 4706, if the control voltage is below the desired range a capacitor is added 4710. Next, the process routes the flow back to the beginning of the process where the control voltage is reevaluated 4702.

The VCO tuning control circuitry 4604 of FIG. 46*a* functions to carry out the process of FIG. 47*a*. If the voltage of the loop lies outside the window defined by the threshold voltages V1 and V2. The clock input to the 6-bit bi-directional tuning register 4630 is enabled. This register function may be provided by a conventional circuitry known in the art to provide this function and is not limited to the circuitry depicted. A "lock time out" circuit 4648 of FIG. 46*a* is reset on the rising edge of the clock signal to the 6-bit bi-directional tuning register 4630 of FIG. 46*a*. The "lock time out" circuit is conventionally constructed and is not limited to the components depicted in FIG. 46*a*.

If control voltage 4632 exceeds the upper threshold set by the comparators, zeros are shifted through the register 4630. A zero voltage decreases the capacitance in the VCO tuning circuitry by switching out a capacitance controlled by one of the 6 control lines 4628. Alternatively, any suitable number of control lines may be used other then the exemplary six. This shifting of values in a register allows one of six exemplary capacitor switch control lines to be activated or deactivated, an evaluation made and another line activated or deactivated so that the previous tuning setting is not lost. This function may be implemented by passing a value (on or off) down a line of capacitors by shifting or by activating a capacitor associated with a given line and then a next capacitor without shifting the capacitance control signal.

If the control voltage 4632 is less than the lower threshold voltage of the comparator 4634 ones are shifted through the 6-bit bi-directional tuning register. The ones increase the capacitance applied in the VCO tuning circuit by switching in a capacitance controlled by one of the 6 control lines 4628.

Once control voltage 4632 enters the predetermined valid range of operation as set by voltages V1 and V2 the shift register 4630 is disabled. At this time the locked time out circuit 4648 is enabled. If the lock time out circuit remains enabled for the predetermined time period, that satisfies the in lock condition for the PLL, the clock to the DQ flip-flop 4644 is disabled, thus disengaging the control circuit. The functions described in this paragraph are constructed from standard logic components known to those skilled in the art, and are not limited to those components depicted in FIG. 46*a*.

FIG. 47*b* is a flow diagram of a PLL start up and locking process for an embodiment of the invention.

A PLL start-up process is utilized to ensure that all inputs to the PLL are in the proper initial state and applied at the proper time. The PLL's start-up and locking process is completed when the PLL achieves a steady state. In the steady state condition, the PLL is set to be locked.

In response to a control signal, the PLL start-up and locking process is initiated 4701. In an embodiment, a controller utilizes a bus structure to receive data indicative of circuit performance, and to send commands to a circuit such that the coordination of circuit functions is accomplished.

After initiation of the process, the logic circuits are reset 4703. Logic signals to be reset comprise a state signal 4510, and a reset signal 4512 that are inputs to the tuning control circuit 4535.

The next process step is directed to setting an initial VCO oscillator frequency. A tuning register 4630 is set to produce an output of all ones at process step 4705. An output of all ones causes all capacitors in the VCO to be switched into a feedback network circuit 4505 through control lines 4520 with a maximum value of capacitance switched into the feedback network, the VCO is tuned to its lowest frequency where the frequency F is given by the relation, $$F = \frac{1}{2\pi\sqrt{LC}} \quad (7.25)$$

F=frequency in Hz (hertz)

L=inductance in H (henry)

C=capacitance in F (farad)

Next, the zero cap in a loop filter 5524 is zeroed in the next process step 4707.

The tuning control circuit 4535 has now been initialized and VCO tuning 4709 is commenced. To tune the VCO, an MSB and an LSB signal are sampled every 64th clock cycle 4711 in an embodiment. The MSB signal is the output of comparator 4636 of FIG. 46*a*. The LSB signal is the output of a comparator 4634 also shown in FIG. 46. The action taken in tuning the PLL depends upon the state of the MSB and LSB signals. First, an evaluation is made to determine if the MSB and LSB signals are both equal to one 4713. If the signals are both in the ones state, a capacitor is switched into the circuit 4720. The state of the circuit continues to be monitors and if the MSB and LSB are not equal to one, a further evaluation is made. Next, the MSB and LSB are evaluated to determine if both signals are equal to a zero value 4716. If both signals are equal to the zero state, a switched capacitor is removed 4722. The signal continues to be monitored every 64th clock cycle 4711 and when the MSB and LSB signals are not both equal to one or zero, a determination is made as to whether the MSB signal is equal to zero and the LSB signal is equal to zero 4718. If the signal does not meet this condition, the signal continues to be monitored with the capacitance adjusted until the MSB is equal to zero and the LSB is equal to one for three clock cycles. Once this condition has been met, the PLL is deemed to be in lock 4724. The circuit condition continues to be monitored and if the PLL remains in lock for 15 reference clock cycles, the tuning circuit is disabled 4726, and the process is ended 4728.

FIG. 47*c* is a graph of a family of frequency verses control voltage for various capacitor values that illustrates the use of comparator hysteresis to aid in achieving a frequency lock condition. The first embodiment of the invention does not utilize hysteresis, an alternative embodiment of the invention utilizes hysteresis. Comparators 4656, 4634 of FIG. 46*a* are shown as having hysteresis incorporated in their design. Returning to FIG. 47*c*, the comparator's hysteresis about a voltage level $V_L$ is shown by range Δ 4730. In an embodiment, hysteresis is employed to help achieve a PLL lock condition 4732 corresponding to a frequency $F_1$ at control voltage level $V_L$ corresponding to a tuning capacitance value $C_2$.

In an alternate embodiment the utilization of a hysteresis characteristic built into a comparator circuit aids in maintaining phase lock. If a single fixed threshold $V_1$ is used, and a lock is attempted during a temperature change, it is possible that a phase lock condition for the loop would not be obtainable. For example, if lock at 900 MHz is being attempted, the circuit hunts along one of the families of curves defined by various numbers of capacitors being switched into the circuit. The intersection of the vertical line extending through $V_L$ and the horizontal line extending from 900 MHz defines the point at which lock is desired. Using a well defined $V_1$, has the problem that control voltage may be swept along a capacitance curve and past the lock point without producing a lock. The process would then switch capacitance in or out of the circuit causing a jump to a new curve of the family tending to pass the lock point without locking the PLL. Hysteresis tends to force the process to hunt along the presently selected curve for a slightly longer time to ensure that the PLL locks while on the correct capacitance curve.

FIG. 47*d* is a graph of a family of frequency verses control voltage for various capacitor values that illustrates the use of dual comparator windows to aid in achieving a frequency lock condition. The graph illustrates the sliding window of valid lock ranges provided by the design. A valid lock range for a low $V_{GT}$ and a high $V_{GT}$ are shown. The voltage range of the window is constant. However, the starting and ending values of the window vary.

Once the fine, or narrow band PLL has been tuned such that is has been locked its frequency may be used in conjunction with the frequency generated by the coarse PLL to provide channel tuning as previously described for the coarse/fine PLL tuning of FIGS. 21 and 22.

Receiver

FIG. 48 is a block diagram of a first exemplary embodiment of a receiver. FIGS. 48, 51, 52, 53 and 54 are embodiments of receivers that utilize band pass filters and image reject mixers to achieve image rejection that tend to reduce the distortion previously described. The embodiments advantageously convert an input signal (1906 of FIGS. 19, 48, 51, 52, 53 and 54) to a final IF frequency (1914 of FIGS. 1948, 51, 52, 53 and 54) by processing the input signal substantially as shown in FIG. 19. Image rejection is measured relative to the signal strength of the desired signal. The strength of the unwanted image frequency is measured in units of decibels below the desired carrier ($dB_c$). In the exemplary embodiments of the invention an image frequency rejection of 60 to 65 $dB_c$ is required. In the embodiments of the invention this requirement has been split more or less equally among a series of cascaded filter banks and mixers following the filters. The filter banks 1912,1934 provide 30 to 35 $dB_c$ image rejection and complex mixers 4802,4806 used provide an additional 30 to 35 $dB_c$ of image rejection yielding an overall image rejection of 60 to 70 $dB_c$ for the combination. The use of complex mixing, advantageously allows the rejection requirements on the filters to be relaxed. First, a channel of an input spectrum is centered about a first IF frequency.

FIG. 49 is an exemplary illustration of the frequency planning utilized in the embodiments of the invention for the reception of CATV signals. The frequency spectrum at the top of the FIG. 4902 illustrates exemplary received RF signals ranging from 50 to 860 MHz 4904. The received RF signals are applied to a band pass filter 4921 to eliminate out of band distortion products Image1 4906. The frequency plan advantageously utilizes a trade off between image rejection achievable by filters and mixers at different frequencies. The processing of the first IF and the second IF have many features in common and will be discussed together in the following paragraphs.

For example, the second mixer 4802 and second bank of IF filters 4834 of FIG. 48 achieve 35 dB and 35 dB of image rejection, respectively. The third mixer 4806 and the third IF filter bank 1936 of FIG. 48 achieve 25 dB and 40 dB of image rejection respectively. The last distribution reflects the fact that at the lower third IF frequency the Q of the filters tend to be lower, and the image rejection of the mixers tend to be improved at lower frequencies.

For example, returning to FIG. 48, a signal 1906 in the 50 to 860 MHz range is up converted by mixer 1916 and LO2 1908 to 1,200 MHz IF-1 1918. The presence of LO-2 1904 at 925 MHz that is required to mix the signal IF-1 1918 down to the 275 MHz IF-2 1922 has an image frequency Image2 (4908 as shown in FIG. 49) at 650 MHz. The filter Q of the 1,200 MHz center frequency LC filter 1912 causes Image2 to undergo 35 dB of rejection thus, attenuating it. To achieve 70 dB of image rejection another 35 dB of rejection must be provided by the second mixer (4702 of FIG. 48) that converts the signal from 1,200 MHz to 275 MHz.

Continuing with FIG. 48, the same structure as described in the preceding paragraph is again encountered, but at a lower frequency for the second IF 4914. Image rejection of the 275 MHz filter (1934 of FIG. 48) is less due to its lower Q and the fact that the image frequency Image3 4912 is spaced only 88 MHz 4910 from the signal IF-2 4914. In the previous first IF stage the image frequency Image2 4908 was spaced 550 MHz 4918 from the signal IF-1 4916, providing better image attenuation by filter stop bands. In this situation 25 dB of selectivity can be achieved in the filter, requiring 40 dB of rejection in the mixer to achieve at least 65 dB of attenuation of Image3.

Phase matching at lower frequencies is more accurate allowing better image rejection to be obtained from the third mixer. The method of trading off filter selectivity against mixer image rejection at different frequencies advantageously allows a receiver to successful integrate the filters on chip with the desired image frequency rejection. This process is described in detail in the following paragraphs.

Returning to FIG. 48, it is desired to up convert a channel received in this band of signals 1906 to a channel centered at an intermediate frequency of 1,200 MHz 1918. A local oscillator 1908 produces frequencies from 1,250 MHz to 2060 MHz. For example, a channel centered at 50 MHz is mixed with the local oscillator set at 1,250 MHz to produce first IF frequency components 1918 at 1,200 MHz and 1,300 MHz. Only one of the two frequency components containing identical information produced by the mixing process is needed; the low side 1,200 MHz component is kept. Filtering 1912 tends to remove the unneeded high side component and other desired signals.

Choosing the first IF 1918 to be centered at 1,200 MHz makes the first IF susceptible to interference from a range of first image frequencies from 2,450 MHz to 3,260 MHz (4906 as shown in FIG. 49), depending upon the channel tuned. The lower image frequency of 2,450 MHz results from the first IF of 1,200 MHz being added to the lowest first LO present at 1,250 MHz to yield 2,450 MHz. The highest image frequency results from the first IF of 1,200 MHz being added to the highest first LO of 2,060 MHz to yield 3,260 MHz as the highest first image. Choosing the first IF 1918 at 1,200 MHz yields image frequencies (4906 of FIG. 49) that are well out of the band of the receiver. The result tends to place undesired frequencies far down on the filter skirts of filters present in the receiver, attenuating them.

After a channel is up conversion to a first IF 1918 of 1,200 MHz, it is next filtered by a bank of 3 LC band pass filters 1912 each having its response centered at 1,200 MHz in the embodiment. These filters in conjunction with the second mixer 4802 provide 70 dB of image frequency rejection (4908 of FIG. 49). Filters are advantageously integrated onto the CMOS substrate. An LC filter comprises inductors (or coils) and capacitors. An inductor implemented on a CMOS substrate tends to have a low Q. The low Q has the effect of reducing the selectivity and thus the attenuation of signals out of band.

The attenuation of signals out of band can be increased by cascading one or more filters. Cascading filters with identical response curves has the effect of increasing the selectivity, or further attenuating out of band signals. The embodiments of the invention advantageously incorporate active $g_m$ stage filters 1912,1934 to increase selectivity and provide circuit gain to boost in band signal strength. Three cascaded active LC filters implemented on a CMOS substrate yield a satisfactory in band gain, and provide approximately 35 dB of out of band image signal rejection in the embodiment described. However, the filters need not be limited to active LC filters, other characteristics and passive filters are contemplate equivalents.

The remaining 35 dB of image frequency rejection needed must be achieved in the other circuitry. Hence, differential I/Q mixers 4802,4806 are advantageously used to achieve this approximate 35 dB of additional image rejection required in the first IF.

FIG. 50 is a block diagram illustrating how image frequency cancellation is achieved in an I/Q mixer. An I/Q mixer is a device previously developed to achieve single side band signal transmission. It is one of three known methods for eliminating jone of two side bands. This type of mixer is able to transmit one signal while eliminating or canceling another signal. An I/Q mixer advantageously possesses the properties of image frequency cancellation in addition to frequency conversion. For example, returning to FIG. 48, a second LO 1904 of 925 MHz is used to create the down conversion to a second IF 1922 of 275 MHz, while rejecting image frequencies from the previous frequency conversion by LO1 1908.

The I/Q mixers are implemented in several ways in the invention. However the overall function is maintained. An interconnection of components that achieves I/Q mixing is illustrated in the exemplary I/Q mixer 4802 shown in FIG. 48.

First an input signal 1918 is input to a mixer assembly comprising two conventional mixers 4828, 4830 of either a differential (as shown) or single ended construction.

Local oscillator signals 1904, that need not necessarily be buffered to achieve I/Q mixing, are applied to each mixer. The local oscillator signals applied to each mixer are of the same frequency, but 90 degrees out of phase with each other. Thus, one signal is a sine function, and the other is a cosine at the local oscillator frequency. The 90 degree phase shift can be generated in the I/Q mixer or externally. In the circuit of FIG. 48 a conventional poly phase circuit 4832 provides the phase shift and splitting of a local oscillator signal generated by PLL2 4806.

Two IF signals, an I IF signal and a Q IF signal, are output from the mixers and fed into another conventional poly phase circuit 4834. The poly phase circuit outputs a single differential output IF signal.

Returning to FIG. 50, the I/Q mixer uses two multipliers 5002,5004 and two phase shift networks 5006,5008 to implement a trigonometric identity that results in passing one signal and canceling the other. The trigonometric identity utilized is:

$$\cos(2\pi f_{RF}t)\cos(2\pi f_{LO1}t)\pm\sin(2\pi f_{RF}t)\sin(2\pi f_{LO1}t)=\cos[2\pi(f_{RF}-f_{LO1})t] \quad (8)$$

where $f_{RF}$ is an input signal 5010

$f_{LO1}$ is the first LO 5012

The signals produced and blocks showing operations to create signal transformation of these signals to yield the desired final result is shown in FIG. 50. The process makes use of a hardware implementation of the trigonometric identities:

$$\sin(u)\sin(v)=\tfrac{1}{2}[\cos(u-v)-\cos(u+v)] \quad (9)$$

and $$\cos(u)\cos(v)=\tfrac{1}{2}[\cos(u-v)+\cos(u+v)] \quad (10)$$

By applying these trigonometric identities to the signals created by the two mixers, the product of the sine waves 5014 is:

$$\tfrac{1}{2}[\cos(2\pi f_{LO1}t-2\pi f_{RF}t)-\cos(2\pi f_{LO1}t+2\pi f_{RF}t)] \quad (11)$$

and the product of the cosines 5016 is:

$$\tfrac{1}{2}[\cos(2\pi f_{LO1}t-2\pi f_{RF}t)+\cos(2\pi f_{LO1}t+2\pi f_{RF}t)] \quad (12)$$

Thus, two frequencies are created by each multiplication. Two of the frequencies have the same sign and frequency, so that when they are added together 5018 the resultant signal is a positive sum 5020. The other frequency created cancels itself out 5022. The sum frequency component created by the product of the sines is a negative quantity. The same sum frequency component created by the multiplication of the cosines is positive and of equal magnitude. Thus, when these signals are added together one frequency component, the difference, that is present in each signal has twice the amplitude of the individual signals and the second, sum frequency created is of opposite polarity of the other signal created and cancels out when the signals are added together. Thus, the difference frequency is passed to the output while the sum frequency component is canceled.

The implementation of this trigonometric identity by a circuit is very useful for canceling image frequencies. As shown in FIG. 4 signal, S and image signal I are equally spaced by the IF frequency from the local oscillator frequency. The signal frequency would be represented by the term ($2\pi f_{LO1}t-2\pi f_{RF}t$) and the image frequency would be represented by ($2\pi f_{LO1}t+2\pi f_{RF}t$). In the embodiments of the invention, the phase shifting and summing functions are performed utilizing standard polyphase or other circuits known in the art.

Mathematically exact cancellation can be achieved. However, real circuit components are not able to achieve exact cancellation of the image frequency. Errors in phase occur in the circuitry. A phase error of 3° can yield an image frequency suppression of 31.4 $dB_c$ and a phase error of 4° can yield an image frequency suppression of 28.9 $dB_c$. These phase errors tend to be achievable in an integrated circuit on CMOS. To attempt to achieve the entire 70 $dB_c$ of image rejection tends to be undesirable, thus necessitating the filters. For example, to achieve 59 $dB_c$ of image frequency rejection a phase error tending to be of no more than 0.1250 in the mixer would be allowable.

By combining image frequency rejection achievable by an LC filter implemented in CMOS with an I/Q mixer's image rejection properties, properties that tend to be achievable in a CMOS integrated circuit, a required image frequency rejection is obtained. Additionally, the frequency of a first up conversion has been advantageously selected to place an image frequency of a first LO well down the filter skirts of a 1,200 MHz LC filter bank, thus achieving the desired image frequency rejection.

Returning to FIG. 48, buffer amplifiers 4810 are used to recondition the amplitudes of LO signals 1908,1904,1930 that drive the I/Q ports of mixers 4802,4806. A distance of several millimeters across a chip from where LOs are generated 4504,4506,4508,4502 to where it is applied at the mixers 1916,4802,4806 tends to require reconditioning of the slopes of the local oscillator signals. Buffering also tends to prevent loading of the PLLs 4504,4806.

Eliminating any preselection filtering requiring tunable band pass filters is desirable. To do this image frequency response and local oscillator (LO) signals are set to fall outside of a received signals bandwidth. The first signal conversion tends to eliminate any requirements for channel selectivity filtering in the receiver front end. Because of the integrated circuit approach to this design it is desirable to locate an LO outside of the signal bandwidth to reduce distortion created by the interaction of the received signals and the first local oscillator signals.

An approximately 35 dB of out-of-band channel rejection in the first IF stage's filter 1912 is insufficient. The additional 35 dB of selectivity provided by a mixer 4802 increases selectivity. However, it is desirable to mix down a received signal as quickly as possible. This is desirable because at lower frequencies filters tend to have better selectivity than at the higher IF frequencies. By converting a received signal to as low a frequency as possible as quickly as possible better filtering tends to be obtained. Two frequency down conversions are next performed.

Filters are available that will achieve a better rejection than an LC filter at a given frequency, for example a SAW filter. While better filtering of the intermediate frequencies could be obtained with a filter such as a SAW filter at a higher frequency, a fully integrated receiver would not be achievable. A SAW filter is a piezoelectric device that converts an electrical signal to a mechanical vibration signal and then back to an electrical signal. Filtering is achieved through the interaction of signal transducers in the conversion process. A filter of this type is typically constructed on a zinc oxide ($ZnO_2$), a material that is incompatible with integration on a CMOS circuit utilizing a silicon (Si) substrate. However in alternative embodiments of the invention, SAW or other filter types known in the art including external LC filters are contemplate embodiments. In particular, a hybrid construction utilizing receiver integrated circuit bonded to a hybrid substrate and filters disposed on the substrate is contemplated.

Returning to the frequency plan of FIG. 49, there is an image response (Image2) 4908 associated with the second local oscillator signal ($LO_2$) 4920. Returning to the embodiment of FIG. 48, this Image2 signal occurs at $f_{LO2}-f_{IF2}$=925 MHz−275 MHz, which is 650 MHz. If there is a signal of 650 MHz at the receiver's input 4808 it is possible that a 650 MHz signal will be mixed down to the second IF frequency ($IF_2$) (1922 of FIG. 48) causing interference with the desired received signal which is now located at the second IF frequency. To reduce interference from this signal the receiver has been designed to produce greater than 65 dB of rejection of Image2 by the mechanism previously described for the 1,200 MHz LC filter bank 1912 of FIG. 48.

Returning to FIG. 48, the third IF is next generated. The third LO 1930 is created by direct synthesis. The divide by 4 block 4802 creates a 231 MHz third LO ($LO_3$) consisting of I and Q signals required to mix the 275 MHz second IF 1922 down to the third and final IF frequency of 44 MHz 1926. A second down conversion to the 275 MHz third IF is used in the design. If a 1,200 MHz first IF signal were down converted directly to 44 MHz a local oscillator signal of 1156 MHz (1,200 MHz−44 MHz) would be required. A resulting image frequency for this local oscillator would be at 1,112 MHz (1,200 MHz−88 MHz). A 1,112 MHz image would fall within the band of the 1,200 MHz LC filter. Thus, there would be no rejection of this image frequency from the first IF's filter since it falls in the pass hand. Therefore, the intermediate frequency conversion to a second IF of 275 MHz is used to reduce the effects of the problem.

The 231 MHz third LO 1936 falls close to the center of the received signal band width 1906. With the three frequency conversions of the design the third LO necessarily falls within the received signal band. This is undesirable from a design standpoint. This is because any spurious responses created by a third local oscillator signal fall within the received signal bandwidth. The present embodiment of this invention advantageously minimizes these undesirable effects.

In generating the third LO signal of 231 MHz, typically a phase lock loop containing a voltage controlled oscillator would be used. However, these frequency components tend to be primary generators of spurious products that tend to be problematic. The present embodiments of the invention advantageously avoids the use of a PLL and the attendant VCO in producing the third LO signal 1930 at 231 MHz. A divide by 4 circuit 4802 utilizes two flip-flops that create the I and Q third LO signals 1930 from the 925 MHz second LO 1904. This simple direct synthesis of the third LO tends to produce a clean signal. The reduced generation of distortion within the signal band tends to be important in an integrated circuit design where all components are in close physical proximity. If a PLL were used to generate the 231 MHz signal an external loop filter for the PLL would be utilized, providing another possible path for noise injection. By elegantly generating this third LO, that necessarily falls within the received signal bandwidth, noise and interference injection through the substrate into the received signal path tends to be minimized.

LC filter tuning 4812,4814,4816 in the embodiment is advantageously performed at startup of the chip. A "1,200 MHz filter tuning" circuit 4812 tunes the 1,200 MHz low pass filters 1912; a "275 MHz filter tuning" circuit 4814 tunes the 275 MHz low pass filter 1934; and a "44/36 MHz filter tuning" circuit 4816 alternatively tunes a final LC filter 1936 to one of two possible third IF frequencies (44 MHz or 36 MHz) depending upon the application. Alternatively, in this embodiment, the filtering of the third IF frequencies is done by an external filter 4818. This external filter may have a saw device or other type of filter that provides satisfactory filtering of the third IF frequency.

In an embodiment an intermediate frequency automatic gain control amplifier ("IF AGC") 3419 is used to provide a nearly constant IF frequency signal level to IF signal processing/demodulating circuitry (3416 of FIG. 34).

Often the signal level variations being compensated for by the IF AGC are created by improperly tuned filters. The on chip filter tuning utilizing one or more existing PLL signals tends to reduce signal level variations.

As previously described, the filter tuning circuits 4812, 4814,4816 utilize tuning signals based on the PLL2 signal 4806, with the "44/36 MHz filter tuning" circuit utilizing the PLL2 frequency divided by four 4802. However, the tuning signals selected may vary. Any or all of the PLLs 4804, 4806,4802 or reference oscillator 4808 may be used to generate a filter tuning signal. Also a single frequency can be used to tune all filters with the appropriate frequency scaling applied. In tuning the LC filters, first the chip is turned on and PLL2 4806 must lock. PLL2 must first lock at 925 MHz as previously described. A VCO in the PLL 4806 is centered by adjusting its resonant circuit with tunable capacitors as previously described.

Once the PLL2 is adjusted to 925 MHz a write signal is sent out to indicate that a stable reference for filter tuning is available. Once a stable 925 MHz reference for tuning is available the 1,200 MHz filter, the 275 MHz filter tuning previously described takes place. Once the filter tuning is finished the filter tuning circuitry sends out a signal over an internal control bus structure, linking the receiver to a controller indicating that the tuning has finished. The receiver is now ready to select and tune a channel.

Frequency tuning of received channels is accomplished in the embodiment with a coarse and fine PLL adjustment as previously described. The tuning is performed in such a way that there is always a third IF present at the output during the tuning process. PLL1 4804 is the coarse tuning PLL that tunes in 10 MHz steps. PLL2 4806 is the fine tuning PLL that tunes in 100 KHz steps. Exemplary tuning steps can be made as small as 25 KHz. A 100 kHz step is used for QAM modulation, and a 25 KHz step is used for NTSC modulation.

At the input of the tuner each exemplary channel is separated by 6 MHz. PLL1 jumps in tuning steps of 10 MHz. Therefore, + or −4 MHz is the maximum tuning error. If the filters used had a narrow band pass characteristic this tuning approach tends to become less desirable. For example, if the filter bandwidth was one channel, 6 MHz, wide and the first IF could be 1204 MHz or 1196 MHz. Thus, the selected channel would not be tuned. The bandwidth of the cascaded filters in the first IF strip is approximately 260 MHz. The bandwidth of the filters centered at 275 MHz in the second IF strip is approximately 50 MHz. The bandwidths are set to be several channels wide, a characteristic that advantageously takes advantage of the low Q in the LC filters built on the chip. The two PLLs guarantee that a third IF output is always obtained. The first PLL that tunes coarsely must tune from 1,250 to 2,060 MHz, a wide bandwidth. PLL2, the fine tuning PLL, must tune from + to −4 MHz, which tends to be easier to implement.

FIG. 51 shows a second exemplary embodiment of the invention. This embodiment is similar to the embodiment of FIG. 48, however it eliminates the first IR reject mixer (4802 of FIG. 48). The approximately 35 dB of image rejection that has been eliminated due to the removal of the IR reject mixer is made up by increased filter rejection provided by a 1,200 MHz LC filter bank 5101. The IR reject mixer is replaced with a conventional differential mixer 5104. The IO required is a single differential LO signal 5106 rather than the differential I and Q signals previously described. Better filters are used or alternatively an additional series of three 1,200 MHz LC filters 1912 for a total of six cascaded filters 5101 to provide sufficient image rejection are provided. This design provides the advantage of being simpler to implement on an integrated circuit.

If a higher Q or better filter selectivity is realized on the integrated circuit 65 dB of image frequency rejection at 650

MHz is required. In an alternate embodiment of the invention the third down conversion can be accomplished in a similar manner by eliminating the third I/Q mixer 4806 and increasing the selectivity of the 275 MHz filter bank 5102. The mixer 4806 is replaced with a conventional mixer requiring only a single differential third LO.

FIG. 52 shows a third alternate embodiment of the invention that tends to provide continuous tuning of the filter over temperature, and tends to more accurately keeps the response curve of the filter centered on the desired frequency. This embodiment of the invention preserves the separation of 15202 and Q 5204 signals through the second IF stage 5206. In the third frequency conversion stage 5208 the I and Q signals are transformed into I', $\bar{I}$, Q, and $\overline{Q}$ signals. This alternate embodiment of the invention relies on a "three-stage poly phase" 5210 to provide image cancellation. The advantage of using a gyrator in place of dual LC filter bank 5212 is that a close relationship between I and Q tends to be maintained throughout the circuit. The phase relationship at the output of the gyrator filter tends to be very close to 90°. If an LC filter is utilized there is no cross-coupling to maintain the phase relationship as in the gyrator. In the LC filter configuration complete reliance upon phase and amplitude matching is relied upon to maintain the I and Q signal integrity. The gyrator circuit has the additional advantage of tending to improve the phase relationship of signals initially presented to it that are not exactly in quadrature phase. For example, an I signal that is initially presented to the gyrator that is 80° out of phase with its Q component has the phase relation continuously improved throughout the gyrator such that when the signals exit the gyrator quadrature phase of 90° tends to be established between the I and Q signals, such as in a polyphase circuit element. This present embodiment of the invention provides the additional benefit of being easily integrated onto a CMOS substrate since the gyrator eliminates the inductors that an LC filter would require. Filter timing and frequency generation utilize the methods previously described.

FIG. 53 is a block diagram of an exemplary CATV tuner that incorporates an embodiment of the present invention. The exemplary embodiments of the receiver are for terrestrial and cable television reception of signals from 50 to 860 MHz. Television signals in this exemplary band are frequency QAM or NTSC modulated signals. A receiver as described performs equally well in receiving digital or analog signals. However, it is to be understood that the receiver architecture disclosed will function equally well regardless of the frequencies used, the type of transmission, or the type of signal being transmitted. With regard to signal levels input to the receiver, the dynamic range of the devices used in the receiver may be adjusted accordingly. Thus, in a wide-band receiver distortion products are particularly problematic. The receiver disclosed in the exemplary embodiments of the present invention tends to advantageously reduces interference problems created by this type of distortion.

In the exemplary embodiments of the invention signals input to the receiver may range from +10 to +15 $dB_m$. Where, zero $dB_m$=10 log(1 mV/1 mV). It should be noted that in the case of a cable transmitting the RF signals, that an attenuation envelope impressed on the signals will have a downward or negative slope. This downward or negative slope is a result of a low pass filter characteristic of the coaxial cable. This effect may be compensated for by introducing a gain element in the signal chain that has positive slope, to compensate for the negative slope resulting from cable transmission.

In a wide band receiver designed to process signals received over multiple octaves of band width, this transmission characteristic can present a problem. For example, in the cable television band going from 50 to 860 MHz it is possible for distortion products created by the lower frequency signals in this band width to fall upon one of the higher tuned frequencies, for example 860 MHz. In a multi octave band-width receiver harmonic signals are problematic since they also fall within the receiver band-width, and cannot be low pass filtered out. If a channel at one of the higher frequencies is the desired signal that the receiver is tuned to, the low pass filter characteristic of the cable, or transmission medium, reduces the strength of this desired tuned signal relative to the lower frequency untuned signals. Because of the relatively greater strength of the lower frequency signal, the strength of the distortion products generated by them, are comparable in strength to the desired tuned signal. Thus, these distortion products can cause a great deal of interference with the desired received signal when one of their harmonics coincidentally occurs at the same frequency as the tuned signal.

The frequency plan of this tuner allows it to be implemented in a single CMOS integrated circuit 4822 and functions as previously described in FIG. 48. This exemplary single up-conversion dual down conversion CATV tuner utilizes two PLLs that run off of a common 10 MHz crystal oscillator 5302. From the 10 MHz crystal oscillator references the PLLs generate two local oscillator signals that are used to mix down a received radio frequency to an intermediate frequency. This integrated CATV tuner advantageously uses differential signals throughout its architecture to achieve superior noise rejection and reduced phase noise. The receiver of the present invention advantageously provides channel selectivity and image rejection on the chip to minimize the noise injected into the received signal path. The differential configuration also tends to suppress noise generated on the CMOS substrate as well as external noise that is radiated into the differential leads of the 10 MHz crystal that connect it to the substrate. In this embodiment, an external front end as previously described is supplied on a separate chip 5304 and an external filter 5306 is utilized.

The details of integrated tuners are disclosed in more detail in U.S. patent application Ser. No. 09/439,101 filed Nov. 12, 1999 entitled "Fully Integrated Tuner Architecture" by Pieter Vorenkamp, Klaas Bult, Frank Carr, Christopher M. Ward, Ralph Duncan, Tom W. Kwan, James Y. C. Chang and Haideh Khorramabadi; based on U.S. Provisional Application No. 60/108,459 filed Nov. 12, 1998, the subject matter of which is incorporated in this application in its entirety by reference.

Telephony Over Cable Embodiment

FIG. 54 is a block diagram of a low power embodiment of the receiver that has been configured to receive cable telephony signals. These services among other cable services offered make use of RF receivers. A cable telephone receiver converts an RF signals present on the cable to a baseband signal suitable for processing to an audio, or other type of signal routed to a telephone system and a subscriber via two way transmission. When such services are widely offered, and are packaged into a common device, per unit cost and power dissipation tend to become concerns. It is desirable to provide a low cost and power efficient receiver.

Receivers integrated onto a single chip that incorporates filters on the chip reduce cost. However, placing filters onto a an integrated circuit results in a high power consumption by the chip. On chip filters require tuning circuitry that tends to consume significant amounts of power. Removal of this circuitry allows reduction of power levels to below 2 Watts per receiver. Each time that a signal is routed off of an integrated circuit the chances of increasing system noise are increased due to the susceptibility of the external connections to the pick up of noise. Careful signal routing and the proper frequency planning of the present embodiment are calculated to reduce these undesired effects.

First, an input signal is passed through an RF front end chip 5304 as previously described. The first frequency up conversion to the first IF 5402 is performed on the integrated receiver chip. After passing a 50–860 MHz signal through a receiver front end 5304 that provides a differential output to the receiver chip 5404 the signal is down converted to 1,220 MHz 5402. The 1,270 to 2,080 MHz LO 5406 is generated on chip by a first PLL circuit, PLL1 5408. The 1220 MHz differential signal is passed through buffer amplifiers 5410 and is applied to an off chip differential signal filter 5412, with a center frequency at 1,220 MHz having a characteristic impedance of 200 Ohms. The differential signal tends to provide the necessary noise rejection when routing the signal off and subsequently back onto the chip. Next the signal is routed back on to the integrated circuit 5404 where it is again passed through a send buffer amplifier 5414.

The second frequency down conversion to the second IF 5416 is performed on the integrated receiver chip. An 1,176 MHz differential I and Q LO 5418 is generated on the integrated circuit by a second PLL, PLL2 5420 and polyphase 5422. The resulting second IF frequency 5616 is 44 MHz. The mixer used to generate the second IF is an I/Q type mixer 5424 that subsequently passes the signal through a polyphase circuit 5426. The second IF is then passed through a third buffer amplifier 5428. The signal is next routed off chip to a differential filter centered at 44 MHz 5430. After filtering the signal is returned to the integrated circuit where it undergoes amplification by a variable gain amplifier 5432.

Variable gain amplifier ("VGA") 5432 utilizes cross coupled differential pairs as described in FIG. 74. The improved dynamic range of the VGA compensates for increased variations in signal amplitude caused by irregularities in the external differential filter 5430. By operating satisfactorily over a wide dynamic range of input signal levels the filter requirements may be relaxed, allowing for a more economical receiver to be constructed.

The details of a low power receiver design are disclosed in more detail in U.S. patent application Ser. No. 09/439,102 filed Nov. 12, 1999 entitled "System and Method for Providing a Low Power Receiver Design" by Frank Carr and Pieter Vorenkamp; based on U.S. Provisional Application No. 60/159,726 filed Oct. 15, 1999, the subject of which is incorporated in this application in its entirety by reference.

Electronic Circuits Incorporating Embodiments of the Receiver

FIG. 55 shows a set top box 5502 used in receiving cable television (CATV) signals. These boxes typically incorporate a receiver 5504 and a descrambling unit 5506 to allow the subscriber to receive premium programming. Additionally, on a pay for view basis subscribers can order programming through their set top boxes. This function additionally requires modulation circuitry and a radio frequency transmitter to transmit the signal over the CATV network 5508.

Set top boxes can, depending on the nature of the network, provide other services as well. These devices include, IP telephones, digital set-top cards that fit into PCs, modems that hook up to PCs, Internet TVs, and video conferencing systems.

The set-top box is the device that interfaces subscribers with the network and lets them execute the applications that reside on the network. Other devices in the home that may eventually connect with the network include IP telephones, digital set-top cards that fit into PCs, modems that hook up to PCs, Internet TVs, and video conferencing systems.

To satisfactorily provide digital services requiring high bandwidth, set top boxes must provide a easy to use interface between the user and CATV provider. Memory 5510 and graphics driven by a CPU 5512 tend to make the application as appealing as possible to a user when interfaced with a set top box 5514.

Also the set-top can receive data in Internet Protocol format and has an IP address assigned to it. Also, satisfactory methods of handling reverse path communications are required to provide interactive digital services. All of these services utilize an operating system resident in the set top box 5502 for providing a user interface and communicating with the head end 5514 where the services are provided.

To receive services, and transmit requests for service, bidirectionally across a CATV network the data signal must be modulated on a RF carrier signal. The set top box is a convenient place to modulate the carrier for transmission, or to convert the modulated carrier to a base band signal for use at the user's location.

This is accomplished with a radio frequency (RF) transmitter and receiver, commonly referred to in combination as a transceiver 5508. A bidirectional signal from a cable head end 5514 is transmitted over a cable network that comprises cable and wireless data transmission. At the subscriber's location a signal 3406 is received an input to the subscriber's set top box 5502. The signal 3406 is input to a set top box transceiver 5504. The set top box transceiver 5504 comprises one or more receiver and transmitter circuits. The receiver circuits utilized are constructed according to an embodiment of the invention. From the set top box transceiver, received data is passed to a decryption box 5506. If the television signal has been encrypted, this box performs a necessary descrambling operation on the signal. After being passed through the decryption box, the signal next is presented to a set top box decoder 3416 where the signal is demodulated into audio and video outputs 3414. The set top box incorporates a CPU 5512 with graphics capabilities and a memory 5510 to provide an interface and control the set top box through a data transfer structure 5514. An optional input output capability 5516 is provided for a direct user interface with the set top box. To transmit instructions from the user to the head end, information is transmitted over data transfer structure 5514 into the transceiver module to the internal transmitter via the cable TV network to the head end.

FIG. 56 is an illustration of the integrated television receiver 5602. This television could be one that processes digital or analog broadcast signals 5604. An exemplary integrated switchless attenuator and low noise amplifier 3408 is the first stage in a receiver contained in a television set. The integrated switchless attenuator and low noise amplifier is used as a "front end" of the receiver to adjust the amplitude of the incoming signal. Incoming television signals whether received from a cable or antenna vary widely in strength, from received channel to channel. Differences in signal strength are due to losses in the transmission path, distance from the transmitter, or head end, obstructions in the signal path, among others.

The front end adjusts the received signal level to an optimum value. A signal that is too strong produces distortion in the subsequent circuitry by over driving it into a non linear operating region. A signal that is too week will be lost in the noise floor when subsequent high noise figure circuitry is used in an attempt to boost the signal strength. When used in conjunction with "automatic level control" (5604) circuitry the integrated switchless attenuator and low noise amplifier responds to a generated feed back signal input to its control voltage terminal to adjust the input signal level to provide optimum performance.

After passing through the front end 3408, the RF signals 5604 are input to tuner 5620. This tuner circuit is as described in the previous embodiments where a single channel is selected from a variety of channels presented in the input signal 5604. An automatic fine tuning circuit ("AFT") 4622 is provided to adjust the level of the final IF signal 5624 being output to the television signal processing circuitry 5610. The signal processing circuitry splits the audio signal 5602 off of the final IF signal 5624 and outputs it to an audio output circuit such as an amplifier and then to a speaker 5618. The video signal split from IF signal 5624 is delivered via video signal 5606 to video processing circuitry 5612. Here the analog or digital video signal is processed for application as control signals to the circuitry 5614 that controls the generation of an image on a display device 5626. Such a receiver would typically be contained in a television set, a set top box, a VCR, a cable modem, or any kind of tuner arrangement.

FIG. 57 is a block diagram of a VCR that incorporates an integrated receiver embodiment 5702 in its circuitry. VCRs are manufactured with connections that allow reception and conversion of a television broadcast signal 5704 to a video signal 5706. The broadcast signals are demodulated 5708 in the VCR and recorded 5710 on a recording media such as a tape, or output as a video signal directly. VCRs are a commodity item. Cost pressures require economical high performance circuitry for these units to provide additional more features as the prices decline in the marketplace.

FIG. 58 shows a block diagram of a typical cable modem. A "Cable Modem" is a device that allows high speed data connection (such as to the Internet) via a cable TV (CATV) network 5812. A cable modem commonly has two connections, one to the cable TV wall outlet 5802 and the other to a computer 5804.

There are several methods for connecting cable modems to computers, Ethernet 10BaseT is an example. The coax cable 5808 connects to the cable modem 5806, which in turn connects to an Ethernet card 5814 in a PC. The function of the cable modem is to connect broadband (i.e., the cable television network) to Ethernet. Once the Ethernet card has been installed, the TCP/IP software is typically used to manage the connection.

On-line access through cable modems allows PC users to download information at a speeds approximately 1,000 times faster than with telephone modems. Cable modem speeds range from 500 Kbps to 10 Mbps. Typically, a cable modem sends and receives data in two slightly different, or asynchronous fashions.

Data transmitted downstream, to the user, is digital data modulated onto a typical 6 MHz channel on a television carrier, between 42 MHz and 750 MHz. Two possible modulation techniques are QPSK (allowing data transmission of up to 10 Mbps) and QAM64 (allowing data transmission of up to 36 Mbps). The data signal can be placed in a 6 MHz channel adjacent to an existing TV signals without disturbing the cable television video signals.

The upstream channel to the ISP provider is transmitted at a rate between 5 and 40 MHz. This transmission path tends to inject more noise than the downstream path. Due to this problem, QPSK or a similar modulation scheme in the upstream direction is desirable due to noise immunity above that available in other modulation schemes. However, QPSK is "slower" than QAM.

Cable modems can be configured to incorporate many desirable features in addition to high speed. Cable modems can be configured to include, but are not limited to, a modem, a tuner 5816, an encryption/decryption device, a bridge, a router, a NIC card, SNMP agent, and an Ethernet hub.

To transmit and receive the data onto the cable television channel it must be modulated and demodulated respectively. This is accomplished with a radio frequency (RF) transmitter and receiver, commonly referred to in combination as a transceiver 5818. The receiver's front end 5820 is advantageously provided as previously described.

ESD Protection

FIG. 59 is an illustration of a typical integrated circuit die layout. An IC die 5900 is typically laid out with a series of pads 5904 at the edge of the die. This peripheral area of the die is referred to as the pad ring 5906. Typically at the center of the die a core 5902 is located. The core contains the circuit functions being performed on the integrated circuit die 5900. An integrated circuit die is typically placed inside of an IC package or "header". The IC package provides a mechanically sturdy package to protect the die 5900 and interface reliably with external circuitry. The pads 5904 in the pad ring 5906 are typically wire bonded to pins fixed in the header. Arranging pads 5904 in a peripheral pad ring 5906 allows for ease in an automated wire bonding from header pins to the pads of the die 5900.

Thus, on an IC die 5900, typically configured as shown in FIG. 59, the pads 5904 located in the pad ring 5906 are an intermediate connection between the circuit core 5902 and outside connections on the IC package.

The pad ring of an integrated circuit die typically provides a convenient place to provide electrostatic discharge ("ESD") protection circuitry. ESD discharge occurs when static build-up of electrical charge occurs. A static charge build-up typically comprises a high voltage until discharged. A static charge built up upon a surface will jump, or arc, to another surface of lower potential once the voltage difference between the surfaces exceeds a spark gap voltage for a dielectric, that separates the two surfaces. Spark gap voltages are typically rated in volts per inch. This is the voltage required to arc from one surface to another, located one inch away from each other with a given material present between the surfaces. For a given separating material a charge will arc from one surface to the other for a lower value of potential if the surfaces are moved closer together. In integrated circuits distances between conductors or devices present on an integrated circuit tend to decrease as the degree of miniaturization increases. Thus, electrostatic discharge from one surface to another within an integrated circuit tends to occur at smaller voltages as the state of the art advances.

ESD is a major source of integrated circuit damage. After a charge builds up to a point where it arcs from one surface to another, the arcing causes damage to the integrated circuit. Typical damage comprises holes punched in a substrate and destruction of transistors in the core 5902.

ESD protection is typically provided by a device that provides a low impedance discharge path from an IC pin to all other pins including ground when an ESD charge exceeds a predesigned threshold voltage of the protection device. During normal operation of the circuit the ESD device does not cause a loading at the IC pin. Better ESD protection tends to be produced when a lower trigger threshold is provided in the ESD protection circuit. (ESD circuits provide a low impedance discharge path from any pin of an integrated circuit to any other pin once an ESD triggers a given threshold designed into an ESD circuit). Thus, to protect integrated circuits from ESD signal isolation from pin to pin is undesirable. To withstand an ESD event, large structures with sufficient spacing tend to provide increased ESD protection.

However, from a signal isolation prospective, it is desirable to have a high signal isolation between integrated circuits pins. Isolation between pins is particularly desirable in RF integrated circuits. To function properly, circuits tend to require power supply lines, ground lines and signal lines that are isolated. ESD circuitry conflictingly tends to require all pins to be interconnected somehow. Furthermore, RF IC's tend to need small structures in order to enhance bandwidth and reduce noise. This requirement is contradictory to an ESD's circuits requirement for structures that handle large currents.

An increasing trend in integrated circuit design is to mix high speed and/or high frequency circuitry with high digital circuits. Digital circuits tend to generate high noise levels within an IC. Digital circuit noise tends to interfere with other circuit functions present on the die. The individual circuits present on the die are often designed in blocks that define a given area on the die substrate. These circuit blocks containing sensitive circuitry are shielded as much as possible from the digital circuitry.

A common technique to minimize noise injection is to put different circuit blocks on separate power and ground lines. Sensitive circuits in this arrangement are placed as far as possible from noisy circuitry. While this arrangement tends to improve power supply and ground isolation, ESD discharge problems tend to be aggravated.

During ESD discharge a current flows from one to point to another through path of least resistance. If a path is not present, or inadequate, parasitic discharge paths tend to form causing damage to the integrated circuit. Thus, circuitry separated by large distances to minimize cross talk and noise injection tend to be susceptible to damage from ESD discharge over parasitic paths.

For example, for a noise sensitive mixed mode IC fabricated by a CMOS technology, a non-epitaxial process is preferred due to the processes ability to provide a higher substrate isolation. However, the non-epitaxial CMOS process tends to create undesirable ESD discharge paths due to a triggering of a parasitic bipolar structure inherent with the process. These discharge paths tend to pass through and damage core circuitry. Thus, it is desirable to provide a structure that tends to control ESD discharge paths.

From an ESD design standpoint, large ESD structures provide better protection than a smaller structure. However, in noise sensitive circuits, the large ESD structures connected to the circuitry tend to act as noise sources, degrading circuit performance. Thus insertion of ESD structures in noise sensitive circuits must be done with care.

FIG. 60 illustrates an embodiment of the invention that utilizes pad ring power and ground busses. A pad ring buss utilizes a reference VDD 6002 and a reference ground ring 6004 that run through the entire pad ring of a die along the exterior edge of the die. In an embodiment, the pads 5904 along an edge of the die are arranged in line. In an alternate embodiment, the pads 5904 may be staggered along the edge of the die 5900.

The reference VDD rings and reference ground rings serve to connect a series of localized power domains contained in the core 5902 of the die. Because of the block structure making up individual circuit functions within the core comprise localized power domains they connect to a primary power bus in the pad rings. The pad rings 6002, 6004 may be broken 6006 to prevent the formation of a current loop causing eddy currents. The pad rings are connected to individual power domains within the circuit through ESD discharge protection structures.

FIG. 61 is an illustration of the connection of a series of power domains 6102, 6104, 6106 to a pad ring bus structure 6002, 6004. On die 5900 pad rings 6002, 6004 are disposed about the periphery of an integrated circuit. The pad rings are provided with a gap 6006. The pad rings surround an integrated circuit core 5902 that comprises one or more circuit blocks 6102, 6104, 6106. Within each block a localized power and ground bus structure is provided for each block 6110, 6112, 6114 respectively. ESD discharge protection devices 6108 are utilized to prevent electrostatic discharge damage.

The localized bus structures 6110, 6112, 6114 are connected through ESD discharge protection devices to the pad rings at a single point. In this structure, no localized power supply or ground line is more than two ESD structures away in potential drop from any other voltage or ground structure.

FIG. 62 is an illustration of an embodiment utilizing an ESD ground ring 6200. In the embodiment shown a set of localized power and ground buses 6110, 6112, 6114 are located in a corresponding circuit function blocks 6102, 6104, 6106. It is understood that the localized power and ground busses may contain multiple power and ground lines, and that for simplicity in explanation a single power supply line and ground line will be discussed. It is also understood that any number of circuit function blocks may be utilized in the circuit to provide the desired protection. The circuit function blocks are protected from ESD by utilizing the ESD ground ring 6200 coupled to a series of ESD protection devices 6204, 6108.

Each of the localized power and ground busses being protected is configured as in circuit function block 6102. The interconnections in circuit block 6102 will be discussed as a representative example of all connections. A discharge path for power supply lines is through the ESD protection device 6108 coupled between a local power line VDD1 and a local ground line GND1. The ESD ground ring and ESD protection devices provide isolation between the voltage buss and ground within the circuit blocks 6102, 6104, 6106. The structure also provides an ESD discharge path between any voltage bus line contained in another circuit function block and ground.

Local grounds 6110, 6112, 6114 are coupled through an ESD clamp structure 6204 to the ESD ground ring. To prevent eddy currents from forming, a gap 6006 is cut in the ESD ground ring 6200. A bond pad 6202 coupled to the ESD ground 6200 is provided to couple the ESD ground to a system ground. Coupling an ESD ground to a system ground tends to decrease noise that tends to be coupled through the ESD ground ring into the circuit core 5902.

In each circuit function block all individual grounds Gnd1 Gnd2 Gnd3 are connected to the ESD ground ring through a pair of anti-parallel diodes 6204. In addition to anti parallel diodes other ESD triggered protection devices may be equivalently utilized. Thus, with the connection described, any ground in any circuit block is only two diode potential drops (approximately 0.6 of a volt for a silicon diode) away from any other ground in any circuit block.

When implemented in a CMOS technology the substrate is conductive. In CMOS technology the ground lines in each block are inherently coupled to each other through the substrate. By going through the ESD ground ring the localized grounds tend to be loosely coupled to each other through the pair of anti-parallel diodes. Because of loose coupling between the substrate and ESD ground ring, noise coupling between the various grounds tends to be minimized.

The VDD lines in each block are completely isolated from each other. The ESD clamps 6108 between the VDD and ground lines in the circuit block tend to provide a complete discharge path for the VDD bus lines. When an ESD event occurs the VDD supply lines in a block sees a low impedance path through two diodes and two ESD clamps to the VDD bus of another circuit block.

RF and high speed signals present unique problems to providing ESD protection. Noise is typically injected in a circuit through the circuit's power supply and ground leads. Good high impedance RF isolation of noise sources from an RF signal while providing a low impedance ESD discharge path is provided by circuitry comprising an ESD pad ring. The embodiments tend to provide isolation of RF signals from noise sources by high impedance paths between the noise signal and RF signal while maintaining a low impedance discharge path from pin to pin of the integrated circuit when presented with an ESD signal. Thus, the dual requirement of an RF signal's need for isolation and an ESD circuit's needs for all pins to be connected tends to be achieved in the embodiments described above.

Another conflicting requirement is an RF circuit's need to maintain small structures that reduce noise coupling and enhance bandwidth by reducing parasitic capacitance verses an ESD circuit's requirements for a large structure that will withstand a large ESD discharge current.

FIG. 63 is an illustration of the effect of parasitic circuit elements on an RF input signal. Parasitic effects tend to be more pronounced in a circuit structure with large physical dimensions such as a bonding pad. In a typical RF integrated circuit a bonding pad tends to have dimensions much greater than the circuit elements present on the integrated circuit. In addition bonding pads are attached to pins of an integrated circuit often by wire bonds that increase the parasitic effects. Parasitic elements tend to produce the affects of a low pass filter 6300. For simplicity the low pass filter is shown as a series resistor 6302 with a shunt capacitance 6304. However in an actual circuit it is understood that this resistance and capacitance comprises distributed elements disposed along the length of the bond wire and pad structure.

If an RF signal 6306 having a given bandwidth is presented to such a filtering structure 6300, then the signal emerging at the other end is a band limited or filtered signal 6308. Such a distorted signal is undesirable. In the case of an analog RF input signal information, or the signal its self may be lost. In the case of a digital signal, limiting the bandwidth of the spectral components that make up the pulse train causes distortion in the pulse train at the output. The capacitance 6304 tends to be produced predominantly by a bonding pad structure that separates the charge collected on the bonding pad from a ground underneath it.

In an ESD protection circuit large bonding pads and large ESD structures are desirable to shunt large ESD currents to ground without damage to the circuitry. However, when such a large ESD structure or bonding pad is present RF signals tend to be degraded due to the parasitic effects. Large capacitance is desirable from an ESD design standpoint. Large capacitors tend to slow down a buildup of charge, and thus potential during an ESD event.

In addition cross-talk is produced by a signal on one line being capacitively coupled to a signal on a second line distance between the lines must be maintained. A reference ring routed about the periphery of a chip with bonding pads placed on the core side tends to reduce or eliminate the cross-talk that would occur between these conductors if one were routed on top of the other.

Returning to FIG. 59, in the state of the art power buses are typically disposed between the integrated circuit core 5902 and the pad ring 5906, with the bonding pads 5904 disposed about the periphery of the chip 5900. In this arrangement a pad to core connection typically crosses the power buses perpendicularly.

FIG. 64 illustrates a cross-talk coupling mechanism. A bonding pad 5904 disposed on the periphery of the die 5900 would require interconnecting traces 6404 to pass over ESD voltage and ground reference pad rings 6002, 6004. Any signal present on the integrated circuit track 6404 crossing over the ESD protection rings 6002, 6004 are capacitively coupled 6402. Signals on reference rings 6002 and 6004 will tend to be coupled onto trace 6404 and vice versa. Thus, it is desirable to place the bond pad 5904 within the periphery of the reference rings.

In an embodiment bond pads 5904 are disposed within the pad rings 6002, 6004. External connections are achieved with bond wire connections that cross over the pad rings. The crossover gap of the bond wire is much larger than the vertical distance between the circuit track 6404 and either of the reference rings 6002, 6004.

FIG. 65 is an illustration of an ESD device disposed between a connection to a bonding pad and power supply traces. In a typical IC layout a bonding pad 5904 is connected 6404 to an integrated circuit core 5902. Traces 6504 typically cross power supply and ground lines 6002 6004. An ESD device 6500 is typically disposed between the traces and the power supply buses. A parasitic capacitance exists between the traces 6404 and the power supply connections 6002, 6004. This parasitic capacitance reduces signal bandwidth and degrades noise performance because of the low pass filtering affect. Also, with this arrangement a core circuit 5902 must be distanced from the bonding pad 5904 to allow for the power supply traces 6002, 6004 to pass between the pad and core. This prevents minimization of the distance between bonding pad and circuit core. Parasitic capacitance between power supply conductors and traces connecting the core to the bonding pad are not the only problem encountered with this configuration. In the current state of the art the bonding pads tend to increase parasitic capacitance.

FIG. 66 is an illustration of parasitic capacitance in a typical bonding pad arrangement on an integrated circuit. In a typical integrated circuit a large bonding pad is disposed on the surface of the integrated circuit die 5900. To prevent pad peeling and liftoff one or more metal layers 6600 are disposed in a layered structure separated by semiconductor material or oxide. The two metal layers 6602, 6604 shown are coupled to the upper metal layer 5904 by multiple feed-throughs 6606 that provide electrical contact and mechanical stability to the uppermost bond pad 5904. With this structure multiple parasitic capacitance 6610 due to the layout are present. These parasitic capacitances will couple to the substrate or any circuit traces disposed nearby such as a power and ground bus structure.

FIG. 67 is an illustration of a embodiment of a bonding pad arrangement tending to reduce parasitic capacitances. A pad ring bus comprised of lines 6002, 6004, 6200 is disposed about the periphery of the chip 5900. ESD devices 6702 are disposed to the side of a bonding pad 6704. With this arrangement a bonding pad 6704 may be connected 6504 to a circuit block in the core 5902 with a minimum interconnecting trace length. The pad to core connection 6504 does not overlap any power ground or ESD bus structure. Thus, cross-talk and noise coupling with these structures tends to be minimized. In addition the metal routing width from core to bonding pad is not restricted due to requirements that would be imposed by an ESD structure as described in FIG. 67. In an alternate embodiment that provides improved ESD handling capabilities, the ESD structures 6702 may be increased in size.

In an alternative embodiment the ESD ground bus 6200 is placed at the periphery of the die. This bus tends to carry noise that is most disruptive to circuit operation. Thus, it is desirable to space this bus as far as possible from a pad. In the alternate embodiment the ground bus is disposed between the ESD ground bus and the VDD bus to reduce coupling between the ESD ground bus and the VDD bus line.

FIG. 68 illustrates a cross section of the bonding pad structure of FIG. 67. The bond pad 5904 is reduced in size to the smallest dimension allowable for successful product manufacturing. A second metal layer 6802, further reduced in area as compared to the top layer, is utilized as an anchor to hold the bonding pad above it in place during a bonding process. With this arrangement a smaller number of feed-through connections 6606 are required. By eliminating multiple metal layers beneath the top layer 5904 a distance between the lower bond pad 6802 and the substrate 5900 is increased. As predicted from the capacitance formula, when the distance is increased between capacitor plates the parasitic capacitance is decreased.

The relationship is as follows:

$$C=K\epsilon r\times(A/d) \tag{13}$$

where

C=capacitance

K=dielectric constant $\epsilon r$=the relative dielectric constant of the separating material A=area of the conducting plates d=distance between the conducting plates As can also be seen from the equation the reduced area of the bonding pad results in a smaller capacitance. In addition, if the dielectric constant in the equation is lowered then the capacitance will also be lowered.

A diffusion area 6804 is disposed beneath the bonding pads 5904,6802 to decrease the capacitance from bonding pad to substrate. The diffusion area comprises a salicided diffusion implant 6804 to further reduce parasitic capacitance coupling to the substrate. This diffusion area 6804 is coupled to a potential 6806 that tends to reduce a voltage difference between the diffusion layer 6804 and the bond pad structure 5904, 6802.

FIGS. 69*a*–69*e* illustrate various ESD protection schemes utilized in the state of the art to protect an integrated circuit from ESD discharge due to charge build up on a die pad. Typically a large ESD structure (or clamping device) attached to an IO pin of a CMOS integrated circuit allows a high ESD discharge current to be shunted to ground through it. However, a large ESD structure on an IO pin causes two problems. First dedicating a large area on an integrated circuit die to an ESD structure is undesirable. Die size is directly related to the cost of manufacturing making a minimized die size desirable. A second problem with a large ESD structure is a capacitive loading by the ESD structure on a signal present on the pin. The loading causes a decrease in bandwidth of the input signal, increased power dissipation, and exceeding the allowable specified input capacitance. A compact ESD protection structure that works in conjunction with over-voltage protection, has a fast response time, will not be turned on by noise generated in normal operation, and provides a layout that may be used by multiple semiconductor foundries is described in the following paragraphs.

In the past various structures 6902, 6904, 6906, 6908, 6910 have been coupled to IC die pads 5904 to shunt away harmful ESD levels. A common structure is the ggNMOS ESD structure 6902. A ggNMOS transistor M1 is utilized to shunt an ESD charge to ground. The source of M1 is tied to the pad, and the drain to ground. Equivalently the drain may be tied to a lower potential source. As ESD charge builds on the pad its voltage increases to a point where the ggNMOS transistor is triggered to conduct the ESD charge to ground.

Internal capacitance in the ggNMOS transistor feeds a portion of the voltage established by a static charge to the ggNMOS transistor gate. When the voltage has risen to a sufficient level on the gate the transistor conducts. When conducting the transistor is in a low impedance state and all the static charge on the pad is shunted to ground.

Until the gate voltage rises to a level to cause the transistor to conduct it is in an off, or high impedance state. In this state the ggNMOS transistor tends to not disturb the signal on the pad.

Gate bias determines the effectiveness of this structure. In normal operation the gate of the ggNMOS is biased off putting the NMOS in an off, or high impedance state. Under an ESD discharge condition the gate of the ggNMOS is biased high to turn on a channel under the gate oxide. The ggNMOS relies on the transistor's inherent capacitance from gate to drain ("Cgd") to pull the gate high when the pad is pulled high when a large electrostatic charge is present. Triggering is set by a voltage divider circuit comprising Cgd and resistor R. The electrostatic charge on the pad 5904 is divided down by the ratio of impedances of the capacitor Cgd and resistor R.

Coupling through Cgd degrades in a typical cascode over-voltage protection circuit. The ggNMOS cannot be used alone without a series cascode transistor 6904 when its voltage from drain to source ("VDS") exceeds a given electrical overstress limit. The ggNMOS M1 utilizes a series cascode stage M5, with its gate biased on, as shown at 6904 prevents Cgd from being directly coupled to a bonding pad 5904, substantially impairing its effectiveness. To circumvent insufficient coupling of M1's Cgd to the pad three other device configurations 6906, 6908, 6910 are known.

The first device 6906 adds capacitor C1 to the ggNMOS structure of 6902. C1 is coupled from gate to source of M1. C1 increases the coupling effect produced by the inherent Cgd of the ggNMOS. Unfortunately C1 strongly couples the ggNMOS to the pad. Slight perturbations present on the pad during normal operation are directly coupled to the ggNMOS through the strong coupling. Thus, with the added coupling capacitor C1 present, typical AC noise present on the pad tends to turn on the ggNMOS during normal operation.

The next circuit 6908 utilizes the same coupling capacitor C1 as described in 6906. However, this coupling capacitor has one terminal tied to the gate of M1 and the second terminal tied to a power supply voltage. During an ESD event the power supply is pulled high by the ESD voltage present on the pad. When the power supply is pulled high the gate of the ggNMOS M1 follows it to a high state. However with this arrangement the gate of the ggNMOS is directly coupled to a noise typically present on a power supply line. Switching noise present on a power supply line tends to cause the ggNMOS M1 to turn on. If a quiet, or filtered, power supply is coupled to capacitor C1 an extra voltage drop caused by going through ESD protections of the quiet power supply would be required before the gate bias is pulled high. This causes an undesirably slow response time.

The third method 6910 utilizes a zener diode Z1 connected with the positive terminal at the gate of M1 and its negative terminal to the source of M1 to pull the gate of the ggNMOS high under an ESD discharge. When an ESD discharge event occurs the zener diode goes into a voltage breakdown mode allowing charge to flow to the gate of the ggNMOS M1. The gate floats high and the ggNMOS turns on shunting the ESD current to ground. The drawback of this approach is that zener diodes are not available in standard digital CMOS process.

FIG. 70 illustrates an approach to pad protection during ESD event. Electrostatic charge builds up on an integrated circuit pad 5904. A shunt device 7002 is connected from the pin 5904 to ground. The shunt device 7002 is in a high impedance state until sufficient charge builds up upon the pad 5904 to trigger the shunt device into a low impedance state. A low impedance state allows all of the charge built up upon the pad to be shunted to ground before damage to circuitry coupled to the pad can occur. The shunt device is triggered by the ESD charge building on the pad. A divider circuit comprising a capacitive element 7006 in series with a resistive element 7004 are coupled between the pad 5904 and ground. The junction of the capacitive and resistive element is used as a trigger to the shunt device 7002. When a preset trigger voltage is reached the shunt device is activated into a low impedance state.

FIG. 71 is a schematic of a circuit immune to noise that uses an ggNMOS' Cgd and a gate boosting structure to trigger ESD protection. In this configuration diode CR1, transistors M2 and M3 are all disposed in an n-well biased at a voltage V to form a gate boosting structure 7102. The source and drain of M3 are coupled to the n-well 710. The source of transistor M2 is tied to a quiet power supply V. Power supply V is used to provide back gate bias in the N-well. CR1 is made by a P+ diffusion into the n-well. Typically only one quiet power supply is sufficient to bias the entire chip. This is because CR1 is fabricated with small dimensions and dissipates little power.

Transistor M3 is a PMOS transistor operating in its linear region to provide a MOS capacitor inherent to its construction between CR1 and R1. The drain of M2 is coupled to the source of M3. The drain of M3 is coupled to the negative terminal of CR1. The positive terminal CR1 is coupled to the pad 5904. The gate of M3 is coupled to a first terminal of resistor R1, and a second terminal of R1 is coupled to ground. The junction of the gate of M3 and R1 is tied to the gate of M1 and the negative terminal of CR1. The drain of M1 is tied to pin 5904 and the source of M1 is tied to ground. Alternatively the ground connection is not at zero potential but some lower potential. Resistor R1 is fabricated as an ohmic resistor, or alternatively using other pulldown techniques known in the art.

In normal operation M2 is turned on. This provides a low impedance path from the n-well back gate 7100 which is the n-well that host 7102 to the quiet power supply V. The channel side, that is formed by the gate and conductive channel formed in the silicon between the source and drain, of the MOS capacitor formed by M3 is thus tied to a low impedance source. Diode D1 is reverse biased forming a high impedance path between M3 and pad 5904. Thus, a strong coupling between the MOS capacitor formed by M3 and the pad is not present. Added input capacitance tends to be negligible by keeping the dimensions of diode CR1 as small as allowed by a process' constraints.

When electrostatic discharge occurs CR1 becomes forward biased, providing a low impedance path from the pad 5904 to the capacitor formed by M3. In response the capacitor formed by M3 charges up, providing a "boosting" to turn on the gate of M1. By providing boosting to the gate of M1 the drain source channel in M1 is turned on quickly forming a low impedance connection from the pad 5904 to ground. The fast response time is particularly suitable for a machine model ("MM") and charge device model ("CDM") ESD discharge modes.

The MOS capacitor formed by M3 significantly increases the capacitance present on the gate of M1. This allows R1 to be reduced in size to maintain the same time constant $\tau$ ($\tau$=1/R×C) that would otherwise be required if M3 were absent. Without the presence of the capacitance of M3, R1 would be required to be in the range of hundreds of kilo-Ohms. Resistors of this value require a large amount of layout area.

Thus R1 and CR1 do not require significant die area. The fabrication of M3 utilizes thin oxide to form the MOS capacitor also providing a compact layout of this device. M1 is also reduced in size because of the gate boosting provided. In the configuration described, M1 is biased at a higher gate source voltage allowing a channel to conduct current more efficiently. Thus, a given ESD current is capable of being conducted to ground with a smaller transistor M1. The dimensions of M1 do not need to be made large in order to provide sufficient Cgd for gate boosting, since boosting is primarily accomplished through the capacitance supplied by M3.

FIG. 72 is a schematic of an alternative embodiment utilizing the gate boosting structure and a cascode configuration. In an I/O application the gate of the cascode transistor is tied directly to a power supply connection.

FIG. 73 is a schematic of an embodiment that does not require a quiet power supply. For a small amplitude signal, as in RF signal applications, the drain to gate coupling of M1 will not turn on the channel of M1. Under this condition a quiet power supply is not required, allowing M2 of FIG. 71 to be eliminated. In this embodiment the pad is coupled to a silicon substrate through the N-well capacitance of diode CR2. The PMOS capacitor M3 of FIG. 71 is replaced by a metal capacitor that reduces total n-well area coupled through CR2. The configuration further reduces pad capacitance while still allowing gate boosting of shunting transistor M1 during an ESD discharge.

The details of ESD protection are disclosed in more detail in U.S. patent application Ser. No. 09/483,551 filed Jan. 14, 2000 entitled "System and Method for ESD Protection" by Agnes N. Woo, Kenneth R. Kindsfater and Fang Lu based on U.S. Provisional Application No. 60/116,003 filed Jan. 15, 1999; U.S. Provisional Application No. 60/117,322 filed Jan. 26, 1999; and U.S. Provisional Application No. 60/122,754 filed Feb. 25, 1999; the subject matters of which are incorporated in this application in their entirety by reference.

IF AGC Amplifier

The VGA and PGA/LNA have characteristics in common that allow interchangeability in alternative embodiments.

FIG. 74 is a block diagram of a variable gain amplifier ("VGA") 3403. The VGA produces a signal that is a reproduction of a signal input to it at an amplified level. The amplified level in a VGA is capable of being varied. A variable gain is accomplished through the use of one or more control signals applied to the amplifier.

VGAs are frequently used to maintain a constant output signal level. VGAs do this by varying the amplifier gain to compensate for varying input levels. In the case of strong or weak signals it is desirable to maintain a linear gain for input verses output signals with little noise added. Maintenance of a linear gain reduces distortion for high level input signals. VGAs are often used in IF or RF strips to compensate for prior losses or weak signal reception.

In a linear gain, a 1 dB increase in sinusoidal input signal level produces a 1 dB change in the output signal level at that same frequency. A gain of this nature is termed a "linear response." If a 1 dB change is not produced, this is indicative of an available power being diverted to produce a signal at another frequency of operation. A signal at a frequency other than desired often interferes with the signal being amplified and is termed distortion. Thus, the linearity of an amplifier is a figure of merit, the greater the linearity the better the quality of the amplifier. Amplifiers that utilize compensation circuitry and differential signal transmission tend to have improved linearity.

VGA compensation circuitry controls $V_{ds}$. For a large input signal, linearity and low gain is required. With a reduction in $V_{ds}$, good linearity and low gain are achieved. If a small signal is input to the amplifier, $V_{ds}$ is increased. The increase in $V_{ds}$ causes one or more MOSFETs internal to the VGA to be biased in the active region. Active region bias allows for high gain and low noise to be achieved simultaneously. The VGA utilizes a current steering method of applying control signals to provide an extended gain range VGA. The control of $V_{ds}$ allows the production of a linear output when a large signal is applied to the input.

The VGA has a differential input comprising two signals, $+V_{in}$ and $-V_{in}$ 7408. The VGA has a differential current output comprising two signals, $+I_{out}$ and $-I_{out}$. In the embodiment shown the differential current signals are applied to a first and second resistor R1 and R2 to produce a differential voltage output, $+V_{out}$ and $-V_{out}$ 7410 respectively. Equivalently the current outputs may be applied to work against any impedance to generate a voltage output.

A set of three control signals 7404 are supplied to the VGA 3403 from a linearization circuit 7402. The linearization circuit 7402 produces the three control signals 7404 that are derived from a single control signal, $V_c$ 7406 through compensation circuitry. Control signal $V_c$ tends to be proportional to the gain desired in the VGA 3403. The three control signals 7404 control the VGA in a manner such that a desired gain and a desired linearity tend to be produced by the VGA.

The linearization circuit is stimulated by the control signal $V_c$ 7406 is supplied by an external DSP chip. The control signal applied to the linearization circuit 7402 is shaped in a predetermined way. A goal of shaping the control circuit is to produce the second set of control signals 7404 that are applied to the VGA 3403 to produce a desired VGA gain transfer function, measured in decibels, that changes linearly with the applied control signal $V_c$. In the embodiment shown $V_c$ is a voltage, however a control circuit may be equivalently supplied. In an alternate embodiment the overall transfer function of the VGA is configured to yield a linear function of gain as measured with linear units versus control voltage by appropriately adjusting the linearization circuit through the application of a log to linear conversion current.

In addition to shaping the gain transfer function, another function of the linearization circuit is to control signals that control the VGA to produce the desired low distortion output. The second set of control signals 7404 are shown as a bussed line 7404. The second set of control signals comprise a voltage VD1, and a pair of control currents: iSig and iAtten. The second set of control signals 7404 tend to produce a linear change in gain with variation of the control signal while maintaining an acceptable distortion level in the VGA.

The three control signals are generated by two subcircuits in the linearization circuit: a current steering circuit and a drain voltage control voltage signal generation circuit. The current steering circuit produces two signals, iSig and iAtten. The drain voltage control signal voltage generation circuit produces one signal, VD1.

FIG. 75, is a block diagram of the internal configuration of the VGA and the linearization circuit. The VGA and linearization circuit to implement current steering and $V_{ds}$ control of the VGA are described as a separate function block. However, the functions described may be equivalently merged into the circuit functional blocks of the other.

The VGA 3403 is constructed from two cross coupled differential pair amplifiers 7500 7502. A first differential pair amplifier 7500 includes two transistors M4 and M10. A second differential pair amplifier 7502 includes transistors M13 and M14. The first and second differential pair amplifiers are driven in parallel by a differential input voltage 7408. When referenced to ground, the differential input voltage applied to each amplifier simultaneously is denoted $+V_{in}$ and $-V_{in}$.

The differential pair amplifiers have differential current outputs +I1, −I1, +I2, −I2, that are combined to produce a differential VGA output comprising $+I_{out}$ and $-I_{out}$ The first differential pair amplifier 7500 has differential current outputs +I1 and −I1 that are sinusoidal and 180 degrees out of phase from each other. The second differential pair amplifier 7502 has differential current outputs +12 and −12 that are sinusoidal and 180 degrees out of phase from each other. VGA output current $+I_{out}$ results from the combination at node 7505 of out of phase currents −I1 and +I2. VGA output current $-I_{out}$ results from the combination at node 7507 of out of phase currents +11 and −12. Note that the currents described above having a minus sign prefix, −I1, −I2, are generated in response to input voltage $-V_{in}$, and the currents with plus sign prefixes, +I1, +I2, are generated in response to $+V_{in}$.

A $V_{ds}$ control circuit 7504 within the VGA 3403 supplies a $V_{ds}$ control voltage that is applied to nodes 7505 and 7508. The $V_{ds}$ control circuit receives an input VD1 from a VD1 control signal generation circuit 7510 that is a part of the linearization circuit 7402. In alternative embodiments the $V_{ds}$ control circuit is merged into the VD1 control signal generation circuit 751.

A current steering circuit 7512 in the gain control circuit 7402 supplies control signals iSig and iAtten. The signal iSig is a control input to the first differential pair amplifier 7500. The signal iAtten is a control input to the second differential pair amplifier 7500.

In the embodiment shown the VGA 3403 is configured to operate at an IF frequency. However it is understood that the VGA may be configured, by appropriate component selection to function at any desired frequency. In an IF strip, the addition of a VGA maintains a constant IF output as the input varies. This is accomplished by adjusting the gain of the VGA. A VGA is useful in any situation where a signal presented to a circuit is of unknown or variable strength.

Functionally the VGA maintains a constant level at its output so that subsequent circuitry may be designed that tends to have better performance and less noise. In alternate embodiments, the variable gain amplifier may be used at RF or other frequencies to reduce signal level variations in a circuit. For example in an embodiment, a VGA 3403 as described may be used in the RF front end 3408 to control the RF signal level that is applied to a receiver 3402.

The overall gain of the VGA is attributable to the individual gain contributions of transistors M10 M4, M13 and M14 that produce a current gain. In an embodiment, the VGA voltage gain is set by providing resistance at the $+I_{out}$ and $-I_{out}$ terminals to establish a voltage output, and thus a voltage gain for the amplifier. The exemplary embodiment includes field effect transistors ("MOSFETs"). Equivalently, other transistor types may be substituted for the MOSFETs utilized in the exemplary embodiment. A pair of control currents iSig and iAtten and a control voltage VD1 are principally used to provide an extended range of available VGA gain and a linear in dB VGA amplifier transfer function that provides a desired linearity.

Two methods of gain control are utilized in the exemplary VGA. The first method is $V_{ds}$ control that controls noise and linearity while reducing VGA gain when large signals are applied, the second is current steering that provides an extended range of available VGA gain. The set of three control signals 7404 include iSig, iAtten and VD1.

In the first method of $V_{ds}$ control, gain and linearity in the output of the VGA tend to be controlled by adjusting each of four transistors' M4, M10, M13, M14 drain source voltages ("$V_{ds}$") of the transistors to control a transductance ("$g_m$") associated with each transistor. If a drain source voltage $V_{ds}$ across a MOSFET device M10, M4, M13, M14 is reduced, a $g_m$ transfer characteristic of that transistor, which is a function of input voltage, becomes flatter. The flatter the $g_m$ transfer function the more linearly the transistor tends to operates. The $V_{ds}$ of all four transistors is controlled in order to manipulate an overall $g_m$ characteristic for the VGA.

The $V_{ds}$ gain control method tends to reduce VGA output distortion by tending to improve the linearity of the VGA. To improve the linearity, the $V_{ds}$ of the transistors are reduced yielding better linearity in conjunction with a transistor operating point on a flattened g curve. As an input signal's strength increases, $V_{ds}$ is reduced providing a linear response VGA. Reducing $V_{ds}$ also tends to contribute to VGA gain control. For small input signals as $V_{ds}$ is increased the MOSFETs become biased in the active region where high gain and low noise operation is obtained. The main effect of reducing $V_{ds}$ tends to be control of the linearity of the VGA amplifier.

In the second method, current steering control, currents iSig and iAtten tend to set amplifier gain over a large range. An increase in the control current iSig tends to increase gain by causing an increase in overall amplifier $g_m$, while an increase in iAtten tends to decrease gain by causing a subtraction of overall amplifier $g_m$. For certain type and size MOSFETs, the relationship between iSig, iAtten and $g_m$ is as shown in equation (14)

$$g_m = \sqrt{\frac{K}{2}}\left(\sqrt{iSig} - \sqrt{iAtten}\right) \tag{14}$$

where $iAtten = I_{tot} - Isig$

K=a constant of proportionality

For other size/type transistors this relationship may not hold, but the idea is still applicable. The $g_m$s of each transistor M10, M4, M13, M14 is controlled to adjust gain. This is accomplished by subtracting, or adding currents through control lines iSig and iAtten to boost or reduce the VGA $g_m$, as required. Control signals iSig and iAtten control amplifier gain by adjusting an overall $g_m$ of the amplifier. A fixed available control current is available for controlling VGA gain through the iSig and iAtten control lines. Gain is controlled by selectively steering the available current into the appropriate control line. For large VGA signal inputs, the linearity produced in a VGA from current steering tends to be improved by the addition of the $V_{ds}$ control circuit.

A single stage VGA amplifier with linearization circuitry as described above that utilizes current steering and $V_{ds}$ control could yield a gain control range in excess of 40 dB.

The second method of VGA gain control is $V_{ds}$ control. Linearity in amplifier output tends to be improved by $V_{ds}$ control or "$V_{ds}$ squeezing." With current steering, no provision is made for improving linearity once the input signal becomes large.

Linearity is typically determined by the $g_m$ of each of the two differential amplifier stages. The first stage comprises M10 and M4. The second stage comprises M13 and M14. The embodiment described tends to have an increased linearity of 26 dB, corresponding to a factor of 20 improvement in linearity over that typically available.

VGA operating conditions determine the distribution the currents iSig and iAtten. When a small signal is applied to the input terminals $+V_{in}$ and $-V_{in}$ it is typically desirable to amplify the signal with a high gain setting. Transistors M10 and M4 are coupled to the differential output so that their $g_m$s tend to contribute to VGA overall gain. However, transistors M13 and M14 are coupled to the VGA output so that their $g_m$s tend to decrease VGA gain through a $g_m$ subtraction. Transistors M4 and M10 are controlled by iSig, transistors M13 and M14 are controlled by iAtten.

For a high gain condition, $g_m$ subtraction is undesired.

Thus, for a high gain setting, it is desirable to have most of the gain available from devices M10 and M4 contributing to the amplifier's overall gain. M10 and M4 are set for maximum gain by setting iSig to a maximum current. Correspondingly iAtten is set to a low value of current. In achieving a maximum gain, a control current is divided between iSig and iAtten such that a maximum current is present in the iSig line.

In the low gain state, the second differential pair transistors M13 and M14 are controlled by iAtten such that they subtract from the gain of M10 and M4. A large gain present for devices M13 and M14 creates a large gain subtraction in devices M10 and M4 which are controlled by iSig to produce a minimum gain.

Thus, when the signal input is small, minimum gain on M13 and M14 is desired and maximum gain on M10 and M4 is desired to produce maximum VGA gain. When the input signal is large, a maximum gain on M13 and M14 is desired and minimum gain on M10 and M4 is desired to produce minimum VGA gain.

FIG. 76 is a graph of gain versus the control current iSig. Control current iSig is shown as a fraction of iAtten, with the total current being equal to 1, or 100%. At the far right of the graph, a 0 dB reference is set corresponding to maximum amplifier gain of maximum amplifier $g_m$. As iSig is reduced, control current iAtten is increasing proportionately causing the VGA's overall $g_m$ and gain to decrease.

Maximum VGA gain is desirable with a small input signal present at the VGA input. Maximum gain is achieved with a maximum current into the iSig control line and minimum current into the iAtten control line. As the signal at the VGA input becomes larger, it is desired to decrease the amplifier gain. A reduction in VGA gain is achieved by decreasing the current in the iSig line and increasing the current in the iAtten control line. A minimum VGA gain corresponds to maximum current in the iAtten control line and minimum current into the iSig line.

Returning to FIG. 75, the linearization circuit takes the externally supplied control signal 7406 that is provided as a voltage and converts it to control signals 7404 that are current and voltage signals. In the current steering circuit 7512 a maximum control signal voltage amplified in the embodiment described corresponds to a maximum gain condition with iSig set to a maximum and iAtten being set to a minimum. As the control voltage is decreased, iSig decreases and iAtten increases.

The control voltage Vc 7406 is created by digital circuitry that is responsive to the input level of the amplifier. In the embodiment described the gain control loop is closed in a digital circuitry domain located off of chip that produces control signal 7404.

The output of the VGA is sampled to determine if sufficient signal strength is available for further signal processing. The sample is processed by an A to D converter into a digital signal, and the control voltage responsive to the level of the VGA output is created. Alternatively, analog methods may be used to sample the output and generate control voltage. In an embodiment the VGA is utilized as an IF VGA. In alternate embodiments the VGA is configured for used at other frequency bands that require an adjustment in gain.

Stability of the AGC loop is maintained during changes in iSig and iAtten. Stability is achieved in the minimum gain setting by keeping iSig greater than iAtten. In the embodiment described iSig is prevented from becoming less than iAtten by the linearization circuit. If iSig becomes less than iAtten, phase inversion problems tend to occur causing a degradation in VGA performance, disrupting automatic gain control ("AGC") loop performance in a receiver. This condition is prevented from happening by providing appropriate circuitry in the linearization circuit.

Also with respect to AGC loop stability, a zero gain setting is undesirable. In the embodiment, the transistors are fabricated with identical dimensions, and it is possible to set the gain equal to zero by making the iSig and iAtten currents equal. This is undesirable from a control loop stability standpoint. The linearization circuit provides appropriate circuitry preventing this condition from occurring.

Maximum attenuation is determined by how close iSig is allowed to approach iAtten in value. Thus, the maximum attenuation achieved is dependent upon the stability that is permissible as iSig approaches iAtten.

FIG. 77 is the schematic diagram of an embodiment of the VGA. The VGA has a control circuit to control the $V_{ds}$ of M10 and M13 at node 7505, and the $V_{ds}$ of M4 and M14 at node 7507.

A control voltage VD1 is generated by the linearization circuit 7510 and applied to control a differential amplifier U1. The negative input of U1 is coupled to node 7505, and the positive input of U1 is coupled to node 7507.

A transistor M1 has its source coupled to node 7505, its drain comprises the $+I_{out}$ terminal of the VGA. The gate of transistor M1 is coupled to the positive output of U1. A transistor M2 has its source coupled to node 7507, its drain comprises the $-I_{out}$ terminal of the VGA. The gate of transistor M2 is coupled to the negative output of A1.

The $V_{ds}$ squeezing is utilized since it tends to improve linearity. As the control signal voltage increases, the control voltage VD1 decreases tending to decrease the VGA gain. As previously discussed, iSig is decreasing and iAtten is increasing to achieve the desired decrease in VGA gain. Concurrently with $V_{ds}$ squeezing, the $V_{ds}$ of all four transistors M10, M4, M13, M14 also tends to decrease with increasing input signal level due to the application of a variable DC voltage at the transistor source leads. A DC voltage is fixed at nodes 7501 and 7503. Thus, the way available to reduce $V_{ds}$ for M10, M4, M13, and M14 is to reduce the DC voltage at the $+I_{out}$ and $-I_{out}$ terminals. A variable voltage source is connected at each node $+I_{out}$ and $-I_{out}$–7505, 7507.

The sources of M13 and M14 are coupled in common to node 7503 and to the control signal iAtten. Control signal iAtten tends to cause a decrease in amplifier gain, while control signal iSig tends to increase amplifier gain. The sources of M10 and M4 are coupled in common to iSig at node 7510. The drains of M10 and M13 are coupled in common to provide an output signal $+I_{out}$. The drains of M4 and M14 are coupled in common to provide an output signal $-I_{out}$. In the exemplary embodiment input $-V_{in}$ is coupled to the gates of M10 and M14. Input $+V_{in}$ is coupled to the gates of M4 and M13. In the exemplary embodiment differential inputs and outputs are shown in the amplifier. However, it is understood by those skilled in the art that a single ended configuration is equivalently produced by the use of a device such as a balun.

FIG. 78*a* illustrates a family of curves showing the relationship of a transistor's drain current ("$I_d$") to its gate source voltage ("$V_{gs}$") measured at each of a series of drain source voltages ("$V_{ds}$") from 50 mV to 1 V. From this graph a transconductance, $g_m$ is determined. The following relationship defines a $g_m$ curve for each $V_{ds}$ value:

$$g_m = dI_d \backslash dV_{gs} \tag{15}$$

FIG. 78*b* is a graph of $g_m$ verses $V_{gs}$ as $V_{ds}$ is varied from 50 mV to 1 V. To provide improved output linearity performance, it is desirable to operate a transistor on a curve of $g_m$ that has a constant value and zero slope. As seen in the graph for a $V_{ds}$ of approximately 50 mV, the curves of $g_m$ verses $V_{gs}$ tend to be flat. As $V_{ds}$ is increased, the curve begins to slope, indicating the presence of non-linearity in the output signal. As $V_{ds}$ increases the curve not only begins to slope, but it develops a bow, further complicating the compensation for the non-linearities at the higher level of $V_{ds}$. These irregularities in $g_m$ tend to be the sources of non-linearities in the output of the amplifier. Thus, it is desired to provide a flat $g_m$ response to produce a more linear transfer function for the VGA by controlling $V_{ds}$.

FIG. 78*c* is a graph of the cross-section of FIG. 78*b* plotting $g_m$ verses $V_{ds}$ for various values of $V_{gs}$. As $V_{ds}$ changes from approximately 200 mV to 500 mV, $g_m$ changes from approximately 5 mS to 13 mS. The change in $g_m$ from 5 mS to 13 mS by changing $V_{ds}$ may be used to control gain.

Thus, as $V_{ds}$ is decreased, the gain is decreased. Control of $V_{ds}$ provides approximately 9 dB of gain control range.

Within the range of $V_{ds}$, graphed between the vertical bars 7801, the value for $g_m$ remains essentially the same for a range of $V_{gs}$ input signal from 1.2 V to 1.4 V. Thus by controlling $V_{ds}$ from 200 mV to 600 mV approximately 9 dB of gain control is provided.

When control of $V_{ds}$ is combined with the g subtraction method previously described, the linear output signal is maintained. In addition approximately 8 dB to 9 dB of gain control in addition to that provided by $g_m$ subtraction contributes to provide overall VGA gain control on the order of 30 dB, in the exemplary embodiment.

Output linearity is often quantitized by measuring an intermodulation product produced by two input signals present at differing frequencies ($f_1$ and $f_2$ 302 and 304 respectively of FIG. 3). For the VGA a two tone intermodulation ("IM") product test is utilized, and the distortion as represented by the third order intermodulation product (308 of FIG. 3) is measured. Approximately a 26 dB decrease in the third order IM product (308 of FIG. 3) tends to be achieved in the exemplary embodiment.

With the input signal maintained at a constant level, the output signal at $+I_{out}$ and $-I_{out}$ is measured as gain squeezing is performed. Improvement is measured as compared to adjusting gain without utilizing gain squeezing. A reduction in third order intermodulation of approximately 25 dB is measured as $V_{ds}$ is squeezed within a range of approximately 150 mV to 200 mV. Utilizing a test having two tones at 44 MHz and 45 MHz typically produces third order intermodulation product components at 43 MHz and 46 MHz. With this test, 20 dB to 25 dB improvement in third order intermodulation is observed in the exemplary embodiment. A typical improvement of 20 dB is realized in the linearity of the output signal.

FIG. 79 is a schematic of a current steering circuit. An external control signal $V_c$ drives a differential pair amplifier 7910 including MC1, MC2, to ultimately generate iSig and iAtten. The iSig and iAtten are generated through two current mirrors 7904, 7906. The first current mirror 7904 comprises MC3 and MC6. The second current mirror 7906 comprises MC4 and MC5. The circuit maintains a fixed relationship between iSig and iAtten, defined by:

$$I_{tot}=iSig+iAtten \tag{16}$$

To guarantee that phase reversal does not occur, iSig must remain greater than iAtten at all times. By selecting $V_{ref}$ to be slightly less than the minimum value of control voltage $V_c$ that will be present, iSig will remain greater than iAtten.

In an embodiment of current steering circuit 7512, a control voltage $V_c$ is applied to a differential pair amplifier 7910. In the exemplary embodiment, control signal $V_c$ ranges from 0.5 V to 2.5 V. The 0.5 V corresponds to a minimum gain setting and 2.5 V corresponds to a maximum gain setting. Differential pair amplifier 7910 comprises two transistors MC1 and MC2. In the exemplary embodiment, field effect transistors are used. Equivalently, other types of transistors may be substituted for field effect devices. The inputs to the differential pair amplifier are the gates of MC1 and MC2. The sources of MC1 and MC2 are coupled in common to a current source $I_{tot}$. Current source $I_{tot}$ is in turn coupled to a supply voltage $V_{cc}$. Current source $I_{tot}$ is conventional current source constructed as is known by those skilled in the art.

The drains of MC1 and MC2 are coupled to current mirrors 7904 and 7906, respectively. Control voltage V, is coupled to the gate of MC1 and a voltage reference is coupled to the gate of MC2. Voltage reference $V_{ref}$ is typically constructed as conventional voltage source known to those skilled in the art. The currents present in the sources of MC1 and MC2 drive current mirrors 7904 and 7906, respectively. Current mirror 7904 comprises transistors MC6 and MC3. Current mirror 7906 comprises transistors MC4 and MC5. These current mirrors are constructed conventionally as is known by those skilled in the art. Output of current mirror 7904 and 7906 consists of the control signals iAtten and iSig.

FIG. 80*a* is a schematic of a VD1 control signal generation circuit. Control signal $V_c$ is fed to the positive input of a differential amplifier U2. Signal ended output of amplifier U2 is fed into the gate of transistor MC9. The source of MC9 is connected to the negative input of U2. The source of MC9 is also coupled to a first terminal of a resistor R1. A second terminal of R1 is coupled to ground. The drain of MC9 receives a current $i_{c1}$ that is supplied by a drain of transistor MC7. The drain of MC7 is coupled to the gate of MC7. The source of MC7 is coupled to a supply voltage $V_{cc}$. The gate of MC7 is coupled to the gate of MC6. The source of MC6 is coupled to a supply voltage $V_{cc}$. The drain of MC6 is coupled to a first terminal of a resistor R2. The second terminal of resistor R2 is coupled to node 1001. The node formed by coupling MC6 to R2 supplies control signal VD1. Together transistors MC7 and MC6 form a current mirror 8001.

Control current $V_c$ sets up the control current $i_{c1}$ through amplifier U2, resistor R1 and transistor MC9. Current $i_{c1}$ is mirrored through transistor MC7 and MC8 of the current mirror. The current generated in the drain lead of MC6 creates a voltage across resistor R2 as reference to the voltage present on node 7501. Thus, R1 and R2 are sized properly to control $V_{ds}$ across M10, M4, M13 and M14. For example, VD1 can range from 100 mV to 600 mV. This condition corresponds to a $V_c$=05V at a minimum gain maximum input condition and a $V_c$=2.5V maximum gain minimum input signal condition.

In alternative embodiments, control voltage $V_c$ may be subjected to conditioning by temperature compensation circuitry and linear in dB transfer function compensation before being applied to the VD1 generation circuit 7510.

FIG. 80*b* is a graph of composite transconductance vs. differential input voltage $V_{in}$, for a set of differential pair transistors coupled in parallel, and having varying degrees of offset introduced at the gates of each differential pair. The offsets are typically created by coupling the gates of differential pair transistors to nodes in a resistive ladder and applying a variable voltage across the ladder, to change the voltage difference between nodes.

For the case of an input voltage of "0" volts, no current flows through resistive ladders. Thus, all the gates of the individual differential pairs are at zero volts DC. At zero volts input the maximum gain shown by curve 8021 is achieved. However, the range of voltages over which this gain is achievable tends to be small.

As the currents in the ladders are increased a greater offset is generated between the parallel coupled differential pairs resulting in a transconductance curve 8023 that possesses a lower gain. However this gain is available over a larger range of input voltages. Thus, a larger linear input window is provided.

If the signal input is not kept separate from the control signal typically imposed upon a ladder circuit VGA performance tends to degrade at high frequencies if the RF impedance of the ladder circuits 8009, 8011 is not kept low.

However, if both a control signal and an input signal are both applied to the resistor ladders, a low RF impedance in the ladder means that more DC current tends to flow in the ladder causing an increased power dissipation in the reference ladder.

FIG. 80*c* is a schematic of an embodiment of a low voltage VGA. the embodiment shown of the low voltage VGA is disposed upon a semiconductor substrate 8079. Typical substrates include silicon fabricated by a CMOS process. In the embodiment shown of a low voltage VGA, a pair of amplifiers are cross coupled in parallel. In the low voltage VGA, performance tends to be better than that of a multiple differential pair amplifier when it is operated under low supply voltage conditions.

In a typical design approach, DC bias voltages are applied at the same pins as the AC signal voltages. AC inputs to the transistors typically have resistors of the reference ladders disposed between the gates and the voltage source of the signal. The typical design approach is usually not desirable when input voltages tend to be less than two and a half volts.

In the low voltage VGA of the present invention a reference ladder is disposed such that its DC signal path has been separated from that of the AC input signal path. Thus, the DC input drop is not present in the AC signal input lines.

In the embodiment shown, a first set of differential pairs 8037, 8039, 8041, 8043 is cross-coupled to a second set of differential pairs, 8045, 8047, 8049, 8051. A single resistive ladder 8035 is utilized to spread the VGA transconductance evenly over a range of input voltages. In the embodiment shown, the differential input voltage $V_{IN}$ is not applied to the same transistor gates as the reference voltages $V_{REFPP}$, $V_{REFN}$. Thus, the input voltage is decoupled from the input signal and the reference ladder voltages apply to the gates of the various differential pairs remain static. Decoupling of the input signal from the reference voltages allows a significant power dissipation reduction.

In the embodiment shown, a differential input voltage $V_{IN}$ includes a positive component $V_{INF}$, and a negative component $V_{INN}$. The output of the VGA, $I_{OUT}$ is a differential signal comprising $IOUT_{OUT+}$, $I_{OUT-}$. The positive output signal $I_{OUT}$, includes the sum of two currents $I_1$ and $I_4$. The negative output current $I_{OUT-}$ includes currents $I_2$ and $I_3$. A control voltage ($V_{REF-}$ $V_{REFN}$) is applied across the reference ladder 8035.

The reference ladder 8053 includes a first terminal of resistor R1 coupled to voltage $V_{REFP}$. A second terminal of R1 coupled to a first terminal of R2, a second terminal of R2 coupled to a first terminal of R3, a second terminal of R3 coupled to a first terminal of R4, and a second terminal of R4 coupled to voltage $V_{REFN}$. Input voltage $V_{INF}$ is simultaneously coupled to the gates of transistors T1, T3, T5, and T7 of respective differential pairs 8037, 8039, 8041, and 8043. The voltage $V_{INN}$ is simultaneously coupled to the gates of transistors T10, T12, T14, and T16 of respective differential pairs 8045, 8047, 8049, and 8051. The gates of transistors T2 and T9 are coupled to the first terminal of resistor R1. The gates of transistors T4 and T11 are coupled to the node formed by the coupling of the second terminal of R1 and the first terminal of R2. The gates of transistors T6 and T13 are coupled to the node formed by the coupling of the second terminal of R2 to the first terminal of R3. The gates of T8 and T15 are coupled to the node formed by the second terminal of resistor R3 coupled to the first terminal of resistor R4.

At node 8069, currents $I_1$ and $I_4$ combine to form current $I_{OUT+}$ flowing out of node 8069. The drains of transistors T1, T3, T5, and T7 are coupled to node 8069. The drains of transistors T9, T11, T13, and T15 are coupled together to form current $I_4$ which is coupled to node 8069.

Node 8071 is formed by the intersection of lines carrying currents $I_2$ and $I_3$. The current falling out of node 8071 is $I_{OUT-}$. The drains of transistors T10, T12, T14, and T16, are coupled together to form current $I_3$, which flows into node 8071. The drains of transistors T2, T4, T6, and T8 are coupled together to form current 12 flowing into node 8071.

The sources of transistors T1 and T2 are coupled together and in turn coupled to a first terminal of conventionally constructed current source 8053. A second terminal of conventionally constructed current source 8053 is coupled to ground. The sources of transistors T3 and T4 are coupled together and in turn, coupled to a first terminal of conventionally constructed current source 8055. A second terminal of conventionally constructed current source 8055 is coupled to ground. The source terminals of transistors T5 and T6 are coupled together and in turn coupled to a first terminal of conventionally constructed current source 8057. A second terminal of conventionally constructed current source 8057 is coupled to ground. The sources of transistors T7 and T8 are coupled together and in turn coupled to a first terminal of conventionally constructed current source 8059. A second terminal of conventionally constructed current source 8059 is coupled to ground.

The source terminals of transistors T9 and T10 are coupled together and in turn, coupled to a first terminal of conventionally constructed current source 8061. A second terminal of conventionally constructed current source 8061 is coupled to ground. The source terminals of transistors T11 and T12 are coupled together and in turn coupled to a first terminal of conventionally constructed current source 8063. A second terminal of conventionally constructed current source 8063 is coupled to ground. The source terminals of transistors T13 and T14 are coupled together and in turn coupled to a first terminal of conventionally constructed current source 8065. A second terminal of conventionally constructed current source 8065 is coupled to ground. The source terminals of transistors T15 and T16 are coupled together and in turn coupled to a first terminal of conventionally constructed current source 8067. A second terminal of conventionally constructed current source 8067 is coupled to ground.

In the embodiments shown, transistors T1, T2, T3, T4, T5, T6, T7, T8, T9, T10, T11, T12, T13, T14, T15, and T16 are NMOS devices. In an alternative embodiment, Pmoss transistors may be utilized equivalently.

The low voltage VGA includes a first differential pair of transistors 8037 comprising transistors T1 and T2; a second differential pair of transistors 8039 comprising transistors T3 and T4; a third differential pair of transistors 8041 comprising transistors T5 and T6; a fourth differential pair of transistors 8043 comprising transistors T7 and T8; a fifth differential pair of transistors 8045 comprising transistors T9 and T10; a sixth differential pair of transistors 8047 comprising transistors T11 and T12; a seventh differential pair of transistors 8049 comprising transistors T13 and T14; An eighth differential pair of transistors 8051 comprising transistors T15 and T16. In an alternative embodiment, a different even number of differential pairs may be utilized to construct a low voltage VGA.

To ensure proper operation, i.e., a maximum linear input window, a common node level of analog input signal at VIN should be biased about the middle tap of the voltage reference ladder between $V_{REFP}$ and $V_{REFN}$. This is accomplished using a resistive connection between the middle tap of the reference ladder and the two input terminals, using an AC coupling capacitor between the input terminals and the common input gate.

FIG. 80*d* is a schematic diagram of a low voltage VGA having an increased gain range. The gain range of the low voltage VGA is typically increased by modulating tail currents of the differential pairs as a function of the control voltage ($V_{REFP}$–$V_{REFN}$). This circuit implementation is achieved by adding a tail current modulation circuit 8075 and reproducing the circuit of FIG. 80*c* with the current sources replaced by NMOS transistors.

In each instance, an NMOS transistor is coupled to the sources of a differential pair, and the source of the transistor (e.g. T17) replacing the conventional current source is coupled to ground. The gates of the transistors replacing the conventional current sources are all tied in common to a voltage $V_{BIAS}$. For example, in the embodiment shown, current sources 8053, 8055, 8057, 8059, 8061, 8063, 8065, 8067 of FIG. 80*c* are replaced by transistors T17, T18, T19, T20, T21, T22, T23, T24 of FIG. 83*d*, each coupled as previously described.

The tail current modulation circuit 8075 includes a conventional current source 8073 having a first terminal coupled to ground and a second terminal coupled to the source terminals of a differential pair of PMOS transistors 8077 including PMOS transistors include PMOS transistor T25 and T26. The drain of T25 is coupled to a source terminal of a transistor T27. The drain terminal of T26 is coupled to a drain terminal of transistor T27. The source of transistor T27 is coupled to a supply voltage. The gate of transistor T27 is coupled to its drain and forms the voltage $V_{BIAS}$. Transistor T27 is a conventional NMOS transistor. Voltage $V_{REFN}$ is coupled to the gate of transistor T25. The voltage $V_{REFP}$ is coupled to the gate of transistor T26.

In the embodiments described, power dissipation in the referenced ladders is typically reduced significantly compared to that available in the prior art. In addition, the minimum power supply voltage requirement for this embodiment is reduced. Reduction of the power supply voltage requirement facilitates the usefulness of VGA circuits disposed in deep sub-micron CMOS processes.

Digital IF Demodulator

An integrated receiver such as is shown in FIG. 48 converts a received signal down to an intermediate frequency, suitable for a final down conversion to one or more base band signals by an IF demodulator. It is desirable to integrate the IF demodulator onto a silicon substrate to the maximum extent possible, and to also include the receiver on a common substrate with the IF demodulator. It has been difficult to integrate a receiver and an IF demodulator due to the large number of external components previously needed.

However, a digital IF demodulator, utilizing digital signal processing techniques to implement the IF demodulator functions allows integration of the demodulator into a single substrate. When an integrated tuner such as is described in FIG. 48 and the accompanying text is disposed upon the same substrate as the digital IF demodulator a low cost circuit that converts a high frequency signal to a base band signal is possible. With the digital IF demodulator the added benefit of providing programmability to allow demodulation of multi-standard video signals with a single tuner is possible.

FIG. 81 is a block diagram of a typical prior art IF demodulator 8013. A demodulator is typically cascaded after a RF tuner (or synonymously, a receiver) 4822. The RF tuner typically converts an RF carrier signal, impressed with a modulated signal, at a first frequency to an IF signal at a second carrier frequency impressed with the modulated signal. The second carrier frequency, or IF is typically lower in frequency than the RF signal. Alternatively, the receiver may be of the direct conversion type that produces an output that consists solely of the modulated signal without a carrier.

It is desirable to integrate a tuner and IF demodulator onto a single substrate 8017 to reduce parts count, cost and size. Typical substrate materials suitable for RF integrations are often costly and result in incomplete integrations. It is desirable to integrate a tuner and demodulator onto a single low cost silicon substrate fabricated with the low cost CMOS process. However, complete integration onto a single low cost substrate is difficult to achieve because limitations of the designed circuitry often call for external components in a typical tuner and IF demodulator circuit.

Between the tuner and IF demodulator, a filter 8003 is often present, as well as a variable gain amplifier 8015. The variable gain amplifier is shown as part of the demodulator circuit block 8013, however it is commonly implemented as a stand alone module. The filter 8003 and variable gain amplifier 8015 may be associated with either the tuner circuitry of the IF demodulator circuitry.

Typical external circuitry utilized in an analog IF demodulator is an audio band pass filter 8009, a Nyquist filter 8003 having a controlled slope for vestigial sideband (VSB) demodulation, a PLL loop filter 8007 and a VCO tank circuit 8005. The external circuitry typically requires components having values that do not facilitate integration onto a single substrate. Large values of capacitance or inductance often required in tuned circuits tend to be large and difficult to integrate satisfactorily on a substrate. In addition these components are difficult to tune, or adjust to utilize a single tuner in various applications. A tuner that allows digital programmability of circuit parameters to allow the tuner to be used in differing applications would be desirable.

For example, an inductance often present as a coil tends to be utilized in tank circuits 8005, and filters 8009 and 8003. Inductance is often fabricated by forming a spiral conductor on an integrated circuit substrate. The spirals are typically lossy and large, an inefficient utilization of integrated circuit layout area. Tuning of an integrated inductor is typically not performed.

Large values of capacitance typically found in filter design tend to utilize large integrated circuit areas to provide a separation of charge required to provide a given capacitance. Changing values of integrated capacitance is typically accomplished with banks of switched capacitors. Thus, by providing a circuit including the previously described tuner 4822 that minimizes or eliminates external circuit components with a IF demodulator circuit that tends to minimize or eliminate external circuitry a space efficient and economical integrated circuit may be fabricated. An exemplary tuner circuit may be as previously described in the text accompanying block 4822 of FIG. 48.

FIG. 82 is a frequency spectrum of a typical NTSC television signal. Television signals typically utilize vestigial-side band (VSB) transmission. In a typical television channel, three carrier frequencies are typically utilized to transmit a picture with sound. The carriers include a picture carrier 8202, a color carrier 8207 and a frequency modulated (FM) sound carrier 8215. The color carrier and picture carrier utilize vestigial side band (VSB) modulation.

A vestigial side band modulated signal comprises an amplitude modulated signal having two side bands 8209, 8211 in which one of the side bands has been partially suppressed 8209. The suppressed side band is termed a vestigial side band 8209. VSB modulation is desirable since it requires less frequency spectrum than an AM modulated signal to transmit the same information.

An AM modulation also known as double side band (DSB) requires twice the band width of a single side band (SSB). In AM modulation the two side bands and carrier are present. In SSB one side band is present and the carrier is suppressed. The carrier is present in the VSB signal.

A single side band receiver typically requires complex circuitry, while an AM receiver is simple to construct. VSB transmission is a compromise between the AM and SSB transmission. Thus, the vestigial side band modulation is a compromise that allows a simpler receiver to efficiently utilize the band width of a television channel.

A typical television signal incorporates carriers that transmit audio 8216, color 8203, 8205 and monochrome 8201 signals. Each signal is typically impressed upon a subcarrier. The manner of modulating desired information onto each of the subcarriers varies with the type of transmission standard or modulation being used. For example, in the NTSC system, the sound signal 8216 is impressed upon a subcarrier 8215 through frequency (FM) modulation. The video signals 8213, including the monochrome 8201 and color information 8203, 8205 are each impressed upon sub-carriers 8202, 8207. The color information is further encoded before it is impressed upon its sub-carrier. The color sub-carrier utilizes phase and amplitude quadrature modulation to interlace two color signals 8203, 8205 on the color sub-carrier 8207.

In the vestigial side band picture signal information present from approximately DC to 1 MHz is repeated in the vestigial side band 8209. If such a signal were processed by a conventional AM receiver. The low frequency video information would tend to have a voltage value of twice the high frequency video signals from approximately 1 MHz and above. This is because the low frequency information in the upper side band 8211 is repeated in the vestigial side band 8209.

The voltages of the received picture signal are typically made equal by utilizing an intermediate frequency (IF) band pass filter (BPF) that shapes the picture signal by attenuating frequencies from approximately 1 MHz from the picture carrier 8102 and below. A filter with the described pass band shape is termed a Nyquist filter. A typical IF BPF filter is a SAW filter, that shapes the pass band response. A saw filter is typically an external device since it is disposed on a pizeo-electric substrate such as zinc oxide. It is desirable to simplify the IF filter by utilizing an IF BPF with a flat response, that is integrated onto a substrate such as silicon.

FIG. 83 is a block diagram of an embodiment of a digital IF demodulator 8309. In the embodiment shown, the digital IF demodulator 8309 is disposed upon a substrate 8301. In the embodiment shown, the substrate is silicon fabricated according to the CMOS process. In alternative embodiments, different processes may be utilized.

The digital IF demodulator 8309 is typically disposed on a common substrate 8301 with a receiver circuit (not shown) that supplies an IF signal to the IF in port 8311. An exemplary receiver suitable for common integration is the receiver shown in FIG. 48. In an alternate embodiment, the digital IF demodulator 8309 is disposed on a common substrate 8301 with additional analog signal processing circuitry including as inputs, signals A, C, A prime, and S from the digital IF demodulator 8309. In further alternative embodiment, an RF receiver (not shown) is coupled to the digital IF demodulator 8309 which is in turn coupled to analog signal processing circuitry (not shown) and is disposed on a common substrate 8301. In a further alternative embodiment, the digital IF demodulator 8309 and a receiver coupled to the digital IF demodulator are disposed upon a common substrate 8301 with a conventional transmitter circuit (not shown) operating in cooperation with the digital IF demodulator, for example to establish a two way communications path in a communications system.

The digital IF demodulator 8309 typically includes an input section 8308 in which analog signals input to the digital IF demodulator are processed and converted from the analog to the digital signal domains. Signals from the analog input section 8308 that have been converted into digital signals are further processed by digital single processing block 8305. In the digital single processing block 8305 DSP techniques are utilized so that conventional analog circuit functions are fabricated with digital signal processing circuitry. DSP circuit elements advantageously allow digital programmability of the parameters of each circuit such that a high degree of flexibility in using and programming the digital IF demodulator is possible such that input signals formatted to various standards may be accommodated.

In $I^2C$ Control bus 8307 is disposed upon the substrate 8301 and couples digital control lines to the digital signal processing functional blocks 8305 allowing them to be programmed. The $I^2C$ bus also provides control to the analog input section 8308 and an analog output section 8303.

Analog output section 8303 is disposed on the common substrate 8301 and converts digital signals from the DSP block 8305 into analog signals suitable for further processing by subsequent analog single processing circuitry.

In the embodiment shown, the digital IF demodulator demodulates NTSC video signals that are impressed upon an IF carrier frequency and input to the digital IF demodulator 8309 at the IF port 8311. The signal at input IF IN is fed into a variable gain amplifier (VGA) 8317. An exemplary VGA is described in FIG. 74. The output of the variable gain amplifier 8317 is coupled to the input of a conventionally constructed analog to digital converter (ADC) 8319, where an analog IF signal is converted to a digital signal. The digital output of ADC 8319 is coupled to a conventionally constructed AGC peak detection circuit 8315, and also to a conventionally constructed VIF demodulator and Nyquist filter 8321.

The AGC peak detection circuit 8315 implements an analog circuit function in digital circuitry utilizing conventional digital signal processing techniques. The AGC peak detection circuit provides two outputs used to control automatic gain control in the tuner. Tuner automatic gain control is available by establishing a connection at the pad labeled RF AGC. A second AGC peak detection output is conventionally converted with the DAC 8313 into an analog control signal utilized to control the IF level. The IF level is controlled by applying a second AGC peak detection control circuit to the analog voltage control input of voltage controlled amplifier 8317. The AGC peak detection circuit 8315 examines the magnitude of the number representing the IF level output from analog to digital converter 8319 to generate the two AGC outputs proportional to that level. In an alternative embodiment, the AGC peak detection circuit is implemented as an analog circuit having an input sampled at the IF output of VGA 8317. In the alternate embodiment, DACs 8311 and 8313 are eliminated since the analog AGC peak detection circuit provides analog outputs.

The AGC peak detection circuit 8315 output is fed into a conventionally constructed digital to analog converter circuit 8311 where the digital signal is converted into an analog signal that is output as a signal named RF AGC. The AGC peak detection circuit 8315 also outputs a signal to a conventional digital to analog converter 8313. The analog output of digital to analog converter 8313 is supplied as an output AGC TP and simultaneously as a control signal input to an analog variable gain amplifier 8317. Typically coupled to AGC TP is a filter capacitor to low pass filter the DAC 8313 output. DAC outputs 8313 and 8311 are control currents that cause the gain of the variable gain amplifiers they are coupled to increase or decrease.

An analog to digital converter (ADC) 8319 is coupled to the output of the VGA 8317. The output of the ADC 8319 is coupled to AGC peak detection circuit 8315, and an input of a VIF demodulator and Nyquist filter 8321.

FIGS. 84*a*–84*d* are frequency spectra showing digital VIF demodulation and Nyquist filtering of an exemplary received band of television channels received at an IF frequency and presented to the VIF demodulator and Nyquist filter and the circuitry contained therein.

Figure 84A:
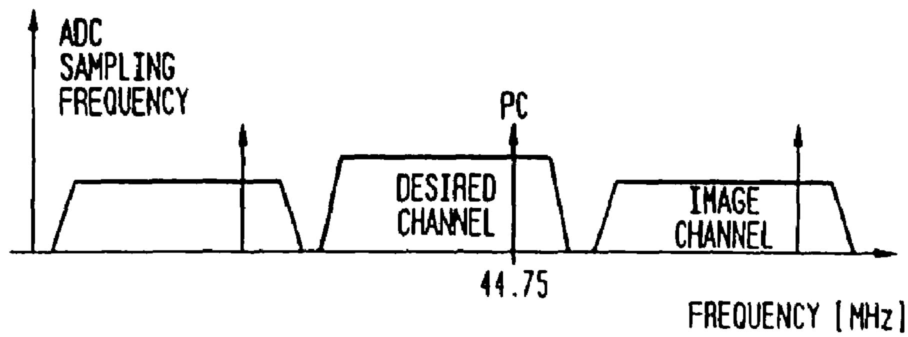

FIG. 84*a* is a frequency spectrum of an exemplary input signal to the VIF demodulator and Nyquist filter circuit (8421 of FIG. 83) as present at node 8349 of FIG. 83. A conventional analog to digital converter (ADC) 8319 disposed internally to the VIF demodulator and Nyquist filter is coupled to input node 8349 and provides a frequency conversion when operated in a sub-sampling mode. The illustrated spectrum is an analog representation of the digital signal present at input node 8349, since in block 8309 of FIG. 83 all of the signals exist as digital representations of analog values.

A typical receiver (not shown) has a bandwidth typically three channels wide allowing the three channels shown to pass through and be down-converted to an IF frequency as shown. For the NTSC television signal shown, a desired channel has a picture carrier at 44.75 MHz. A sampling frequency of an analog to digital converter (ADC), included in the VIF demodulator and Nyquist filter (8321 of FIG. 83), is chosen to be lower than the picture carrier frequency. The ADC sampling frequency is also selected to be lower than the lowest frequency present in the desired channel, such that aliasing problems typically encountered in the process of folding a signal down to baseband are not encountered.

Figure 84B:
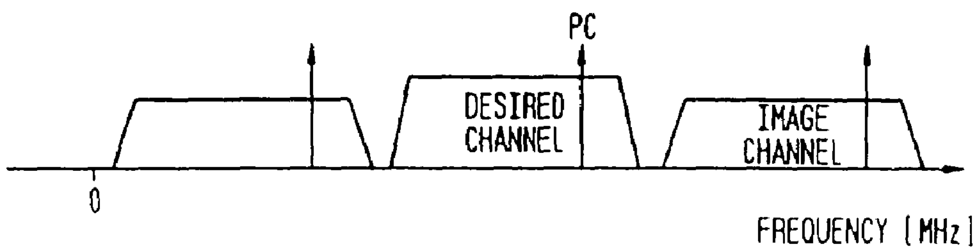

FIG. 84*b* is an illustration of the output of the ADC converter. The frequency spectrum has been shifted down to a low IF frequency by the ADC converter operated in the sub-sampling mode. The signal is then coupled to a digitally implemented Nyquist filter.

Figure 84C:
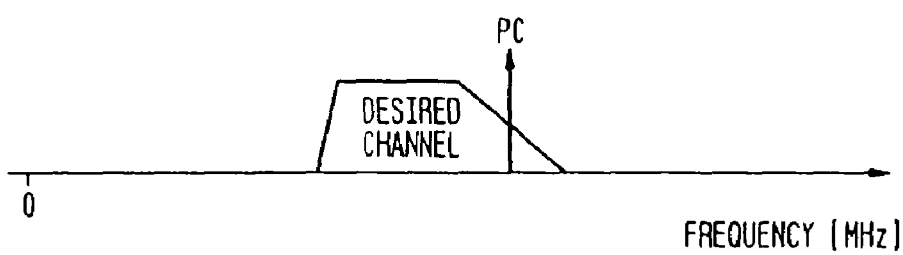

FIG. 84*c* illustrates a spectra output of a Nyquist filter. A digital Nyquist filter is coupled to the sub-sampling ADC. Digital filtering is used to implement a filter having a slope characteristic of a Nyquist filter. By choosing the ADC sampling frequency at the edge of the IF saw filter passband, the tuner acts as an additional image filter, and the image channel is strongly attenuated before it folds on top of the desired channel.

The picture carrier is positioned such that its frequency falls at the midpoint in frequency of the Nyquist filter's characteristic slope. The picture carrier is utilized as a synchronous demodulation signal. An accurate Nyquist slope is typically needed to prevent folding half of the frequency band into the baseband. Thus, the Nyquist filter truncates the desired channel and removes the image channel and any other channels present in the spectrum.

Figure 84D:
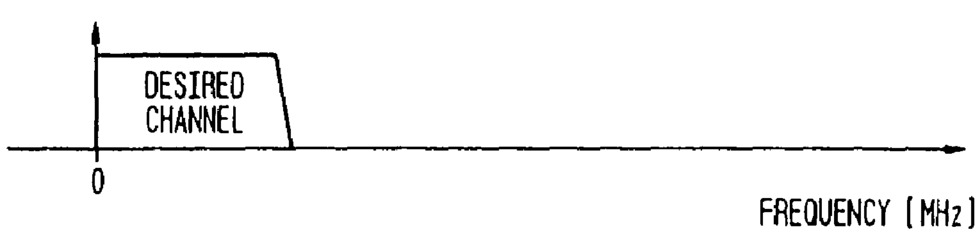

FIG. 84*d* is a frequency spectra showing the resultant shift from the low IF frequency of FIG. 84*c* to baseband. In mixing the desired channel down to baseband, the picture carrier is utilized as the local oscillator (LO) signal. With the picture carrier or LO falling partially in band with the desired channel, part of the channel is caused to fold back on itself after the mixing process. The Nyquist filter slope is selected such that when the channel folds back on itself, the constant output level of the desired channel is maintained across its frequency bandwidth.

Returning to FIG. 83, the output of the VIF demodulator and Nyquist filter 8421 is coupled to an automatic frequency tuning (AFT) circuit 8323. The AFT circuit provides a feedback signal coupled to the tuner (not shown) to adjust a local oscillator of the tuner.

Output of the AFT 8323 is a digital signal that is coupled to digital to analog converter 8325 where it is converted back into an analog signal. The output of DAC 8325 is fed back to the tuner circuit (not shown). Implementation of the automatic frequency tuning circuit by digital signal processing techniques allows a more accurate automatic gain control for controlling a typical television receiver to be implemented.

The second output of the VIF demodulator and Nyquist filter 8421 is simultaneously coupled to three filters 8327, 8337, 8345.

A low pass filter 8327 is conventionally constructed according to digital signal processing techniques. Filters implemented utilizing digital signal processing techniques are typically programmable allowing the filter parameters to be varied through one or more programming lines. The output of the first filter 8327 is simultaneously fed into a conventionally constructed sync detector and AGC circuit 8331 and into a second conventionally constructed digital variable gain amplifier 8329, constructed using DSP circuit design techniques.

The sync detector and the AGC circuit 8331 provide an output utilized as a control voltage to the second, or digital, VGA 8329 at a digital control signal control signal input. The output of the second VGA is coupled into a conventionally constructed digital to analog converter 8333. The analog output of DAC 8333 is coupled to a conventionally constructed buffer amplifier 8335. The output of amplifier 8335 forms the analog output labeled C.

Filter 8337 is a bandpass filter conventionally constructed utilizing digital signal processing techniques. This filter has the same degree of adjustability as described for filter 8327. The output of bandpass filter 8337 is fed into the input of a conventionally constructed FM demodulator circuit 8339. The output of the FM demodulator circuit is fed into a conventionally constructed digital to analog converter 8341.

In an alternative embodiment, digital to analog converter 8341 is a delta sigma type digital to analog converter. The output of digital analog converter 8341 is fed into a conventionally constructed buffer amplifier 8343. The analog output of buffer amplifier 8343 forms the A-prime output of the digital IF demodulator 8309.

Filter 8345 is a high pass filter. The high pass filter is constructed utilizing conventional digital signal processing design techniques. High pass filter 8345 possesses the same degree of programmability described for filter 8327. The output of filter 8345 is coupled to a conventionally constructed digital to analog converter 8347. The analog output of digital to analog converter 8347 forms output S of the digital IF demodulator 8309.

FIG. 85 is a spectrum of an NTSC television signal relative to the filter responses of filters 8327, 8337 and 8345. Low pass filter 8327, bandpass filter 8337, and high pass filter 8345 separate the second signal output of the VIF demodulator and Nyquist filter 8421 into three signal components.

Low pass filter 8327 passes the video signal represented by envelope 8507. The exemplary video signal includes a color subcarrier 8501 located at 3.57 MHz. The envelope of the low pass filter response 8509 allows passage of the video signal. In the exemplary NTSC signal, an FM sound carrier 8503 is present at 4.5 MHz. The bandpass filter response 8511 is designed to pass the first FM sound carrier. A second sound carrier typically encountered in high end television systems 8505 is passed by high pass filter response 8513.

Returning to FIG. 83, low pass filter 8327 passes video information and rejects sound carriers. Low pass filter 8327 is a digital circuit implemented utilizing digital signal processing techniques, such that the filter cut-off frequency and roll-off may be programmed externally. In addition, the digital filters are integrated onto the substrate 8301 as an integral unit that is part of the IF demodulator 8309.

The utility of the programmable filters is illustrated by the varying locations of the sound carriers. For example, in an NTSC signal, the sound carrier appears at 4.5 MHz. For PAL standards, the sound carrier appears at 5 or 5½ MHz. Thus, a demodulator utilizing programmable filters tends to process television signals processed according to differing formats, such as NTSC and the varying PAL standards. The output of low pass filter 8327 is coupled simultaneously to a second variable gain amplifier (VGA) 8329 and a sync detection and AGC circuit 8331. The sync detect and AGC circuit provides a clamping function and automatic gain control to control VGA 8329.

A composite video signal contains sync pulse information and varying video information. It is desired to clamp the black level of the picture to a desired output level. Thus, the black level and the amplitude of the sync signal are controlled by the sync detect and AGC circuit. A typical sync pulse is 250 mV. If the sync pulse is not approximately 250 mV, then the gain is appropriate controlled to achieve this level of sync pulse amplitude. The output of the second VGA 8329 is coupled to the input of a digital to analog converter 8333. The analog output of the DAC 8333 is coupled to a buffer amplifier 8335, having an output C available for further video processing.

Bandpass filter 8337 filters out the sound carrier. Typically this filter would have different characteristics depending upon which standard of television broadcast signal the digital IF demodulator is designed to process. However, with filters integrated in the digital domain, a multi-standard digital IF demodulator may be implemented by making the parameters of filter 8337 adjustable through digital programming. Digital programming may be accomplished through $I^2C$ programming or by supplying discrete logic levels to the filter 8337. The output of bandpass filter 8337 is coupled to the input of an FM demodulator 8339. This circuit path demodulates one FM sound carrier. The FM demodulator 8339 is constructed from a digital PLL circuit that provides demodulation of the FM carrier. DSP implementation of the FM demodulator allows very large time constants to be provided in the loop filter without the need for large external components. The output of FM demodulator 8339 is coupled to a digital to analog converter 8341.

Digital to analog converter 8341 is a conventionally constructed DAC. In an alternative embodiment, a sigma delta DAC utilizing an oversampling function, including a noise shaping response, improves the signal to noise ratio in the final analog audio output. The output of DAC 8341 is coupled to the input of a buffer amplifier 8343 having an output coupled to port A prime.

High pass filter 8345 is coupled directly to the input of DAC 8347, whose output is coupled to terminal S. This pathway provides unmodulated FM sound information at terminal S. A path such as through high pass filter 8345 would typically be used to pass multiple sound carriers, such as those utilized in dual language broadcasts. Alternatively, output S may be coupled to a surround sound system.

The invention claimed is:

1. A method for controlling transconductance gain of a complementary differential amplifier having first and second differential pairs of transistors, comprising:

applying a first input voltage to a first transistor gate of the first differential pair of transistors;

applying a second input voltage to a second transistor gate of the second differential pair of transistors; and varying a current source for at least one of the first and second differential pairs of transistors to control transconductance gain of the complementary differential amplifier for varying input voltages.

2. The method as recited in claim 1, further comprising varying the current source for at least one of the differential pairs of transistors to provide a linear transconductance gain of the complementary differential amplifier.

3. The method as recited in claim 1, further comprising varying the current source for at least one of the differential pairs of transistors as a function of at least one of the first input voltage, the second input voltage, and the difference between the first and second input voltages.

4. A method for controlling transconductance gain of a complementary differential amplifier over a range of input voltages, the complementary differential pair amplifier having first and second differential pairs of transistors, comprising:

applying a first input voltage to a first transistor gate of the first differential pair of transistors;

applying a second input voltage to a second transistor gate of the second differential pair of transistors;

varying a current source for at least one pair of the differential pairs of transistors to control transconductance gain of the complementary differential amplifier for varying input voltages; and applying a differential reference voltage across a resistive ladder connected between respective second transistor gates of the first differential pair of transistors and respective first transistor gates of the second differential pair of transistors.

5. The method as recited in claim 4, further comprising varying the differential reference voltage to control the range of input voltages.

6. The method as recited in claim 4, further comprising varying the differential reference voltage to expand the range of input voltages.

7. The method as recited in claim 4, further comprising varying the current source for at least one of the differential pairs of transistors to provide a linear transconductance gain of the complementary differential amplifier.

8. The method as recited in claim 4, further comprising varying the current source for at least one of the differential pairs of transistors as a function of at least one of the first input voltage, the second input voltage, and the difference between the first and second input voltages.

* * * * *

UNITED STATES PATENT AND TRADEMARK OFFICE

CERTIFICATE OF CORRECTION

PATENT NO. : 7,076,226 B2 Page 1 of 1
APPLICATION NO. : 10/747124
DATED : July 11, 2006
INVENTOR(S) : Bult et al.

It is certified that error appears in the above-identified patent and that said Letters Patent is hereby corrected as shown below:

Column 36
Lines 10-15, in Equation (5), please replace "($C_2$" with --($C_2$)--.
Lines 10-15, in Equation (5), please replace "($C_1$" with --($C_1$)--.

Signed and Sealed this

Ninth Day of October, 2007

JON W. DUDAS
*Director of the United States Patent and Trademark Office*